(12) United States Patent
Podlozhnyuk et al.

(10) Patent No.: US 11,791,938 B2
(45) Date of Patent: Oct. 17, 2023

(54) PARITY CHECK DECODING

(71) Applicant: NVIDIA Corporation, Santa Clara, CA (US)

(72) Inventors: Victor Podlozhnyuk, Reading (GB); Nirmal Saxena, Los Altos Hills, CA (US); Yanxiang Huang, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 16/584,811

(22) Filed: Sep. 26, 2019

(65) Prior Publication Data

US 2021/0099251 A1    Apr. 1, 2021

(51) Int. Cl.
*H04L 1/00* (2006.01)
*H04W 28/04* (2009.01)

(52) U.S. Cl.
CPC .......... *H04L 1/0076* (2013.01); *H04L 1/0057* (2013.01); *H04W 28/04* (2013.01)

(58) Field of Classification Search
CPC ..... H04L 1/0076; H04L 1/0057; H04W 28/04
See application file for complete search history.

(56) References Cited

U.S. PATENT DOCUMENTS

| 9,100,052 B2* | 8/2015 | Pisek ................. H03M 13/256 |
| 10,735,138 B2* | 8/2020 | Kalachev ......... H03M 13/6516 |
| 10,929,132 B1* | 2/2021 | Pawlowski ............... G06F 9/35 |
| 2010/0146362 A1 | 6/2010 | Pisek et al. |
| 2018/0331695 A1* | 11/2018 | Fisher-Jeffes ..... H03M 13/6516 |
| 2019/0026149 A1* | 1/2019 | Jiang ..................... G06F 9/4843 |
| 2019/0181881 A1* | 6/2019 | Matsuo .................. H04N 19/61 |
| 2020/0293368 A1* | 9/2020 | Andrei .................. G06F 9/4881 |

FOREIGN PATENT DOCUMENTS

| CA | 3055231 A1 * | 12/2018 | .......... H03M 13/116 |
| CA | 3055231 A1 | 12/2018 | |
| EP | 2568612 A1 | 3/2013 | |
| EP | 3542481 A1 | 9/2019 | |

OTHER PUBLICATIONS

IEEE, A. Fitri, K. Anwar and D. M. Saputri, "Simple Rateless Codes Based on 5G New Radio QC-LDPC Codes for Dynamic Networks," 2019 IEEE International Conference on Signals and Systems (ICSigSys), Jul. 1, 2019, pp. 150-155 (Year: 2019).*

3rd Generation Partnership Project, Technical Specification Group Radio Access Network, NR, "Multiplexing and channel coding (Release 15)," 3GPP TS 38.212, V0.0.1, Jul. 2017, 24 pages.

International Search Report and Written Opinion dated Dec. 10, 2020, in International Patent Application No. PCT/US2020/051855, filed Sep. 21, 2020, 18 pages.

(Continued)

*Primary Examiner* — Lan-Huong Truong

(74) *Attorney, Agent, or Firm* — Davis Wright Tremaine LLP

(57) ABSTRACT

Apparatuses, systems, and techniques to decode encoded data. In at least one embodiment, parts of information for decoding the encoded data is provided to a plurality of processors, and parts of data decoded by the plurality of processors is combined.

25 Claims, 61 Drawing Sheets

(56) References Cited

OTHER PUBLICATIONS

Gallagher, "Low-Density Parity-Check Codes," MIT Ph. D. Thesis, Jul. 1963, retrieved Oct. 14, 2020, from https://web.stanford.edu/class/ee388/papers/ldpc.pdf, 90 pages.
IEEE Computer Society, "IEEE Standard 754-2008 (Revision of IEEE Standard 754-1985): IEEE Standard for Floating-Point Arithmetic," The Institute of Electrical and Electronics Engineers, Inc., Aug. 29, 2008, 70 pages.
Mackay, "Good Error-Correcting Codes Based on Very Sparse Matrices," IEEE Transactions on Information Theory 45(2):399-431, Mar. 1999.
Society of Automotive Engineers On-Road Automated Vehicle Standards Committee, "Taxonomy and Definitions for Terms Related to Driving Automation Systems for On-Road Motor Vehicles," Standard No. J3016-201609, issued Jan. 2014, revised Sep. 2016, 30 pages.
Society of Automotive Engineers On-Road Automated Vehicle Standards Committee, "Taxonomy and Definitions for Terms Related to Driving Automation Systems for On-Road Motor Vehicles," Standard No. J3016-201806, issued Jan. 2014, revised Jun. 2018, 35 pages.
Wikipedia, "IEC 61508," Wikipedia Encyclopedia, retrieved on Oct. 13, 2020, from https://en.wikipedia.org/wiki/IEC_61508, 7 pages.
Wikipedia, "IEEE 802.11," Wikipedia the Free Encyclopedia, https://en.wikipedia.org/wiki/IEEE_802.11, most recent edit Sep. 20, 2020 [retrieved Sep. 22, 2020], 15 pages.
Wikipedia, "ISO 26262," Wikipedia Encyclopedia, retrieved on Oct. 13, 2020, from https://en.wikipedia.org/wiki/ISO_26262, 8 pages.

\* cited by examiner

LIFTING SET 300

COMPRESSED ROW REPRESENTATION 302

PARITY CHECK DECODING

FIELD OF INVENTION

At least one embodiment pertains to decoding data encoded according to a parity check code.

BACKGROUND

Decoding data encoded with a parity check code may use significant memory, time, or computing resources. For example, decoding data encoded with a low density parity check code may require significant amounts of memory and processor time, particularly when various soft decoding algorithms are used. Nevertheless, usage of complex parity check codes, such as those employed in various communications protocols, is increasing.

BRIEF DESCRIPTION OF THE DRAWINGS

Various techniques will be described with reference to drawings, in which.

DETAILED DESCRIPTION

Figure 1:
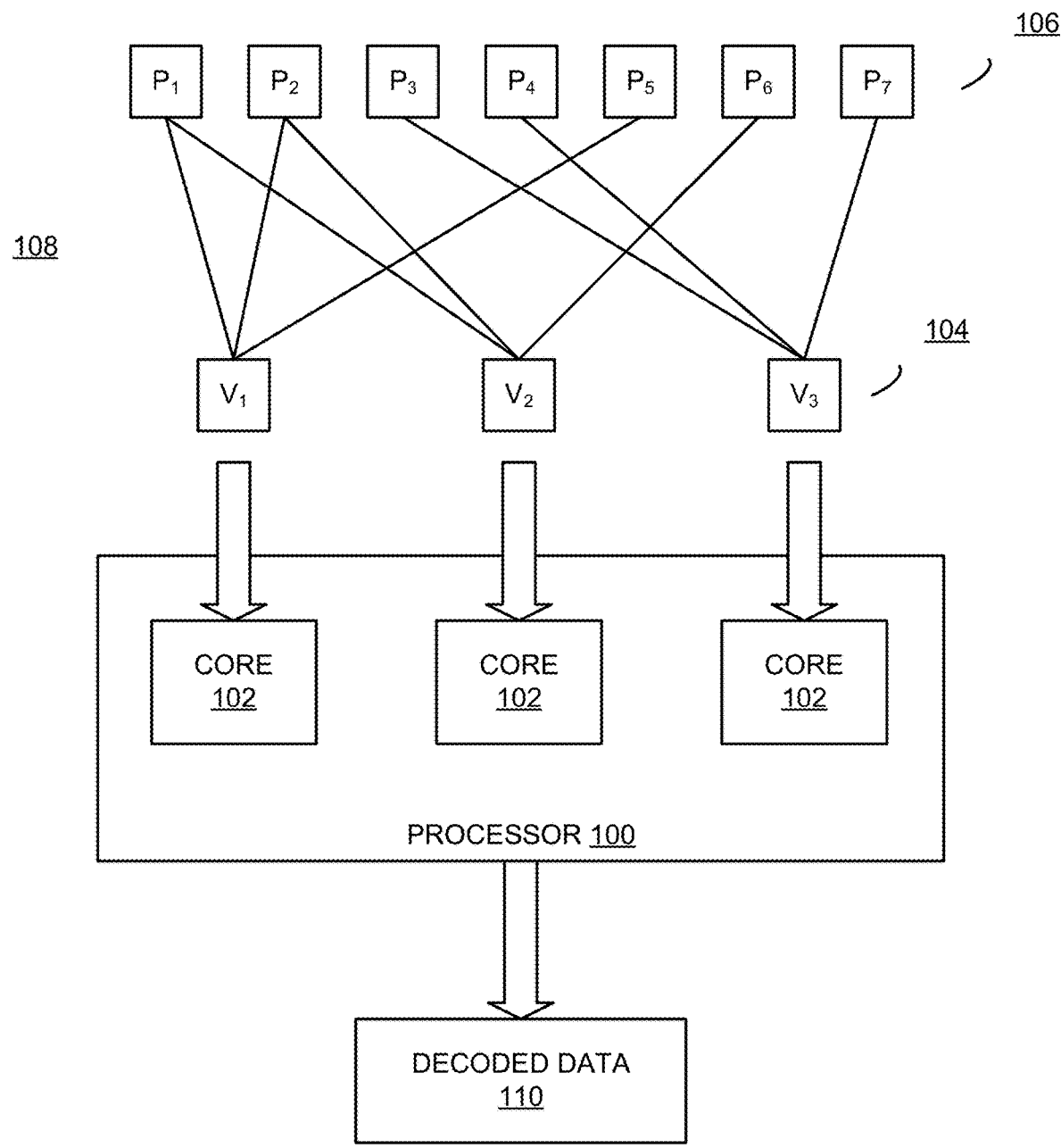
FIG. 1 illustrates an example a decoder for decoding a parity check code, according to at least one embodiment.

FIG. 1 illustrates an example a decoder for decoding a parity check code, according to at least one embodiment.

In at least one embodiment, a processor 100 decodes data encoded using a linear error correcting code, such as a low density parity check ("LDPC") code. In at least one embodiment, an LDPC code associated with 5G new radio ("5G NR") is used.

In at least one embodiment, a parity check matrix of an LDPC encoding may be described using a graph 108, such as a Tanner graph. A graph 108, in at least one embodiment, describes a coding relationships between bit nodes $P_1$-$P_7$ 106 and check nodes $V_1$-$V_3$ 104. A bit node, such as any of $P_1$-$P_7$ 106, represents data that is to be decoded. This may include both original data and additional parity bits used to detect and correct errors that may occur when data is transmitted.

In at least one embodiment, a code is defined in accordance with a bipartite graph, in which each of check nodes $V_1$-$V_3$ 104 may linked in a graph to one or more of bit nodes $P_1$-$P_7$ 106, but not to any other check node. Similarly, each of bit nodes $P_1$-$P_7$ 106 may be linked to one or more of $V_1$-$V_3$ 104, but not to any other bit node.

In at least one embodiment, a quasi-cyclic LDPC ("QC-LDPC") code is used. A QC-LDPC code may be associated with a base graph or protograph. In at least one embodiment, a base graph or protograph is copied and its edges permuted, by a process sometimes referred to as lifting, to form a larger graph. A degree of lifting, e.g., a number of attached copies, may be represented by a variable 'Z.'

In at least one embodiment, bit nodes $P_1$-$P_7$ 106 are decoded by a plurality of partial decoding operations. A partial decoding operation may comprise a subset of operations to obtain a finalized decoding of bit nodes $P_1$-$P_7$ 106. For example, in at least one embodiment, a partial decoding operation comprises at least a portion of a soft decision decoding algorithm, based on techniques associated with belief propagation.

In at least one embodiment, a message passing algorithm is employed, in which a check nodes passes messages conveying its belief, e.g. expressed as a percentage likelihood, of a value of a linked bit node.

In at least one embodiment, a partial decoding operation comprises operations associated with a message passing algorithm.

In at least one embodiment, a partial decoding operation comprises operations associated with lifting. For example, in an embodiment, a partial decoding operation comprises matrix operations to generate permutations of a base graph or protograph.

In at least one embodiment, a parity check matrix may be generated from a base graph. For example, in at least one embodiment, a parity check matrix is generated by replacing zero-valued entries with an all-zero matrix of dimensions Z×Z, and non-zero entries with a permutation matrix, also of dimensions Z×Z. A permutation matrix, in at least one embodiment, is a circularly shifted identity matrix. A permutation may therefore be represented, in at least one embodiment, as a number indicative of a degree of rotation.

In at least one embodiment, a communications standard, such as 5G NR, defines one or more base graphs, or protographs, to be used in encoding and decoding operations.

In at least one embodiment, a communications standard, such as 5G NR, defines lifting sizes and permutations matrices to be used in encoding and decoding operations.

In at least one embodiment, as illustrated in FIG. 1, a processor 100 may comprise a plurality of cores 102. A core 102, in at least one embodiment, performs a partial decoding operation, such as a partial decoding operation to generate data for permuting, or to permute, a base graph or protograph.

In at least one embodiment, one or more of a plurality of cores 102 are each provided with a compressed or compacted representation of a base graph or protograph used in encoding. In at least one embodiment, a compressed or compacted representation contributes to decoding efficiency.

In at least one embodiment, a processor 100 completes decoding, to generate decoded data 110, based at least in part on output from partial decoding operations. Decoded data 110, in at least one embodiment, is generated by estimating parity-checked bit values, based on belief-propagation to determine likely bit values.

Figure 2:
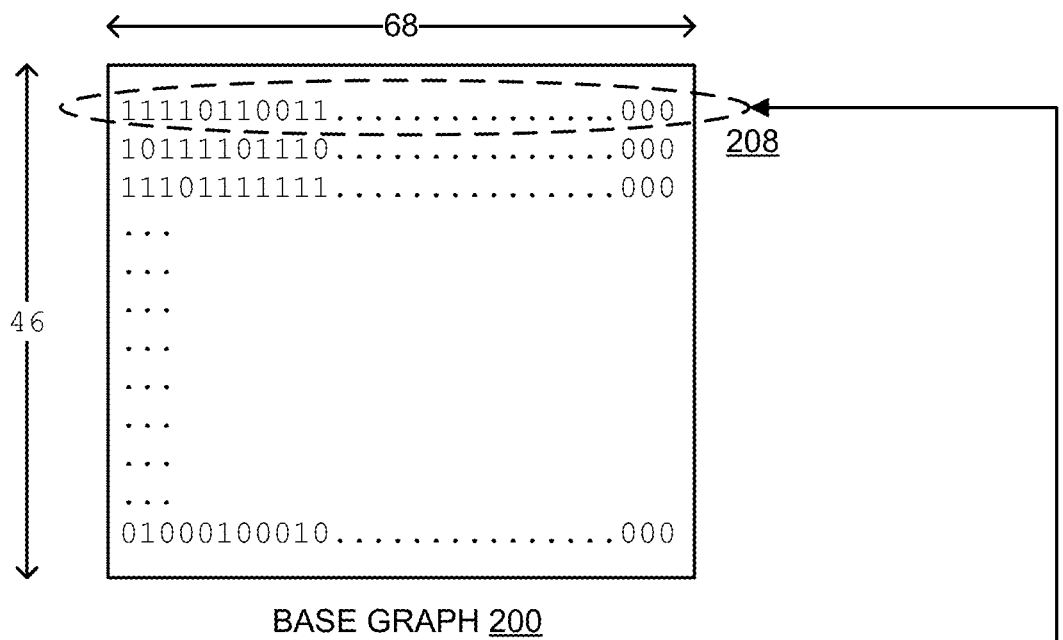
FIG. 2 illustrates an example of a compacted representation of a base graph, according to at least one embodiment.
Figure 2:
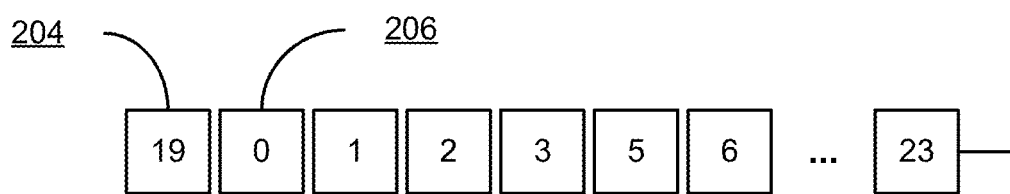

FIG. 2 illustrates an example of a compacted representation of a base graph, according to at least one embodiment.

In at least one embodiment, decoding of LDPC codes is done based on iterative belief propagation algorithms. In at least one embodiment, an LDPC code can be represented in a form of a graph, such as base graph 200, associated with a parity check matrix H of size M×N, where matrix H defines connections between graph nodes. In at least one embodiment, M rows of matrix H corresponds to parity check nodes, and N columns corresponds to variable nodes, e.g., received code word bits. In at least one embodiment, a belief propagation algorithm is based on iterative message exchange, such that a posteriori probabilities between variable and check nodes are updated, until a valid code word is obtained. In at least one embodiments, dimensions of a base graph are 46×68. However, this example of dimensions is intended only to be illustrative, and as such should not be construed so as to preclude embodiments employ other dimension values.

In at least one embodiment, a base graph 200 is associated with 5G NR. In at least one embodiment, two LDPC base graphs are defined in association with 5G NR, one for use with smaller transport blocks and the other for larger transport blocks. In at least one embodiment, these base graphs may be represented, during decoding, by a compacted or compressed representation. In at least one embodiment, a compacted or compressed representation is generate a priori and provided to a processor, core, or thread for use during decoding.

In at least one embodiment, a compacted row representation 202 is generated to represent a row 208 of a base graph 200. A first field 204 of compacted row representation 202 comprises a value indicative a number of non-zero entries in row 208.

In an example, row 208 might comprise nineteen non-zero values. A field 204 might then comprise '19' to represent a count of non-zero entries in row 208. Other fields 206 of compacted row representation 202 correspond to non-zero entries in row 208, and comprise values indicative of a position of a respective non-zero entry. For example, in row 208 positions 0, 1, 2, 3, 5, 6 (and so on) might be non-zero. Fields 208 of compacted row representation 202 might therefore comprise 0, 1, 2, 3, 5, 6, and so forth, indicating which positions in row 208 are non-zero.

In at least one embodiment, a compressed representation of a portion of base graph is column-oriented. In an embodiment, a compressed representation of a portion of a base graph comprises a count of non-zero locations in a column of a base graph, and references to those non-zero locations.

In at least one embodiment, compressed representation of a portion of a base graph corresponds to a region in a base graph. In at least one embodiment, a compressed representation of a portion of a base graph comprises references to non-zero locations within a region of a base graph.

Figure 3:
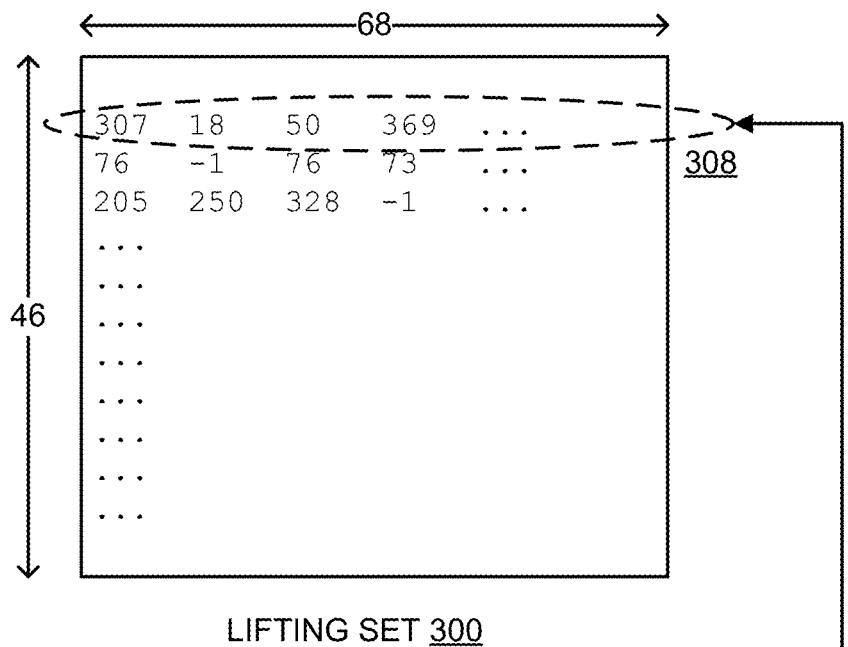
FIG. 3 illustrates an example of a compacted lifting set representation, according to at least one embodiment.
Figure 3:
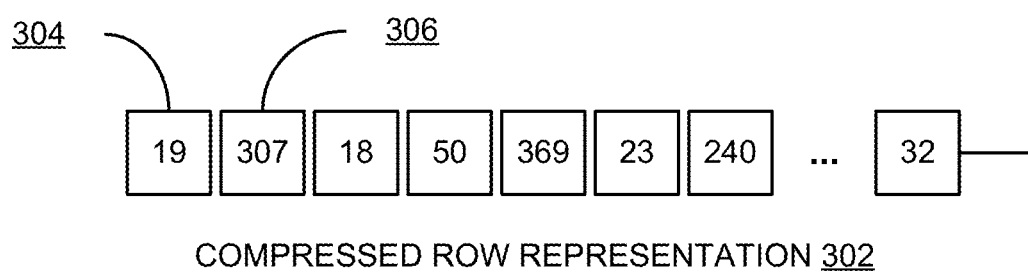

FIG. 3 illustrates an example of a compacted lifting set representation, according to at least one embodiment. In at least one embodiment, a communications standard, such as 5G NR, defines one or more lifting sets to be used in encoding and decoding operations.

In at least one embodiment, a compacted row representation 302 is generated to represent a row 308 of a lifting set 300.

In at least one embodiment, a field 304 of a compacted row representation 302 comprises a value indicative of a number of other fields 306 in a compacted row representation. For example, a row of lifting set 300 might comprise nineteen additional fields 306, containing values from lifting set 300 that correspond to non-zero entries in a corresponding base graph, such as base graph 200 depicted in FIG. 2. As such, in at least one embodiment, fields 306 contain values indicating a circular rotation value for a corresponding entry in a compacted row representation 202 of base graph 200.

In at least one embodiment, data is decoded by partial decoding operations performed in parallel. In at least one embodiment, partial decoding operations are performed by associating portions of a base graph with cores of a processor, and executing threads on those cores to perform partial decoding operations associated with base graph portions.

In at least one embodiment, groups of threads are associated with cores of a processor, and perform partial decoding operations using compacted representations of a base graph and lifting set.

In at least one embodiment, processor cores utilized in performing partial decoding operations comprise circuits in accordance with a single instructions, multiple thread ("SIMT") architecture.

In at least one embodiment, a compressed representation of a portion of a lifting set is column-oriented. In an embodiment, a compressed representation of a portion of a lifting set comprises a count of non-zero locations in a column of a lifting set, and references to those non-zero locations.

In at least one embodiment, compressed representation of a portion of a lifting set corresponds to a region in a lifting set. In at least one embodiment, a compressed representation of a portion of a lifting set comprises references to non-zero locations within a region of a lifting set.

Figure 4:
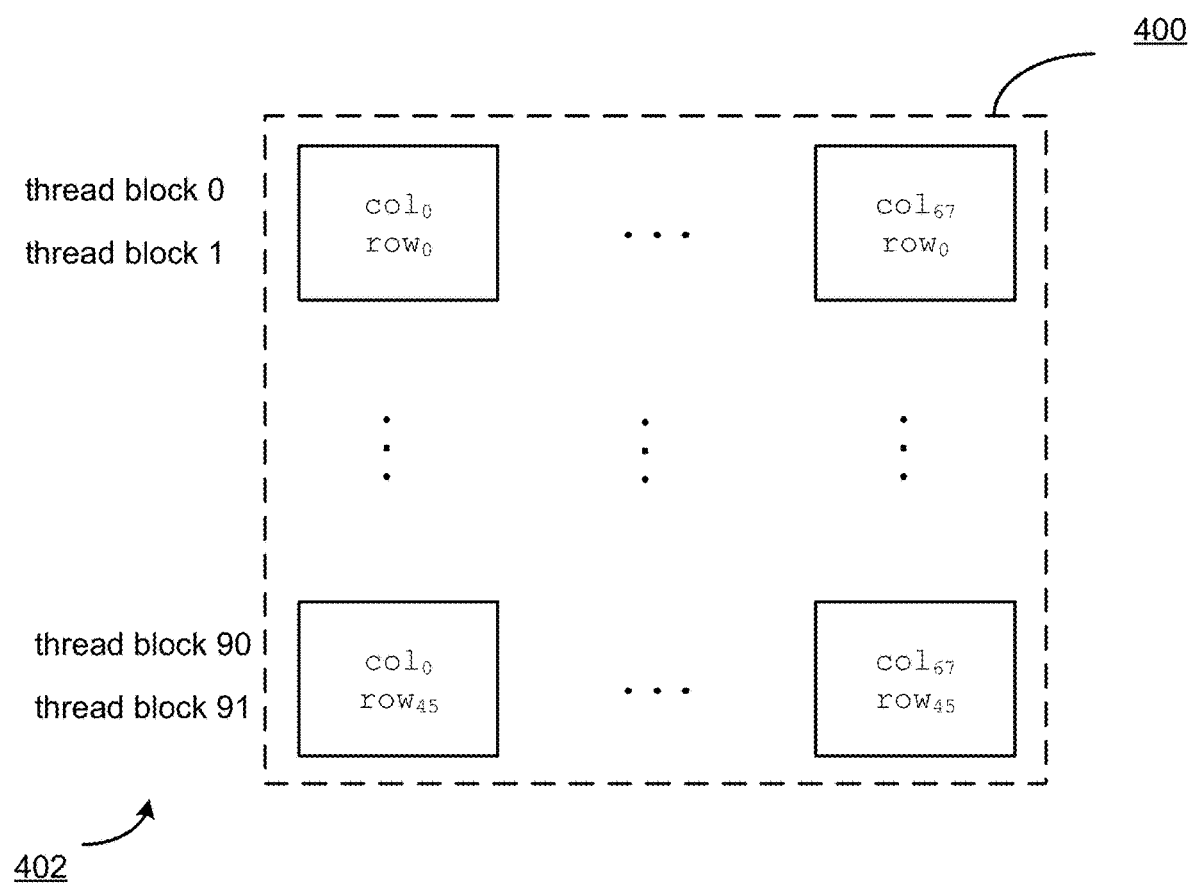
FIG. 4 illustrates an example of thread assignment in a decoder, according to at least one embodiment.

FIG. 4 illustrates an example of thread assignment in a decoder, according to at least one embodiment. An example matrix 400 indicates rows and columns of a corresponding matrix defining a base graph. Thread-block assignments 402 indicate how groups of threads may, in at least one embodiment, be associated with portions of a base graph. For example, in at least one embodiment, two thread blocks are assigned to each row of matrix 400. As depicted in FIG. 4, columns 0-67 of row 0 of a base graph, such as base graph 200 of FIG. 2, are associated with a thread block 0 and a thread block 1. Each other row is similarly associated, in this at least one embodiment, with two thread blocks.

In at least one embodiment, partial decoding operations involving a base graph are performed in accordance with a thread group assignment, such as the thread group assignment depicted in FIG. 4.

Figure 5:
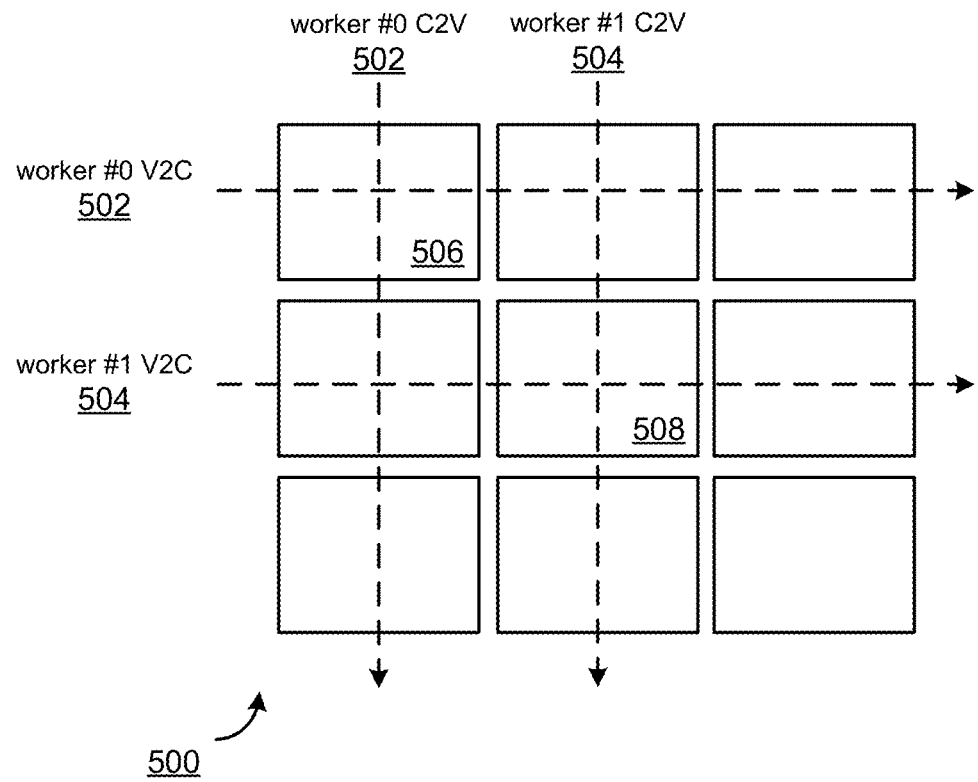
FIG. 5 illustrates an example of thread assignment in a decoder, according to at least one embodiment.

FIG. 5 illustrates an example of thread assignment in a decoder, according to at least one embodiment. In at least one embodiment, worker threads 502, 504 are associated with portions of a lifting set 500. For example, in at least one embodiment, a worker thread #0 is associated with a first position 506 in a lifting set and performs variable-to-check ("V2C") and check-to-variable ("C2V") operations using data associated with that first position. Likewise, a worker thread #1 is associated with a second position 508 in a lifting set, and performs V2C and C2V operations associated with that second position.

Figure 6:
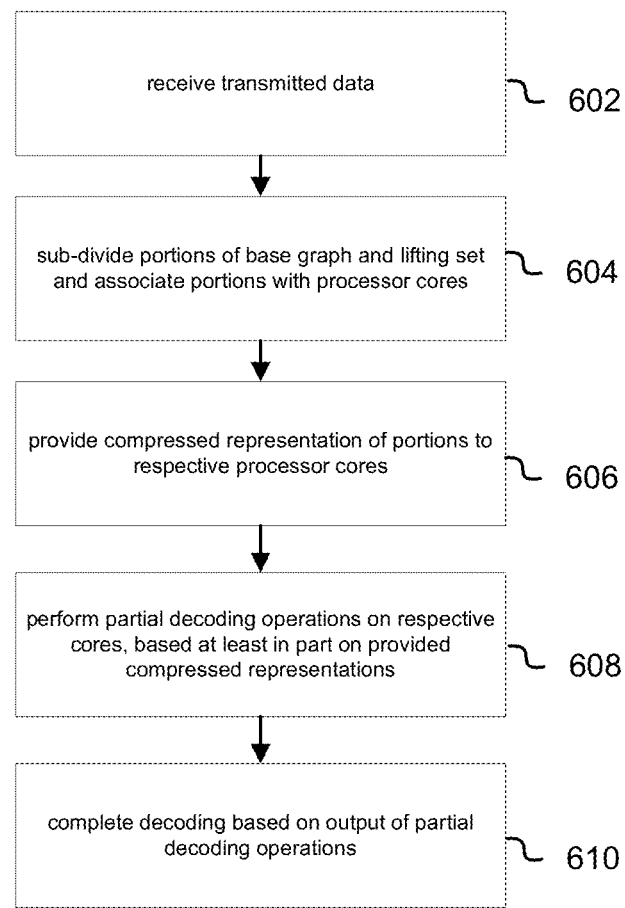
FIG. 6 illustrates an example of decoding data received according to a communications protocol, according to at least one embodiment.

FIG. 6 illustrates an example of decoding data received according to a communications protocol, according to at least one embodiment. In at least one embodiment, a communications protocol includes one or more aspects of radio communications consistent with 5G New Radio technology.

In at least one embodiment, a system receives transmitted data, to decode in accordance with information provided in a base graph and a lifting set 602. In at least one embodiment, transmitted data is received in accordance with 5G New Radio, for example by being encoded in accordance with a QC-LDPC code.

In at least one embodiment, portions of a base graph and lifting set are sub-divided and associated with processor cores 604. In at least one embodiment, such subdivision is made in accordance with techniques illustrated by FIG. 4 or 5.

In at least one embodiment, compressed representations of portions are provided to respective processor cores 606. In at least one embodiment, compressed representations are made in accordance with techniques illustrated by FIG. 2. For example, in at least one embodiment, a compacted row representation 202 is provided to a processor core that will execute threads to perform partial decoding of encoded data. In an embodiment, such partial decoding corresponds to computations, performed in parallel, related to portions of a base graph and lifting set, as might be performed in conjunction with various soft-decoding techniques, such as those for decoding QC-LDPC codes.

In at least one embodiment, partial decoding operations are performed on respective processor cores, based at least in part on a compressed representations of a base graph and lifting set 608. In at least one embodiment, partial decoding operations comprise rotation operations for permutation of a base graph or protograph. In at least one embodiment, partial decoding operations comprise application of a parity check equation defined by a corresponding row of a base graph.

In at least one embodiment, decoding is completed based on output of partial decoding operations 610. In at least one embodiment, completion of decoding is based on a belief propagation or soft decoding algorithm, utilizing parts of decoded data as obtained from a respective processor core.

Figure 7:
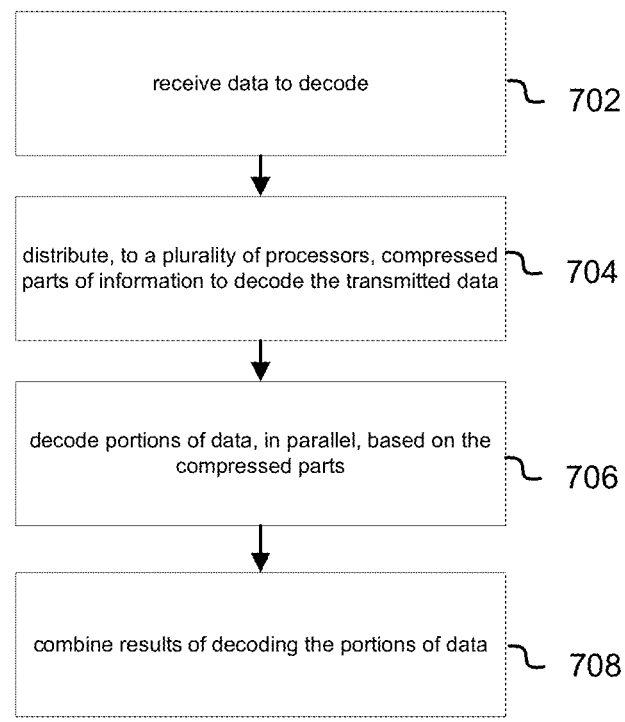
FIG. 7 illustrates an example of decoding data, according to at least one embodiment.

FIG. 7 illustrates an example of decoding data, according to at least one embodiment.

In at least one embodiment, data to decode is received 702. In at least one embodiment, a device comprising one or more processors receives data encoded using a parity check code, such as a LDPC code. In at least one embodiment, data is encoded according to QC-LDPC. In at least one embodiment, data is encoded according to an encoding associated with 5G NR.

In at least one embodiment, compressed parts of information to decode data is distributed to a plurality of processors 704. In at least one embodiment, compressed parts of information include a compressed representation of a row of a base graph, such as is depicted by FIG. 2. In at least one embodiment, compressed parts of information included a compressed representation of a row of a lifting set, such as is depicted by FIG. 3.

In at least one embodiment, portions of data are decoded, in parallel, based on compressed parts of information 706. In an embodiment, decoding portions of data comprises a partial decoding of encoded data. In an embodiment, such partial decoding comprises a soft decoding of encoded data.

In at least one embodiment, results of decoding portions are combined 708. In at least one embodiment, parts of decoded data are obtained as output from a partial decoding operation. In at least one embodiment, output of a partial decoding operation comprises a soft probability of a bit value, as computed based on a respective portion of a base graph. In at least one embodiment, a belief propagation or soft decoding algorithm is utilized to complete decoding.

In at least one embodiment, a system comprises one or more processors to decode encoded data by distributing compressed parts of information to decode encoded data to a plurality of processors, and to complete decoding of encoded data by combining parts of decoded data from a plurality of processors. In at least one embodiment, combined parts include estimated bit values for a portion of encoded data.

In at least one embodiment, compressed parts of information correspond to a row of a base graph defining an encoding.

In at least one embodiment, compressed parts of information to decode encoded data comprises a count of non-zero values in a row of a base graph, and references to non-zero locations in a row of a base graph.

In at least one embodiment, a compressed parts of information to decode encoded data comprise a representation of a portion of a lifting set. A representation of a lifting set, in at least one embodiment, comprises a count of non-zero values in a corresponding row of a base graph, and a rotation amount.

In at least one embodiment, encoded data is encoded using a low-density parity check code.

In at least one embodiment, encoded data is received in accordance with 5G New Radio.

In at least one embodiment, a processor comprises one or more cores to decode encoded data by receiving compressed parts of information to decode encoded data, and to combine results of decoding encoded data.

In at least one embodiment, a machine-readable medium has stored thereon a set of instructions, which if performed by one or more processors, cause one or more processors to at least decode encoded data by distributing compressed parts of information to decode encoded data, and to combine results of decoding parts of the decoded data from the one or more processors.

In at least one embodiment, a communications device comprises a plurality of processors to decode encoded data by distributing compressed parts of information to decode encoded data to a plurality of processors, and to combine results of decoding parts of decoded data.

In at least one embodiment, processors of a communications device receive encoded data by a transmission in accordance with a 5G New Radio protocol.

In at least one embodiment, processors of a communications device decode encoded data based at least in part on a base graph associated with a 5G New Radio protocol.

In at least one embodiment, compressed parts of information to decode encoded data comprise a count of non-zero locations in a row of the base graph and one or more references to the non-zero locations.

In at least one embodiment, compressed parts of information to decode encoded data comprise one or more rotation values of a lifting set.

In at least one embodiment, a communications device receives and decodes data encoded based at least in part on a QC-LDPC code.

In at least one embodiment, a system comprises one or more processors to perform in parallel a plurality of partial decoding operations on encoded data, wherein a partial decoding operation, of the plurality of partial decoding operations, is based at least in part on a compacted representation of a row of a base graph; and to complete decoding of the encoded data based at least in part on the plurality of partial decoding operations.

Data Center

Figure 8:
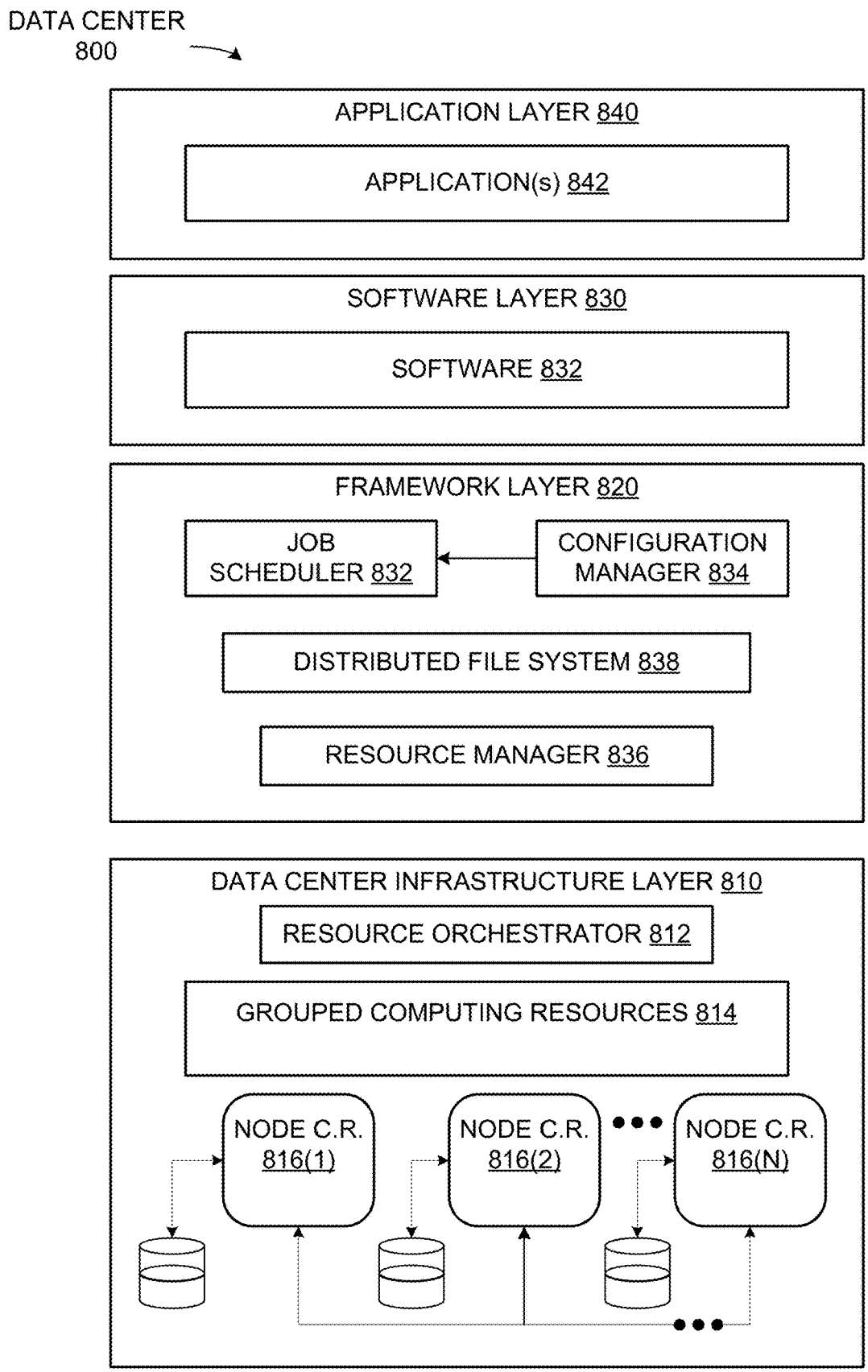
FIG. 8 illustrates an example data center system, according to at least one embodiment.

FIG. 8 illustrates an example data center 800, in which at least one embodiment may be used. In at least one embodiment, data center 800 includes a data center infrastructure layer 810, a framework layer 820, a software layer 830 and an application layer 840.

In at least one embodiment, as shown in FIG. 8, data center infrastructure layer 810 may include a resource orchestrator 812, grouped computing resources 814, and node computing resources ("node C.R.s") 816(1)-816(N), where "N" represents any whole, positive integer. In at least one embodiment, node C.R.s 816(1)-816(N) may include, but are not limited to, any number of central processing units ("CPUs") or other processors (including accelerators, field programmable gate arrays (FPGAs), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 816(1)-816(N) may be a server having one or more of above-mentioned computing resources.

In at least one embodiment, grouped computing resources 814 may include separate groupings of node C.R.s housed within one or more racks (not shown), or many racks housed in data centers at various geographical locations (also not shown). Separate groupings of node C.R.s within grouped computing resources 814 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 812 may configure or otherwise control one or more node C.R.s 816(1)-816(N) and/or grouped computing resources 814. In at least one embodiment, resource orchestrator 812 may include a software design infrastructure ("SDI") management entity for data center 800. In at least one embodiment, resource orchestrator may include hardware, software or some combination thereof.

In at least one embodiment, as shown in FIG. 8, framework layer 820 includes a job scheduler 832, a configuration manager 834, a resource manager 836 and a distributed file system 838. In at least one embodiment, framework layer 820 may include a framework to support software 832 of software layer 830 and/or one or more application(s) 842 of application layer 840. In at least one embodiment, software 832 or application(s) 842 may respectively include web-based service software or applications, such as those provided by Amazon Web Services, Google Cloud and Microsoft Azure. In at least one embodiment, framework layer 820 may be, but is not limited to, a type of free and open-source software web application framework such as Apache Spark™ (hereinafter "Spark") that may utilize distributed file system 838 for large-scale data processing (e.g., "big data"). In at least one embodiment, job scheduler 832 may include a Spark driver to facilitate scheduling of workloads supported by various layers of data center 800. In at least one embodiment, configuration manager 834 may be capable of configuring different layers such as software layer 830 and framework layer 820 including Spark and distributed file system 838 for supporting large-scale data processing. In at least one embodiment, resource manager 836 may be capable of managing clustered or grouped computing resources mapped to or allocated for support of distributed file system 838 and job scheduler 832. In at least one embodiment, clustered or grouped computing resources may include grouped computing resource 814 at data center infrastructure layer 810. In at least one embodiment, resource manager 836 may coordinate with resource orchestrator 812 to manage these mapped or allocated computing resources.

In at least one embodiment, software 832 included in software layer 830 may include software used by at least portions of node C.R.s 816(1)-816(N), grouped computing resources 814, and/or distributed file system 838 of framework layer 820. one or more types of software may include, but are not limited to, Internet web page search software, e-mail virus scan software, database software, and streaming video content software.

In at least one embodiment, application(s) 842 included in application layer 840 may include one or more types of applications used by at least portions of node C.R.s 816(1)-816(N), grouped computing resources 814, and/or distributed file system 838 of framework layer 820. One or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, any of configuration manager 834, resource manager 836, and resource orchestrator 812 may implement any number and type of self-modifying actions based on any amount and type of data acquired in any technically feasible fashion. In at least one embodiment, self-modifying actions may relieve a data center operator of data center 800 from making possibly bad configuration decisions and possibly avoiding underutilized and/or poor performing portions of a data center.

In at least one embodiment, data center 800 may include tools, services, software or other resources to train one or more machine learning models or predict or infer information using one or more machine learning models according to one or more embodiments described herein. In at least one embodiment, a machine learning model may be trained by calculating weight parameters according to a neural network architecture using software and computing resources described above with respect to data center 800. In at least one embodiment, trained machine learning models corresponding to one or more neural networks may be used to infer or predict information using resources described above with respect to data center 800 by using weight parameters calculated through one or more training techniques described herein.

In at least one embodiment, data center may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as image recognition, speech recognition, or other artificial intelligence services.

In at least one embodiment, an application layer 840 comprises application(s) 842 that comprising logic to decode encoded data by distributed compressed parts of decoding information to a plurality of processors, and combine results of such decoding.

In at least one embodiment, a software layer 830 comprises software 832 that comprising logic to decode encoded data by distributed compressed parts of decoding information to a plurality of processors, and combine results of such decoding.

In at least one embodiment, a framework layer 820 comprises logic to decode encoded data by distributed compressed parts of decoding information to a plurality of processors, and combine results of such decoding.

Autonomous Vehicle

Figure 9A:
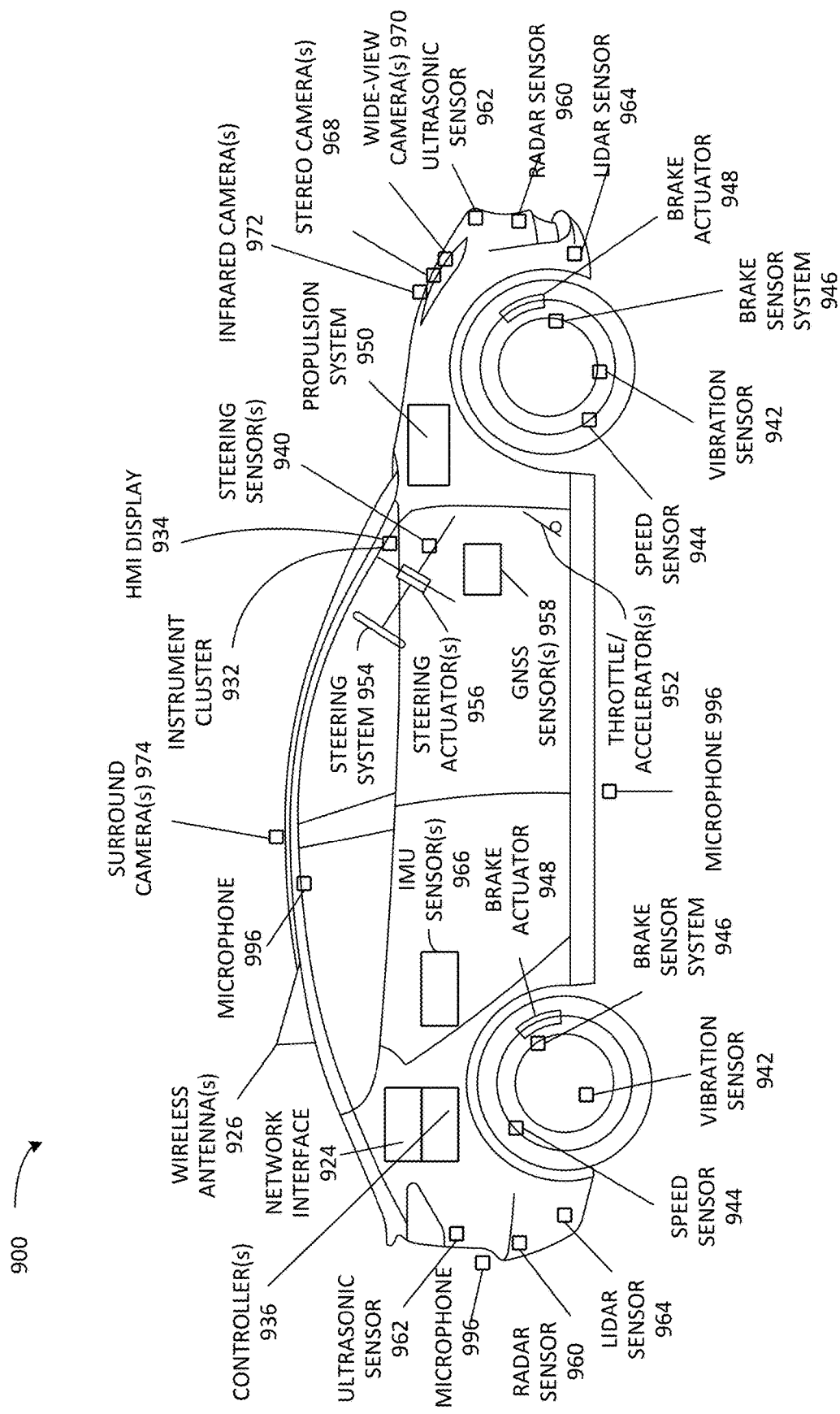
FIG. 9A illustrates an example of an autonomous vehicle, according to at least one embodiment.

FIG. 9A illustrates an example of an autonomous vehicle 900, according to at least one embodiment. In at least one embodiment, autonomous vehicle 900 (alternatively referred to herein as "vehicle 900") may be, without limitation, a passenger vehicle, such as a car, a truck, a bus, and/or another type of vehicle that accommodates one or more passengers. In at least one embodiment, vehicle 900 may be a semi-tractor-trailer truck used for hauling cargo. In at least one embodiment, vehicle 900 may be an airplane, robotic vehicle, or other kind of vehicle.

Autonomous vehicles may be described in terms of automation levels, defined by National Highway Traffic Safety Administration ("NHTSA"), a division of US Department of Transportation, and Society of Automotive Engineers ("SAE") "Taxonomy and Definitions for Terms Related to Driving Automation Systems for On-Road Motor Vehicles" (e.g., Standard No. J3016-201806, published on Jun. 15, 2018, Standard No. J3016-201609, published on Sep. 30, 2016, and previous and future versions of this standard). In one or more embodiments, vehicle 900 may be capable of functionality in accordance with one or more of level 1-level 5 of autonomous driving levels. In at least one embodiment, vehicle 900 may be capable of conditional automation (Level 3), high automation (Level 4), and/or full automation (Level 5), depending on embodiment.

In at least one embodiment, vehicle 900 may include, without limitation, components such as a chassis, a vehicle body, wheels (e.g., 2, 4, 6, 8, 18, etc.), tires, axles, and other components of a vehicle. In at least one embodiment, vehicle 900 may include, without limitation, a propulsion system 950, such as an internal combustion engine, hybrid electric power plant, an all-electric engine, and/or another propulsion system type. In at least one embodiment, propulsion system 950 may be connected to a drive train of vehicle 900, which may include, without limitation, a transmission, to enable propulsion of vehicle 900. In at least one embodiment, propulsion system 950 may be controlled in response to receiving signals from a throttle/accelerator(s) 952.

In at least one embodiment, a steering system 954, which may include, without limitation, a steering wheel, is used to steer a vehicle 900 (e.g., along a desired path or route) when a propulsion system 950 is operating (e.g., when vehicle is in motion). In at least one embodiment, a steering system 954 may receive signals from steering actuator(s) 956. Steering wheel may be optional for full automation (Level 5) functionality. In at least one embodiment, a brake sensor system 946 may be used to operate vehicle brakes in response to receiving signals from brake actuator(s) 948 and/or brake sensors.

In at least one embodiment, controller(s) 936, which may include, without limitation, one or more system on chips ("SoCs") (not shown in FIG. 9A) and/or graphics processing unit(s) ("GPU(s)"), provide signals (e.g., representative of commands) to one or more components and/or systems of vehicle 900. For instance, in at least one embodiment, controller(s) 936 may send signals to operate vehicle brakes via brake actuators 948, to operate steering system 954 via steering actuator(s) 956, to operate propulsion system 950 via throttle/accelerator(s) 952. Controller(s) 936 may include one or more onboard (e.g., integrated) computing devices (e.g., supercomputers) that process sensor signals, and output operation commands (e.g., signals representing commands) to enable autonomous driving and/or to assist a human driver in driving vehicle 900. In at least one embodiment, controller(s) 936 may include a first controller 936 for autonomous driving functions, a second controller 936 for functional safety functions, a third controller 936 for artificial intelligence functionality (e.g., computer vision), a fourth controller 936 for infotainment functionality, a fifth controller 936 for redundancy in emergency conditions, and/or other controllers. In at least one embodiment, a single controller 936 may handle two or more of above functionalities, two or more controllers 936 may handle a single functionality, and/or any combination thereof.

In at least one embodiment, controller(s) 936 provide signals for controlling one or more components and/or systems of vehicle 900 in response to sensor data received from one or more sensors (e.g., sensor inputs). In at least one embodiment, sensor data may be received from, for example and without limitation, global navigation satellite systems ("GNSS") sensor(s) 958 (e.g., Global Positioning System sensor(s)), RADAR sensor(s) 960, ultrasonic sensor(s) 962, LIDAR sensor(s) 964, inertial measurement unit ("IMU") sensor(s) 966 (e.g., accelerometer(s), gyroscope(s), magnetic compass(es), magnetometer(s), etc.), microphone(s) 996, stereo camera(s) 968, wide-view camera(s) 970 (e.g., fisheye cameras), infrared camera(s) 972, surround camera(s) 974 (e.g., 360 degree cameras), long-range cameras (not shown in FIG. 9A), mid-range camera(s) (not shown in FIG. 9A), speed sensor(s) 944 (e.g., for measuring speed of vehicle 900), vibration sensor(s) 942, steering sensor(s) 940, brake sensor(s) (e.g., as part of brake sensor system 946), and/or other sensor types.

In at least one embodiment, one or more of controller(s) 936 may receive inputs (e.g., represented by input data) from an instrument cluster 932 of vehicle 900 and provide outputs (e.g., represented by output data, display data, etc.) via a human-machine interface ("HMI") display 934, an audible annunciator, a loudspeaker, and/or via other components of vehicle 900. In at least one embodiment, outputs may include information such as vehicle velocity, speed, time, map data (e.g., a High Definition map (not shown in FIG. 9A), location data (e.g., vehicle's 900 location, such as on a map), direction, location of other vehicles (e.g., an occupancy grid), information about objects and status of objects as perceived by controller(s) 936, etc. For example, in at least one embodiment, HMI display 934 may display information about presence of one or more objects (e.g., a street sign, caution sign, traffic light changing, etc.), and/or information about driving maneuvers vehicle has made, is making, or will make (e.g., changing lanes now, taking exit 34B in two miles, etc.).

In at least one embodiment, vehicle 900 further includes a network interface 924 which may use wireless antenna(s) 926 and/or modem(s) to communicate over one or more networks. For example, in at least one embodiment, network interface 924 may be capable of communication over Long-Term Evolution ("LTE"), Wideband Code Division Multiple Access ("WCDMA"), Universal Mobile Telecommunications System ("UMTS"), Global System for Mobile communication ("GSM"), IMT-CDMA Multi-Carrier ("CDMA2000"), etc. In at least one embodiment, wireless antenna(s) 926 may also enable communication between objects in environment (e.g., vehicles, mobile devices, etc.), using local area network(s), such as Bluetooth, Bluetooth Low Energy ("LE"), Z-Wave, ZigBee, etc., and/or low power wide-area network(s) ("LPWANs"), such as LoRaWAN, SigFox, etc.

In at least one embodiment, vehicle 900 receives communications encoded using a parity check code. In at least one embodiment, vehicle 900 includes ireless antenna(s) 926 to receive communications. In at least one embodiment, vehicle 900 decodes encoded data by distributed compressed parts of decoding information to a plurality of processors, and combine results of such decoding.

Figure 9B:
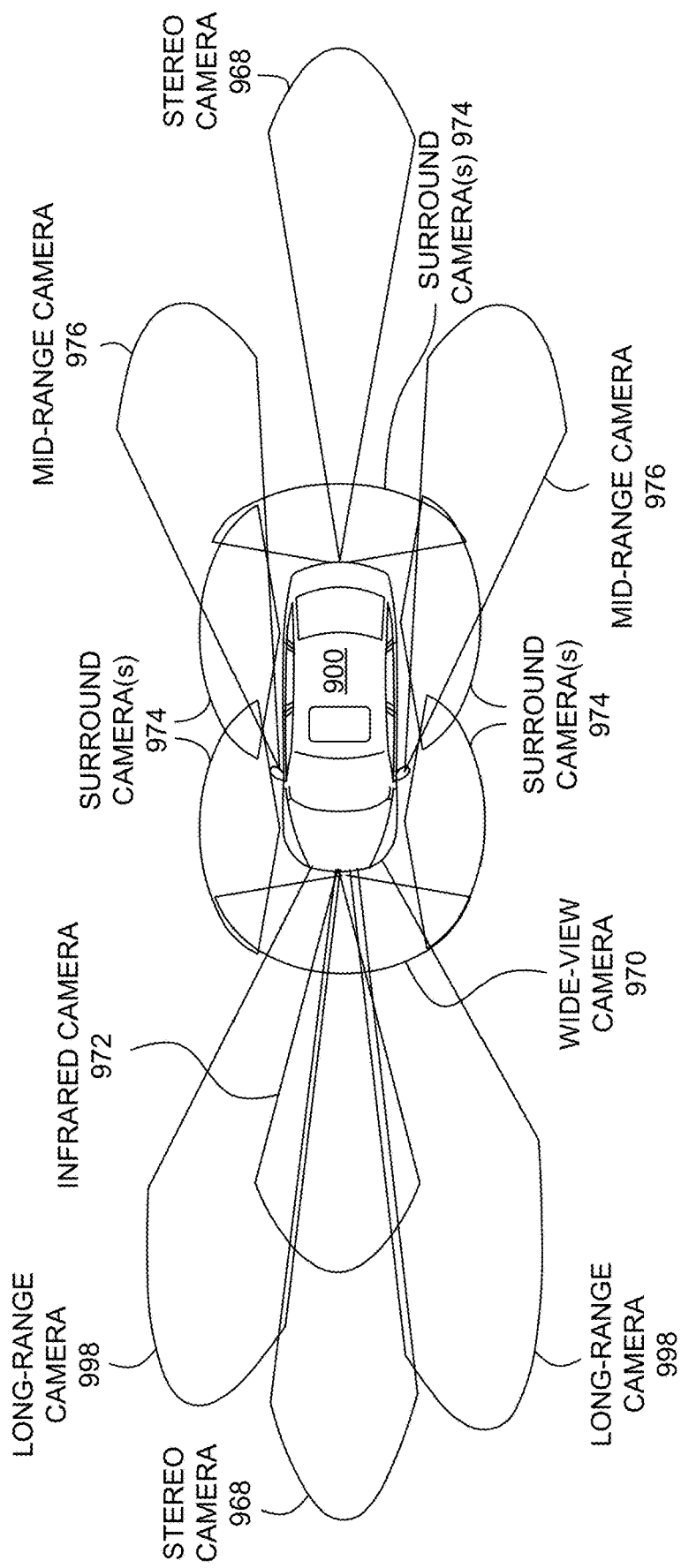
FIG. 9B illustrates an example of camera locations and fields of view for the autonomous vehicle of FIG. 9A, according to at least one embodiment.

FIG. 9B illustrates an example of camera locations and fields of view for autonomous vehicle 900 of FIG. 9A, according to at least one embodiment. In at least one embodiment, cameras and respective fields of view are one example embodiment and are not intended to be limiting. For instance, in at least one embodiment, additional and/or alternative cameras may be included and/or cameras may be located at different locations on vehicle 900.

In at least one embodiment, camera types for cameras may include, but are not limited to, digital cameras that may be adapted for use with components and/or systems of vehicle 900. Camera(s) may operate at automotive safety integrity level ("ASIL") B and/or at another ASIL. In at least one embodiment, camera types may be capable of any image capture rate, such as 60 frames per second (fps), 1220 fps, 240 fps, etc., depending on embodiment. In at least one embodiment, cameras may be capable of using rolling shutters, global shutters, another type of shutter, or a combination thereof. In at least one embodiment, color filter array may include a red clear clear clear ("RCCC") color filter array, a red clear clear blue ("RCCB") color filter array, a red blue green clear ("RBGC") color filter array, a Foveon X3 color filter array, a Bayer sensors ("RGGB") color filter array, a monochrome sensor color filter array, and/or another type of color filter array. In at least one embodiment, clear pixel cameras, such as cameras with an RCCC, an RCCB, and/or an RBGC color filter array, may be used in an effort to increase light sensitivity.

In at least one embodiment, one or more of camera(s) may be used to perform advanced driver assistance systems ("ADAS") functions (e.g., as part of a redundant or fail-safe design). For example, in at least one embodiment, a Multi-Function Mono Camera may be installed to provide functions including lane departure warning, traffic sign assist and intelligent headlamp control. In at least one embodiment, one or more of camera(s) (e.g., all of cameras) may record and provide image data (e.g., video) simultaneously.

In at least one embodiment, one or more of cameras may be mounted in a mounting assembly, such as a custom designed (three-dimensional ("3D") printed) assembly, in order to cut out stray light and reflections from within car (e.g., reflections from dashboard reflected in windshield mirrors) which may interfere with camera's image data capture abilities. With reference to wing-mirror mounting assemblies, in at least one embodiment, wing-mirror assemblies may be custom 3D printed so that camera mounting plate matches shape of wing-mirror. In at least one embodiment, camera(s) may be integrated into wing-mirror. In at least one embodiment, for side-view cameras, camera(s) may also be integrated within four pillars at each corner of car.

In at least one embodiment, cameras with a field of view that include portions of environment in front of vehicle 900 (e.g., front-facing cameras) may be used for surround view, to help identify forward facing paths and obstacles, as well as aid in, with help of one or more of controllers 936 and/or control SoCs, providing information critical to generating an occupancy grid and/or determining preferred vehicle paths. In at least one embodiment, front-facing cameras may be used to perform many of same ADAS functions as LIDAR, including, without limitation, emergency braking, pedestrian detection, and collision avoidance. In at least one embodiment, front-facing cameras may also be used for ADAS functions and systems including, without limitation, Lane Departure Warnings ("LDW"), Autonomous Cruise Control ("ACC"), and/or other functions such as traffic sign recognition.

In at least one embodiment, a variety of cameras may be used in a front-facing configuration, including, for example, a monocular camera platform that includes a CMOS ("complementary metal oxide semiconductor") color imager. In at least one embodiment, wide-view camera 970 may be used to perceive objects coming into view from periphery (e.g., pedestrians, crossing traffic or bicycles). Although only one wide-view camera 970 is illustrated in FIG. 9B, in other embodiments, there may be any number (including zero) of wide-view camera(s) 970 on vehicle 900. In at least one embodiment, any number of long-range camera(s) 998 (e.g., a long-view stereo camera pair) may be used for depth-based object detection, especially for objects for which a neural network has not yet been trained. In at least one embodiment, long-range camera(s) 998 may also be used for object detection and classification, as well as basic object tracking.

In at least one embodiment, any number of stereo camera(s) 968 may also be included in a front-facing configuration. In at least one embodiment, one or more of stereo camera(s) 968 may include an integrated control unit comprising a scalable processing unit, which may provide a programmable logic ("FPGA") and a multi-core microprocessor with an integrated Controller Area Network ("CAN") or Ethernet interface on a single chip. In at least one embodiment, such a unit may be used to generate a 3D map of environment of vehicle 900, including a distance estimate for all points in image. In at least one embodiment, one or more of stereo camera(s) 968 may include, without limitation, compact stereo vision sensor(s) that may include, without limitation, two camera lenses (one each on left and right) and an image processing chip that may measure distance from vehicle 900 to target object and use generated information (e.g., metadata) to activate autonomous emergency braking and lane departure warning functions. In at least one embodiment, other types of stereo camera(s) 968 may be used in addition to, or alternatively from, those described herein.

In at least one embodiment, cameras with a field of view that include portions of environment to side of vehicle 900 (e.g., side-view cameras) may be used for surround view, providing information used to create and update occupancy grid, as well as to generate side impact collision warnings. For example, in at least one embodiment, surround camera(s) 974 (e.g., four surround cameras 974 as illustrated in FIG. 9B) could be positioned on vehicle 900. Surround camera(s) 974 may include, without limitation, any number and combination of wide-view camera(s) 970, fisheye camera(s), 360 degree camera(s), and/or like. For instance, in at least one embodiment, four fisheye cameras may be positioned on front, rear, and sides of vehicle 900. In at least one embodiment, vehicle 900 may use three surround camera(s) 974 (e.g., left, right, and rear), and may leverage one or more other camera(s) (e.g., a forward-facing camera) as a fourth surround-view camera.

In at least one embodiment, cameras with a field of view that include portions of environment to rear of vehicle 900 (e.g., rear-view cameras) may be used for park assistance, surround view, rear collision warnings, and creating and updating occupancy grid. In at least one embodiment, a wide variety of cameras may be used including, but not limited to, cameras that are also suitable as a front-facing camera(s) (e.g., long-range cameras 998 and/or mid-range camera(s) 976, stereo camera(s) 968), infrared camera(s) 972, etc.), as described herein.

Figure 9C:
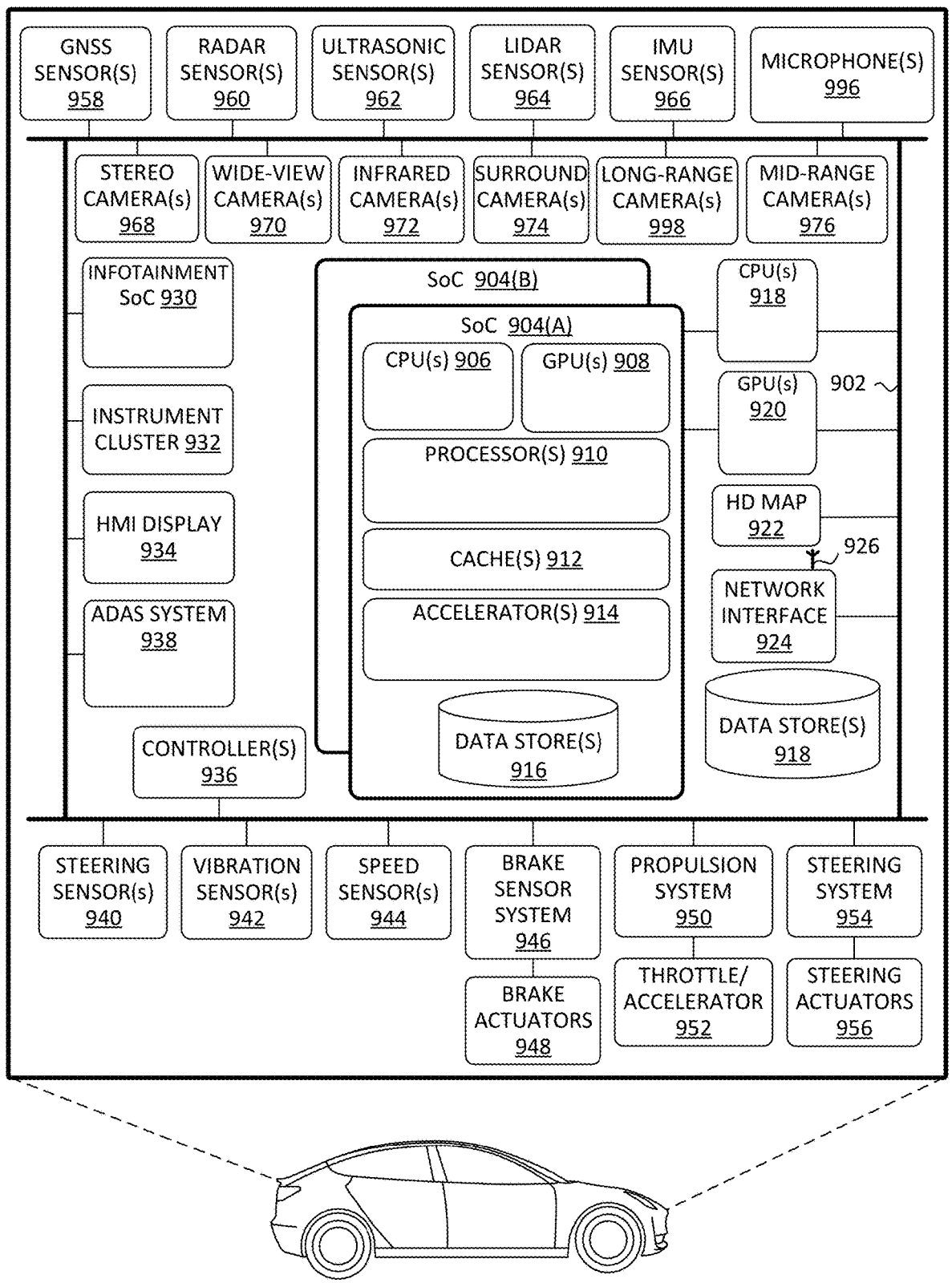
FIG. 9C is a block diagram illustrating an example system architecture for the autonomous vehicle of FIG. 9A, according to at least one embodiment.

FIG. 9C is a block diagram illustrating an example system architecture for autonomous vehicle 900 of FIG. 9A, according to at least one embodiment. In at least one embodiment, each of components, features, and systems of vehicle 900 in FIG. 9C are illustrated as being connected via a bus 902. In at least one embodiment, bus 902 may include, without limitation, a CAN data interface (alternatively referred to herein as a "CAN bus"). In at least one embodiment, a CAN may be a network inside vehicle 900 used to aid in control of various features and functionality of vehicle 900, such as actuation of brakes, acceleration, braking, steering, windshield wipers, etc. In at least one embodiment, bus 902 may be configured to have dozens or even hundreds of nodes, each with its own unique identifier (e.g., a CAN ID). In at least one embodiment, bus 902 may be read to find steering wheel angle, ground speed, engine revolutions per minute ("RPMs"), button positions, and/or other vehicle status indicators. In at least one embodiment, bus 902 may be a CAN bus that is ASIL B compliant.

In at least one embodiment, in addition to, or alternatively from CAN, FlexRay and/or Ethernet may be used. In at least one embodiment, there may be any number of busses 902, which may include, without limitation, zero or more CAN busses, zero or more FlexRay busses, zero or more Ethernet busses, and/or zero or more other types of busses using a different protocol. In at least one embodiment, two or more busses 902 may be used to perform different functions, and/or may be used for redundancy. For example, a first bus 902 may be used for collision avoidance functionality and a second bus 902 may be used for actuation control. In at least one embodiment, each bus 902 may communicate with any of components of vehicle 900, and two or more busses 902 may communicate with same components. In at least one embodiment, each of any number of system(s) on chip(s) ("SoC(s)") 904, each of controller(s) 936, and/or each computer within vehicle may have access to same input data (e.g., inputs from sensors of vehicle 900), and may be connected to a common bus, such CAN bus.

In at least one embodiment, vehicle 900 may include one or more controller(s) 936, such as those described herein with respect to FIG. 9A. Controller(s) 936 may be used for a variety of functions. In at least one embodiment, controller(s) 936 may be coupled to any of various other components and systems of vehicle 900, and may be used for control of vehicle 900, artificial intelligence of vehicle 900, infotainment for vehicle 900, and/or like.

In at least one embodiment, vehicle 900 may include any number of SoCs 904. Each of SoCs 904 may include, without limitation, central processing units ("CPU(s)") 906, graphics processing units ("GPU(s)") 908, processor(s) 910, cache(s) 912, accelerator(s) 914, data store(s) 916, and/or other components and features not illustrated. In at least one embodiment, SoC(s) 904 may be used to control vehicle 900 in a variety of platforms and systems. For example, in at least one embodiment, SoC(s) 904 may be combined in a system (e.g., system of vehicle 900) with a High Definition ("HD") map 922 which may obtain map refreshes and/or updates via network interface 924 from one or more servers (not shown in FIG. 9C).

In at least one embodiment, CPU(s) 906 may include a CPU cluster or CPU complex (alternatively referred to herein as a "CCPLEX"). In at least one embodiment, CPU(s) 906 may include multiple cores and/or level two ("L2") caches. For instance, in at least one embodiment, CPU(s) 906 may include eight cores in a coherent multi-processor configuration. In at least one embodiment, CPU(s) 906 may include four dual-core clusters where each cluster has a dedicated L2 cache (e.g., a 2 MB L2 cache). In at least one embodiment, CPU(s) 906 (e.g., CCPLEX) may be configured to support simultaneous cluster operation enabling any combination of clusters of CPU(s) 906 to be active at any given time.

In at least one embodiment, one or more of CPU(s) 906 may implement power management capabilities that include, without limitation, one or more of following features: individual hardware blocks may be clock-gated automatically when idle to save dynamic power; each core clock may be gated when core is not actively executing instructions due to execution of Wait for Interrupt ("WFI")/Wait for Event ("WFE") instructions; each core may be independently power-gated; each core cluster may be independently clock-gated when all cores are clock-gated or power-gated; and/or each core cluster may be independently power-gated when all cores are power-gated. In at least one embodiment, CPU(s) 906 may further implement an enhanced algorithm for managing power states, where allowed power states and expected wakeup times are specified, and hardware/microcode determines best power state to enter for core, cluster, and CCPLEX. In at least one embodiment, processing cores may support simplified power state entry sequences in software with work offloaded to microcode.

In at least one embodiment, GPU(s) 908 may include an integrated GPU (alternatively referred to herein as an "iGPU"). In at least one embodiment, GPU(s) 908 may be programmable and may be efficient for parallel workloads. In at least one embodiment, GPU(s) 908, in at least one embodiment, may use an enhanced tensor instruction set. In on embodiment, GPU(s) 908 may include one or more streaming microprocessors, where each streaming microprocessor may include a level one ("L1") cache (e.g., an L1 cache with at least 96 KB storage capacity), and two or more of streaming microprocessors may share an L2 cache (e.g., an L2 cache with a 512 KB storage capacity). In at least one embodiment, GPU(s) 908 may include at least eight streaming microprocessors. In at least one embodiment, GPU(s) 908 may use compute application programming interface(s) (API(s)). In at least one embodiment, GPU(s) 908 may use one or more parallel computing platforms and/or programming models (e.g., NVIDIA's CUDA).

In at least one embodiment, one or more of GPU(s) 908 may be power-optimized for best performance in automotive and embedded use cases. For example, in on embodiment, GPU(s) 908 could be fabricated on a Fin field-effect transistor ("FinFET"). In at least one embodiment, each streaming microprocessor may incorporate a number of mixed-precision processing cores partitioned into multiple blocks. For example, and without limitation, 64 PF32 cores and 32 PF64 cores could be partitioned into four processing blocks. In at least one embodiment, each processing block could be allocated 16 FP32 cores, 8 FP64 cores, 16 INT32 cores, two mixed-precision NVIDIA TENSOR COREs for deep learning matrix arithmetic, a level zero ("L0") instruction cache, a warp scheduler, a dispatch unit, and/or a 64 KB register file. In at least one embodiment, streaming microprocessors may include independent parallel integer and floating-point data paths to provide for efficient execution of workloads with a mix of computation and addressing calculations. In at least one embodiment, streaming microprocessors may include independent thread scheduling capability to enable finer-grain synchronization and cooperation between parallel threads. In at least one embodiment, streaming microprocessors may include a combined L1 data cache and shared memory unit in order to improve performance while simplifying programming.

In at least one embodiment, one or more of GPU(s) 908 may include a high bandwidth memory ("HBM) and/or a 16 GB HBM2 memory subsystem to provide, in some examples, about 900 GB/second peak memory bandwidth. In at least one embodiment, in addition to, or alternatively from, HBM memory, a synchronous graphics random-access memory ("SGRAM") may be used, such as a graphics double data rate type five synchronous random-access memory ("GDDR5").

In at least one embodiment, GPU(s) 908 may include unified memory technology. In at least one embodiment, address translation services ("ATS") support may be used to allow GPU(s) 908 to access CPU(s) 906 page tables directly. In at least one embodiment, embodiment, when GPU(s) 908 memory management unit ("MMU") experiences a miss, an address translation request may be transmitted to CPU(s) 906. In response, CPU(s) 906 may look in its page tables for virtual-to-physical mapping for address and transmits translation back to GPU(s) 908, in at least one embodiment. In at least one embodiment, unified memory technology may allow a single unified virtual address space for memory of both CPU(s) 906 and GPU(s) 908, thereby simplifying GPU(s) 908 programming and porting of applications to GPU(s) 908.

In at least one embodiment, GPU(s) 908 may include any number of access counters that may keep track of frequency of access of GPU(s) 908 to memory of other processors. In at least one embodiment, access counter(s) may help ensure that memory pages are moved to physical memory of processor that is accessing pages most frequently, thereby improving efficiency for memory ranges shared between processors.

In at least one embodiment, one or more of SoC(s) 904 may include any number of cache(s) 912, including those described herein. For example, in at least one embodiment, cache(s) 912 could include a level three ("L3") cache that is available to both CPU(s) 906 and GPU(s) 908 (e.g., that is connected both CPU(s) 906 and GPU(s) 908). In at least one embodiment, cache(s) 912 may include a write-back cache that may keep track of states of lines, such as by using a cache coherence protocol (e.g., MEI, MESI, MSI, etc.). In at least one embodiment, L3 cache may include 4 MB or more, depending on embodiment, although smaller cache sizes may be used.

In at least one embodiment, one or more of SoC(s) 904 may include one or more accelerator(s) 914 (e.g., hardware accelerators, software accelerators, or a combination thereof). In at least one embodiment, SoC(s) 904 may include a hardware acceleration cluster that may include optimized hardware accelerators and/or large on-chip memory. In at least one embodiment, large on-chip memory (e.g., 4 MB of SRAM), may enable hardware acceleration cluster to accelerate neural networks and other calculations. In at least one embodiment, hardware acceleration cluster may be used to complement GPU(s) 908 and to off-load some of tasks of GPU(s) 908 (e.g., to free up more cycles of GPU(s) 908 for performing other tasks). In at least one embodiment, accelerator(s) 914 could be used for targeted workloads (e.g., perception, convolutional neural networks ("CNNs"), recurrent neural networks ("RNNs"), etc.) that are stable enough to be amenable to acceleration. In at least one embodiment, a CNN may include a region-based or regional convolutional neural networks ("RCNNs") and Fast RCNNs (e.g., as used for object detection) or other type of CNN.

In at least one embodiment, accelerator(s) 914 (e.g., hardware acceleration cluster) may include a deep learning accelerator(s) ("DLA). DLA(s) may include, without limitation, one or more Tensor processing units ("TPUs) that may be configured to provide an additional ten trillion operations per second for deep learning applications and inferencing. In at least one embodiment, TPUs may be accelerators configured to, and optimized for, performing image processing functions (e.g., for CNNs, RCNNs, etc.). DLA(s) may further be optimized for a specific set of neural network types and floating point operations, as well as inferencing. In at least one embodiment, design of DLA(s) may provide more performance per millimeter than a typical general-purpose GPU, and typically vastly exceeds performance of a CPU. In at least one embodiment, TPU(s) may perform several functions, including a single-instance convolution function, supporting, for example, INT8, INT16, and FP16 data types for both features and weights, as well as post-processor functions. In at least one embodiment, DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones 996; a CNN for facial recognition and vehicle owner identification using data from camera sensors; and/or a CNN for security and/or safety related events.

In at least one embodiment, DLA(s) may perform any function of GPU(s) 908, and by using an inference accelerator, for example, a designer may target either DLA(s) or GPU(s) 908 for any function. For example, in at least one embodiment, designer may focus processing of CNNs and floating point operations on DLA(s) and leave other functions to GPU(s) 908 and/or other accelerator(s) 914.

In at least one embodiment, accelerator(s) 914 (e.g., hardware acceleration cluster) may include a programmable vision accelerator(s) ("PVA"), which may alternatively be referred to herein as a computer vision accelerator. In at least one embodiment, PVA(s) may be designed and configured to accelerate computer vision algorithms for advanced driver assistance system ("ADAS") 938, autonomous driving, augmented reality ("AR") applications, and/or virtual reality ("VR") applications. PVA(s) may provide a balance between performance and flexibility. For example, in at least one embodiment, each PVA(s) may include, for example and without limitation, any number of reduced instruction set computer ("RISC") cores, direct memory access ("DMA"), and/or any number of vector processors.

In at least one embodiment, RISC cores may interact with image sensors (e.g., image sensors of any of cameras described herein), image signal processor(s), and/or like. In at least one embodiment, each of RISC cores may include any amount of memory. In at least one embodiment, RISC cores may use any of a number of protocols, depending on embodiment. In at least one embodiment, RISC cores may execute a real-time operating system ("RTOS"). In at least one embodiment, RISC cores may be implemented using one or more integrated circuit devices, application specific integrated circuits ("ASICs"), and/or memory devices. For example, in at least one embodiment, RISC cores could include an instruction cache and/or a tightly coupled RAM.

In at least one embodiment, DMA may enable components of PVA(s) to access system memory independently of CPU(s) 906. In at least one embodiment, DMA may support any number of features used to provide optimization to PVA including, but not limited to, supporting multi-dimensional addressing and/or circular addressing. In at least one embodiment, DMA may support up to six or more dimensions of addressing, which may include, without limitation, block width, block height, block depth, horizontal block stepping, vertical block stepping, and/or depth stepping.

In at least one embodiment, vector processors may be programmable processors that may be designed to efficiently and flexibly execute programming for computer vision algorithms and provide signal processing capabilities. In at least one embodiment, PVA may include a PVA core and two vector processing subsystem partitions. In at least one embodiment, PVA core may include a processor subsystem, DMA engine(s) (e.g., two DMA engines), and/or other peripherals. In at least one embodiment, vector processing subsystem may operate as primary processing engine of PVA, and may include a vector processing unit ("VPU"), an instruction cache, and/or vector memory (e.g., "VMEM"). In at least one embodiment, VPU core may include a digital signal processor such as, for example, a single instruction, multiple data ("SIMD"), very long instruction word ("VLIW") digital signal processor. In at least one embodiment, a combination of SIMD and VLIW may enhance throughput and speed.

In at least one embodiment, each of vector processors may include an instruction cache and may be coupled to dedicated memory. As a result, in at least one embodiment, each of vector processors may be configured to execute independently of other vector processors. In at least one embodiment, vector processors that are included in a particular PVA may be configured to employ data parallelism. For instance, in at least one embodiment, plurality of vector processors included in a single PVA may execute same computer vision algorithm, but on different regions of an image. In at least one embodiment, vector processors included in a particular PVA may simultaneously execute different computer vision algorithms, on same image, or even execute different algorithms on sequential images or portions of an image. In at least one embodiment, among other things, any number of PVAs may be included in hardware acceleration cluster and any number of vector processors may be included in each of PVAs. In at least one embodiment, PVA(s) may include additional error correcting code ("ECC") memory, to enhance overall system safety.

In at least one embodiment, accelerator(s) 914 (e.g., hardware acceleration cluster) may include a computer vision network on-chip and static random-access memory ("SRAM"), for providing a high-bandwidth, low latency SRAM for accelerator(s) 914. In at least one embodiment, on-chip memory may include at least 4 MB SRAM, consisting of, for example and without limitation, eight field-configurable memory blocks, that may be accessible by both PVA and DLA. In at least one embodiment, each pair of memory blocks may include an advanced peripheral bus ("APB") interface, configuration circuitry, a controller, and a multiplexer. In at least one embodiment, any type of memory may be used. In at least one embodiment, PVA and DLA may access memory via a backbone that provides PVA and DLA with high-speed access to memory. In at least one embodiment, backbone may include a computer vision network on-chip that interconnects PVA and DLA to memory (e.g., using APB).

In at least one embodiment, computer vision network on-chip may include an interface that determines, before transmission of any control signal/address/data, that both PVA and DLA provide ready and valid signals. In at least one embodiment, an interface may provide for separate phases and separate channels for transmitting control signals/addresses/data, as well as burst-type communications for continuous data transfer. In at least one embodiment, an interface may comply with International Organization for Standardization ("ISO") 26262 or International Electrotechnical Commission ("IEC") 61508 standards, although other standards and protocols may be used.

In at least one embodiment, one or more of SoC(s) 904 may include a real-time ray-tracing hardware accelerator. In at least one embodiment, real-time ray-tracing hardware accelerator may be used to quickly and efficiently determine positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses.

In at least one embodiment, accelerator(s) 914 (e.g., hardware acceleration cluster) have a wide array of uses for autonomous driving. In at least one embodiment, PVA may be a programmable vision accelerator that may be used for key processing stages in ADAS and autonomous vehicles. In at least one embodiment, PVA's capabilities are a good match for algorithmic domains needing predictable processing, at low power and low latency. In other words, PVA performs well on semi-dense or dense regular computation, even on small data sets, which need predictable run-times with low latency and low power. In at least one embodiment, autonomous vehicles, such as vehicle 900, PVAs are designed to run classic computer vision algorithms, as they are efficient at object detection and operating on integer math.

For example, according to at least one embodiment of technology, PVA is used to perform computer stereo vision. In at least one embodiment, semi-global matching-based algorithm may be used in some examples, although this is not intended to be limiting. In at least one embodiment, applications for Level 3-5 autonomous driving use motion estimation/stereo matching on-the-fly (e.g., structure from motion, pedestrian recognition, lane detection, etc.). In at least one embodiment, PVA may perform computer stereo vision function on inputs from two monocular cameras.

In at least one embodiment, PVA may be used to perform dense optical flow. For example, in at least one embodiment, PVA could process raw RADAR data (e.g., using a 4D Fast Fourier Transform) to provide processed RADAR data. In at least one embodiment, PVA is used for time of flight depth processing, by processing raw time of flight data to provide processed time of flight data, for example.

In at least one embodiment, DLA may be used to run any type of network to enhance control and driving safety, including for example and without limitation, a neural network that outputs a measure of confidence for each object detection. In at least one embodiment, confidence may be represented or interpreted as a probability, or as providing a relative "weight" of each detection compared to other detections. In at least one embodiment, confidence enables a system to make further decisions regarding which detections should be considered as true positive detections rather than false positive detections. For example, in at least one embodiment, a system may set a threshold value for confidence and consider only detections exceeding threshold value as true positive detections. In an embodiment in which an automatic emergency braking ("AEB") system is used, false positive detections would cause vehicle to automatically perform emergency braking, which is obviously undesirable. In at least one embodiment, highly confident detections may be considered as triggers for AEB In at least one embodiment, DLA may run a neural network for regressing confidence value. In at least one embodiment, neural network may take as its input at least some subset of parameters, such as bounding box dimensions, ground plane estimate obtained (e.g. from another subsystem), output from IMU sensor(s) 966 that correlates with vehicle 900 orientation, distance, 3D location estimates of object obtained from neural network and/or other sensors (e.g., LIDAR sensor(s) 964 or RADAR sensor(s) 960), among others.

In at least one embodiment, one or more of SoC(s) 904 may include data store(s) 916 (e.g., memory). In at least one embodiment, data store(s) 916 may be on-chip memory of SoC(s) 904, which may store neural networks to be executed on GPU(s) 908 and/or DLA. In at least one embodiment, data store(s) 916 may be large enough in capacity to store multiple instances of neural networks for redundancy and safety. In at least one embodiment, data store(s) 912 may comprise L2 or L3 cache(s).

In at least one embodiment, one or more of SoC(s) 904 may include any number of processor(s) 910 (e.g., embedded processors). Processor(s) 910 may include a boot and power management processor that may be a dedicated processor and subsystem to handle boot power and management functions and related security enforcement. In at least one embodiment, boot and power management processor may be a part of SoC(s) 904 boot sequence and may provide runtime power management services. In at least one embodiment, boot power and management processor may provide clock and voltage programming, assistance in system low power state transitions, management of SoC(s) 904 thermals and temperature sensors, and/or management of SoC(s) 904 power states. In at least one embodiment, each temperature sensor may be implemented as a ring-oscillator whose output frequency is proportional to temperature, and SoC(s) 904 may use ring-oscillators to detect temperatures of CPU(s) 906, GPU(s) 908, and/or accelerator(s) 914. In at least one embodiment, if temperatures are determined to exceed a threshold, then boot and power management processor may enter a temperature fault routine and put SoC(s) 904 into a lower power state and/or put vehicle 900 into a chauffeur to safe stop mode (e.g., bring vehicle 900 to a safe stop).

In at least one embodiment, processor(s) 910 may further include a set of embedded processors that may serve as an audio processing engine. In at least one embodiment, audio processing engine may be an audio subsystem that enables full hardware support for multi-channel audio over multiple interfaces, and a broad and flexible range of audio I/O interfaces. In at least one embodiment, audio processing engine is a dedicated processor core with a digital signal processor with dedicated RAM.

In at least one embodiment, processor(s) 910 may further include an always on processor engine that may provide necessary hardware features to support low power sensor management and wake use cases. In at least one embodiment, always on processor engine may include, without limitation, a processor core, a tightly coupled RAM, supporting peripherals (e.g., timers and interrupt controllers), various I/O controller peripherals, and routing logic.

In at least one embodiment, processor(s) 910 may further include a safety cluster engine that includes, without limitation, a dedicated processor subsystem to handle safety management for automotive applications. In at least one embodiment, safety cluster engine may include, without limitation, two or more processor cores, a tightly coupled RAM, support peripherals (e.g., timers, an interrupt controller, etc.), and/or routing logic. In a safety mode, two or more cores may operate, in at least one embodiment, in a lockstep mode and function as a single core with comparison logic to detect any differences between their operations. In at least one embodiment, processor(s) 910 may further include a real-time camera engine that may include, without limitation, a dedicated processor subsystem for handling real-time camera management. In at least one embodiment, processor(s) 910 may further include a high-dynamic range signal processor that may include, without limitation, an image signal processor that is a hardware engine that is part of camera processing pipeline.

In at least one embodiment, processor(s) 910 may include a video image compositor that may be a processing block (e.g., implemented on a microprocessor) that implements video post-processing functions needed by a video playback application to produce final image for player window. In at least one embodiment, video image compositor may perform lens distortion correction on wide-view camera(s) 970, surround camera(s) 974, and/or on in-cabin monitoring camera sensor(s). In at least one embodiment, in-cabin monitoring camera sensor(s) are preferably monitored by a neural network running on another instance of SoC 904, configured to identify in cabin events and respond accordingly. In at least one embodiment, an in-cabin system may perform, without limitation, lip reading to activate cellular service and place a phone call, dictate emails, change vehicle's destination, activate or change vehicle's infotainment system and settings, or provide voice-activated web surfing. In at least one embodiment, certain functions are available to driver when vehicle is operating in an autonomous mode and are disabled otherwise.

In at least one embodiment, video image compositor may include enhanced temporal noise reduction for both spatial and temporal noise reduction. For example, in at least one embodiment, where motion occurs in a video, noise reduction weights spatial information appropriately, decreasing weight of information provided by adjacent frames. In at least one embodiment, where an image or portion of an image does not include motion, temporal noise reduction performed by video image compositor may use information from previous image to reduce noise in current image.

In at least one embodiment, video image compositor may also be configured to perform stereo rectification on input stereo lens frames. In at least one embodiment, video image compositor may further be used for user interface composition when operating system desktop is in use, and GPU(s) 908 are not required to continuously render new surfaces. In at least one embodiment, when GPU(s) 908 are powered on and active doing 3D rendering, video image compositor may be used to offload GPU(s) 908 to improve performance and responsiveness.

In at least one embodiment, one or more of SoC(s) 904 may further include a mobile industry processor interface ("MIPI") camera serial interface for receiving video and input from cameras, a high-speed interface, and/or a video input block that may be used for camera and related pixel input functions. In at least one embodiment, one or more of SoC(s) 904 may further include an input/output controller(s) that may be controlled by software and may be used for receiving I/O signals that are uncommitted to a specific role.

In at least one embodiment, one or more of SoC(s) 904 may further include a broad range of peripheral interfaces to enable communication with peripherals, audio encoders/decoders ("codecs"), power management, and/or other devices. SoC(s) 904 may be used to process data from cameras (e.g., connected over Gigabit Multimedia Serial Link and Ethernet), sensors (e.g., LIDAR sensor(s) 964, RADAR sensor(s) 960, etc. that may be connected over Ethernet), data from bus 902 (e.g., speed of vehicle 900, steering wheel position, etc.), data from GNSS sensor(s) 958 (e.g., connected over Ethernet or CAN bus), etc. In at least one embodiment, one or more of SoC(s) 904 may further include dedicated high-performance mass storage controllers that may include their own DMA engines, and that may be used to free CPU(s) 906 from routine data management tasks.

In at least one embodiment, SoC(s) 904 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. In at least one embodiment, SoC(s) 904 may be faster, more reliable, and even more energy-efficient and space-efficient than conventional systems. For example, in at least one embodiment, accelerator(s) 914, when combined with CPU(s) 906, GPU(s) 908, and data store(s) 916, may provide for a fast, efficient platform for level 3-5 autonomous vehicles.

In at least one embodiment, computer vision algorithms may be executed on CPUs, which may be configured using high-level programming language, such as C programming language, to execute a wide variety of processing algorithms across a wide variety of visual data. However, in at least one embodiment, CPUs are oftentimes unable to meet performance requirements of many computer vision applications, such as those related to execution time and power consumption, for example. In at least one embodiment, many CPUs are unable to execute complex object detection algorithms in real-time, which is used in in-vehicle ADAS applications and in practical Level 3-5 autonomous vehicles.

Embodiments described herein allow for multiple neural networks to be performed simultaneously and/or sequentially, and for results to be combined together to enable Level 3-5 autonomous driving functionality. For example, in at least one embodiment, a CNN executing on DLA or discrete GPU (e.g., GPU(s) 920) may include text and word recognition, allowing supercomputer to read and understand traffic signs, including signs for which neural network has not been specifically trained. In at least one embodiment, DLA may further include a neural network that is able to identify, interpret, and provide semantic understanding of sign, and to pass that semantic understanding to path planning modules running on CPU Complex.

In at least one embodiment, multiple neural networks may be run simultaneously, as for Level 3, 4, or 5 driving. For example, in at least one embodiment, a warning sign consisting of "Caution: flashing lights indicate icy conditions," along with an electric light, may be independently or collectively interpreted by several neural networks. In at least one embodiment, sign itself may be identified as a traffic sign by a first deployed neural network (e.g., a neural network that has been trained), text "flashing lights indicate icy conditions" may be interpreted by a second deployed neural network, which informs vehicle's path planning software (preferably executing on CPU Complex) that when flashing lights are detected, icy conditions exist. In at least one embodiment, flashing light may be identified by operating a third deployed neural network over multiple frames, informing vehicle's path-planning software of presence (or absence) of flashing lights. In at least one embodiment, all three neural networks may run simultaneously, such as within DLA and/or on GPU(s) 908.

In at least one embodiment, a CNN for facial recognition and vehicle owner identification may use data from camera sensors to identify presence of an authorized driver and/or owner of vehicle 900. In at least one embodiment, an always on sensor processing engine may be used to unlock vehicle when owner approaches driver door and turn on lights, and, in security mode, to disable vehicle when owner leaves vehicle. In this way, SoC(s) 904 provide for security against theft and/or carjacking.

In at least one embodiment, a CNN for emergency vehicle detection and identification may use data from microphones 996 to detect and identify emergency vehicle sirens. In at least one embodiment, SoC(s) 904 use CNN for classifying environmental and urban sounds, as well as classifying visual data. In at least one embodiment, CNN running on DLA is trained to identify relative closing speed of emergency vehicle (e.g., by using Doppler effect). In at least one embodiment, CNN may also be trained to identify emergency vehicles specific to local area in which vehicle is operating, as identified by GNSS sensor(s) 958. In at least one embodiment, when operating in Europe, CNN will seek to detect European sirens, and when in United States CNN will seek to identify only North American sirens. In at least one embodiment, once an emergency vehicle is detected, a control program may be used to execute an emergency vehicle safety routine, slowing vehicle, pulling over to side of road, parking vehicle, and/or idling vehicle, with assistance of ultrasonic sensor(s) 962, until emergency vehicle(s) passes.

In at least one embodiment, vehicle 900 may include CPU(s) 918 (e.g., discrete CPU(s), or dCPU(s)), that may be coupled to SoC(s) 904 via a high-speed interconnect (e.g., PCIe). In at least one embodiment, CPU(s) 918 may include an X86 processor, for example. CPU(s) 918 may be used to perform any of a variety of functions, including arbitrating potentially inconsistent results between ADAS sensors and SoC(s) 904, and/or monitoring status and health of controller(s) 936 and/or an infotainment system on a chip ("infotainment SoC") 930, for example.

In at least one embodiment, vehicle 900 may include GPU(s) 920 (e.g., discrete GPU(s), or dGPU(s)), that may be coupled to SoC(s) 904 via a high-speed interconnect (e.g., NVIDIA's NVLINK). In at least one embodiment, GPU(s) 920 may provide additional artificial intelligence functionality, such as by executing redundant and/or different neural networks, and may be used to train and/or update neural networks based at least in part on input (e.g., sensor data) from sensors of vehicle 900.

In at least one embodiment, vehicle 900 may further include network interface 924 which may include, without limitation, wireless antenna(s) 926 (e.g., one or more wireless antennas 926 for different communication protocols, such as a cellular antenna, a Bluetooth antenna, etc.). In at least one embodiment, network interface 924 may be used to enable wireless connectivity over Internet with cloud (e.g., with server(s) and/or other network devices), with other vehicles, and/or with computing devices (e.g., client devices of passengers). In at least one embodiment, to communicate with other vehicles, a direct link may be established between vehicle 90 and other vehicle and/or an indirect link may be established (e.g., across networks and over Internet). In at least one embodiment, direct links may be provided using a vehicle-to-vehicle communication link. Vehicle-to-vehicle communication link may provide vehicle 900 information about vehicles in proximity to vehicle 900 (e.g., vehicles in front of, on side of, and/or behind vehicle 900). In at least one embodiment, aforementioned functionality may be part of a cooperative adaptive cruise control functionality of vehicle 900.

In at least one embodiment, network interface 924 may include an SoC that provides modulation and demodulation functionality and enables controller(s) 936 to communicate over wireless networks. In at least one embodiment, network interface 924 may include a radio frequency front-end for up-conversion from baseband to radio frequency, and down conversion from radio frequency to baseband. In at least one embodiment, frequency conversions may be performed in any technically feasible fashion. For example, frequency conversions could be performed through well-known processes, and/or using super-heterodyne processes. In at least one embodiment, radio frequency front end functionality may be provided by a separate chip. In at least one embodiment, network interface may include wireless functionality for communicating over LTE, WCDMA, UMTS, GSM, CDMA2000, Bluetooth, Bluetooth LE, Wi-Fi, Z-Wave, Zig-Bee, LoRaWAN, and/or other wireless protocols.

In at least one embodiment, vehicle 900 may further include data store(s) 928 which may include, without limitation, off-chip (e.g., off SoC(s) 904) storage. In at least one embodiment, data store(s) 928 may include, without limitation, one or more storage elements including RAM, SRAM, dynamic random-access memory ("DRAM"), video random-access memory ("VRAM"), Flash, hard disks, and/or other components and/or devices that may store at least one bit of data.

In at least one embodiment, vehicle 900 may further include GNSS sensor(s) 958 (e.g., GPS and/or assisted GPS sensors), to assist in mapping, perception, occupancy grid generation, and/or path planning functions. In at least one embodiment, any number of GNSS sensor(s) 958 may be used, including, for example and without limitation, a GPS using a USB connector with an Ethernet to Serial (e.g., RS-232) bridge.

In at least one embodiment, vehicle 900 may further include RADAR sensor(s) 960. RADAR sensor(s) 960 may be used by vehicle 900 for long-range vehicle detection, even in darkness and/or severe weather conditions. In at least one embodiment, RADAR functional safety levels may be ASIL B. RADAR sensor(s) 960 may use CAN and/or bus 902 (e.g., to transmit data generated by RADAR sensor(s) 960) for control and to access object tracking data, with access to Ethernet to access raw data in some examples. In at least one embodiment, wide variety of RADAR sensor types may be used. For example, and without limitation, RADAR sensor(s) 960 may be suitable for front, rear, and side RADAR use. In at least one embodiment, one or more of RADAR sensors(s) 960 are Pulse Doppler RADAR sensor(s).

In at least one embodiment, RADAR sensor(s) 960 may include different configurations, such as long-range with narrow field of view, short-range with wide field of view, short-range side coverage, etc. In at least one embodiment, long-range RADAR may be used for adaptive cruise control functionality. In at least one embodiment, long-range RADAR systems may provide a broad field of view realized by two or more independent scans, such as within a 250 m range. In at least one embodiment, RADAR sensor(s) 960 may help in distinguishing between static and moving objects, and may be used by ADAS system 938 for emergency brake assist and forward collision warning. Sensors 960(*s*) included in a long-range RADAR system may include, without limitation, monostatic multimodal RADAR with multiple (e.g., six or more) fixed RADAR antennae and a high-speed CAN and FlexRay interface. In at least one embodiment, with six antennae, central four antennae may create a focused beam pattern, designed to record vehicle's 900 surroundings at higher speeds with minimal interference from traffic in adjacent lanes. In at least one embodiment, other two antennae may expand field of view, making it possible to quickly detect vehicles entering or leaving vehicle's 900 lane.

In at least one embodiment, mid-range RADAR systems may include, as an example, a range of up to 160 m (front) or 80 m (rear), and a field of view of up to 42 degrees (front) or 150 degrees (rear). In at least one embodiment, short-range RADAR systems may include, without limitation, any number of RADAR sensor(s) 960 designed to be installed at both ends of rear bumper. When installed at both ends of rear bumper, in at least one embodiment, a RADAR sensor system may create two beams that constantly monitor blind spot in rear and next to vehicle. In at least one embodiment, short-range RADAR systems may be used in ADAS system 938 for blind spot detection and/or lane change assist.

In at least one embodiment, vehicle 900 may further include ultrasonic sensor(s) 962. Ultrasonic sensor(s) 962, which may be positioned at front, back, and/or sides of vehicle 900, may be used for park assist and/or to create and update an occupancy grid. In at least one embodiment, a wide variety of ultrasonic sensor(s) 962 may be used, and different ultrasonic sensor(s) 962 may be used for different ranges of detection (e.g., 2.5 m, 4 m). In at least one embodiment, ultrasonic sensor(s) 962 may operate at functional safety levels of ASIL B.

In at least one embodiment, vehicle 900 may include LIDAR sensor(s) 964. LIDAR sensor(s) 964 may be used for object and pedestrian detection, emergency braking, collision avoidance, and/or other functions. In at least one embodiment, LIDAR sensor(s) 964 may be functional safety level ASIL B. In at least one embodiment, vehicle 900 may include multiple LIDAR sensors 964 (e.g., two, four, six, etc.) that may use Ethernet (e.g., to provide data to a Gigabit Ethernet switch).

In at least one embodiment, LIDAR sensor(s) 964 may be capable of providing a list of objects and their distances for a 360-degree field of view. In at least one embodiment, commercially available LIDAR sensor(s) 964 may have an advertised range of approximately 100 m, with an accuracy of 2 cm-3 cm, and with support for a 100 Mbps Ethernet connection, for example. In at least one embodiment, one or more non-protruding LIDAR sensors 964 may be used. In such an embodiment, LIDAR sensor(s) 964 may be implemented as a small device that may be embedded into front, rear, sides, and/or corners of vehicle 900. In at least one embodiment, LIDAR sensor(s) 964, in such an embodiment, may provide up to a 120-degree horizontal and 35-degree vertical field-of-view, with a 200 m range even for low-reflectivity objects. In at least one embodiment, front-mounted LIDAR sensor(s) 964 may be configured for a horizontal field of view between 45 degrees and 135 degrees.

In at least one embodiment, LIDAR technologies, such as 3D flash LIDAR, may also be used. 3D Flash LIDAR uses a flash of a laser as a transmission source, to illuminate surroundings of vehicle 900 up to approximately 200 m. In at least one embodiment, a flash LIDAR unit includes, without limitation, a receptor, which records laser pulse transit time and reflected light on each pixel, which in turn corresponds to range from vehicle 900 to objects. In at least one embodiment, flash LIDAR may allow for highly accurate and distortion-free images of surroundings to be generated with every laser flash. In at least one embodiment, four flash LIDAR sensors may be deployed, one at each side of vehicle 900. In at least one embodiment, 3D flash LIDAR systems include, without limitation, a solid-state 3D staring array LIDAR camera with no moving parts other than a fan (e.g., a non-scanning LIDAR device). In at least one embodiment, flash LIDAR device may use a 5 nanosecond class I (eye-safe) laser pulse per frame and may capture reflected laser light in form of 3D range point clouds and co-registered intensity data.

In at least one embodiment, vehicle may further include IMU sensor(s) 966. In at least one embodiment, IMU sensor(s) 966 may be located at a center of rear axle of vehicle 900, in at least one embodiment. In at least one embodiment, IMU sensor(s) 966 may include, for example and without limitation, accelerometer(s), magnetometer(s), gyroscope(s), magnetic compass(es), and/or other sensor types. In at least one embodiment, such as in six-axis applications, IMU sensor(s) 966 may include, without limitation, accelerometers and gyroscopes. In at least one embodiment, such as in nine-axis applications, IMU sensor (s) 966 may include, without limitation, accelerometers, gyroscopes, and magnetometers.

In at least one embodiment, IMU sensor(s) 966 may be implemented as a miniature, high performance GPS-Aided Inertial Navigation System ("GPS/INS") that combines micro-electro-mechanical systems ("MEMS") inertial sensors, a high-sensitivity GPS receiver, and advanced Kalman filtering algorithms to provide estimates of position, velocity, and attitude. In at least one embodiment, IMU sensor(s) 966 may enable vehicle 900 to estimate heading without requiring input from a magnetic sensor by directly observing and correlating changes in velocity from GPS to IMU sensor(s) 966. In at least one embodiment, IMU sensor(s) 966 and GNSS sensor(s) 958 may be combined in a single integrated unit.

In at least one embodiment, vehicle 900 may include microphone(s) 996 placed in and/or around vehicle 900. In at least one embodiment, microphone(s) 996 may be used for emergency vehicle detection and identification, among other things.

In at least one embodiment, vehicle 900 may further include any number of camera types, including stereo camera(s) 968, wide-view camera(s) 970, infrared camera(s) 972, surround camera(s) 974, long-range camera(s) 998, mid-range camera(s) 976, and/or other camera types. In at least one embodiment, cameras may be used to capture image data around an entire periphery of vehicle 900. In at least one embodiment, types of cameras used depends vehicle 900. In at least one embodiment, any combination of camera types may be used to provide necessary coverage around vehicle 900. In at least one embodiment, number of cameras may differ depending on embodiment. For example, in at least one embodiment, vehicle 900 could include six cameras, seven cameras, ten cameras, twelve cameras, or another number of cameras. Cameras may support, as an example and without limitation, Gigabit Multimedia Serial Link ("GMSL") and/or Gigabit Ethernet. In at least one embodiment, each of camera(s) is described with more detail previously herein with respect to FIG. 9A and FIG. 9B.

In at least one embodiment, vehicle 900 may further include vibration sensor(s) 942. Vibration sensor(s) 942 may measure vibrations of components of vehicle 900, such as axle(s). For example, in at least one embodiment, changes in vibrations may indicate a change in road surfaces. In at least one embodiment, when two or more vibration sensors 942 are used, differences between vibrations may be used to determine friction or slippage of road surface (e.g., when difference in vibration is between a power-driven axle and a freely rotating axle).

In at least one embodiment, vehicle 900 may include ADAS system 938. ADAS system 938 may include, without limitation, an SoC, in some examples. In at least one embodiment, ADAS system 938 may include, without limitation, any number and combination of an autonomous/ adaptive/automatic cruise control ("ACC") system, a cooperative adaptive cruise control ("CACC") system, a forward crash warning ("FCW") system, an automatic emergency braking ("AEB") system, a lane departure warning ("LDW)" system, a lane keep assist ("LKA") system, a blind spot warning ("BSW") system, a rear cross-traffic warning ("RCTW") system, a collision warning ("CW") system, a lane centering ("LC") system, and/or other systems, features, and/or functionality.

In at least one embodiment, ACC system may use RADAR sensor(s) 960, LIDAR sensor(s) 964, and/or any number of camera(s). In at least one embodiment, ACC system may include a longitudinal ACC system and/or a lateral ACC system. In at least one embodiment, longitudinal ACC system monitors and controls distance to vehicle immediately ahead of vehicle 900 and automatically adjust speed of vehicle 900 to maintain a safe distance from vehicles ahead. In at least one embodiment, lateral ACC system performs distance keeping, and advises vehicle 900 to change lanes when necessary. In at least one embodiment, lateral ACC is related to other ADAS applications such as LC and CW.

In at least one embodiment, CACC system uses information from other vehicles that may be received via network interface 924 and/or wireless antenna(s) 926 from other vehicles via a wireless link, or indirectly, over a network connection (e.g., over Internet). In at least one embodiment, direct links may be provided by a vehicle-to-vehicle ("V2V") communication link, while indirect links may be provided by an infrastructure-to-vehicle ("I2V") communication link. In general, V2V communication concept provides information about immediately preceding vehicles (e.g., vehicles immediately ahead of and in same lane as vehicle 900), while I2V communication concept provides information about traffic further ahead. In at least one embodiment, CACC system may include either or both I2V and V2V information sources. In at least one embodiment, given information of vehicles ahead of vehicle 900, CACC system may be more reliable and it has potential to improve traffic flow smoothness and reduce congestion on road.

In at least one embodiment, FCW system is designed to alert driver to a hazard, so that driver may take corrective action. In at least one embodiment, FCW system uses a front-facing camera and/or RADAR sensor(s) 960, coupled to a dedicated processor, DSP, FPGA, and/or ASIC, that is electrically coupled to driver feedback, such as a display, speaker, and/or vibrating component. In at least one embodiment, FCW system may provide a warning, such as in form of a sound, visual warning, vibration and/or a quick brake pulse.

In at least one embodiment, AEB system detects an impending forward collision with another vehicle or other object, and may automatically apply brakes if driver does not take corrective action within a specified time or distance parameter. In at least one embodiment, AEB system may use front-facing camera(s) and/or RADAR sensor(s) 960, coupled to a dedicated processor, DSP, FPGA, and/or ASIC. In at least one embodiment, when AEB system detects a hazard, AEB system typically first alerts driver to take corrective action to avoid collision and, if driver does not take corrective action, AEB system may automatically apply brakes in an effort to prevent, or at least mitigate, impact of predicted collision. In at least one embodiment, AEB system, may include techniques such as dynamic brake support and/or crash imminent braking.

In at least one embodiment, LDW system provides visual, audible, and/or tactile warnings, such as steering wheel or seat vibrations, to alert driver when vehicle 900 crosses lane markings. In at least one embodiment, LDW system does not activate when driver indicates an intentional lane departure, by activating a turn signal. In at least one embodiment, LDW system may use front-side facing cameras, coupled to a dedicated processor, DSP, FPGA, and/or ASIC, that is electrically coupled to driver feedback, such as a display, speaker, and/or vibrating component. In at least one embodiment, LKA system is a variation of LDW system. LKA system provides steering input or braking to correct vehicle 900 if vehicle 900 starts to exit lane.

In at least one embodiment, BSW system detects and warns driver of vehicles in an automobile's blind spot. In at least one embodiment, BSW system may provide a visual, audible, and/or tactile alert to indicate that merging or changing lanes is unsafe. In at least one embodiment, BSW system may provide an additional warning when driver uses a turn signal. In at least one embodiment, BSW system may use rear-side facing camera(s) and/or RADAR sensor(s) 960, coupled to a dedicated processor, DSP, FPGA, and/or ASIC, that is electrically coupled to driver feedback, such as a display, speaker, and/or vibrating component.

In at least one embodiment, RCTW system may provide visual, audible, and/or tactile notification when an object is detected outside rear-camera range when vehicle 900 is backing up. In at least one embodiment, RCTW system includes AEB system to ensure that vehicle brakes are applied to avoid a crash. In at least one embodiment, RCTW system may use one or more rear-facing RADAR sensor(s) 960, coupled to a dedicated processor, DSP, FPGA, and/or ASIC, that is electrically coupled to driver feedback, such as a display, speaker, and/or vibrating component.

In at least one embodiment, conventional ADAS systems may be prone to false positive results which may be annoying and distracting to a driver, but typically are not catastrophic, because conventional ADAS systems alert driver and allow driver to decide whether a safety condition truly exists and act accordingly. In at least one embodiment, vehicle 900 itself decides, in case of conflicting results, whether to heed result from a primary computer or a secondary computer (e.g., first controller 936 or second controller 936). For example, in at least one embodiment, ADAS system 938 may be a backup and/or secondary computer for providing perception information to a backup computer rationality module. In at least one embodiment, backup computer rationality monitor may run a redundant diverse software on hardware components to detect faults in perception and dynamic driving tasks. In at least one embodiment, outputs from ADAS system 938 may be provided to a supervisory MCU. In at least one embodiment, if outputs from primary computer and secondary computer conflict, supervisory MCU determines how to reconcile conflict to ensure safe operation.

In at least one embodiment, primary computer may be configured to provide supervisory MCU with a confidence score, indicating primary computer's confidence in chosen result. In at least one embodiment, if confidence score exceeds a threshold, supervisory MCU may follow primary computer's direction, regardless of whether secondary computer provides a conflicting or inconsistent result. In at least one embodiment, where confidence score does not meet threshold, and where primary and secondary computer indicate different results (e.g., a conflict), supervisory MCU may arbitrate between computers to determine appropriate outcome.

In at least one embodiment, supervisory MCU may be configured to run a neural network(s) that is trained and configured to determine, based at least in part on outputs from primary computer and secondary computer, conditions under which secondary computer provides false alarms. In at least one embodiment, neural network(s) in supervisory MCU may learn when secondary computer's output may be trusted, and when it cannot. For example, in at least one embodiment, when secondary computer is a RADAR-based FCW system, a neural network(s) in supervisory MCU may learn when FCW system is identifying metallic objects that are not, in fact, hazards, such as a drainage grate or manhole cover that triggers an alarm. In at least one embodiment, when secondary computer is a camera-based LDW system, a neural network in supervisory MCU may learn to override LDW when bicyclists or pedestrians are present and a lane departure is, in fact, safest maneuver. In at least one embodiment, supervisory MCU may include at least one of a DLA or GPU suitable for running neural network(s) with associated memory. In at least one embodiment, supervisory MCU may comprise and/or be included as a component of SoC(s) 904.

In at least one embodiment, ADAS system 938 may include a secondary computer that performs ADAS functionality using traditional rules of computer vision. In at least one embodiment, secondary computer may use classic computer vision rules (if-then), and presence of a neural network(s) in supervisory MCU may improve reliability, safety and performance. For example, in at least one embodiment, diverse implementation and intentional non-identity makes overall system more fault-tolerant, especially to faults caused by software (or software-hardware interface) functionality. For example, in at least one embodiment, if there is a software bug or error in software running on primary computer, and non-identical software code running on secondary computer provides same overall result, then supervisory MCU may have greater confidence that overall result is correct, and bug in software or hardware on primary computer is not causing material error.

In at least one embodiment, output of ADAS system 938 may be fed into primary computer's perception block and/or primary computer's dynamic driving task block. For example, in at least one embodiment, if ADAS system 938 indicates a forward crash warning due to an object immediately ahead, perception block may use this information when identifying objects. In at least one embodiment, secondary computer may have its own neural network which is trained and thus reduces risk of false positives, as described herein.

In at least one embodiment, vehicle 900 may further include infotainment SoC 930 (e.g., an in-vehicle infotainment system (IVI)). Although illustrated and described as an SoC, infotainment system 930, in at least one embodiment, may not be an SoC, and may include, without limitation, two or more discrete components. In at least one embodiment, infotainment SoC 930 may include, without limitation, a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, WiFi, etc.), and/or information services (e.g., navigation systems, rear-parking assistance, a radio data system, vehicle related information such as fuel level, total distance covered, brake fuel level, oil level, door open/close, air filter information, etc.) to vehicle 900. For example, infotainment SoC 930 could include radios, disk players, navigation systems, video players, USB and Bluetooth connectivity, carputers, in-car entertainment, WiFi, steering wheel audio controls, hands free voice control, a heads-up display ("HUD"), HMI display 934, a telematics device, a control panel (e.g., for controlling and/or interacting with various components, features, and/or systems), and/or other components. In at least one embodiment, infotainment SoC 930 may further be used to provide information (e.g., visual and/or audible) to user(s) of vehicle, such as information from ADAS system 938, autonomous driving information such as planned vehicle maneuvers, trajectories, surrounding environment information (e.g., intersection information, vehicle information, road information, etc.), and/or other information.

In at least one embodiment, infotainment SoC 930 may include any amount and type of GPU functionality. In at least one embodiment, infotainment SoC 930 may communicate over bus 902 (e.g., CAN bus, Ethernet, etc.) with other devices, systems, and/or components of vehicle 900. In at least one embodiment, infotainment SoC 930 may be coupled to a supervisory MCU such that GPU of infotainment system may perform some self-driving functions in event that primary controller(s) 936 (e.g., primary and/or backup computers of vehicle 900) fail. In at least one embodiment, infotainment SoC 930 may put vehicle 900 into a chauffeur to safe stop mode, as described herein.

In at least one embodiment, vehicle 900 may further include instrument cluster 932 (e.g., a digital dash, an electronic instrument cluster, a digital instrument panel, etc.). Instrument cluster 932 may include, without limitation, a controller and/or supercomputer (e.g., a discrete controller or supercomputer). In at least one embodiment, instrument cluster 932 may include, without limitation, any number and combination of a set of instrumentation such as a speedometer, fuel level, oil pressure, tachometer, odometer, turn indicators, gearshift position indicator, seat belt warning light(s), parking-brake warning light(s), engine-malfunction light(s), supplemental restraint system (e.g., airbag) information, lighting controls, safety system controls, navigation information, etc. In some examples, information may be displayed and/or shared among infotainment SoC 930 and instrument cluster 932. In at least one embodiment, instrument cluster 932 may be included as part of infotainment SoC 930, or vice versa.

In at least one embodiment, vehicle 900 decodes encoded data using one or more of CPU(s) 918 and GPU(s) 920.

In at least one embodiment, one or more of CPU(s) 918 decode encoded data by distributed compressed parts of decoding information to a plurality of processors, and combine results of such decoding.

In at least one embodiment, one or more of GPU(s) 920 decode encoded data by distributed compressed parts of decoding information to a plurality of processors, and combine results of such decoding.

In at least one embodiment, pipeline manager 1932 distributes processing tasks to SIMT parallel processors, such that each of a plurality of processors receives and uses compressed parts of decoding information to partially decode an encoded message. In at least one embodiment, further processing tasks are distributed to completing decoding, based on results of partial decoding.

Figure 9D:
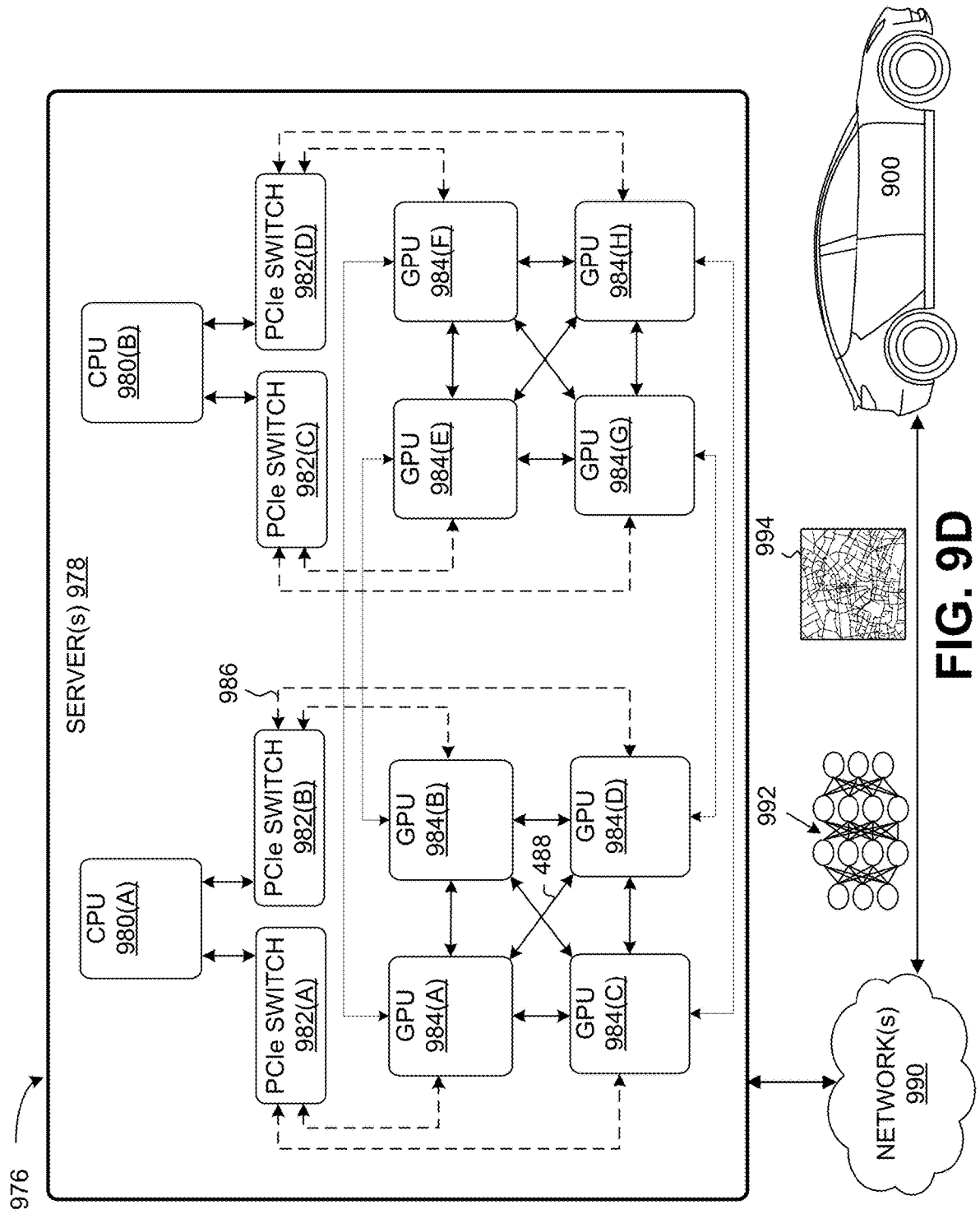
FIG. 9D is a diagram illustrating a system for communication between cloud-based server(s) and the autonomous vehicle of FIG. 9A, according to at least one embodiment.

FIG. 9D is a diagram of a system 976 for communication between cloud-based server(s) and autonomous vehicle 900 of FIG. 9A, according to at least one embodiment. In at least one embodiment, system 976 may include, without limitation, server(s) 978, network(s) 990, and any number and type of vehicles, including vehicle 900. server(s) 978 may include, without limitation, a plurality of GPUs 984(A)-984(H) (collectively referred to herein as GPUs 984), PCIe switches 982(A)-982(H) (collectively referred to herein as PCIe switches 982), and/or CPUs 980(A)-980(B) (collectively referred to herein as CPUs 980). GPUs 984, CPUs 980, and PCIe switches 982 may be interconnected with high-speed interconnects such as, for example and without limitation, NVLink interfaces 988 developed by NVIDIA and/or PCIe connections 986. In at least one embodiment, GPUs 984 are connected via an NVLink and/or NVSwitch SoC and GPUs 984 and PCIe switches 982 are connected via PCIe interconnects. In at least one embodiment, although eight GPUs 984, two CPUs 980, and four PCIe switches 982 are illustrated, this is not intended to be limiting. In at least one embodiment, each of server(s) 978 may include, without limitation, any number of GPUs 984, CPUs 980, and/or PCIe switches 982, in any combination. For example, in at least one embodiment, server(s) 978 could each include eight, sixteen, thirty-two, and/or more GPUs 984.

In at least one embodiment, server(s) 978 may receive, over network(s) 990 and from vehicles, image data representative of images showing unexpected or changed road conditions, such as recently commenced road-work. In at least one embodiment, server(s) 978 may transmit, over network(s) 990 and to vehicles, neural networks 992, updated neural networks 992, and/or map information 994, including, without limitation, information regarding traffic and road conditions. In at least one embodiment, updates to map information 994 may include, without limitation, updates for HD map 922, such as information regarding construction sites, potholes, detours, flooding, and/or other obstructions. In at least one embodiment, neural networks 992, updated neural networks 992, and/or map information 994 may have resulted from new training and/or experiences represented in data received from any number of vehicles in environment, and/or based at least in part on training performed at a data center (e.g., using server(s) 978 and/or other servers).

In at least one embodiment, server(s) 978 may be used to train machine learning models (e.g., neural networks) based at least in part on training data. training data may be generated by vehicles, and/or may be generated in a simulation (e.g., using a game engine). In at least one embodiment, any amount of training data is tagged (e.g., where associated neural network benefits from supervised learning) and/or undergoes other pre-processing. In at least one embodiment, any amount of training data is not tagged and/or pre-processed (e.g., where associated neural network does not require supervised learning). In at least one embodiment, once machine learning models are trained, machine learning models may be used by vehicles (e.g., transmitted to vehicles over network(s) 990, and/or machine learning models may be used by server(s) 978 to remotely monitor vehicles.

In at least one embodiment, server(s) 978 may receive data from vehicles and apply data to up-to-date real-time neural networks for real-time intelligent inferencing. In at least one embodiment, server(s) 978 may include deep-learning supercomputers and/or dedicated AI computers powered by GPU(s) 984, such as a DGX and DGX Station machines developed by NVIDIA. However, in at least one embodiment, server(s) 978 may include deep learning infrastructure that use CPU-powered data centers.

In at least one embodiment, deep-learning infrastructure of server(s) 978 may be capable of fast, real-time inferencing, and may use that capability to evaluate and verify health of processors, software, and/or associated hardware in vehicle 900. For example, in at least one embodiment, deep-learning infrastructure may receive periodic updates from vehicle 900, such as a sequence of images and/or objects that vehicle 900 has located in that sequence of images (e.g., via computer vision and/or other machine learning object classification techniques). In at least one embodiment, deep-learning infrastructure may run its own neural network to identify objects and compare them with objects identified by vehicle 900 and, if results do not match and deep-learning infrastructure concludes that AI in vehicle 900 is malfunctioning, then server(s) 978 may transmit a signal to vehicle 900 instructing a fail-safe computer of vehicle 900 to assume control, notify passengers, and complete a safe parking maneuver.

In at least one embodiment, server(s) 978 may include GPU(s) 984 and one or more programmable inference accelerators (e.g., NVIDIA's TensorRT 3). In at least one embodiment, combination of GPU-powered servers and inference acceleration may make real-time responsiveness possible. In at least one embodiment, such as where performance is less critical, servers powered by CPUs, FPGAs, and other processors may be used for inferencing. In at least one embodiment, hardware structure(s) 815 are used to perform one or more embodiments. Details regarding hardware structure(x) 815 are provided herein in conjunction with FIGS. 8A and/or 8B.

Computer Systems

Figure 10:
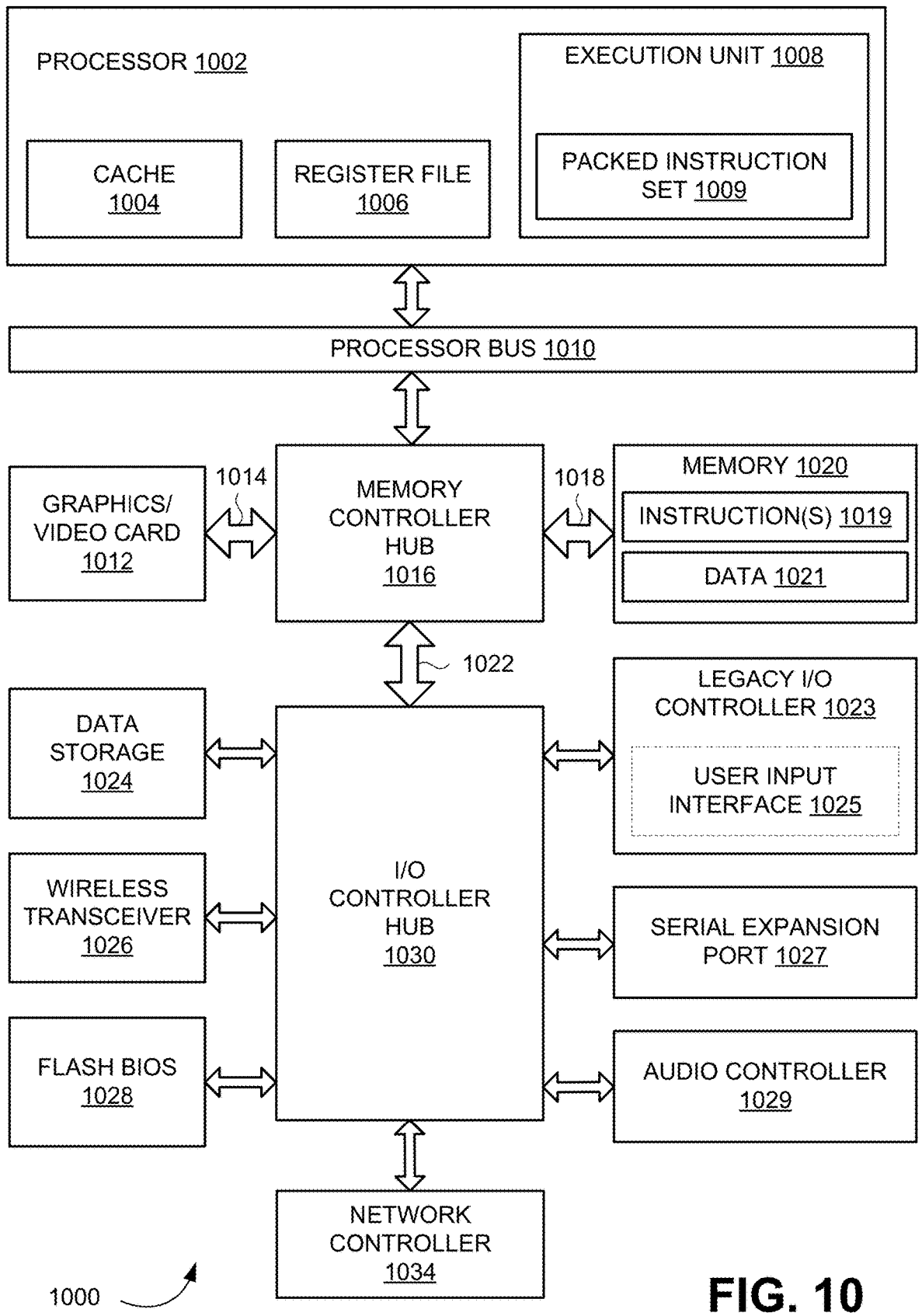
FIG. 10 is a block diagram illustrating a computer system, according to at least one embodiment.

FIG. 10 is a block diagram illustrating an exemplary computer system, which may be a system with interconnected devices and components, a system-on-a-chip (SOC) or some combination thereof 1000 formed with a processor that may include execution units to execute an instruction, according to at least one embodiment. In at least one embodiment, computer system 1000 may include, without limitation, a component, such as a processor 1002 to employ execution units including logic to perform algorithms for process data, in accordance with present disclosure, such as in embodiment described herein. In at least one embodiment, computer system 1000 may include processors, such as PENTIUM® Processor family, Xeon™ Itanium®, XScale™ and/or StrongARM™, Intel® Core™, or Intel® Nervana™ microprocessors available from Intel Corporation of Santa Clara, Calif., although other systems (including PCs having other microprocessors, engineering workstations, set-top boxes and like) may also be used. In at least one embodiment, computer system 1000 may execute a version of WINDOWS' operating system available from Microsoft Corporation of Redmond, Wash., although other operating systems (UNIX and Linux for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, computer system 1000 may include, without limitation, processor 1002 that may include, without limitation, one or more execution units 1008 to perform machine learning model training and/or inferencing according to techniques described herein. In at least one embodiment, system 10 is a single processor desktop or server system, but in another embodiment system 10 may be a multiprocessor system. In at least one embodiment, processor 1002 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, processor 1002 may be coupled to a processor bus 1010 that may transmit data signals between processor 1002 and other components in computer system 1000.

In at least one embodiment, processor 1002 may include, without limitation, a Level 1 ("L1") internal cache memory ("cache") 1004. In at least one embodiment, processor 1002 may have a single internal cache or multiple levels of internal cache. In at least one embodiment, cache memory may reside external to processor 1002. Other embodiments may also include a combination of both internal and external caches depending on particular implementation and needs. In at least one embodiment, register file 1006 may store different types of data in various registers including, without limitation, integer registers, floating point registers, status registers, and instruction pointer register.

In at least one embodiment, execution unit 1008, including, without limitation, logic to perform integer and floating point operations, also resides in processor 1002. Processor 1002 may also include a microcode ("ucode") read only memory ("ROM") that stores microcode for certain macro instructions. In at least one embodiment, execution unit 1008 may include logic to handle a packed instruction set 1009. In at least one embodiment, by including packed instruction set 1009 in instruction set of a general-purpose processor 1002, along with associated circuitry to execute instructions, operations used by many multimedia applications may be performed using packed data in a general-purpose processor 1002. In one or more embodiments, many multimedia applications may be accelerated and executed more efficiently by using full width of a processor's data bus for performing operations on packed data, which may eliminate need to transfer smaller units of data across processor's data bus to perform one or more operations one data element at a time.

In at least one embodiment, execution unit 1008 may also be used in microcontrollers, embedded processors, graphics devices, DSPs, and other types of logic circuits. In at least one embodiment, computer system 1000 may include, without limitation, a memory 1020. In at least one embodiment, memory 1020 may be implemented as a Dynamic Random Access Memory ("DRAM") device, a Static Random Access Memory ("SRAM") device, flash memory device, or other memory device. Memory 1020 may store instruction(s) 1019 and/or data 1021 represented by data signals that may be executed by processor 1002.

In at least one embodiment, system logic chip may be coupled to processor bus 1010 and memory 1020. In at least one embodiment, system logic chip may include, without limitation, a memory controller hub ("MCH") 1016, and processor 1002 may communicate with MCH 1016 via processor bus 1010. In at least one embodiment, MCH 1016 may provide a high bandwidth memory path 1018 to memory 1020 for instruction and data storage and for storage of graphics commands, data and textures. In at least one embodiment, MCH 1016 may direct data signals between processor 1002, memory 1020, and other components in computer system 1000 and to bridge data signals between processor bus 1010, memory 1020, and a system I/O 1022. In at least one embodiment, system logic chip may provide a graphics port for coupling to a graphics controller. In at least one embodiment, MCH 1016 may be coupled to memory 1020 through a high bandwidth memory path 1018 and graphics/video card 1012 may be coupled to MCH 1016 through an Accelerated Graphics Port ("AGP") interconnect 1014.

In at least one embodiment, computer system 1000 may use system I/O 1022 that is a proprietary hub interface bus to couple MCH 1016 to I/O controller hub ("ICH") 1030. In at least one embodiment, ICH 1030 may provide direct connections to some I/O devices via a local I/O bus. In at least one embodiment, local I/O bus may include, without limitation, a high-speed I/O bus for connecting peripherals to memory 1020, chipset, and processor 1002. Examples may include, without limitation, an audio controller 1029, a firmware hub ("flash BIOS") 1028, a wireless transceiver 1026, a data storage 1024, a legacy I/O controller 1023 containing user input and keyboard interfaces, a serial expansion port 1027, such as Universal Serial Bus ("USB"), and a network controller 1034. Data storage 1024 may comprise a hard disk drive, a floppy disk drive, a CD-ROM device, a flash memory device, or other mass storage device.

In at least one embodiment, FIG. 10 illustrates a system, which includes interconnected hardware devices or "chips", whereas in other embodiments, FIG. 10 may illustrate an exemplary System on a Chip ("SoC"). In at least one embodiment, devices illustrated in FIG. cc may be interconnected with proprietary interconnects, standardized interconnects (e.g., PCIe) or some combination thereof. In at least one embodiment, one or more components of system 1000 are interconnected using compute express link (CXL) interconnects.

In at least one embodiment, processor 1002 decodes encoded data by distributed compressed parts of decoding information to processor cores, and combine results of such decoding.

Figure 11:
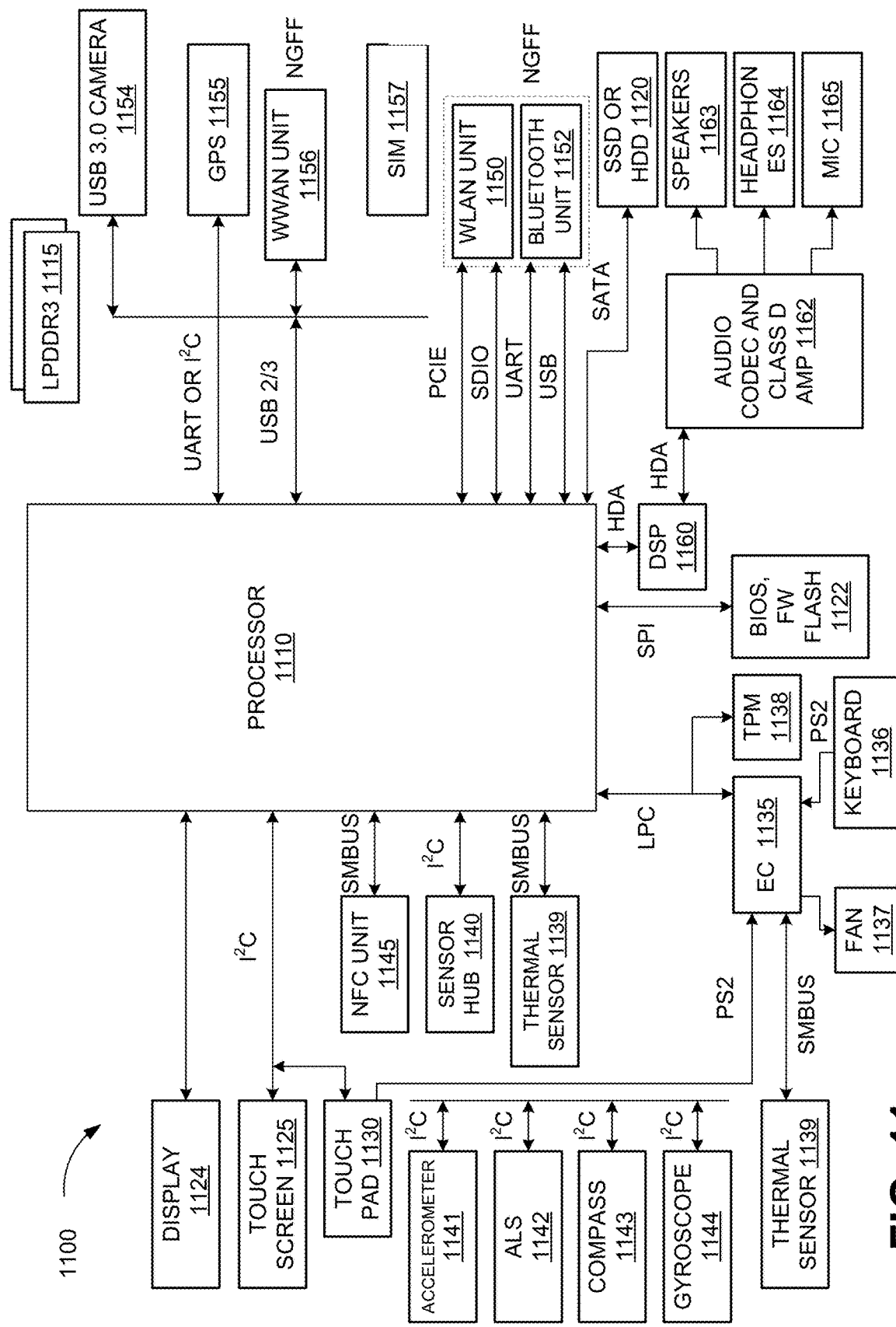
FIG. 11 is a block diagram illustrating computer system, according to at least one embodiment.

FIG. 11 is a block diagram illustrating an electronic device 1100 for utilizing a processor 1110, according to at least one embodiment. In at least one embodiment, electronic device 1100 may be, for example and without limitation, a notebook, a tower server, a rack server, a blade server, a laptop, a desktop, a tablet, a mobile device, a phone, an embedded computer, or any other suitable electronic device.

In at least one embodiment, system 1100 may include, without limitation, processor 1110 communicatively coupled to any suitable number or kind of components, peripherals, modules, or devices. In at least one embodiment, processor 1110 coupled using a bus or interface, such as a 1° C. bus, a System Management Bus ("SMBus"), a Low Pin Count (LPC) bus, a Serial Peripheral Interface ("SPI"), a High Definition Audio ("HDA") bus, a Serial Advance Technology Attachment ("SATA") bus, a Universal Serial Bus ("USB") (versions 1, 2, 3), or a Universal Asynchronous Receiver/Transmitter ("UART") bus. In at least one embodiment, FIG. 11 illustrates a system, which includes interconnected hardware devices or "chips", whereas in other embodiments, FIG. 11 may illustrate an exemplary System on a Chip ("SoC"). In at least one embodiment, devices illustrated in FIG. 11 may be interconnected with proprietary interconnects, standardized interconnects (e.g., PCIe) or some combination thereof. In at least one embodiment, one or more components of FIG. 11 are interconnected using compute express link (CXL) interconnects.

In at least one embodiment, FIG. 11 may include a display 1124, a touch screen 1125, a touch pad 1130, a Near Field Communications unit ("NFC") 1145, a sensor hub 1140, a thermal sensor 1146, an Express Chipset ("EC") 1135, a Trusted Platform Module ("TPM") 1138, BIOS/firmware/ flash memory ("BIOS, FW Flash") 1122, a DSP 1160, a drive "SSD or HDD") 1120 such as a Solid State Disk ("SSD") or a Hard Disk Drive ("HDD"), a wireless local area network unit ("WLAN") 1150, a Bluetooth unit 1152, a Wireless Wide Area Network unit ("WWAN") 1156, a Global Positioning System (GPS) 1155, a camera ("USB 3.0 camera") 1154 such as a USB 3.0 camera, or a Low Power Double Data Rate ("LPDDR") memory unit ("LPDDR3") 1115 implemented in, for example, LPDDR3 standard. These components may each be implemented in any suitable manner.

In at least one embodiment, other components may be communicatively coupled to processor 1110 through components discussed above. In at least one embodiment, an accelerometer 1141, Ambient Light Sensor ("ALS") 1142, compass 1143, and a gyroscope 1144 may be communicatively coupled to sensor hub 1140. In at least one embodiment, thermal sensor 1139, a fan 1137, a keyboard 1146, and a touch pad 1130 may be communicatively coupled to EC 1135. In at least one embodiment, speaker 1163, a headphones 1164, and a microphone ("mic") 1165 may be communicatively coupled to an audio unit ("audio codec and class d amp") 1164, which may in turn be communicatively coupled to DSP 1160. In at least one embodiment, audio unit 1164 may include, for example and without limitation, an audio coder/decoder ("codec") and a class D amplifier. In at least one embodiment, SIM card ("SIM") 1157 may be communicatively coupled to WWAN unit 1156. In at least one embodiment, components such as WLAN unit 1150 and Bluetooth unit 1152, as well as WWAN unit 1156 may be implemented in a Next Generation Form Factor ("NGFF").

In at least one embodiment, processor 1110 decodes encoded data by distributed compressed parts of decoding information to processor cores, and combine results of such decoding.

Figure 12:
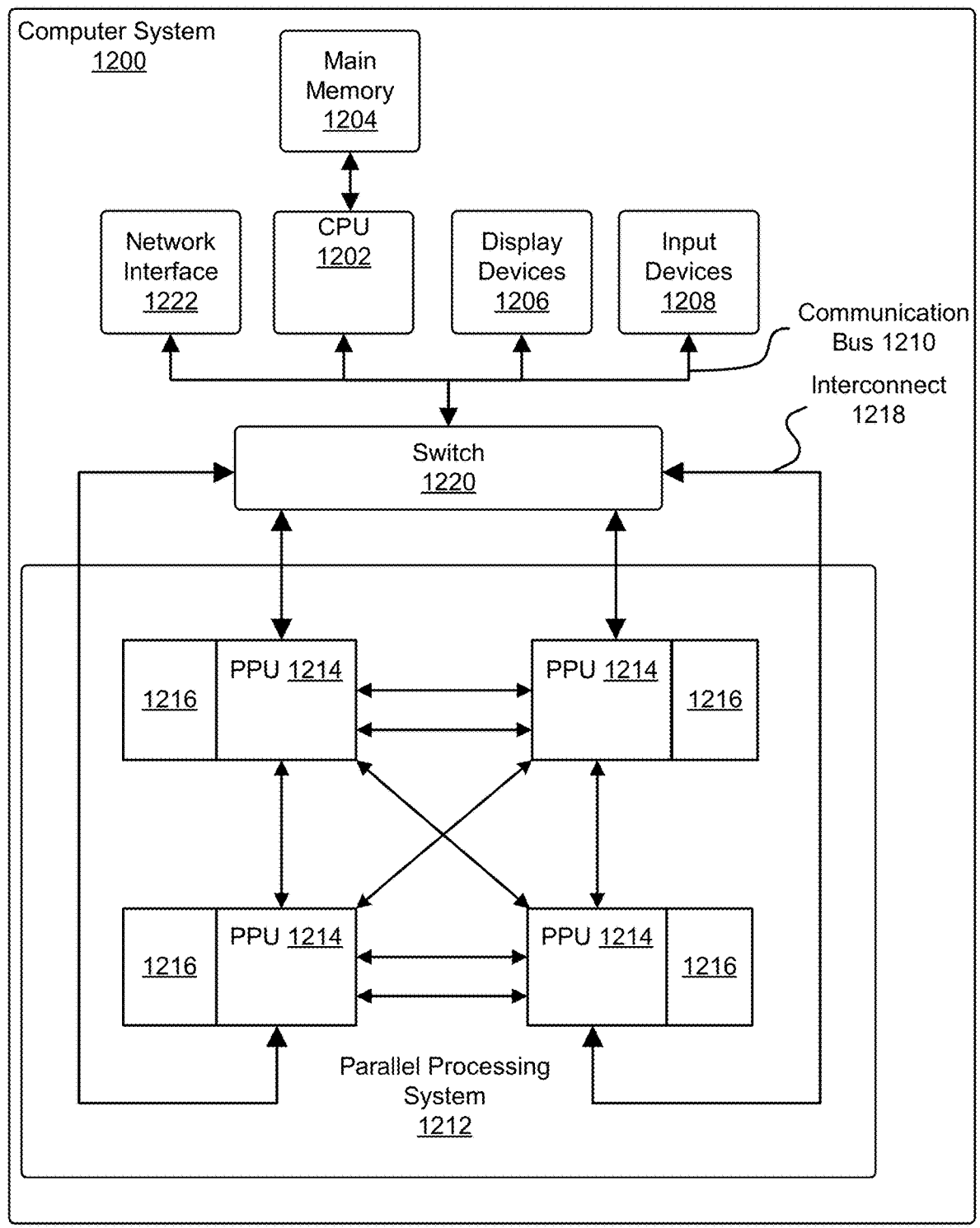
FIG. 12 illustrates a computer system, according to at least one embodiment.

FIG. 12 illustrates a computer system 1200, according to at least one embodiment. In at least one embodiment, computer system 1200 is configured to implement various processes and methods described throughout this disclosure.

In at least one embodiment, computer system 1200 comprises, without limitation, at least one central processing unit ("CPU") 1202 that is connected to a communication bus 1210 implemented using any suitable protocol, such as PCI ("Peripheral Component Interconnect"), peripheral component interconnect express ("PCI-Express"), AGP ("Accelerated Graphics Port"), HyperTransport, or any other bus or point-to-point communication protocol(s). In at least one embodiment, computer system 1200 includes, without limitation, a main memory 1204 and control logic (e.g., implemented as hardware, software, or a combination thereof) and data are stored in main memory 1204 which may take form of random access memory ("RAM"). In at least one embodiment, a network interface subsystem ("network interface") 1222 provides an interface to other computing devices and networks for receiving data from and transmitting data to other systems from computer system 1200.

In at least one embodiment, computer system 1200, in at least one embodiment, includes, without limitation, input devices 1208, parallel processing system 1212, and display devices 1206 which can be implemented using a conventional cathode ray tube ("CRT"), liquid crystal display ("LCD"), light emitting diode ("LED"), plasma display, or other suitable display technologies. In at least one embodiment, user input is received from input devices 1208 such as keyboard, mouse, touchpad, microphone, and more. In at least one embodiment, each of foregoing modules can be situated on a single semiconductor platform to form a processing system.

In at least one embodiment, parallel processing system 1212 decodes encoded data by distributed compressed parts of decoding information to PPUs 1214, and combine results of such decoding.

Figure 13:
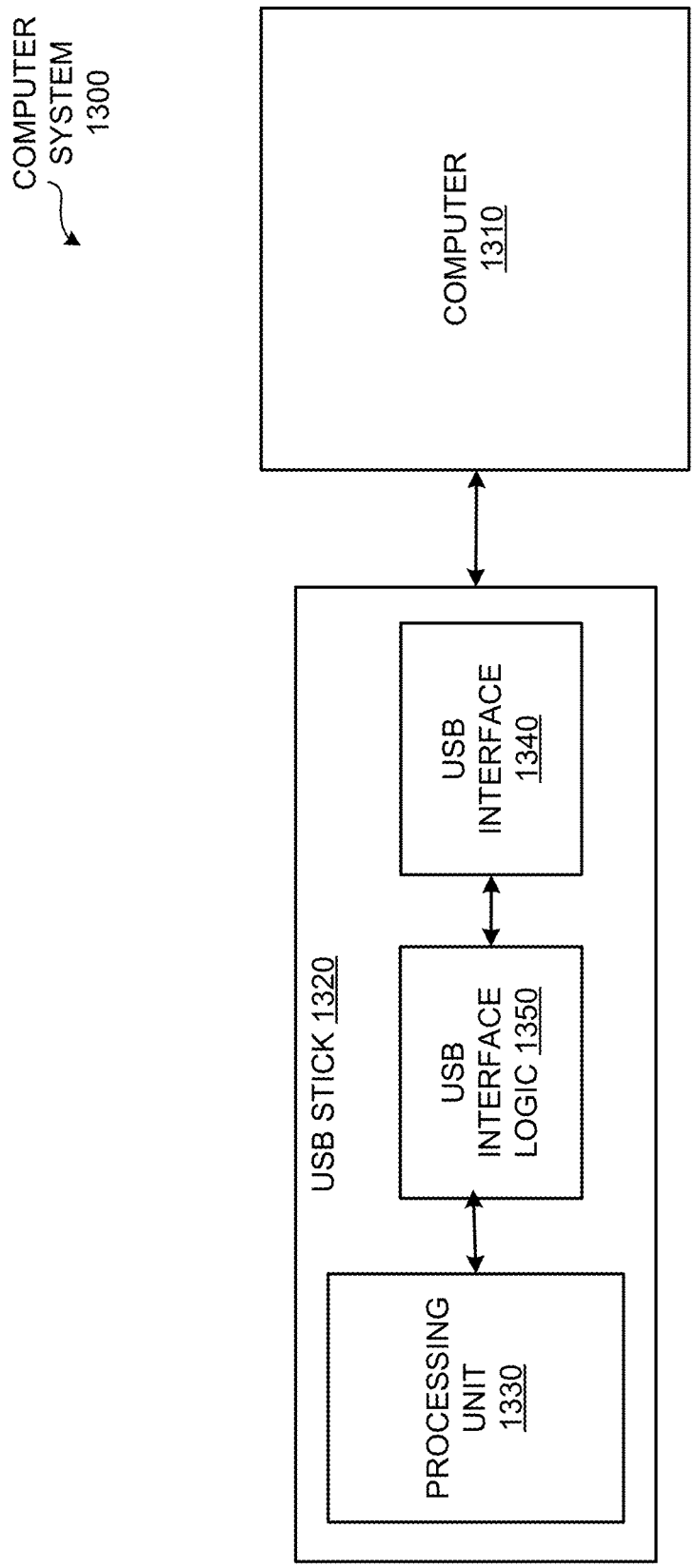
FIG. 13 illustrates a computer system, according at least one embodiment.

FIG. 13 illustrates a computer system 1300, according to at least one embodiment. In at least one embodiment, computer system 1300 includes, without limitation, a computer 1310 and a USB stick 1320. In at least one embodiment, computer 1310 may include, without limitation, any number and type of processor(s) (not shown) and a memory (not shown). In at least one embodiment, computer 1310 includes, without limitation, a server, a cloud instance, a laptop, and a desktop computer.

In at least one embodiment, USB stick 1320 includes, without limitation, a processing unit 1330, a USB interface 1340, and USB interface logic 1350. In at least one embodiment, processing unit 1330 may be any instruction execution system, apparatus, or device capable of executing instructions. In at least one embodiment, processing unit 1330 may include, without limitation, any number and type of processing cores (not shown). In at least one embodiment, processing core 1330 comprises an application specific integrated circuit ("ASIC") that is optimized to perform any amount and type of operations associated with machine learning. For instance, in at least one embodiment, processing core 1330 is a tensor processing unit ("TPC") that is optimized to perform machine learning inference operations. In at least one embodiment, processing core 1330 is a vision processing unit ("VPU") that is optimized to perform machine vision and machine learning inference operations.

In at least one embodiment, USB interface 1340 may be any type of USB connector or USB socket. For instance, in at least one embodiment, USB interface 1340 is a USB 3.0 Type-C socket for data and power. In at least one embodiment, USB interface 1340 is a USB 3.0 Type-A connector. In at least one embodiment, USB interface logic 1350 may include any amount and type of logic that enables processing unit 1330 to interface with or devices (e.g., computer 1310) via USB connector 1340.

In at least one embodiment, processing unit 1330 decodes encoded data providing distributed compressed parts of decoding information to threads executing on processing unit 1330 and combine results of such decoding.

Figure 14A:
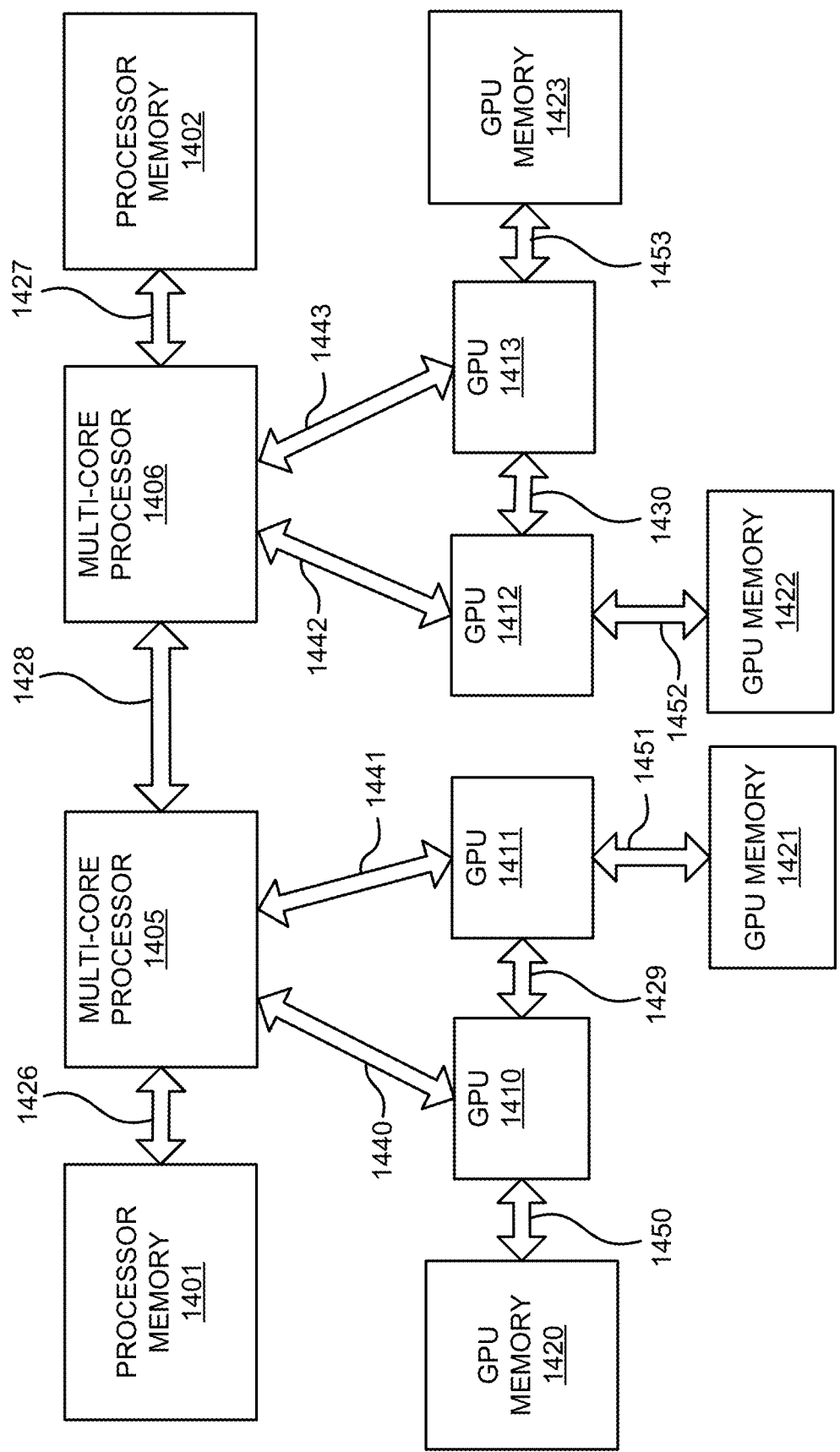
FIG. 14A illustrates a computer system, according to at least one embodiment.

FIG. 14A illustrates an exemplary architecture in which a plurality of GPUs 1410-1413 is communicatively coupled to a plurality of multi-core processors 1405-1406 over high-speed links 1440-1443 (e.g., buses, point-to-point interconnects, etc.). In one embodiment, high-speed links 1440-1443 support a communication throughput of 4 GB/s, 30 GB/s, 80 GB/s or higher. Various interconnect protocols may be used including, but not limited to, PCIe 4.0 or 5.0 and NVLink 2.0.

In addition, and in one embodiment, two or more of GPUs 1410-1413 are interconnected over high-speed links 1429-1430, which may be implemented using same or different protocols/links than those used for high-speed links 1440-1443. Similarly, two or more of multi-core processors 1405-1406 may be connected over high speed link 1428 which may be symmetric multi-processor (SMP) buses operating at 20 GB/s, 30 GB/s, 120 GB/s or higher. Alternatively, all communication between various system components shown in FIG. 14A may be accomplished using same protocols/links (e.g., over a common interconnection fabric).

In one embodiment, each multi-core processor 1405-1406 is communicatively coupled to a processor memory 1401-1402, via memory interconnects 1426-1427, respectively, and each GPU 1410-1413 is communicatively coupled to GPU memory 1420-1423 over GPU memory interconnects 1450-1453, respectively. Memory interconnects 1426-1427 and 1450-1453 may utilize same or different memory access technologies. By way of example, and not limitation, processor memories 1401-1402 and GPU memories 1420-1423 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of processor memories 1401-1402 may be volatile memory and another portion may be non-volatile memory (e.g., using a two-level memory (2LM) hierarchy).

As described herein, although various processors 1405-1406 and GPUs 1410-1413 may be physically coupled to a particular memory 1401-1402, 1420-1423, respectively, a unified memory architecture may be implemented in which a same virtual system address space (also referred to as "effective address" space) is distributed among various physical memories. For example, processor memories 1401-1402 may each comprise 64 GB of system memory address space and GPU memories 1420-1423 may each comprise 32 GB of system memory address space (resulting in a total of 256 GB addressable memory in this example).

Figure 14B:
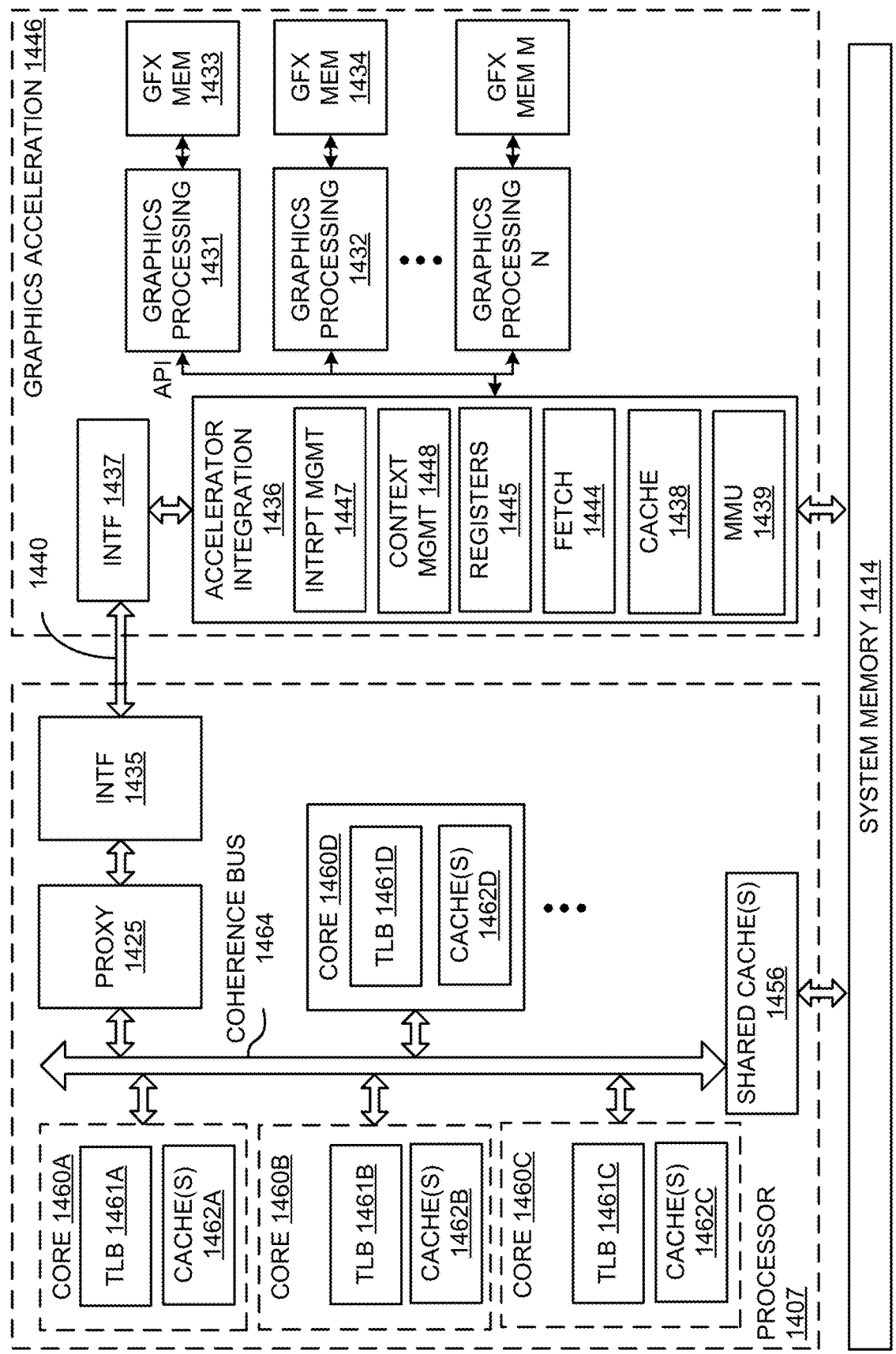
FIG. 14B illustrates a computer system, according to at least one embodiment.

FIG. 14B illustrates additional details for an interconnection between a multi-core processor 1407 and a graphics acceleration module 1446 in accordance with one exemplary embodiment. Graphics acceleration module 1446 may include one or more GPU chips integrated on a line card which is coupled to processor 1407 via high-speed link 1440. Alternatively, graphics acceleration module 1446 may be integrated on a same package or chip as processor 1407.

In at least one embodiment, illustrated processor 1407 includes a plurality of cores 1460A-1460D, each with a translation lookaside buffer 1461A-1461D and one or more caches 1462A-1462D. In at least one embodiment, cores 1460A-1460D may include various other components for executing instructions and processing data which are not illustrated. Caches 1462A-1462D may comprise level 1 (L1) and level 2 (L2) caches. In addition, one or more shared caches 1456 may be included in caches 1462A-1462D and shared by sets of cores 1460A-1460D. For example, one embodiment of processor 1407 includes 24 cores, each with its own L1 cache, twelve shared L2 caches, and twelve shared L3 caches. In this embodiment, one or more L2 and L3 caches are shared by two adjacent cores. Processor 1407 and graphics acceleration module 1446 connect with system memory 1414, which may include processor memories 1401-1402 of FIG. 14A.

Coherency is maintained for data and instructions stored in various caches 1462A-1462D, 1456 and system memory 1414 via inter-core communication over a coherence bus 1464. For example, each cache may have cache coherency logic/circuitry associated therewith to communicate to over coherence bus 1464 in response to detected reads or writes to particular cache lines. In one implementation, a cache snooping protocol is implemented over coherence bus 1464 to snoop cache accesses.

In one embodiment, a proxy circuit 1425 communicatively couples graphics acceleration module 1446 to coherence bus 1464, allowing graphics acceleration module 1446 to participate in a cache coherence protocol as a peer of cores 1460A-1460D. In particular, an interface 1435 provides connectivity to proxy circuit 1425 over high-speed link 1440 (e.g., a PCIe bus, NVLink, etc.) and an interface 1437 connects graphics acceleration module 1446 to link 1440.

In one implementation, an accelerator integration circuit 1436 provides cache management, memory access, context management, and interrupt management services on behalf of a plurality of graphics processing engines 1431, 1432, N of graphics acceleration module 1446. Graphics processing engines 1431, 1432, N may each comprise a separate graphics processing unit (GPU). Alternatively, graphics processing engines 1431, 1432, N may comprise different types of graphics processing engines within a GPU such as graphics execution units, media processing engines (e.g., video encoders/decoders), samplers, and blit engines. In at least one embodiment, graphics acceleration module 1446 may be a GPU with a plurality of graphics processing engines 1431-1432, N or graphics processing engines 1431-1432, N may be individual GPUs integrated on a common package, line card, or chip.

In one embodiment, accelerator integration circuit 1436 includes a memory management unit (MMU) 1439 for performing various memory management functions such as virtual-to-physical memory translations (also referred to as effective-to-real memory translations) and memory access protocols for accessing system memory 1414. MMU 1439 may also include a translation lookaside buffer (TLB) (not shown) for caching virtual/effective to physical/real address translations. In one implementation, a cache 1438 stores commands and data for efficient access by graphics processing engines 1431-1432, N. In one embodiment, data stored in cache 1438 and graphics memories 1433-1434, M is kept coherent with core caches 1462A-1462D, 1456 and system memory 1414. As mentioned, this may be accomplished via proxy circuit 1425 on behalf of cache 1438 and memories 1433-1434, M (e.g., sending updates to cache 1438 related to modifications/accesses of cache lines on processor caches 1462A-1462D, 1456 and receiving updates from cache 1438).

A set of registers 1445 store context data for threads executed by graphics processing engines 1431-1432, N and a context management circuit 1448 manages thread contexts. For example, context management circuit 1448 may perform save and restore operations to save and restore contexts of various threads during contexts switches (e.g., where a first thread is saved and a second thread is stored so that a second thread can be execute by a graphics processing engine). For example, on a context switch, context management circuit 1448 may store current register values to a designated region in memory (e.g., identified by a context pointer). It may then restore register values when returning to a context. In one embodiment, an interrupt management circuit 1447 receives and processes interrupts received from system devices.

In one implementation, virtual/effective addresses from a graphics processing engine 1431 are translated to real/physical addresses in system memory 1414 by MMU 1439. One embodiment of accelerator integration circuit 1436 supports multiple (e.g., 4, 8, 16) graphics accelerator modules 1446 and/or other accelerator devices. Graphics accelerator module 1446 may be dedicated to a single application executed on processor 1407 or may be shared between multiple applications. In one embodiment, a virtualized graphics execution environment is presented in which resources of graphics processing engines 1431-1432, N are shared with multiple applications or virtual machines (VMs). In at least one embodiment, resources may be subdivided into "slices" which are allocated to different VMs and/or applications based on processing requirements and priorities associated with VMs and/or applications.

In at least one embodiment, accelerator integration circuit 1436 performs as a bridge to a system for graphics acceleration module 1446 and provides address translation and system memory cache services. In addition, accelerator integration circuit 1436 may provide virtualization facilities for a host processor to manage virtualization of graphics processing engines 1431-1432, interrupts, and memory management.

Because hardware resources of graphics processing engines 1431-1432, N are mapped explicitly to a real address space seen by host processor 1407, any host processor can address these resources directly using an effective address value. One function of accelerator integration circuit 1436, in one embodiment, is physical separation of graphics processing engines 1431-1432, N so that they appear to a system as independent units.

In at least one embodiment, one or more graphics memories 1433-1434, M are coupled to each of graphics processing engines 1431-1432, N, respectively. Graphics memories 1433-1434, M store instructions and data being processed by each of graphics processing engines 1431-1432, N. Graphics memories 1433-1434, M may be volatile memories such as DRAMs (including stacked DRAMs), GDDR memory (e.g., GDDR5, GDDR6), or HBM, and/or may be non-volatile memories such as 3D XPoint or Nano-Ram.

In one embodiment, to reduce data traffic over link 1440, biasing techniques are used to ensure that data stored in graphics memories 1433-1434, M is data which will be used most frequently by graphics processing engines 1431-1432, N and preferably not used by cores 1460A-1460D (at least not frequently). Similarly, a biasing mechanism attempts to keep data needed by cores (and preferably not graphics processing engines 1431-1432, N) within caches 1462A-1462D, 1456 of cores and system memory 1414.

Figure 14C:
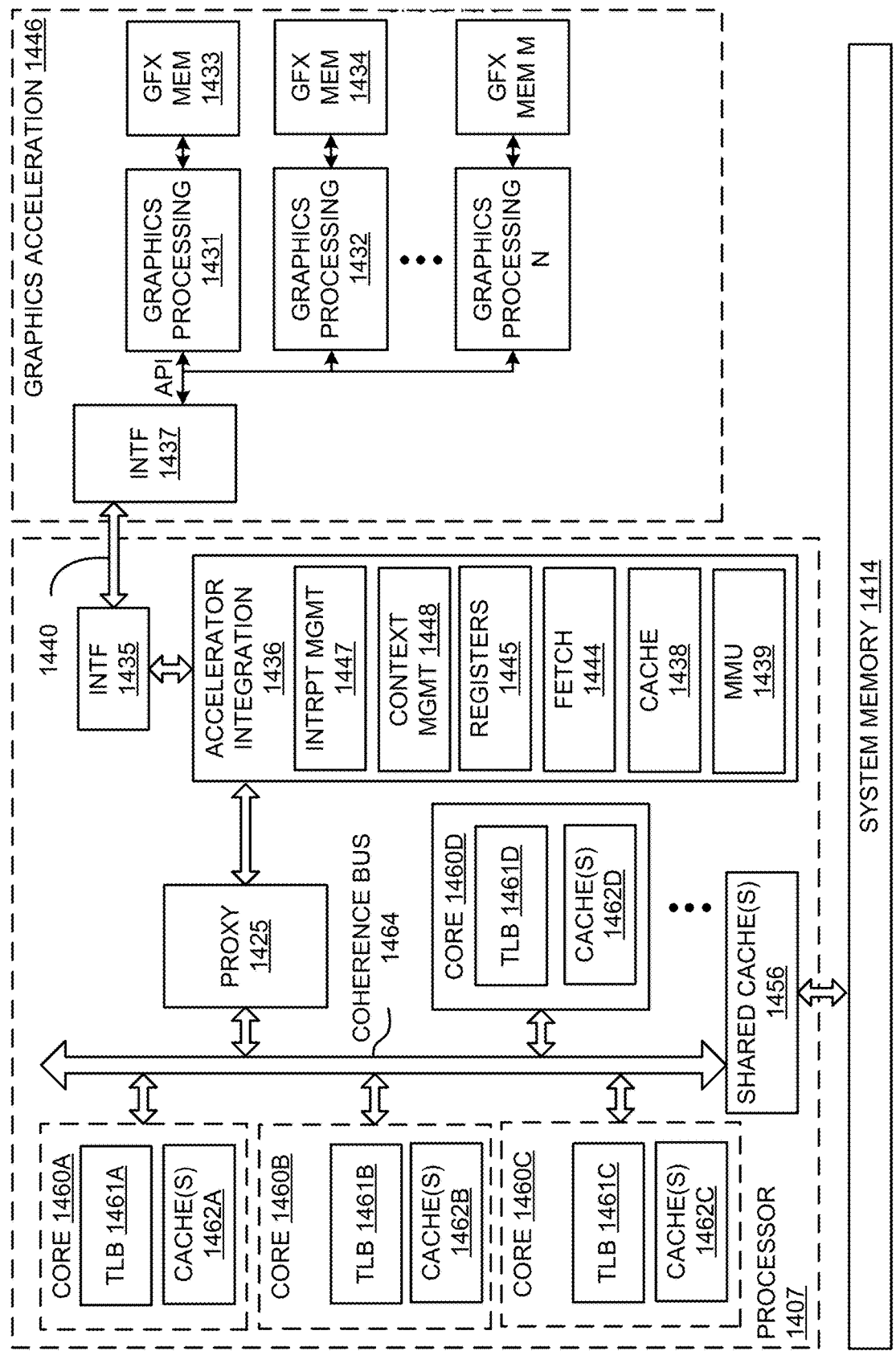
FIG. 14C illustrates a computer system, according to at least one embodiment.

FIG. 14C illustrates another exemplary embodiment in which accelerator integration circuit 1436 is integrated within processor 1407. In this embodiment, graphics processing engines 1431-1432, N communicate directly over high-speed link 1440 to accelerator integration circuit 1436 via interface 1437 and interface 1435 (which, again, may be utilize any form of bus or interface protocol). Accelerator integration circuit 1436 may perform same operations as those described with respect to FIG. 14B, but potentially at a higher throughput given its close proximity to coherence bus 1464 and caches 1462A-1462D, 1456. One embodiment supports different programming models including a dedicated-process programming model (no graphics acceleration module virtualization) and shared programming models (with virtualization), which may include programming models which are controlled by accelerator integration circuit 1436 and programming models which are controlled by graphics acceleration module 1446.

In at least one embodiment, graphics processing engines 1431-1432, N are dedicated to a single application or process under a single operating system. In at least one embodiment, a single application can funnel other application requests to graphics processing engines 1431-1432, N, providing virtualization within a VM/partition.

In at least one embodiment, graphics processing engines 1431-1432, N, may be shared by multiple VM/application partitions. In at least one embodiment, shared models may use a system hypervisor to virtualize graphics processing engines 1431-1432, N to allow access by each operating system. For single-partition systems without a hypervisor, graphics processing engines 1431-1432, N are owned by an operating system. In at least one embodiment, an operating system can virtualize graphics processing engines 1431-1432, N to provide access to each process or application.

In at least one embodiment, graphics acceleration module 1446 or an individual graphics processing engine 1431-1432, N selects a process element using a process handle. In one embodiment, process elements are stored in system memory 1414 and are addressable using an effective address to real address translation techniques described herein. In at least one embodiment, a process handle may be an implementation-specific value provided to a host process when registering its context with graphics processing engine 1431-1432, N (that is, calling system software to add a process element to a process element linked list). In at least one embodiment, a lower 16-bits of a process handle may be an offset of the process element within a process element linked list.

Figure 14D:
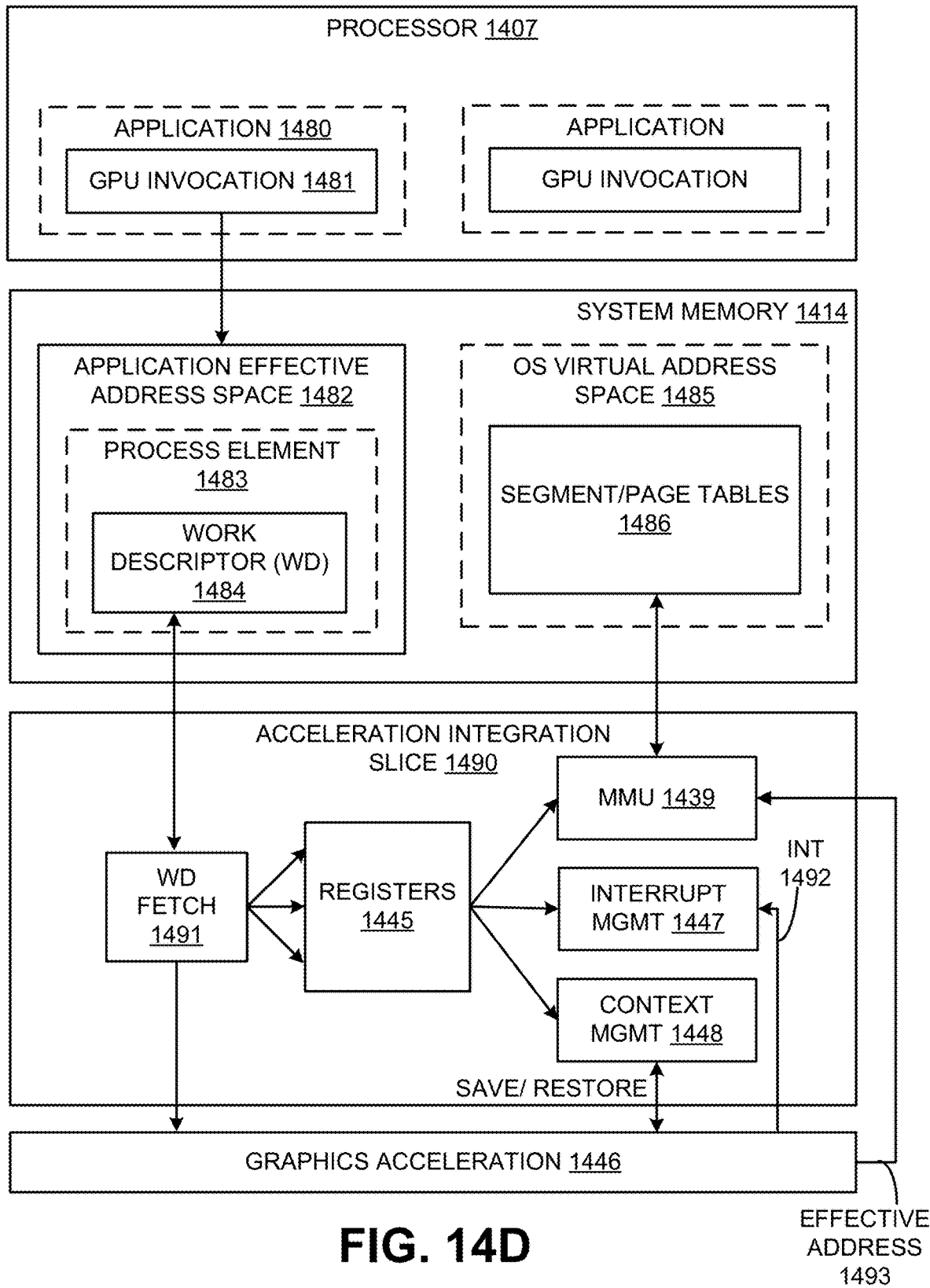
FIG. 14D illustrates a computer system, according to at least one embodiment.

FIG. 14D illustrates an exemplary accelerator integration slice 1490. As used herein, a "slice" comprises a specified portion of processing resources of accelerator integration circuit 1436. Application effective address space 1482 within system memory 1414 stores process elements 1483. In one embodiment, process elements 1483 are stored in response to GPU invocations 1481 from applications 1480 executed on processor 1407. A process element 1483 contains process state for corresponding application 1480. A work descriptor (WD) 1484 contained in process element 1483 can be a single job requested by an application or may contain a pointer to a queue of jobs. In at least one embodiment, WD 1484 is a pointer to a job request queue in an application's address space 1482.

Graphics acceleration module 1446 and/or individual graphics processing engines 1431-1432, N can be shared by all or a subset of processes in a system. In at least one embodiment, an infrastructure for setting up process state and sending a WD 1484 to a graphics acceleration module 1446 to start a job in a virtualized environment may be included.

In at least one embodiment, a dedicated-process programming model is implementation-specific. In this model, a single process owns graphics acceleration module 1446 or an individual graphics processing engine 1431. Because graphics acceleration module 1446 is owned by a single process, a hypervisor initializes accelerator integration circuit 1436 for an owning partition and an operating system initializes accelerator integration circuit 1436 for an owning process when graphics acceleration module 1446 is assigned.

In operation, a WD fetch unit 1491 in accelerator integration slice 1490 fetches next WD 1484 which includes an indication of work to be done by one or more graphics processing engines of graphics acceleration module 1446. Data from WD 1484 may be stored in registers 1445 and used by MMU 1439, interrupt management circuit 1447 and/or context management circuit 1448 as illustrated. For example, one embodiment of MMU 1439 includes segment/page walk circuitry for accessing segment/page tables 1486 within OS virtual address space 1485. Interrupt management circuit 1447 may process interrupt events 1492 received from graphics acceleration module 1446. When performing graphics operations, an effective address 1493 generated by a graphics processing engine 1431-1432, N is translated to a real address by MMU 1439.

In one embodiment, a same set of registers 1445 are duplicated for each graphics processing engine 1431-1432, N and/or graphics acceleration module 1446 and may be initialized by a hypervisor or operating system. Each of these duplicated registers may be included in an accelerator integration slice 1490. Exemplary registers that may be initialized by a hypervisor are shown in Table 1.

TABLE 1

Hypervisor Initialized Registers

1 Slice Control Register
2 Real Address (RA) Scheduled Processes Area Pointer
3 Authority Mask Override Register
4 Interrupt Vector Table Entry Offset
5 Interrupt Vector Table Entry Limit
6 State Register
7 Logical Partition ID
8 Real address (RA) Hypervisor Accelerator Utilization Record Pointer
9 Storage Description Register Exemplary registers that may be initialized by an operating system are shown in Table 2.

TABLE 2

Operating System Initialized Registers

1 Process and Thread Identification
2 Effective Address (EA) Context Save/Restore Pointer
3 Virtual Address (VA) Accelerator Utilization Record Pointer
4 Virtual Address (VA) Storage Segment Table Pointer
5 Authority Mask
6 Work descriptor In one embodiment, each WD 1484 is specific to a particular graphics acceleration module 1446 and/or graphics processing engines 1431-1432, N. It contains all information required by a graphics processing engine 1431-1432, N to do work or it can be a pointer to a memory location where an application has set up a command queue of work to be completed.

Figure 14E:
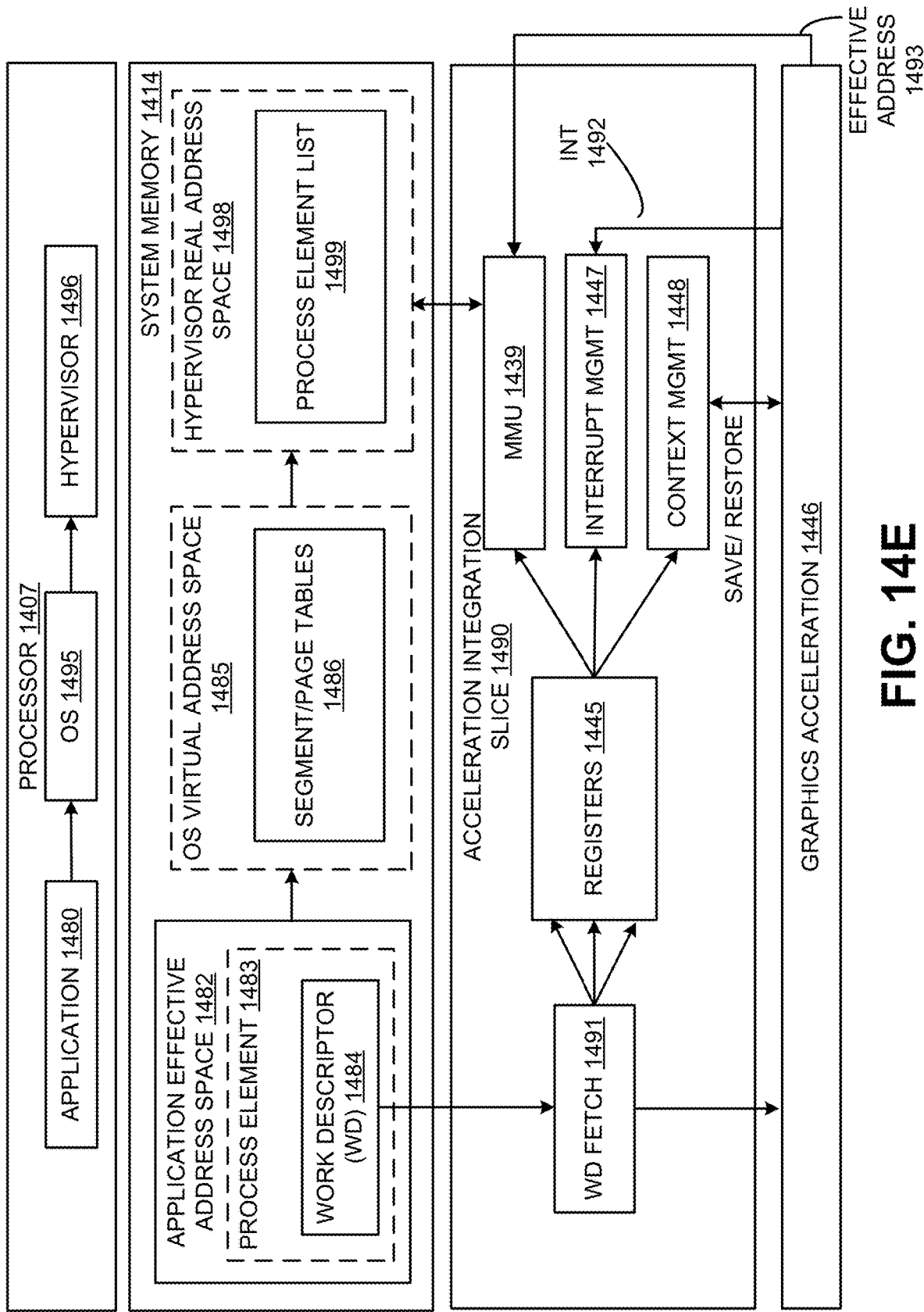
FIGS. 14E and 14F illustrate a shared programming model, according to at least one embodiment.

FIG. 14E illustrates additional details for one exemplary embodiment of a shared model. This embodiment includes a hypervisor real address space 1498 in which a process element list 1499 is stored. Hypervisor real address space 1498 is accessible via a hypervisor 1496 which virtualizes graphics acceleration module engines for operating system 1495.

In at least one embodiment, shared programming models allow for all or a subset of processes from all or a subset of partitions in a system to use a graphics acceleration module 1446. There are two programming models where graphics acceleration module 1446 is shared by multiple processes and partitions: time-sliced shared and graphics directed shared.

In this model, system hypervisor 1496 owns graphics acceleration module 1446 and makes its function available to all operating systems 1495. For a graphics acceleration module 1446 to support virtualization by system hypervisor 1496, graphics acceleration module 1446 may adhere to the following: 1) An application's job request must be autonomous (that is, state does not need to be maintained between jobs), or graphics acceleration module 1446 must provide a context save and restore mechanism. 2) An application's job request is guaranteed by graphics acceleration module 1446 to complete in a specified amount of time, including any translation faults, or graphics acceleration module 1446 provides an ability to preempt processing of a job. 3) Graphics acceleration module 1446 must be guaranteed fairness between processes when operating in a directed shared programming model.

In at least one embodiment, application 1480 is required to make an operating system 1495 system call with a graphics acceleration module 1446 type, a work descriptor (WD), an authority mask register (AMR) value, and a context save/restore area pointer (CSRP). In at least one embodiment, graphics acceleration module 1446 type describes a targeted acceleration function for a system call. In at least one embodiment, graphics acceleration module 1446 type may be a system-specific value. In at least one embodiment, WD is formatted specifically for graphics acceleration module 1446 and can be in a form of a graphics acceleration module 1446 command, an effective address pointer to a user-defined structure, an effective address pointer to a queue of commands, or any other data structure to describe work to be done by graphics acceleration module 1446. In one embodiment, an AMR value is an AMR state to use for a current process. In at least one embodiment, a value passed to an operating system is similar to an application setting an AMR. If accelerator integration circuit 1436 and graphics acceleration module 1446 implementations do not support a User Authority Mask Override Register (UAMOR), an operating system may apply a current UAMOR value to an AMR value before passing an AMR in a hypervisor call. Hypervisor 1496 may optionally apply a current Authority Mask Override Register (AMOR) value before placing an AMR into process element 1483. In at least one embodiment, CSRP is one of registers 1445 containing an effective address of an area in an application's address space 1482 for graphics acceleration module 1446 to save and restore context state. This pointer is optional if no state is required to be saved between jobs or when a job is preempted. In at least one embodiment, context save/restore area may be pinned system memory.

Upon receiving a system call, operating system 1495 may verify that application 1480 has registered and been given authority to use graphics acceleration module 1446. Operating system 1495 then calls hypervisor 1496 with information shown in Table 3.

TABLE 3

| OS to Hypervisor Call Parameters |
| --- |
| 1 A work descriptor (WD) |
| 2 An Authority Mask Register (AMR) value (potentially masked) |
| 3 An effective address (EA) Context Save/Restore Area Pointer (CSRP) |
| 4 A process ID (PID) and optional thread ID (TID) |
| 5 A virtual address (VA) accelerator utilization record pointer (AURP) |
| 6 Virtual address of storage segment table pointer (SSTP) |
| 7 A logical interrupt service number (LISN) |

Upon receiving a hypervisor call, hypervisor 1496 verifies that operating system 1495 has registered and been given authority to use graphics acceleration module 1446. Hypervisor 1496 then puts process element 1483 into a process element linked list for a corresponding graphics acceleration module 1446 type. A process element may include information shown in Table 4.

TABLE 4

| Process Element Information |
| --- |
| 1 A work descriptor (WD) |
| 2 An Authority Mask Register (AMR) value (potentially masked). |
| 3 An effective address (EA) Context Save/Restore Area Pointer (CSRP) |
| 4 A process ID (PID) and optional thread ID (TID) |
| 5 A virtual address (VA) accelerator utilization record pointer (AURP) |
| 6 Virtual address of storage segment table pointer (SSTP) |

TABLE 4-continued

| Process Element Information |
| --- |
| 7 A logical interrupt service number (LISN) |
| 8 Interrupt vector table, derived from hypervisor call parameters |
| 9 A state register (SR) value |
| 10 A logical partition ID (LPID) |
| 11 A real address (RA) hypervisor accelerator utilization record pointer |
| 12 Storage Descriptor Register (SDR) |

In at least one embodiment, hypervisor initializes a plurality of accelerator integration slice 1490 registers 1445.

Figure 14F:
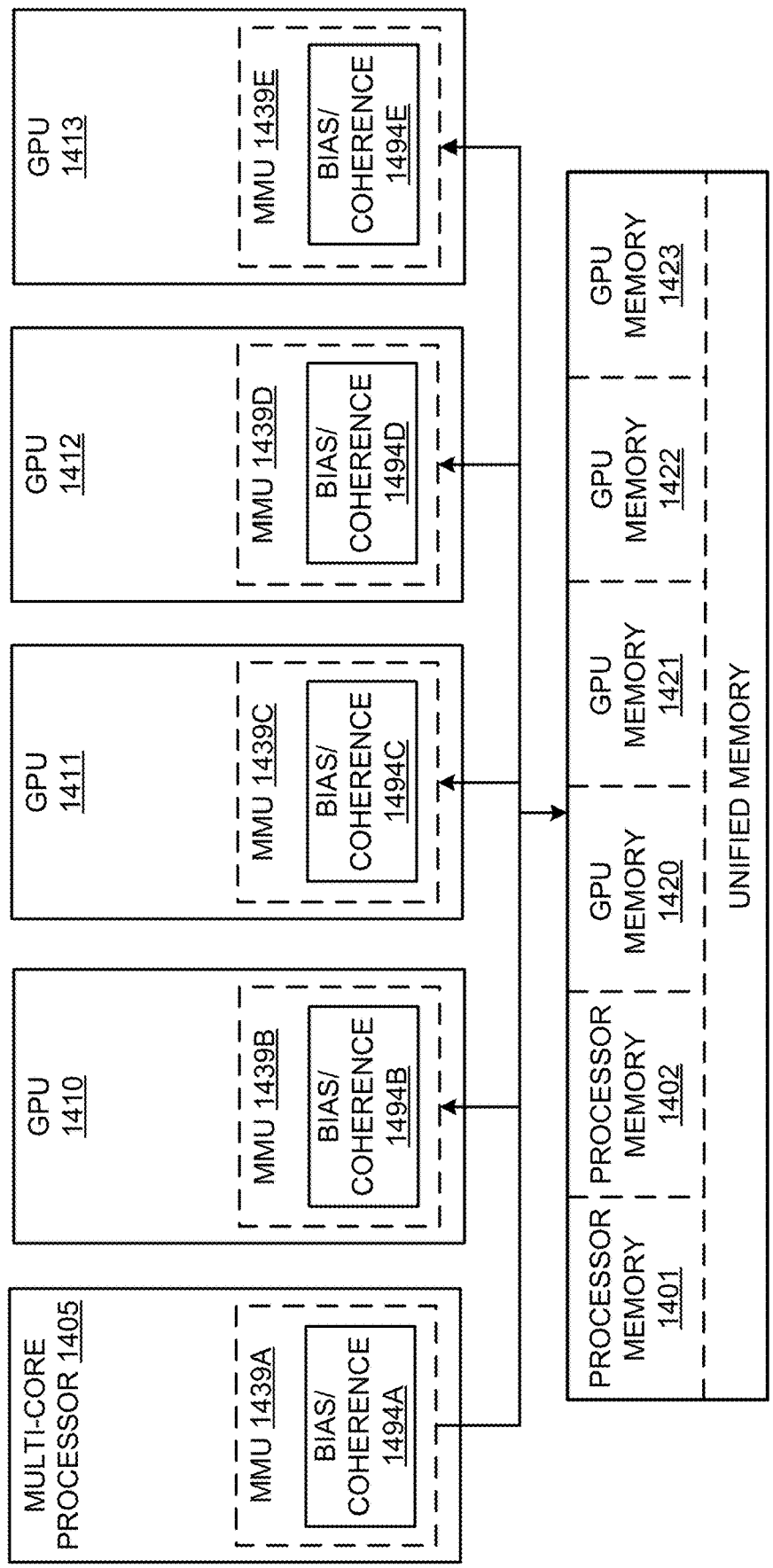

As illustrated in FIG. 14F, in at least one embodiment, a unified memory is used, addressable via a common virtual memory address space used to access physical processor memories 1401-1402 and GPU memories 1420-1423. In this implementation, operations executed on GPUs 1410-1413 utilize a same virtual/effective memory address space to access processor memories 1401-1402 and vice versa, thereby simplifying programmability. In one embodiment, a first portion of a virtual/effective address space is allocated to processor memory 1401, a second portion to second processor memory 1402, a third portion to GPU memory 1420, and so on. In at least one embodiment, an entire virtual/effective memory space (sometimes referred to as an effective address space) is thereby distributed across each of processor memories 1401-1402 and GPU memories 1420-1423, allowing any processor or GPU to access any physical memory with a virtual address mapped to that memory.

In one embodiment, bias/coherence management circuitry 1494A-1494E within one or more of MMUs 1439A-1439E ensures cache coherence between caches of one or more host processors (e.g., 1405) and GPUs 1410-1413 and implements biasing techniques indicating physical memories in which certain types of data should be stored. While multiple instances of bias/coherence management circuitry 1494A-1494E are illustrated in FIG. 14F, bias/coherence circuitry may be implemented within an MMU of one or more host processors 1405 and/or within accelerator integration circuit 1436.

One embodiment allows GPU-attached memory 1420-1423 to be mapped as part of system memory, and accessed using shared virtual memory (SVM) technology, but without suffering performance drawbacks associated with full system cache coherence. In at least one embodiment, an ability for GPU-attached memory 1420-1423 to be accessed as system memory without onerous cache coherence overhead provides a beneficial operating environment for GPU offload. This arrangement allows host processor 1405 software to setup operands and access computation results, without overhead of tradition I/O DMA data copies. Such traditional copies involve driver calls, interrupts and memory mapped I/O (MMIO) accesses that are all inefficient relative to simple memory accesses. In at least one embodiment, an ability to access GPU attached memory 1420-1423 without cache coherence overheads can be critical to execution time of an offloaded computation. In cases with substantial streaming write memory traffic, for example, cache coherence overhead can significantly reduce an effective write bandwidth seen by a GPU 1410-1413. In at least one embodiment, efficiency of operand setup, efficiency of results access, and efficiency of GPU computation may play a role in determining effectiveness of a GPU offload.

In at least one embodiment, selection of GPU bias and host processor bias is driven by a bias tracker data structure. A bias table may be used, for example, which may be a page-granular structure (i.e., controlled at a granularity of a memory page) that includes 1 or 2 bits per GPU-attached memory page. In at least one embodiment, a bias table may be implemented in a stolen memory range of one or more GPU-attached memories 1420-1423, with or without a bias cache in GPU 1410-1413 (e.g., to cache frequently/recently used entries of a bias table). Alternatively, an entire bias table may be maintained within a GPU.

In at least one embodiment, a bias table entry associated with each access to GPU-attached memory 1420-1423 is accessed prior to actual access to a GPU memory, causing the following operations. First, local requests from GPU 1410-1413 that find their page in GPU bias are forwarded directly to a corresponding GPU memory 1420-1423. Local requests from a GPU that find their page in host bias are forwarded to processor 1405 (e.g., over a high-speed link as discussed above). In one embodiment, requests from processor 1405 that find a requested page in host processor bias complete a request like a normal memory read. Alternatively, requests directed to a GPU-biased page may be forwarded to GPU 1410-1413. In at least one embodiment, a GPU may then transition a page to a host processor bias if it is not currently using a page. In at least one embodiment, bias state of a page can be changed either by a software-based mechanism, a hardware-assisted software-based mechanism, or, for a limited set of cases, a purely hardware-based mechanism.

One mechanism for changing bias state employs an API call (e.g. OpenCL), which, in turn, calls a GPU's device driver which, in turn, sends a message (or enqueues a command descriptor) to a GPU directing it to change a bias state and, for some transitions, perform a cache flushing operation in a host. In at least one embodiment, cache flushing operation is used for a transition from host processor 1405 bias to GPU bias, but is not for an opposite transition.

In one embodiment, cache coherency is maintained by temporarily rendering GPU-biased pages uncacheable by host processor 1405. To access these pages, processor 1405 may request access from GPU 1410 which may or may not grant access right away. Thus, to reduce communication between processor 1405 and GPU 1410 it is beneficial to ensure that GPU-biased pages are those which are required by a GPU but not host processor 1405 and vice versa.

Hardware structure(s) 815 are used to perform one or more embodiments. Details regarding the hardware structure (x) 815 are provided herein in conjunction with FIGS. 8A and/or 8B.

Figure 15:
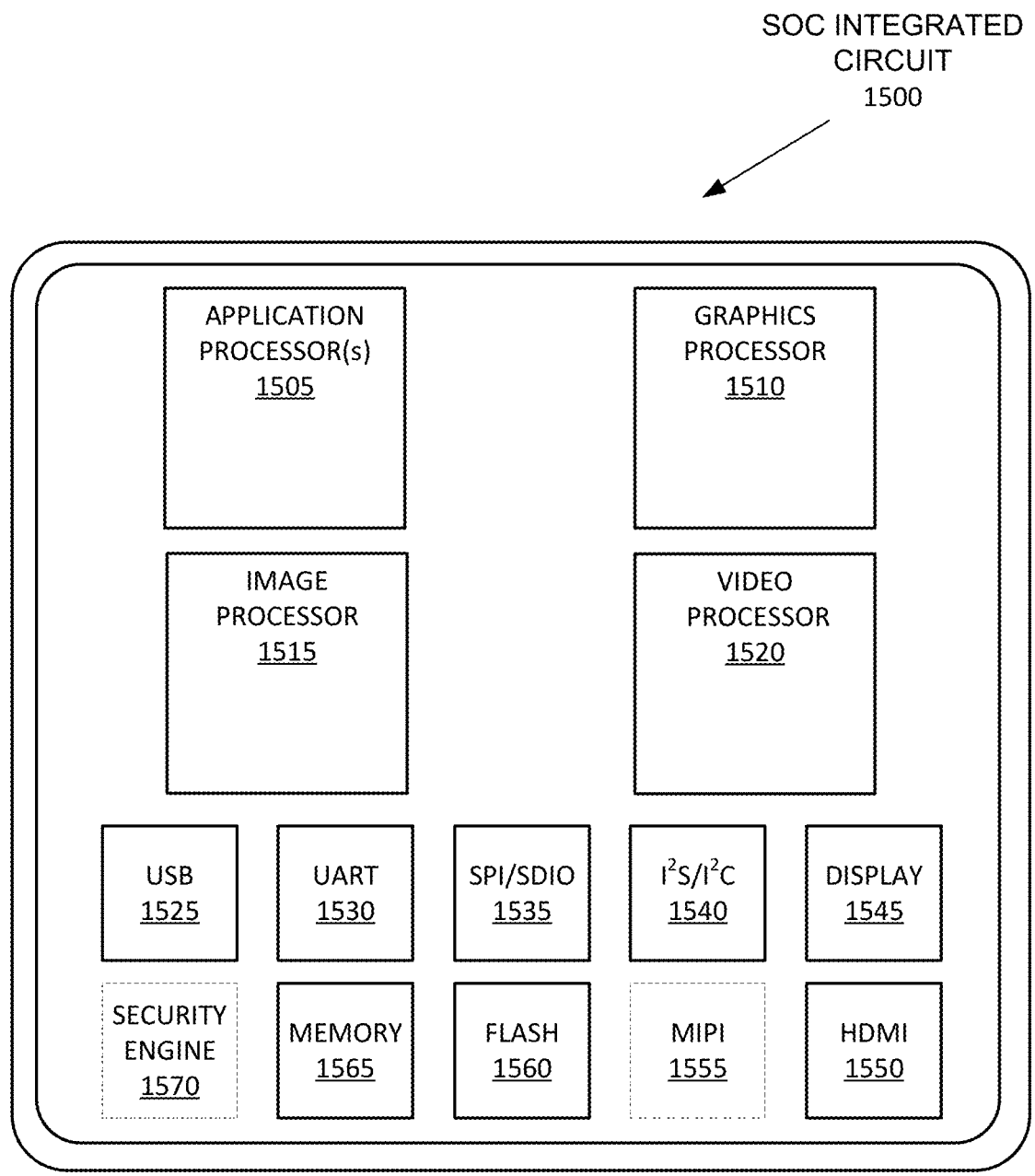
FIG. 15 illustrates exemplary integrated circuits and associated graphics processors, according to at least one embodiment.

FIG. 15 illustrates exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIG. 15 is a block diagram illustrating an exemplary system on a chip integrated circuit 1500 that may be fabricated using one or more IP cores, according to at least one embodiment. In at least one embodiment, integrated circuit 1500 includes one or more application processor(s) 1505 (e.g., CPUs), at least one graphics processor 1510, and may additionally include an image processor 1515 and/or a video processor 1520, any of which may be a modular IP core. In at least one embodiment, integrated circuit 1500 includes peripheral or bus logic including a USB controller 1525, UART controller 1530, an SPI/SDIO controller 1535, and an I.sup.2S/I.sup.2C controller 1540. In at least one embodiment, integrated circuit 1500 can include a display device 1545 coupled to one or more of a high-definition multimedia interface (HDMI) controller 1550 and a mobile industry processor interface (MIPI) display interface 1555. In at least one embodiment, storage may be provided by a flash memory subsystem 1560 including flash memory and a flash memory controller. In at least one embodiment, memory interface may be provided via a memory controller 1565 for access to SDRAM or SRAM memory devices. In at least one embodiment, some integrated circuits additionally include an embedded security engine 1570.

In at least one embodiment, one or more of application processor(s) 1505 or graphics processor 1510 decodes encoded data by distributed compressed parts of decoding information to processing units within a respective processor 1505 or graphics processor 1510, and combine results of such decoding to generate decoded data.

Figure 16A:
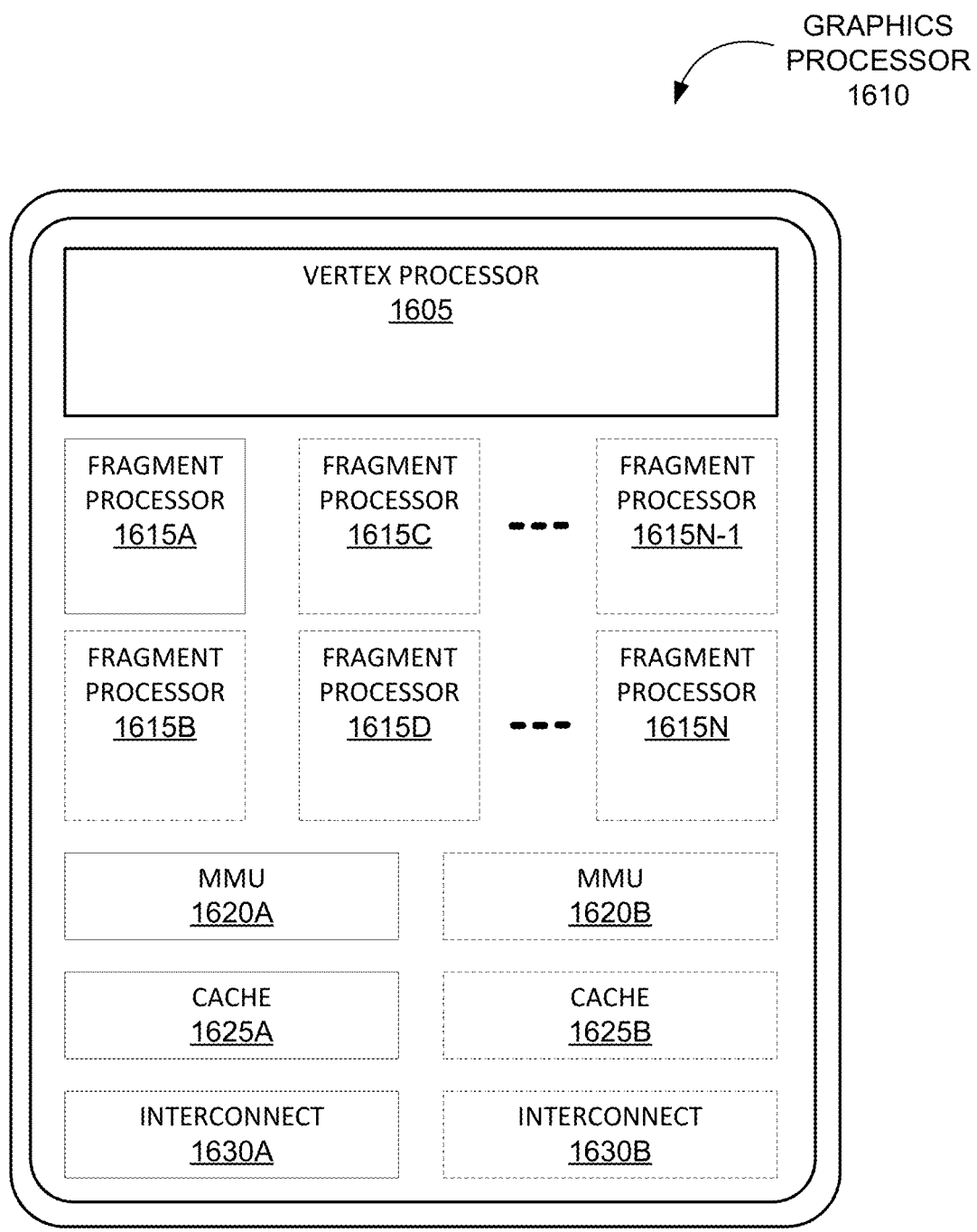
FIGS. 16A-16B illustrate exemplary integrated circuits and associated graphics processors, according to at least one embodiment.
Figure 16B:
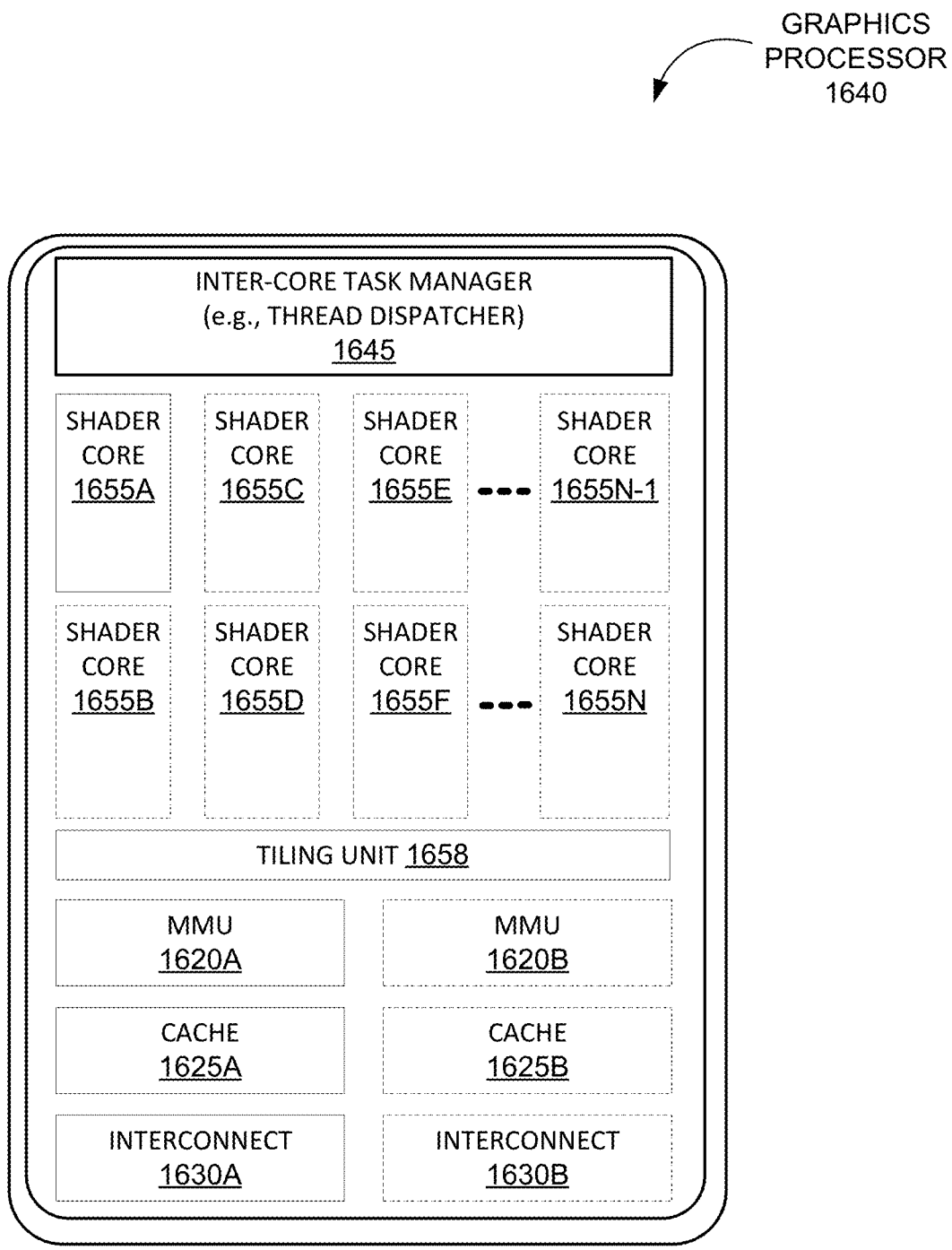

FIGS. 16A-16B illustrate exemplary integrated circuits and associated graphics processors that may be fabricated using one or more IP cores, according to various embodiments described herein. In addition to what is illustrated, other logic and circuits may be included in at least one embodiment, including additional graphics processors/cores, peripheral interface controllers, or general-purpose processor cores.

FIGS. 16A-16B are block diagrams illustrating exemplary graphics processors for use within an SoC, according to embodiments described herein. FIG. 16A illustrates an exemplary graphics processor 1610 of a system on a chip integrated circuit that may be fabricated using one or more IP cores, according to at least one embodiment. FIG. 16B illustrates an additional exemplary graphics processor 1640 of a system on a chip integrated circuit that may be fabricated using one or more IP cores, according to at least one embodiment. In at least one embodiment, graphics processor 1610 of FIG. 16A is a low power graphics processor core. In at least one embodiment, graphics processor 1640 of FIG. 16B is a higher performance graphics processor core. In at least one embodiment, each of graphics processors 1610, 1640 can be variants of graphics processor 1510 of FIG. 15.

In at least one embodiment, graphics processor 1610 includes a vertex processor 1605 and one or more fragment processor(s) 1615A-1615N (e.g., 1615A, 1615B, 1615C, 1615D, through 1615N-1, and 1615N). In at least one embodiment, graphics processor 1610 can execute different shader programs via separate logic, such that vertex processor 1605 is optimized to execute operations for vertex shader programs, while one or more fragment processor(s) 1615A-1615N execute fragment (e.g., pixel) shading operations for fragment or pixel shader programs. In at least one embodiment, vertex processor 1605 performs a vertex processing stage of a 3D graphics pipeline and generates primitives and vertex data. In at least one embodiment, fragment processor(s) 1615A-1615N use primitive and vertex data generated by vertex processor 1605 to produce a framebuffer that is displayed on a display device. In at least one embodiment, fragment processor(s) 1615A-1615N are optimized to execute fragment shader programs as provided for in an OpenGL API, which may be used to perform similar operations as a pixel shader program as provided for in a Direct 3D API.

In at least one embodiment, graphics processor 1610 additionally includes one or more memory management units (MMUs) 1620A-1620B, cache(s) 1625A-1625B, and circuit interconnect(s) 1630A-1630B. In at least one embodiment, one or more MMU(s) 1620A-1620B provide for virtual to physical address mapping for graphics processor 1610, including for vertex processor 1605 and/or fragment processor(s) 1615A-1615N, which may reference vertex or image/texture data stored in memory, in addition to vertex or image/texture data stored in one or more cache(s) 1625A-1625B. In at least one embodiment, one or more MMU(s) 1620A-1620B may be synchronized with other MMUs within system, including one or more MMUs associated with one or more application processor(s) 1505, image processors 1515, and/or video processors 1520 of FIG. 15, such that each processor 1505-1520 can participate in a shared or unified virtual memory system. In at least one embodiment, one or more circuit interconnect(s) 1630A-1630B enable graphics processor 1610 to interface with other IP cores within SoC, either via an internal bus of SoC or via a direct connection.

In at least one embodiment, graphics processor 1640 includes one or more MMU(s) 1620A-1620B, caches 1625A-1625B, and circuit interconnects 1630A-1630B of graphics processor 1610 of FIG. 16A. In at least one embodiment, graphics processor 1640 includes one or more shader core(s) 1655A-1655N (e.g., 1655A, 1655B, 1655C, 1655D, 1655E, 1655F, through 1655N-1, and 1655N), which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 1640 includes an inter-core task manager 1645, which acts as a thread dispatcher to dispatch execution threads to one or more shader cores 1655A-1655N and a tiling unit 1658 to accelerate tiling operations for tile-based rendering, in which rendering operations for a scene are subdivided in image space, for example to exploit local spatial coherence within a scene or to optimize use of internal caches.

In at least one embodiment, graphics processor 1610 decodes encoded data by distributing compressed parts of decoding information to fragment processors 1615, and combines results of such decoding.

Figure 17A:
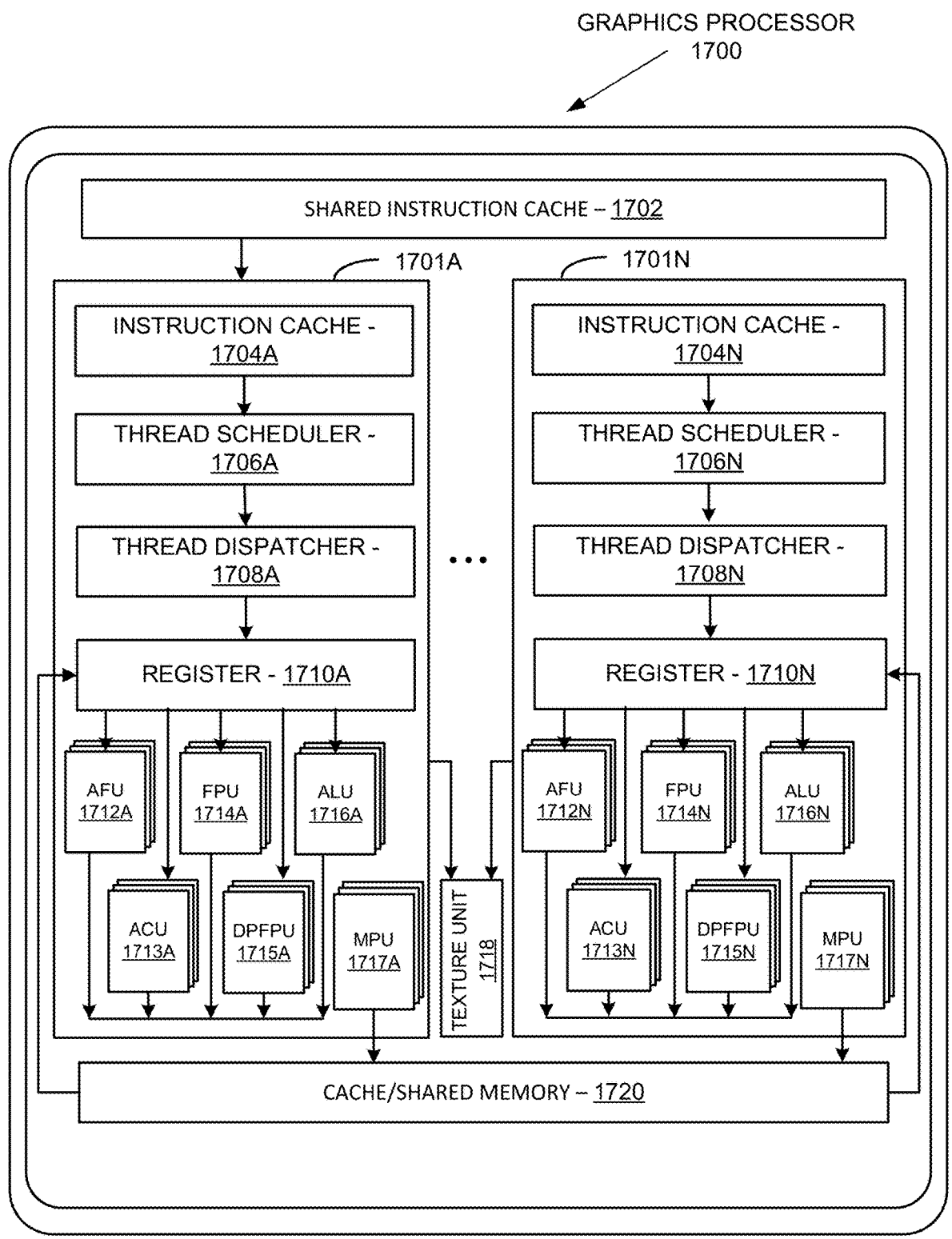
FIGS. 17A-17B illustrate additional exemplary graphics processor logic according to at least one embodiment.
Figure 17B:
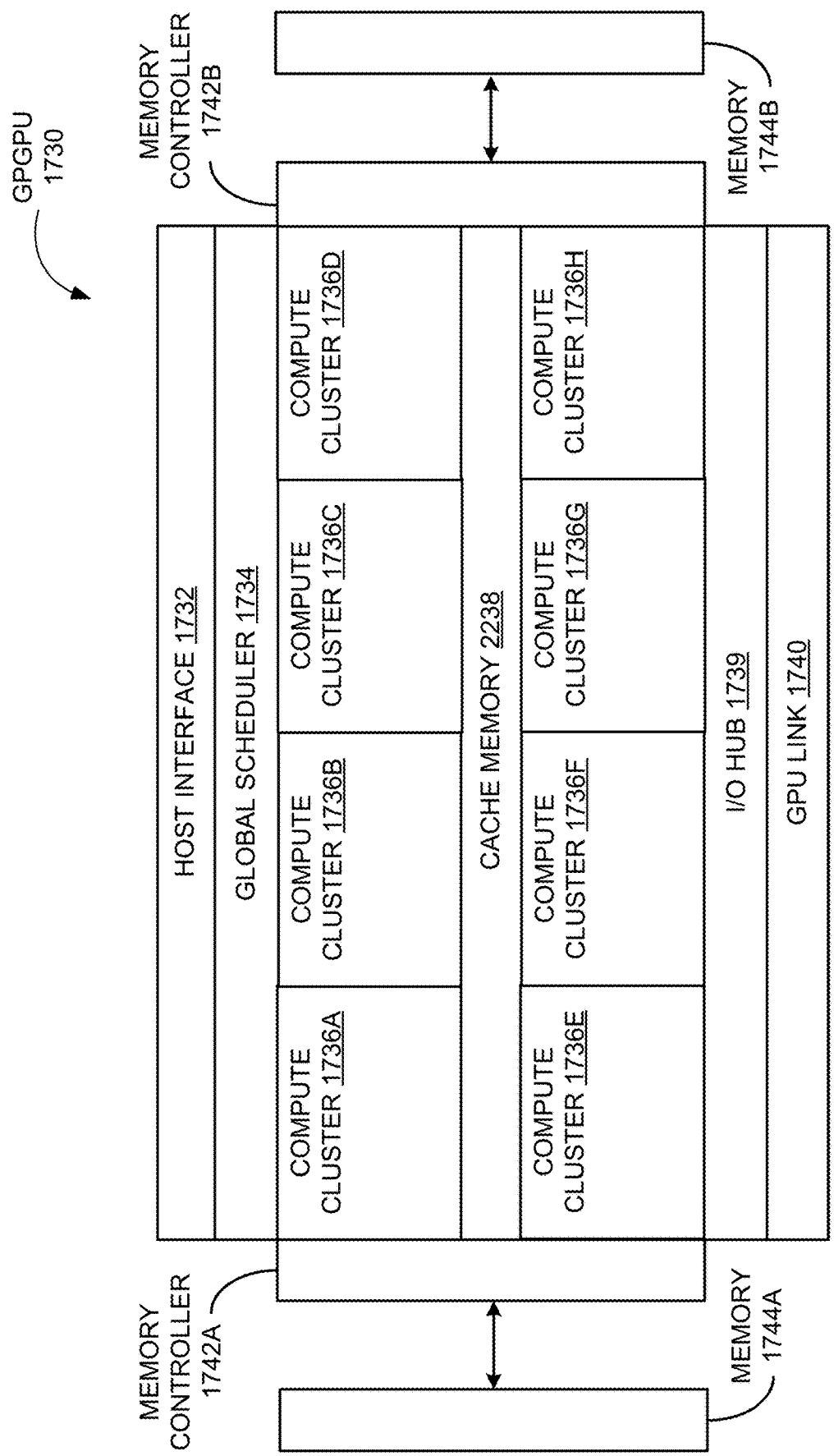

FIGS. 17A-17B illustrate additional exemplary graphics processor logic according to embodiments described herein. FIG. 17A illustrates a graphics core 1700 that may be included within graphics processor 1510 of FIG. 15, in at least one embodiment, and may be a unified shader core 1655A-1655N as in FIG. 16B in at least one embodiment. FIG. 17B illustrates a highly-parallel general-purpose graphics processing unit 1730 suitable for deployment on a multi-chip module in at least one embodiment.

In at least one embodiment, graphics core 1700 includes a shared instruction cache 1702, a texture unit 1718, and a cache/shared memory 1720 that are common to execution resources within graphics core 1700. In at least one embodiment, graphics core 1700 can include multiple slices 1701A-1701N or partition for each core, and a graphics processor can include multiple instances of graphics core 1700. Slices 1701A-1701N can include support logic including a local instruction cache 1704A-1704N, a thread scheduler 1706A-1706N, a thread dispatcher 1708A-1708N, and a set of registers 1710A-1710N. In at least one embodiment, slices 1701A-1701N can include a set of additional function units (AFUs 1712A-1712N), floating-point units (FPU 1714A-1714N), integer arithmetic logic units (ALUs 1716-1716N), address computational units (ACU 1713A-1713N), double-precision floating-point units (DPFPU 1715A-1715N), and matrix processing units (MPU 1717A-1717N).

In at least one embodiment, FPUs 1714A-1714N can perform single-precision (32-bit) and half-precision (16-bit) floating point operations, while DPFPUs 1715A-1715N perform double precision (64-bit) floating point operations. In at least one embodiment, ALUs 1716A-1716N can perform variable precision integer operations at 8-bit, 16-bit, and 32-bit precision, and can be configured for mixed precision operations. In at least one embodiment, MPUs 1717A-1717N can also be configured for mixed precision matrix operations, including half-precision floating point and 8-bit integer operations. In at least one embodiment, MPUs 1717-1717N can perform a variety of matrix operations to accelerate machine learning application frameworks, including enabling support for accelerated general matrix to matrix multiplication (GEMM). In at least one embodiment, AFUs 1712A-1712N can perform additional logic operations not supported by floating-point or integer units, including trigonometric operations (e.g., Sine, Cosine, etc.).

In at least one embodiment, graphics processor 1700 decodes encoded data by distributing compressed parts of decoding information to slices 1701A-N, and combines results of such decoding.

FIG. 17B illustrates a general-purpose processing unit (GPGPU) 1730 that can be configured to enable highly-parallel compute operations to be performed by an array of graphics processing units, in at least one embodiment. In at least one embodiment, GPGPU 1730 can be linked directly to other instances of GPGPU 1730 to create a multi-GPU cluster to improve training speed for deep neural networks. In at least one embodiment, GPGPU 1730 includes a host interface 1732 to enable a connection with a host processor. In at least one embodiment, host interface 1732 is a PCI Express interface. In at least one embodiment, host interface 1732 can be a vendor specific communications interface or communications fabric. In at least one embodiment, GPGPU 1730 receives commands from a host processor and uses a global scheduler 1734 to distribute execution threads associated with those commands to a set of compute clusters 1736A-1736H. In at least one embodiment, compute clusters 1736A-1736H share a cache memory 1738. In at least one embodiment, cache memory 1738 can serve as a higher-level cache for cache memories within compute clusters 1736A-1736H.

In at least one embodiment, GPGPU 1730 includes memory 1744A-1744B coupled with compute clusters 1736A-1736H via a set of memory controllers 1742A-1742B. In at least one embodiment, memory 1744A-1744B can include various types of memory devices including dynamic random access memory (DRAM) or graphics random access memory, such as synchronous graphics random access memory (SGRAM), including graphics double data rate (GDDR) memory.

In at least one embodiment, compute clusters 1736A-1736H each include a set of graphics cores, such as graphics core 1700 of FIG. 17A, which can include multiple types of integer and floating point logic units that can perform computational operations at a range of precisions including suited for machine learning computations. For example, in at least one embodiment, at least a subset of floating point units in each of compute clusters 1736A-1736H can be configured to perform 16-bit or 32-bit floating point operations, while a different subset of floating point units can be configured to perform 64-bit floating point operations.

In at least one embodiment, multiple instances of GPGPU 1730 can be configured to operate as a compute cluster. In at least one embodiment, communication used by compute clusters 1736A-1736H for synchronization and data exchange varies across embodiments. In at least one embodiment, multiple instances of GPGPU 1730 communicate over host interface 1732. In at least one embodiment, GPGPU 1730 includes an I/O hub 1739 that couples GPGPU 1730 with a GPU link 1740 that enables a direct connection to other instances of GPGPU 1730. In at least one embodiment, GPU link 1740 is coupled to a dedicated GPU-to-GPU bridge that enables communication and synchronization between multiple instances of GPGPU 1730. In at least one embodiment GPU link 1740 couples with a high speed interconnect to transmit and receive data to other GPGPUs or parallel processors. In at least one embodiment, multiple instances of GPGPU 1730 are located in separate data processing systems and communicate via a network device that is accessible via host interface 1732. In at least one embodiment GPU link 1740 can be configured to enable a connection to a host processor in addition to or as an alternative to host interface 1732.

In at least one embodiment, GPGPU 1730 can be configured to train neural networks. In at least one embodiment, GPGPU 1730 can be used within a inferencing platform. In at least one embodiment, in which GPGPU 1730 is used for inferencing, GPGPU may include fewer compute clusters 1736A-1736H relative to when GPGPU is used for training a neural network. In at least one embodiment, memory technology associated with memory 1744A-1744B may differ between inferencing and training configurations, with higher bandwidth memory technologies devoted to training configurations. In at least one embodiment, inferencing configuration of GPGPU 1730 can support inferencing specific instructions. For example, in at least one embodiment, an inferencing configuration can provide support for one or more 8-bit integer dot product instructions, which may be used during inferencing operations for deployed neural networks.

In at least one embodiment, GPGPU 1730 decodes encoded data by distributing compressed parts of decoding information to compute clusters 1736, and combines results of such decoding.

Figure 18:
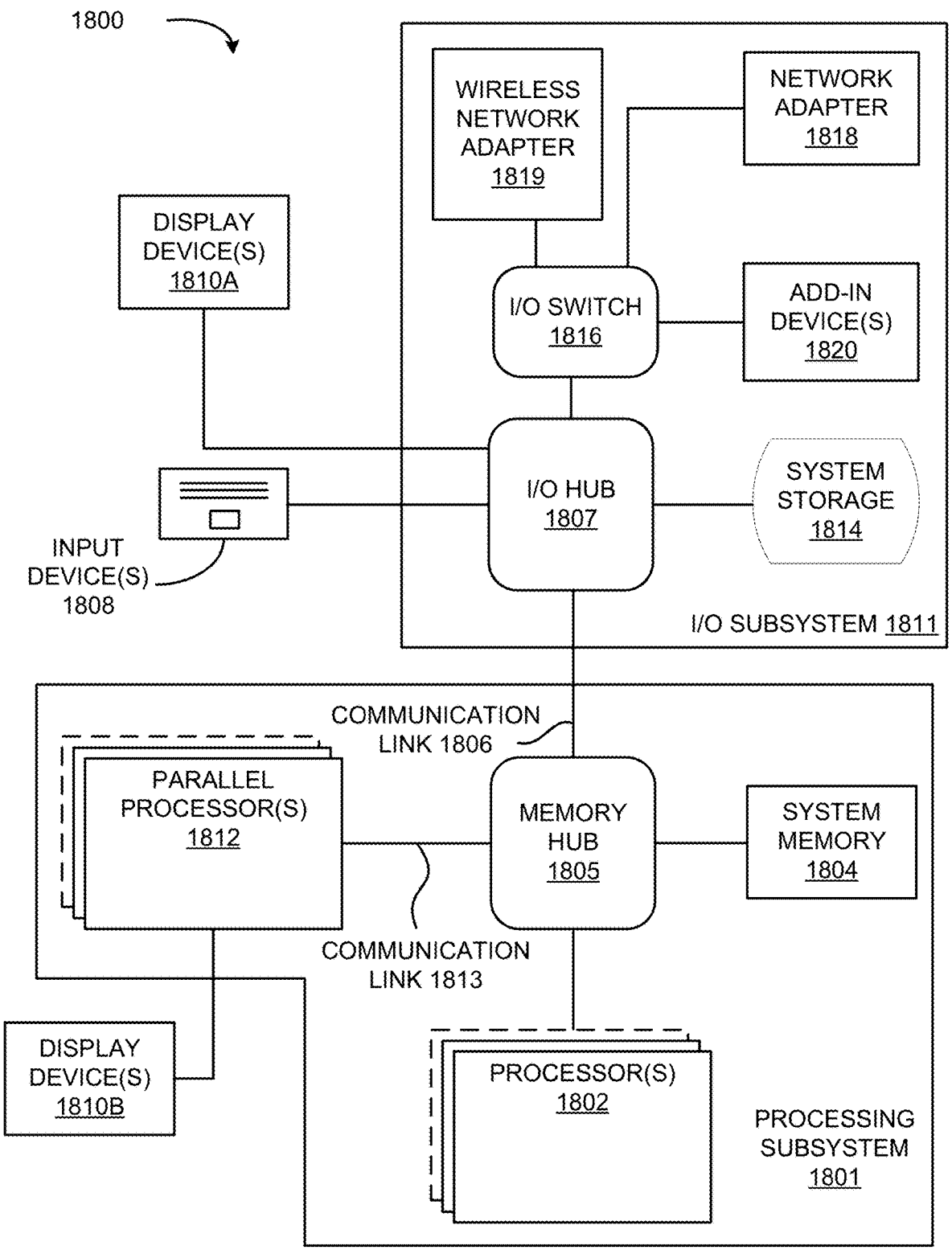
FIG. 18 illustrates a computer system, according to at least one embodiment.

FIG. 18 is a block diagram illustrating a computing system 1800 according to at least one embodiment. In at least one embodiment, computing system 1800 includes a processing subsystem 1801 having one or more processor(s) 1802 and a system memory 1804 communicating via an interconnection path that may include a memory hub 1805. In at least one embodiment, memory hub 1805 may be a separate component within a chipset component or may be integrated within one or more processor(s) 1802. In at least one embodiment, memory hub 1805 couples with an I/O subsystem 1811 via a communication link 1806. In at least one embodiment, I/O subsystem 1811 includes an I/O hub 1807 that can enable computing system 1800 to receive input from one or more input device(s) 1808. In at least one embodiment, I/O hub 1807 can enable a display controller, which may be included in one or more processor(s) 1802, to provide outputs to one or more display device(s) 1810A. In at least one embodiment, one or more display device(s) 1810A coupled with I/O hub 1807 can include a local, internal, or embedded display device.

In at least one embodiment, processing subsystem 1801 includes one or more parallel processor(s) 1812 coupled to memory hub 1805 via a bus or other communication link 1813. In at least one embodiment, communication link 1813 may be one of any number of standards based communication link technologies or protocols, such as, but not limited to PCI Express, or may be a vendor specific communications interface or communications fabric. In at least one embodiment, one or more parallel processor(s) 1812 form a computationally focused parallel or vector processing system that can include a large number of processing cores and/or processing clusters, such as a many integrated core (MIC) processor. In at least one embodiment, one or more parallel processor(s) 1812 form a graphics processing subsystem that can output pixels to one of one or more display device(s) 1810A coupled via I/O Hub 1807. In at least one embodiment, one or more parallel processor(s) 1812 can also include a display controller and display interface (not shown) to enable a direct connection to one or more display device(s) 1810B.

In at least one embodiment, a system storage unit 1814 can connect to I/O hub 1807 to provide a storage mechanism for computing system 1800. In at least one embodiment, an I/O switch 1816 can be used to provide an interface mechanism to enable connections between I/O hub 1807 and other components, such as a network adapter 1818 and/or wireless network adapter 1819 that may be integrated into platform, and various other devices that can be added via one or more add-in device(s) 1820. In at least one embodiment, network adapter 1818 can be an Ethernet adapter or another wired network adapter. In at least one embodiment, wireless network adapter 1819 can include one or more of a Wi-Fi, Bluetooth, near field communication (NFC), or other network device that includes one or more wireless radios.

In at least one embodiment, computing system 1800 can include other components not explicitly shown, including USB or other port connections, optical storage drives, video capture devices, and like, may also be connected to I/O hub 1807. In at least one embodiment, communication paths interconnecting various components in FIG. 18 may be implemented using any suitable protocols, such as PCI (Peripheral Component Interconnect) based protocols (e.g., PCI-Express), or other bus or point-to-point communication interfaces and/or protocol(s), such as NV-Link high-speed interconnect, or interconnect protocols.

In at least one embodiment, one or more parallel processor(s) 1812 incorporate circuitry optimized for graphics and video processing, including, for example, video output circuitry, and constitutes a graphics processing unit (GPU). In at least one embodiment, one or more parallel processor(s) 1812 incorporate circuitry optimized for general purpose processing. In at least embodiment, components of computing system 1800 may be integrated with one or more other system elements on a single integrated circuit. For example, in at least one embodiment, one or more parallel processor (s) 1812, memory hub 1805, processor(s) 1802, and I/O hub 1807 can be integrated into a system on chip (SoC) integrated circuit. In at least one embodiment, components of computing system 1800 can be integrated into a single package to form a system in package (SIP) configuration. In at least one embodiment, at least a portion of components of computing system 1800 can be integrated into a multi-chip module (MCM), which can be interconnected with other multi-chip modules into a modular computing system.

In at least one embodiment, processor(s) 1802 decode encoded data by distributing compressed parts of decoding information to parallel processor(s) 1812, and combining results of such decoding.

Processors

Figure 19A:
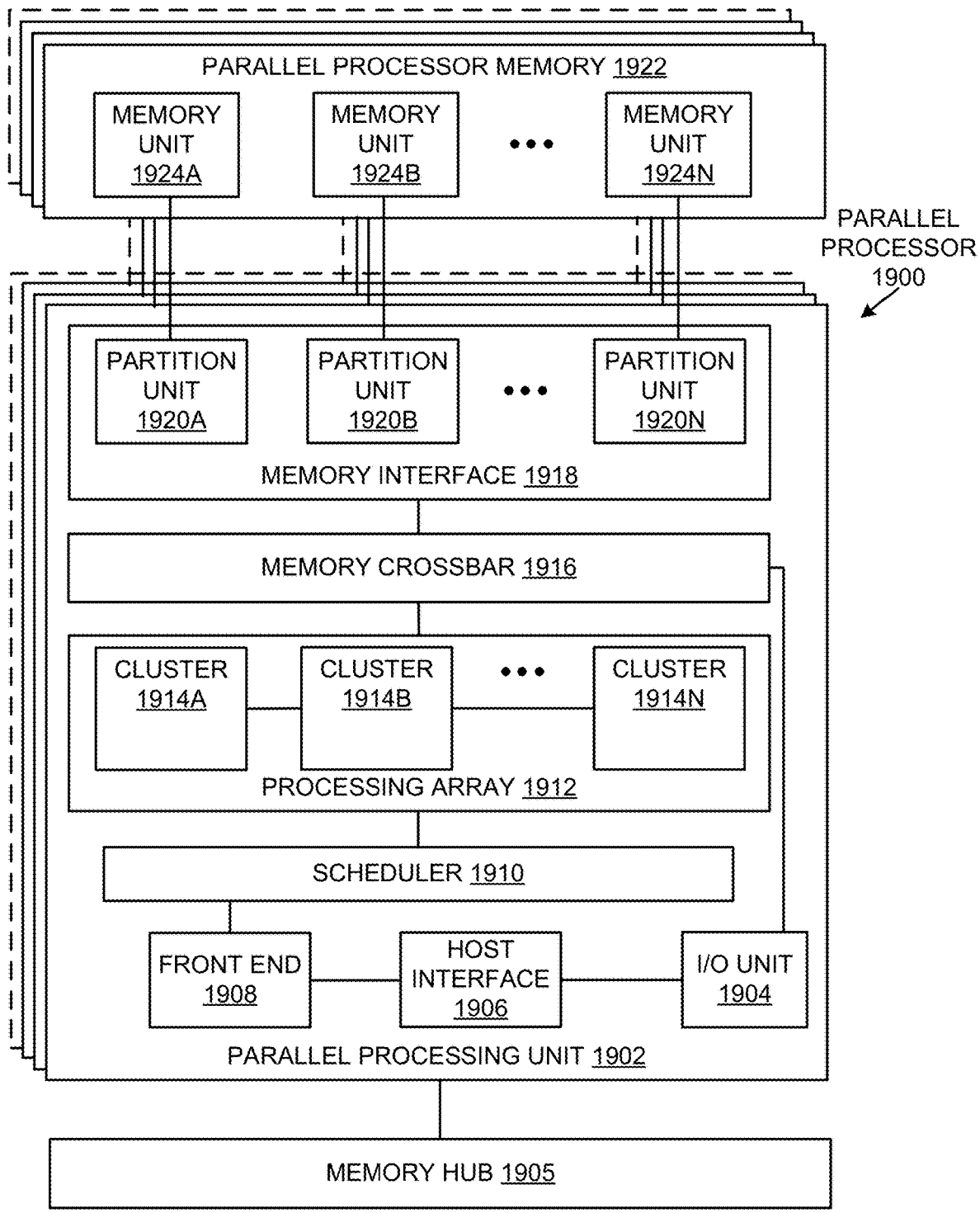
FIG. 19A illustrates a parallel processor, according to at least one embodiment.

FIG. 19A illustrates a parallel processor 1900 according to at least on embodiment. In at least one embodiment, various components of parallel processor 1900 may be implemented using one or more integrated circuit devices, such as programmable processors, application specific integrated circuits (ASICs), or field programmable gate arrays (FPGA). In at least one embodiment, illustrated parallel processor 1900 is a variant of one or more parallel processor(s) 1812 shown in FIG. 18 according to an exemplary embodiment.

In at least one embodiment, parallel processor 1900 includes a parallel processing unit 1902. In at least one embodiment, parallel processing unit 1902 includes an I/O unit 1904 that enables communication with other devices, including other instances of parallel processing unit 1902. In at least one embodiment, I/O unit 1904 may be directly connected to other devices. In at least one embodiment, I/O unit 1904 connects with other devices via use of a hub or switch interface, such as memory hub 1805. In at least one embodiment, connections between memory hub 1805 and I/O unit 1904 form a communication link 1813. In at least one embodiment, I/O unit 1904 connects with a host interface 1906 and a memory crossbar 1916, where host interface 1906 receives commands directed to performing processing operations and memory crossbar 1916 receives commands directed to performing memory operations.

In at least one embodiment, when host interface 1906 receives a command buffer via I/O unit 1904, host interface 1906 can direct work operations to perform those commands to a front end 1908. In at least one embodiment, front end 1908 couples with a scheduler 1910, which is configured to distribute commands or other work items to a processing cluster array 1912. In at least one embodiment, scheduler 1910 ensures that processing cluster array 1912 is properly configured and in a valid state before tasks are distributed to processing cluster array 1912 of processing cluster array 1912. In at least one embodiment, scheduler 1910 is implemented via firmware logic executing on a microcontroller. In at least one embodiment, microcontroller implemented scheduler 1910 is configurable to perform complex scheduling and work distribution operations at coarse and fine granularity, enabling rapid preemption and context switching of threads executing on processing array 1912. In at least one embodiment, host software can prove workloads for scheduling on processing array 1912 via one of multiple graphics processing doorbells. In at least one embodiment, workloads can then be automatically distributed across processing array 1912 by scheduler 1910 logic within a microcontroller including scheduler 1910.

In at least one embodiment, processing cluster array 1912 can include up to "N" processing clusters (e.g., cluster 1914A, cluster 1914B, through cluster 1914N). In at least one embodiment, each cluster 1914A-1914N of processing cluster array 1912 can execute a large number of concurrent threads. In at least one embodiment, scheduler 1910 can allocate work to clusters 1914A-1914N of processing cluster array 1912 using various scheduling and/or work distribution algorithms, which may vary depending on workload arising for each type of program or computation. In at least one embodiment, scheduling can be handled dynamically by scheduler 1910, or can be assisted in part by compiler logic during compilation of program logic configured for execution by processing cluster array 1912. In at least one embodiment, different clusters 1914A-1914N of processing cluster array 1912 can be allocated for processing different types of programs or for performing different types of computations.

In at least one embodiment, processing cluster array 1912 can be configured to perform various types of parallel processing operations. In at least one embodiment, processing cluster array 1912 is configured to perform general-purpose parallel compute operations. For example, in at least one embodiment, processing cluster array 1912 can include logic to execute processing tasks including filtering of video and/or audio data, performing modeling operations, including physics operations, and performing data transformations.

In at least one embodiment, processing cluster array 1912 is configured to perform parallel graphics processing operations. In at least one embodiment, processing cluster array 1912 can include additional logic to support execution of such graphics processing operations, including, but not limited to texture sampling logic to perform texture operations, as well as tessellation logic and other vertex processing logic. In at least one embodiment, processing cluster array 1912 can be configured to execute graphics processing related shader programs such as, but not limited to vertex shaders, tessellation shaders, geometry shaders, and pixel shaders. In at least one embodiment, parallel processing unit 1902 can transfer data from system memory via I/O unit 1904 for processing. In at least one embodiment, during processing, transferred data can be stored to on-chip memory (e.g., parallel processor memory 1922) during processing, then written back to system memory.

In at least one embodiment, when parallel processing unit 1902 is used to perform graphics processing, scheduler 1910 can be configured to divide a processing workload into approximately equal sized tasks, to better enable distribution of graphics processing operations to multiple clusters 1914A-1914N of processing cluster array 1912. In at least one embodiment, portions of processing cluster array 1912 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 1914A-1914N may be stored in buffers to allow intermediate data to be transmitted between clusters 1914A-1914N for further processing.

In at least one embodiment, processing cluster array 1912 can receive processing tasks to be executed via scheduler 1910, which receives commands defining processing tasks from front end 1908. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 1910 may be configured to fetch indices corresponding to tasks or may receive indices from front end 1908. In at least one embodiment, front end 1908 can be configured to ensure processing cluster array 1912 is configured to a valid state before a workload specified by incoming command buffers (e.g., batch-buffers, push buffers, etc.) is initiated.

In at least one embodiment, each of one or more instances of parallel processing unit 1902 can couple with parallel processor memory 1922. In at least one embodiment, parallel processor memory 1922 can be accessed via memory crossbar 1916, which can receive memory requests from processing cluster array 1912 as well as I/O unit 1904. In at least one embodiment, memory crossbar 1916 can access parallel processor memory 1922 via a memory interface 1918. In at least one embodiment, memory interface 1918 can include multiple partition units (e.g., partition unit 1920A, partition unit 1920B, through partition unit 1920N) that can each couple to a portion (e.g., memory unit) of parallel processor memory 1922. In at least one embodiment, a number of partition units 1920A-1920N is configured to be equal to a number of memory units, such that a first partition unit 1920A has a corresponding first memory unit 1924A, a second partition unit 1920B has a corresponding memory unit 1924B, and an Nth partition unit 1920N has a corresponding Nth memory unit 1924N. In at least one embodiment, a number of partition units 1920A-1920N may not be equal to a number of memory devices.

In at least one embodiment, memory units 1924A-1924N can include various types of memory devices, including dynamic random access memory (DRAM) or graphics random access memory, such as synchronous graphics random access memory (SGRAM), including graphics double data rate (GDDR) memory. In at least one embodiment, memory units 1924A-1924N may also include 3D stacked memory, including but not limited to high bandwidth memory (HBM). In at least one embodiment, render targets, such as frame buffers or texture maps may be stored across memory units 1924A-1924N, allowing partition units 1920A-1920N to write portions of each render target in parallel to efficiently use available bandwidth of parallel processor memory 1922. In at least one embodiment, a local instance of parallel processor memory 1922 may be excluded in favor of a unified memory design that utilizes system memory in conjunction with local cache memory.

In at least one embodiment, any one of clusters 1914A-1914N of processing cluster array 1912 can process data that will be written to any of memory units 1924A-1924N within parallel processor memory 1922. In at least one embodiment, memory crossbar 1916 can be configured to transfer an output of each cluster 1914A-1914N to any partition unit 1920A-1920N or to another cluster 1914A-1914N, which can perform additional processing operations on an output. In at least one embodiment, each cluster 1914A-1914N can communicate with memory interface 1918 through memory crossbar 1916 to read from or write to various external memory devices. In at least one embodiment, memory crossbar 1916 has a connection to memory interface 1918 to communicate with I/O unit 1904, as well as a connection to a local instance of parallel processor memory 1922, enabling processing units within different processing clusters 1914A-1914N to communicate with system memory or other memory that is not local to parallel processing unit 1902. In at least one embodiment, memory crossbar 1916 can use virtual channels to separate traffic streams between clusters 1914A-1914N and partition units 1920A-1920N.

In at least one embodiment, multiple instances of parallel processing unit 1902 can be provided on a single add-in card, or multiple add-in cards can be interconnected. In at least one embodiment, different instances of parallel processing unit 1902 can be configured to inter-operate even if different instances have different numbers of processing cores, different amounts of local parallel processor memory, and/or other configuration differences. For example, in at least one embodiment, some instances of parallel processing unit 1902 can include higher precision floating point units relative to other instances. In at least one embodiment, systems incorporating one or more instances of parallel processing unit 1902 or parallel processor 1900 can be implemented in a variety of configurations and form factors, including but not limited to desktop, laptop, or handheld personal computers, servers, workstations, game consoles, and/or embedded systems.

Figure 19B:
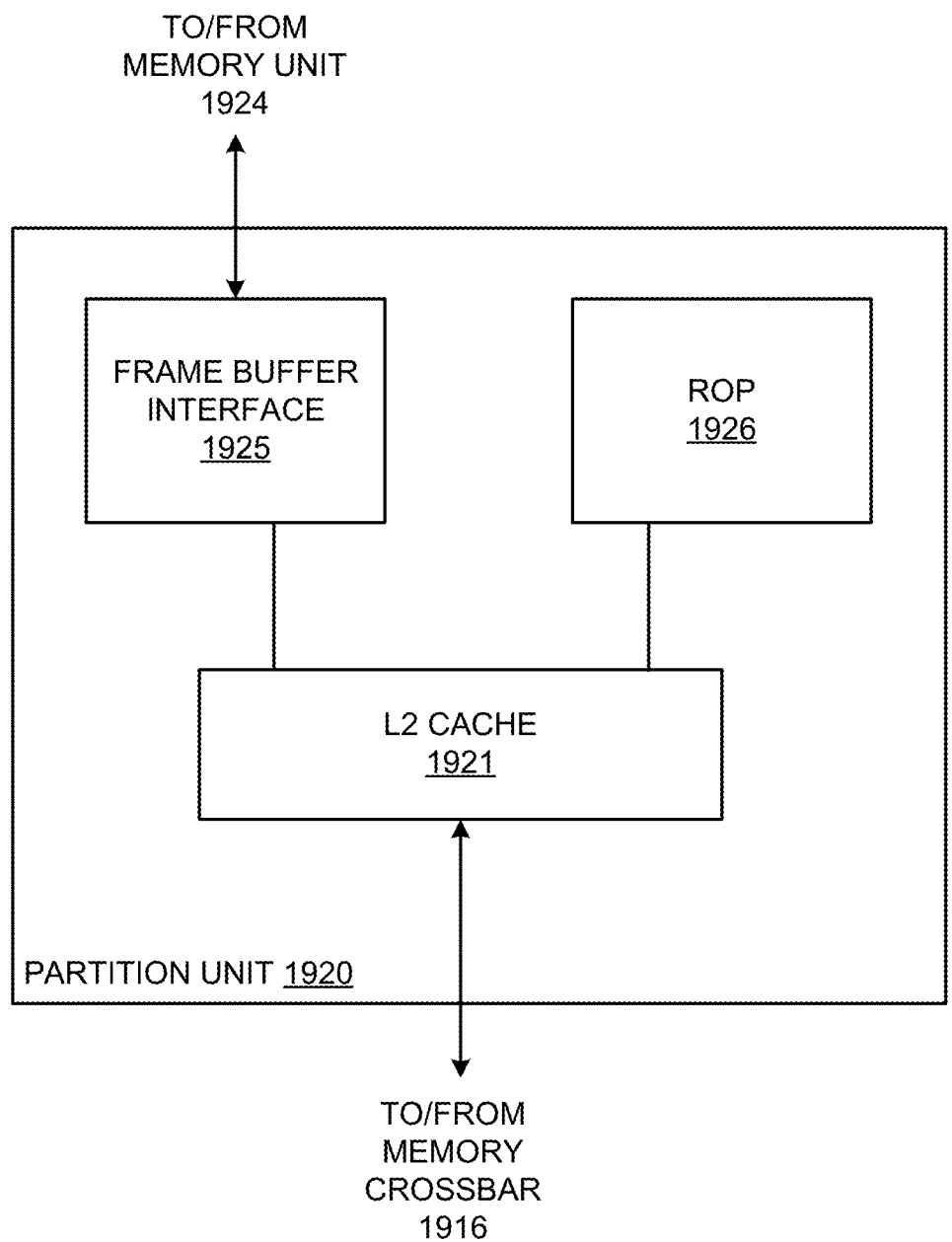
FIG. 19B illustrates a partition unit, according to at least one embodiment.

FIG. 19B is a block diagram of a partition unit 1920 according to at least one embodiment. In at least one embodiment, partition unit 1920 is an instance of one of partition units 1920A-1920N of FIG. 19A. In at least one embodiment, partition unit 1920 includes an L2 cache 1921, a frame buffer interface 1925, and a ROP 1926 (raster operations unit). L2 cache 1921 is a read/write cache that is configured to perform load and store operations received from memory crossbar 1916 and ROP 1926. In at least one embodiment, read misses and urgent write-back requests are output by L2 cache 1921 to frame buffer interface 1925 for processing. In at least one embodiment, updates can also be sent to a frame buffer via frame buffer interface 1925 for processing. In at least one embodiment, frame buffer interface 1925 interfaces with one of memory units in parallel processor memory, such as memory units 1924A-1924N of FIG. 19 (e.g., within parallel processor memory 1922).

In at least one embodiment, ROP 1926 is a processing unit that performs raster operations such as stencil, z test, blending, and like. In at least one embodiment, ROP 1926 then outputs processed graphics data that is stored in graphics memory. In at least one embodiment, ROP 1926 includes compression logic to compress depth or color data that is written to memory and decompress depth or color data that is read from memory. In at least one embodiment, compression logic can be lossless compression logic that makes use of one or more of multiple compression algorithms. type of compression that is performed by ROP 1926 can vary based on statistical characteristics of data to be compressed. For example, in at least one embodiment, delta color compression is performed on depth and color data on a per-tile basis.

In at least one embodiment, ROP 1926 is included within each processing cluster (e.g., cluster 1914A-1914N of FIG. 19) instead of within partition unit 1920. In at least one embodiment, read and write requests for pixel data are transmitted over memory crossbar 1916 instead of pixel fragment data. In at least one embodiment, processed graphics data may be displayed on a display device, such as one of one or more display device(s) 1810 of FIG. 18, routed for further processing by processor(s) 1802, or routed for further processing by one of processing entities within parallel processor 1900 of FIG. 19A.

Figure 19C:
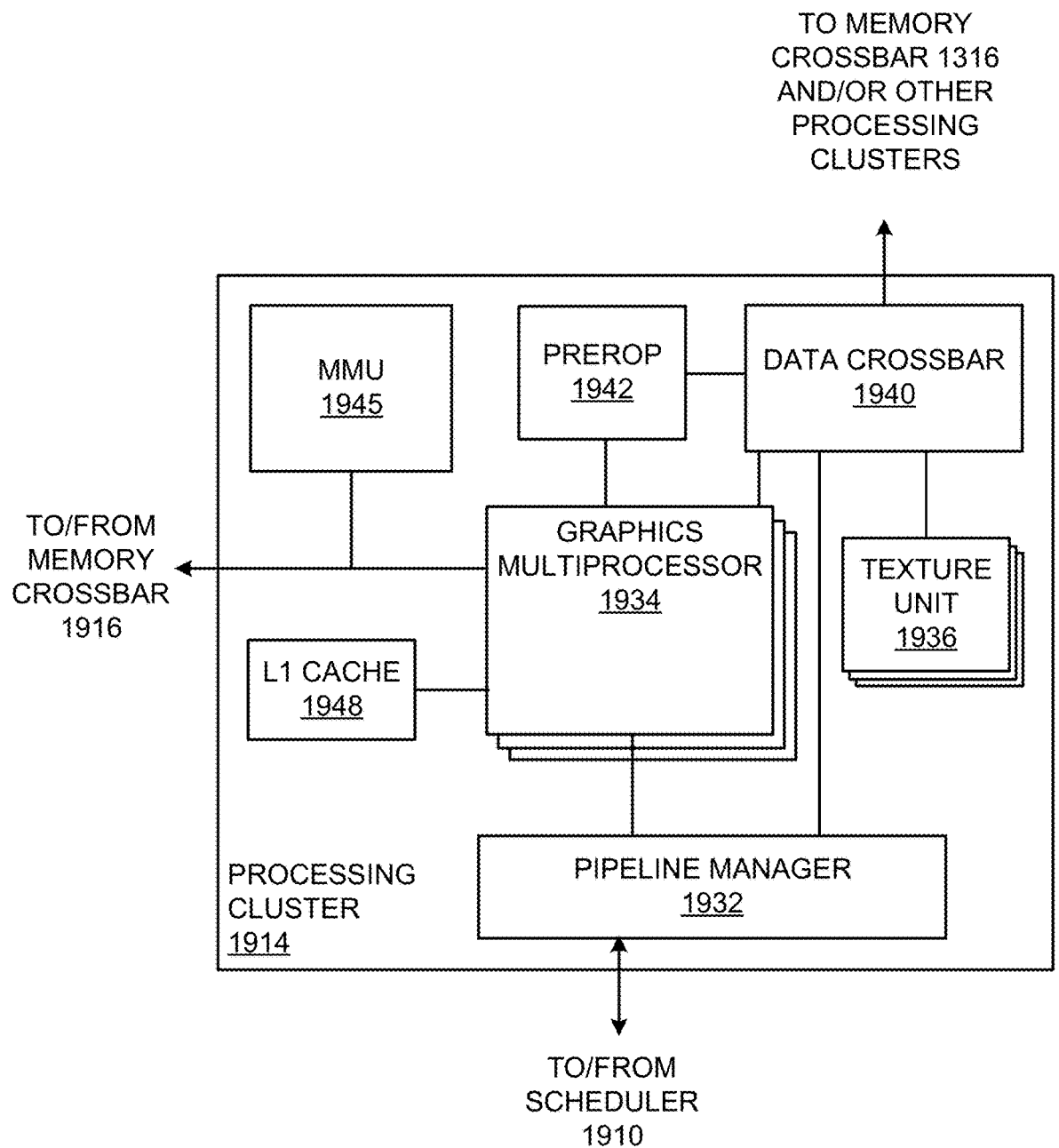
FIG. 19C illustrates a processing cluster, according to at least one embodiment.

FIG. 19C is a block diagram of a processing cluster 1914 within a parallel processing unit according to at least one embodiment. In at least one embodiment, a processing cluster is an instance of one of processing clusters 1914A-1914N of FIG. 19. In at least one embodiment, processing cluster 1914 can be configured to execute many threads in parallel, where term "thread" refers to an instance of a particular program executing on a particular set of input data. In at least one embodiment, single-instruction, multiple-data (SIMD) instruction issue techniques are used to support parallel execution of a large number of threads without providing multiple independent instruction units. In at least one embodiment, single-instruction, multiple-thread (SIMT) techniques are used to support parallel execution of a large number of generally synchronized threads, using a common instruction unit configured to issue instructions to a set of processing engines within each one of processing clusters.

In at least one embodiment, operation of processing cluster 1914 can be controlled via a pipeline manager 1932 that distributes processing tasks to SIMT parallel processors. In at least one embodiment, pipeline manager 1932 receives instructions from scheduler 1910 of FIG. 19 and manages execution of those instructions via a graphics multiprocessor 1934 and/or a texture unit 1936. In at least one embodiment, graphics multiprocessor 1934 is an exemplary instance of a SIMT parallel processor. However, in at least one embodiment, various types of SIMT parallel processors of differing architectures may be included within processing cluster 1914. In at least one embodiment, one or more instances of graphics multiprocessor 1934 can be included within a processing cluster 1914. In at least one embodiment, graphics multiprocessor 1934 can process data and a data crossbar 1940 can be used to distribute processed data to one of multiple possible destinations, including other shader units. In at least one embodiment, pipeline manager 1932 can facilitate distribution of processed data by specifying destinations for processed data to be distributed vis data crossbar 1940.

In at least one embodiment, each graphics multiprocessor 1934 within processing cluster 1914 can include an identical set of functional execution logic (e.g., arithmetic logic units, load-store units, etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 1914 constitute a thread. In at least one embodiment, a set of threads executing across a set of parallel processing engines is a thread group. In at least one embodiment, thread group executes a program on different input data. In at least one embodiment, each thread within a thread group can be assigned to a different processing engine within a graphics multiprocessor 1934. In at least one embodiment, a thread group may include fewer threads than a number of processing engines within graphics multiprocessor 1934. In at least one embodiment, when a thread group includes fewer threads than a number of processing engines, one or more of processing engines may be idle during cycles in which that thread group is being processed. In at least one embodiment, a thread group may also include more threads than a number of processing engines within graphics multiprocessor 1934. In at least one embodiment, when a thread group includes more threads than number of processing engines within graphics multiprocessor 1934, processing can be performed over consecutive clock cycles. In at least one embodiment, multiple thread groups can be executed concurrently on a graphics multiprocessor 1934.

In at least one embodiment, graphics multiprocessor 1934 includes an internal cache memory to perform load and store operations. In at least one embodiment, graphics multiprocessor 1934 can forego an internal cache and use a cache memory (e.g., L1 cache 1948) within processing cluster 1914. In at least one embodiment, each graphics multiprocessor 1934 also has access to L2 caches within partition units (e.g., partition units 1920A-1920N of FIG. 19) that are shared among all processing clusters 1914 and may be used to transfer data between threads. In at least one embodiment, graphics multiprocessor 1934 may also access off-chip global memory, which can include one or more of local parallel processor memory and/or system memory. In at least one embodiment, any memory external to parallel processing unit 1902 may be used as global memory. In at least one embodiment, processing cluster 1914 includes multiple instances of graphics multiprocessor 1934 can share common instructions and data, which may be stored in L1 cache 1948.

In at least one embodiment, each processing cluster 1914 may include an MMU 1945 (memory management unit) that is configured to map virtual addresses into physical addresses. In at least one embodiment, one or more instances of MMU 1945 may reside within memory interface 1918 of FIG. 19. In at least one embodiment, MMU 1945 includes a set of page table entries (PTEs) used to map a virtual address to a physical address of a tile (talk more about tiling) and optionally a cache line index. In at least one embodiment, MMU 1945 may include address translation lookaside buffers (TLB) or caches that may reside within graphics multiprocessor 1934 or L1 cache or processing cluster 1914. In at least one embodiment, physical address is processed to distribute surface data access locality to allow efficient request interleaving among partition units. In at least one embodiment, cache line index may be used to determine whether a request for a cache line is a hit or miss.

In at least one embodiment, a processing cluster 1914 may be configured such that each graphics multiprocessor 1934 is coupled to a texture unit 1936 for performing texture mapping operations, e.g., determining texture sample positions, reading texture data, and filtering texture data. In at least one embodiment, texture data is read from an internal texture L1 cache (not shown) or from an L1 cache within graphics multiprocessor 1934 and is fetched from an L2 cache, local parallel processor memory, or system memory, as needed. In at least one embodiment, each graphics multiprocessor 1934 outputs processed tasks to data crossbar 1940 to provide processed task to another processing cluster 1914 for further processing or to store processed task in an L2 cache, local parallel processor memory, or system memory via memory crossbar 1916. In at least one embodiment, preROP 1942 (pre-raster operations unit) is configured to receive data from graphics multiprocessor 1934, direct data to ROP units, which may be located with partition units as described herein (e.g., partition units 1920A-1920N of FIG. 19). In at least one embodiment, PreROP 1942 unit can perform optimizations for color blending, organize pixel color data, and perform address translations.

In at least one embodiment, processing cluster 1914 receives compressed parts of decoding information and performs partial decoding based on compressed parts of decoding information.

Figure 19D:
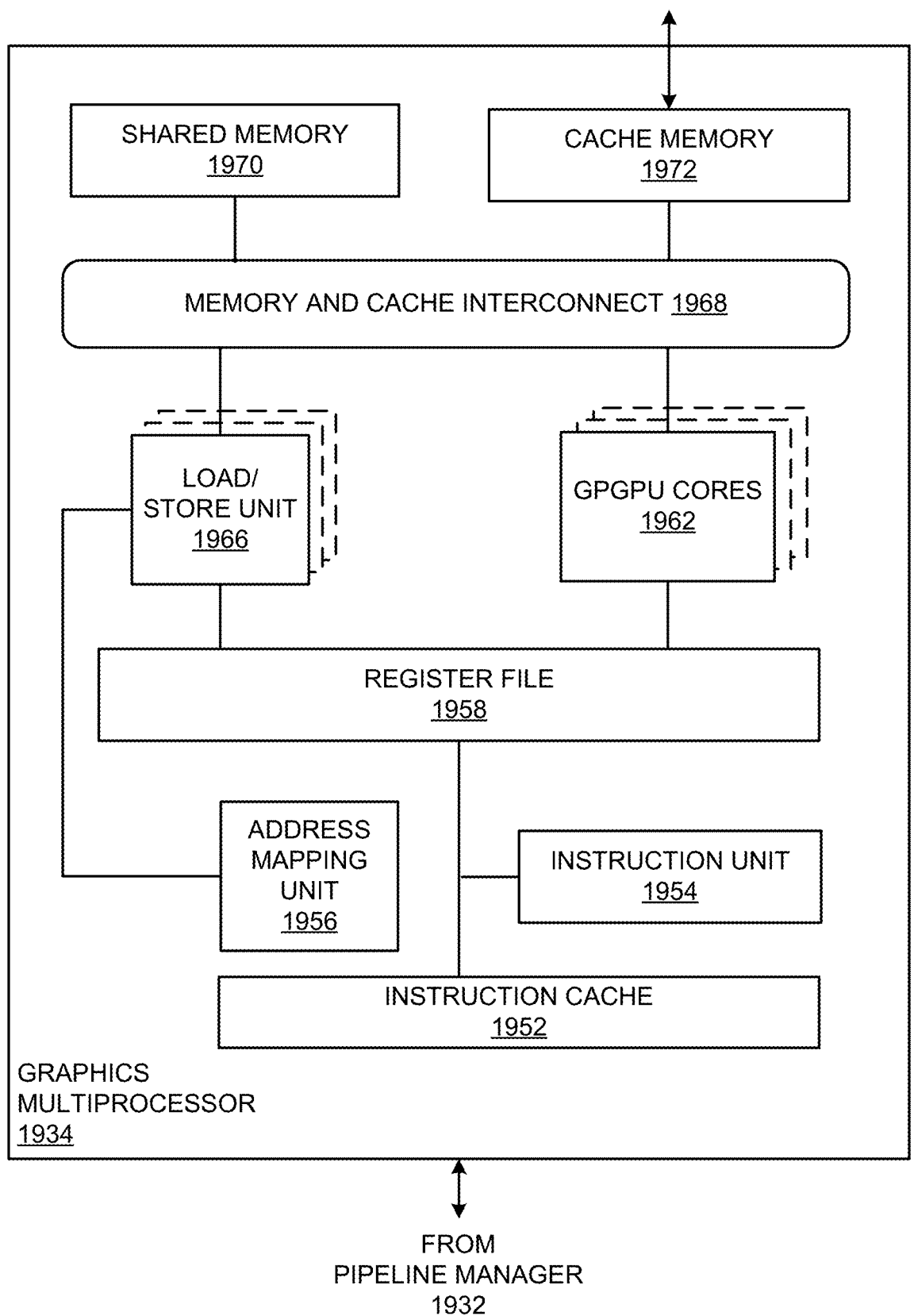
FIG. 19D illustrates a graphics multiprocessor, according to at least one embodiment.

FIG. 19D shows a graphics multiprocessor 1934 according to at least one embodiment. In at least one embodiment, graphics multiprocessor 1934 couples with pipeline manager 1932 of processing cluster 1914. In at least one embodiment, graphics multiprocessor 1934 has an execution pipeline including but not limited to an instruction cache 1952, an instruction unit 1954, an address mapping unit 1956, a register file 1958, one or more general purpose graphics processing unit (GPGPU) cores 1962, and one or more load/store units 1966. GPGPU cores 1962 and load/store units 1966 are coupled with cache memory 1972 and shared memory 1970 via a memory and cache interconnect 1968.

In at least one embodiment, instruction cache 1952 receives a stream of instructions to execute from pipeline manager 1932. In at least one embodiment, instructions are cached in instruction cache 1952 and dispatched for execution by instruction unit 1954. In at least one embodiment, instruction unit 1954 can dispatch instructions as thread groups (e.g., warps), with each thread of thread group assigned to a different execution unit within GPGPU core 1962. In at least one embodiment, an instruction can access any of a local, shared, or global address space by specifying an address within a unified address space. In at least one embodiment, address mapping unit 1956 can be used to translate addresses in a unified address space into a distinct memory address that can be accessed by load/store units 1966.

In at least one embodiment, register file 1958 provides a set of registers for functional units of graphics multiprocessor 1934. In at least one embodiment, register file 1958 provides temporary storage for operands connected to data paths of functional units (e.g., GPGPU cores 1962, load/store units 1966) of graphics multiprocessor 1934. In at least one embodiment, register file 1958 is divided between each of functional units such that each functional unit is allocated a dedicated portion of register file 1958. In at least one embodiment, register file 1958 is divided between different warps being executed by graphics multiprocessor 1934.

In at least one embodiment, GPGPU cores 1962 can each include floating point units (FPUs) and/or integer arithmetic logic units (ALUs) that are used to execute instructions of graphics multiprocessor 1934. GPGPU cores 1962 can be similar in architecture or can differ in architecture. In at least one embodiment, a first portion of GPGPU cores 1962 include a single precision FPU and an integer ALU while a second portion of GPGPU cores include a double precision FPU. In at least one embodiment, FPUs can implement IEEE 754-2008 standard for floating point arithmetic or enable variable precision floating point arithmetic. In at least one embodiment, graphics multiprocessor 1934 can additionally include one or more fixed function or special function units to perform specific functions such as copy rectangle or pixel blending operations. In at least one embodiment one or more of GPGPU cores can also include fixed or special function logic.

In at least one embodiment, GPGPU cores 1962 include SIMD logic capable of performing a single instruction on multiple sets of data. In at least one embodiment GPGPU cores 1962 can physically execute SIMD4, SIMD8, and SIMD16 instructions and logically execute SIMD1, SIMD2, and SIMD32 instructions. In at least one embodiment, SIMD instructions for GPGPU cores can be generated at compile time by a shader compiler or automatically generated when executing programs written and compiled for single program multiple data (SPMD) or SIMT architectures. In at least one embodiment, multiple threads of a program configured for an SIMT execution model can executed via a single SIMD instruction. For example, in at least one embodiment, eight SIMT threads that perform same or similar operations can be executed in parallel via a single SIMD8 logic unit.

In at least one embodiment, memory and cache interconnect 1968 is an interconnect network that connects each functional unit of graphics multiprocessor 1934 to register file 1958 and to shared memory 1970. In at least one embodiment, memory and cache interconnect 1968 is a crossbar interconnect that allows load/store unit 1966 to implement load and store operations between shared memory 1970 and register file 1958. In at least one embodiment, register file 1958 can operate at a same frequency as GPGPU cores 1962, thus data transfer between GPGPU cores 1962 and register file 1958 is very low latency. In at least one embodiment, shared memory 1970 can be used to enable communication between threads that execute on functional units within graphics multiprocessor 1934. In at least one embodiment, cache memory 1972 can be used as a data cache for example, to cache texture data communicated between functional units and texture unit 1936. In at least one embodiment, shared memory 1970 can also be used as a program managed cached. In at least one embodiment, threads executing on GPGPU cores 1962 can programmatically store data within shared memory in addition to automatically cached data that is stored within cache memory 1972.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, GPU may be communicatively coupled to host processor/cores over a bus or other interconnect (e.g., a high speed interconnect such as PCIe or NVLink). In at least one embodiment, GPU may be integrated on same package or chip as cores and communicatively coupled to cores over an internal processor bus/interconnect (i.e., internal to package or chip). In at least one embodiment, regardless of manner in which GPU is connected, processor cores may allocate work to GPU in form of sequences of commands/instructions contained in a work descriptor. In at least one embodiment, GPU then uses dedicated circuitry/logic for efficiently processing these commands/instructions.

In at least one embodiment, GPGPU cores 1962 receive compressed parts of decoding information and use the compressed parts to perform partial decoding.

Figure 20:
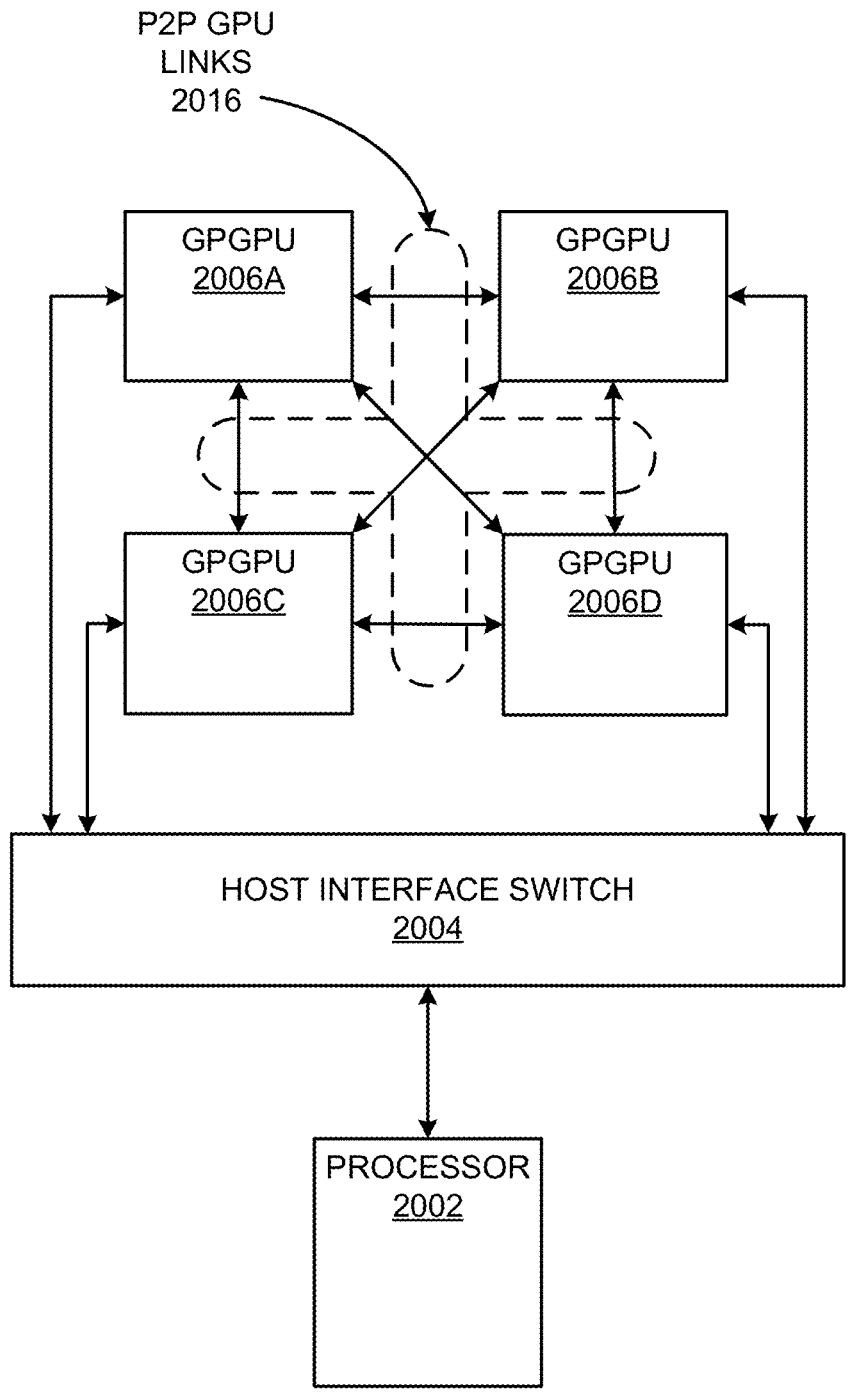
FIG. 20 illustrates a multi-graphics processing unit (GPU) system, according to at least one embodiment.

FIG. 20 illustrates a multi-GPU computing system 2000, according to at least one embodiment. In at least one embodiment, multi-GPU computing system 2000 can include a processor 2002 coupled to multiple general purpose graphics processing units (GPGPUs) 2006A-D via a host interface switch 2004. In at least one embodiment, host interface switch 2004 is a PCI express switch device that couples processor 2002 to a PCI express bus over which processor 2002 can communicate with GPGPUs 2006A-D. GPGPUs 2006A-D can interconnect via a set of high-speed point to point GPU to GPU links 2016. In at least one embodiment, GPU to GPU links 2016 connect to each of GPGPUs 2006A-D via a dedicated GPU link. In at least one embodiment, P2P GPU links 2016 enable direct communication between each of GPGPUs 2006A-D without requiring communication over host interface bus 2004 to which processor 2002 is connected. In at least one embodiment, with GPU-to-GPU traffic directed to P2P GPU links 2016, host interface bus 2004 remains available for system memory access or to communicate with other instances of multi-GPU computing system 2000, for example, via one or more network devices. While in at least one embodiment GPGPUs 2006A-D connect to processor 2002 via host interface switch 2004, in at least one embodiment processor 2002 includes direct support for P2P GPU links 2016 and can connect directly to GPGPUs 2006A-D.

In at least one embodiment, GPGPU(s) 2006 receives compressed parts of decoding information and performs partial decoding based on compressed parts of decoding information.

Figure 21:
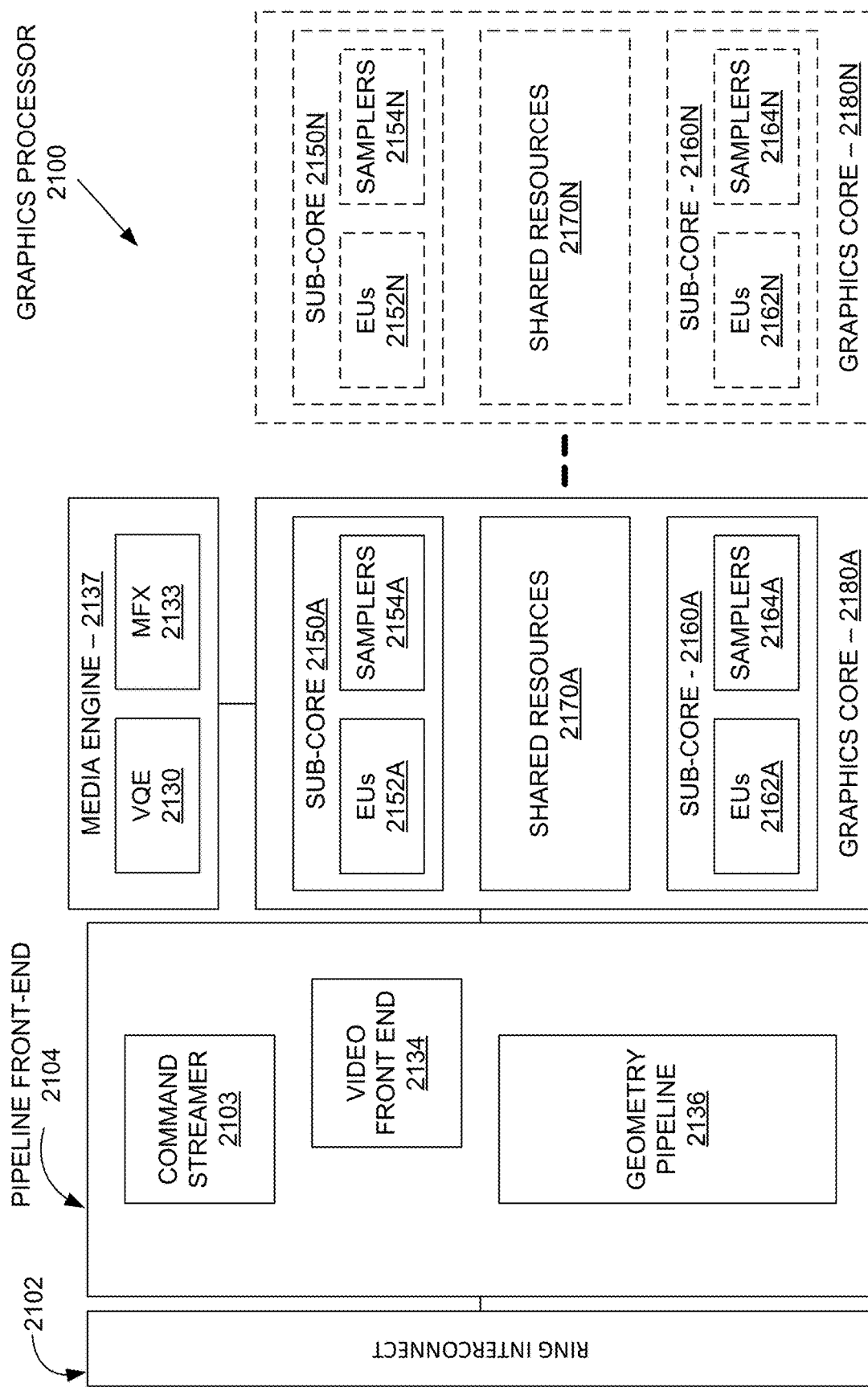
FIG. 21 illustrates a graphics processor, according to at least one embodiment.

FIG. 21 is a block diagram of a graphics processor 2100, according to at least one embodiment. In at least one embodiment, graphics processor 2100 includes a ring interconnect 2102, a pipeline front-end 2104, a media engine 2137, and graphics cores 2180A-2180N. In at least one embodiment, ring interconnect 2102 couples graphics processor 2100 to other processing units, including other graphics processors or one or more general-purpose processor cores. In at least one embodiment, graphics processor 2100 is one of many processors integrated within a multi-core processing system.

In at least one embodiment, graphics processor 2100 receives batches of commands via ring interconnect 2102. In at least one embodiment, incoming commands are interpreted by a command streamer 2103 in pipeline front-end 2104. In at least one embodiment, graphics processor 2100 includes scalable execution logic to perform 3D geometry processing and media processing via graphics core(s) 2180A-2180N. In at least one embodiment, for 3D geometry processing commands, command streamer 2103 supplies commands to geometry pipeline 2136. In at least one embodiment, for at least some media processing commands, command streamer 2103 supplies commands to a video front end 2134, which couples with a media engine 2137. In at least one embodiment, media engine 2137 includes a Video Quality Engine (VQE) 2130 for video and image post-processing and a multi-format encode/decode (MFX) 2133 engine to provide hardware-accelerated media data encode and decode. In at least one embodiment, geometry pipeline 2136 and media engine 2137 each generate execution threads for thread execution resources provided by at least one graphics core 2180A.

In at least one embodiment, graphics processor 2100 includes scalable thread execution resources featuring modular cores 2180A-2180N (sometimes referred to as core slices), each having multiple sub-cores 2150A-550N, 2160A-2160N (sometimes referred to as core sub-slices). In at least one embodiment, graphics processor 2100 can have any number of graphics cores 2180A through 2180N. In at least one embodiment, graphics processor 2100 includes a graphics core 2180A having at least a first sub-core 2150A and a second sub-core 2160A. In at least one embodiment, graphics processor 2100 is a low power processor with a single sub-core (e.g., 2150A). In at least one embodiment, graphics processor 2100 includes multiple graphics cores 2180A-2180N, each including a set of first sub-cores 2150A-2150N and a set of second sub-cores 2160A-2160N. In at least one embodiment, each sub-core in first sub-cores 2150A-2150N includes at least a first set of execution units 2152A-2152N and media/texture samplers 2154A-2154N. In at least one embodiment, each sub-core in second sub-cores 2160A-2160N includes at least a second set of execution units 2162A-2162N and samplers 2164A-2164N. In at least one embodiment, each sub-core 2150A-2150N, 2160A-2160N shares a set of shared resources 2170A-2170N. In at least one embodiment, shared resources include shared cache memory and pixel operation logic.

In at least one embodiment, graphics cores 2180 receive compressed parts of decoding information and performs partial decoding based on compressed parts of decoding information.

Figure 22:
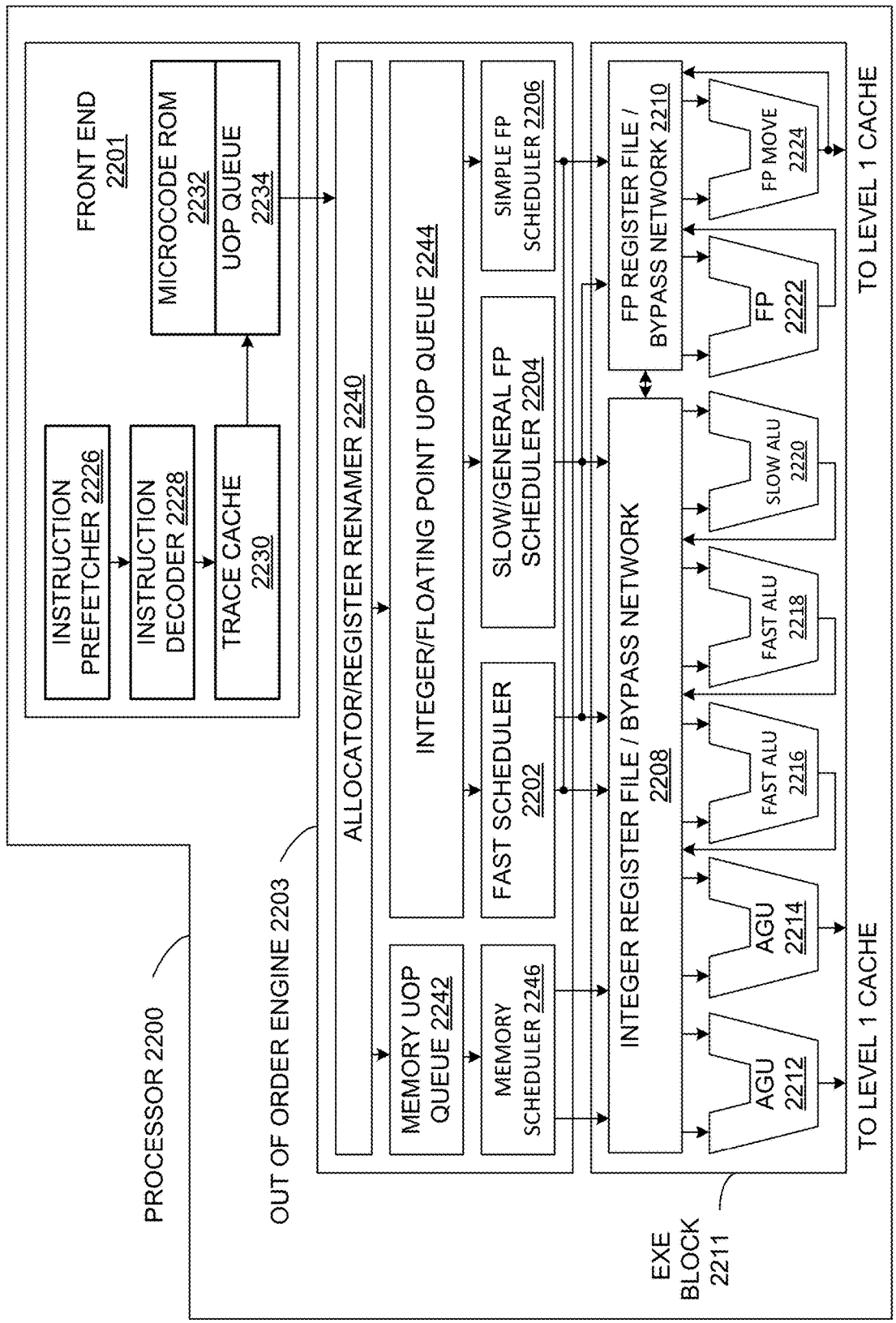
FIG. 22 is a block diagram illustrating a processor micro-architecture for a processor, according to at least one embodiment.

FIG. 22 is a block diagram illustrating micro-architecture for a processor 2200 that may include logic circuits to perform instructions, according to at least one embodiment. In at least one embodiment, processor 2200 may perform instructions, including x86 instructions, ARM instructions, specialized instructions for application-specific integrated circuits (ASICs), etc. In at least one embodiment, processor 2210 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany single instruction, multiple data ("SIMD") and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processors 2210 may perform instructions to accelerate machine learning or deep learning algorithms, training, or inferencing.

In at least one embodiment, processor 2200 includes an in-order front end ("front end") 2201 to fetch instructions to be executed and prepare instructions to be used later in processor pipeline. In at least one embodiment, front end 2201 may include several units. In at least one embodiment, an instruction prefetcher 2226 fetches instructions from memory and feeds instructions to an instruction decoder 2228 which in turn decodes or interprets instructions. For example, in at least one embodiment, instruction decoder 2228 decodes a received instruction into one or more operations called "micro-instructions" or "micro-operations" (also called "micro ops" or "uops") that machine may execute. In at least one embodiment, instruction decoder 2228 parses instruction into an opcode and corresponding data and control fields that may be used by micro-architecture to perform operations in accordance with at least one embodiment. In at least one embodiment, a trace cache 2230 may assemble decoded uops into program ordered sequences or traces in a uop queue 2234 for execution. In at least one embodiment, when trace cache 2230 encounters a complex instruction, a microcode ROM 2232 provides uops needed to complete operation.

In at least one embodiment, some instructions may be converted into a single micro-op, whereas others need several micro-ops to complete full operation. In at least one embodiment, if more than four micro-ops are needed to complete an instruction, instruction decoder 2228 may access microcode ROM 2232 to perform instruction. In at least one embodiment, an instruction may be decoded into a small number of micro-ops for processing at instruction decoder 2228. In at least one embodiment, an instruction may be stored within microcode ROM 2232 should a number of micro-ops be needed to accomplish operation. In at least one embodiment, trace cache 2230 refers to an entry point programmable logic array ("PLA") to determine a correct micro-instruction pointer for reading microcode sequences to complete one or more instructions from microcode ROM 2232 in accordance with at least one embodiment. In at least one embodiment, fter microcode ROM 2232 finishes sequencing micro-ops for an instruction, front end 2201 of machine may resume fetching micro-ops from trace cache 2230.

In at least one embodiment, out-of-order execution engine ("out of order engine") 2203 may prepare instructions for execution. In at least one embodiment, out-of-order execution logic has a number of buffers to smooth out and re-order flow of instructions to optimize performance as they go down pipeline and get scheduled for execution. out-of-order execution engine 2203 includes, without limitation, an allocator/register renamer 2240, a memory uop queue 2242, an integer/floating point uop queue 2244, a memory scheduler 2246, a fast scheduler 2202, a slow/general floating point scheduler ("slow/general FP scheduler") 2204, and a simple floating point scheduler ("simple FP scheduler") 2206. In at least one embodiment, fast schedule 2202, slow/general floating point scheduler 2204, and simple floating point scheduler 2206 are also collectively referred to herein as "uop schedulers 2202, 2204, 2206." allocator/register renamer 2240 allocates machine buffers and resources that each uop needs in order to execute. In at least one embodiment, allocator/register renamer 2240 renames logic registers onto entries in a register file. In at least one embodiment, allocator/register renamer 2240 also allocates an entry for each uop in one of two uop queues, memory uop queue 2242 for memory operations and integer/floating point uop queue 2244 for non-memory operations, in front of memory scheduler 2246 and uop schedulers 2202, 2204, 2206. In at least one embodiment, uop schedulers 2202, 2204, 2206, determine when a uop is ready to execute based on readiness of their dependent input register operand sources and availability of execution resources uops need to complete their operation. In at least one embodiment, fast scheduler 2202 of at least one embodiment may schedule on each half of main clock cycle while slow/general floating point scheduler 2204 and simple floating point scheduler 2206 may schedule once per main processor clock cycle. In at least one embodiment, uop schedulers 2202, 2204, 2206 arbitrate for dispatch ports to schedule uops for execution.

In at least one embodiment, execution block b11 includes, without limitation, an integer register file/bypass network 2208, a floating point register file/bypass network ("FP register file/bypass network") 2210, address generation units ("AGUs") 2212 and 2214, fast Arithmetic Logic Units (ALUs) ("fast ALUs") 2216 and 2218, a slow Arithmetic Logic Unit ("slow ALU") 2220, a floating point ALU ("FP") 2222, and a floating point move unit ("FP move") 2224. In at least one embodiment, integer register file/bypass network 2208 and floating point register file/bypass network 2210 are also referred to herein as "register files 2208, 2210." In at least one embodiment, AGUSs 2212 and 2214, fast ALUs 2216 and 2218, slow ALU 2220, floating point ALU 2222, and floating point move unit 2224 are also referred to herein as "execution units 2212, 2214, 2216, 2218, 2220, 2222, and 2224." In at least one embodiment, execution block b11 may include, without limitation, any number (including zero) and type of register files, bypass networks, address generation units, and execution units, in any combination.

In at least one embodiment, register files 2208, 2210 may be arranged between uop schedulers 2202, 2204, 2206, and execution units 2212, 2214, 2216, 2218, 2220, 2222, and 2224. In at least one embodiment, integer register file/bypass network 2208 performs integer operations. In at least one embodiment, floating point register file/bypass network 2210 performs floating point operations. In at least one embodiment, each of register files 2208, 2210 may include, without limitation, a bypass network that may bypass or forward just completed results that have not yet been written into register file to new dependent uops. In at least one embodiment, register files 2208, 2210 may communicate data with each other. In at least one embodiment, integer register file/bypass network 2208 may include, without limitation, two separate register files, one register file for low-order thirty-two bits of data and a second register file for high order thirty-two bits of data. In at least one embodiment, floating point register file/bypass network 2210 may include, without limitation, 128-bit wide entries because floating point instructions typically have operands from 64 to 128 bits in width.

In at least one embodiment, execution units 2212, 2214, 2216, 2218, 2220, 2222, 2224 may execute instructions. In at least one embodiment, register files 2208, 2210 store integer and floating point data operand values that microinstructions need to execute. In at least one embodiment, processor 2200 may include, without limitation, any number and combination of execution units 2212, 2214, 2216, 2218, 2220, 2222, 2224. In at least one embodiment, floating point ALU 2222 and floating point move unit 2224, may execute floating point, MMX, SIMD, AVX and SSE, or other operations, including specialized machine learning instructions. In at least one embodiment, floating point ALU 2222 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 2216, 2218. In at least one embodiment, fast ALUS 2216, 2218 may execute fast operations with an effective latency of half a clock cycle. In at least one embodiment, most complex integer operations go to slow ALU 2220 as slow ALU 2220 may include, without limitation, integer execution hardware for long-latency type of operations, such as a multiplier, shifts, flag logic, and branch processing. In at least one embodiment, memory load/store operations may be executed by AGUS 2212, 2214. In at least one embodiment, fast ALU 2216, fast ALU 2218, and slow ALU 2220 may perform integer operations on 64-bit data operands. In at least one embodiment, fast ALU 2216, fast ALU 2218, and slow ALU 2220 may be implemented to support a variety of data bit sizes including sixteen, thirty-two, 128, 256, etc. In at least one embodiment, floating point ALU 2222 and floating point move unit 2224 may be implemented to support a range of operands having bits of various widths. In at least one embodiment, floating point ALU 2222 and floating point move unit 2224 may operate on 128-bit wide packed data operands in conjunction with SIMD and multimedia instructions.

In at least one embodiment, uop schedulers 2202, 2204, 2206, dispatch dependent operations before parent load has finished executing. In at least one embodiment, as uops may be speculatively scheduled and executed in processor 2200, processor 2200 may also include logic to handle memory misses. In at least one embodiment, if a data load misses in data cache, there may be dependent operations in flight in pipeline that have left scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and replay mechanism of at least one embodiment of a processor may also be designed to catch instruction sequences for text string comparison operations.

In at least one embodiment, term "registers" may refer to on-board processor storage locations that may be used as part of instructions to identify operands. In at least one embodiment, registers may be those that may be usable from outside of processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

In at least one embodiment, processor 2200 decodes encoded data by dispatching operations to perform partial decoding based on compressed parts of decoding information, and to combine parts of data decoded based on compressed parts of decoding information.

Figure 23:
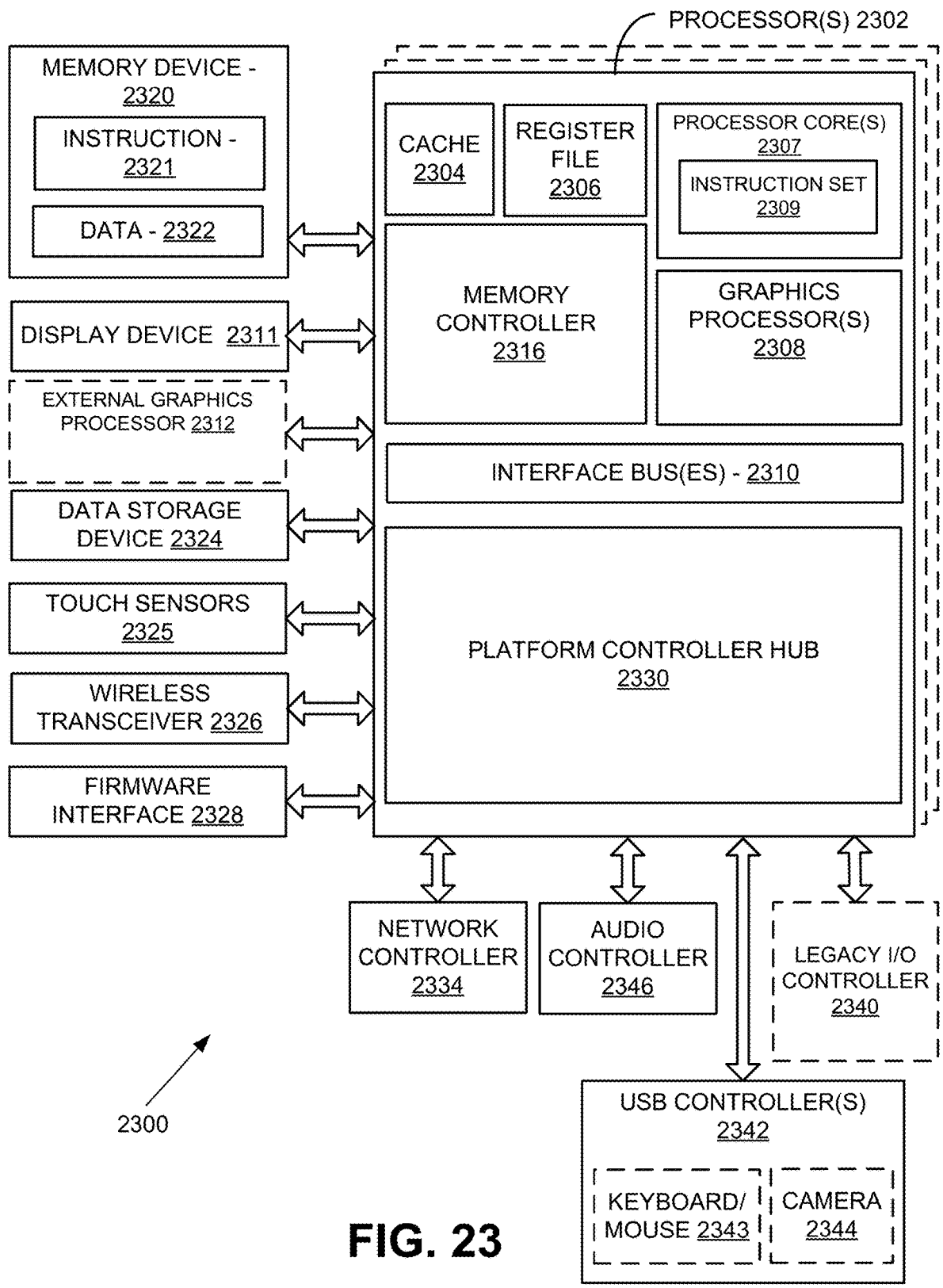
FIG. 23 illustrates at least portions of a graphics processor, according to one or more embodiments.

FIG. 23 is a block diagram of a processing system, according to at least one embodiment. In at least one embodiment, system 2300 includes one or more processors 2302 and one or more graphics processors 2308, and may be a single processor desktop system, a multiprocessor workstation system, or a server system having a large number of processors 2302 or processor cores 2307. In at least one embodiment, system 2300 is a processing platform incorporated within a system-on-a-chip (SoC) integrated circuit for use in mobile, handheld, or embedded devices.

In at least one embodiment, system 2300 can include, or be incorporated within a server-based gaming platform, a game console, including a game and media console, a mobile gaming console, a handheld game console, or an online game console. In at least one embodiment, system 2300 is a mobile phone, smart phone, tablet computing device or mobile Internet device. In at least one embodiment, processing system 2300 can also include, couple with, or be integrated within a wearable device, such as a smart watch wearable device, smart eyewear device, augmented reality device, or virtual reality device. In at least one embodiment, processing system 2300 is a television or set top box device having one or more processors 2302 and a graphical interface generated by one or more graphics processors 2308.

In at least one embodiment, one or more processors 2302 each include one or more processor cores 2307 to process instructions which, when executed, perform operations for system and user software. In at least one embodiment, each of one or more processor cores 2307 is configured to process a specific instruction set 2309. In at least one embodiment, instruction set 2309 may facilitate Complex Instruction Set Computing (CISC), Reduced Instruction Set Computing (RISC), or computing via a Very Long Instruction Word (VLIW). In at least one embodiment, processor cores 2307 may each process a different instruction set 2309, which may include instructions to facilitate emulation of other instruction sets. In at least one embodiment, processor core 2307 may also include other processing devices, such a Digital Signal Processor (DSP).

In at least one embodiment, processor 2302 includes cache memory 2304. In at least one embodiment, processor 2302 can have a single internal cache or multiple levels of internal cache. In at least one embodiment, cache memory is shared among various components of processor 2302. In at least one embodiment, processor 2302 also uses an external cache (e.g., a Level-3 (L3) cache or Last Level Cache (LLC)) (not shown), which may be shared among processor cores 2307 using known cache coherency techniques. In at least one embodiment, register file 2306 is additionally included in processor 2302 which may include different types of registers for storing different types of data (e.g., integer registers, floating point registers, status registers, and an instruction pointer register). In at least one embodiment, register file 2306 may include general-purpose registers or other registers.

In at least one embodiment, one or more processor(s) 2302 are coupled with one or more interface bus(es) 2310 to transmit communication signals such as address, data, or control signals between processor 2302 and other components in system 2300. In at least one embodiment interface bus 2310, in one embodiment, can be a processor bus, such as a version of a Direct Media Interface (DMI) bus. In at least one embodiment, interface 2310 is not limited to a DMI bus, and may include one or more Peripheral Component Interconnect buses (e.g., PCI, PCI Express), memory busses, or other types of interface busses. In at least one embodiment processor(s) 2302 include an integrated memory controller 2316 and a platform controller hub 2330. In at least one embodiment, memory controller 2316 facilitates communication between a memory device and other components of system 2300, while platform controller hub (PCH) 2330 provides connections to I/O devices via a local I/O bus.

In at least one embodiment, memory device 2320 can be a dynamic random access memory (DRAM) device, a static random access memory (SRAM) device, flash memory device, phase-change memory device, or some other memory device having suitable performance to serve as process memory. In at least one embodiment memory device 2320 can operate as system memory for system 2300, to store data 2322 and instructions 2321 for use when one or more processors 2302 executes an application or process. In at least one embodiment, memory controller 2316 also couples with an optional external graphics processor 2312, which may communicate with one or more graphics processors 2308 in processors 2302 to perform graphics and media operations. In at least one embodiment, a display device 2311 can connect to processor(s) 2302. In at least one embodiment display device 2311 can include one or more of an internal display device, as in a mobile electronic device or a laptop device or an external display device attached via a display interface (e.g., DisplayPort, etc.). In at least one embodiment, display device 2311 can include a head mounted display (HMD) such as a stereoscopic display device for use in virtual reality (VR) applications or augmented reality (AR) applications.

In at least one embodiment, platform controller hub 2330 enables peripherals to connect to memory device 2320 and processor 2302 via a high-speed I/O bus. In at least one embodiment, I/O peripherals include, but are not limited to, an audio controller 2346, a network controller 2334, a firmware interface 2328, a wireless transceiver 2326, touch sensors 2325, a data storage device 2324 (e.g., hard disk drive, flash memory, etc.). In at least one embodiment, data storage device 2324 can connect via a storage interface (e.g., SATA) or via a peripheral bus, such as a Peripheral Component Interconnect bus (e.g., PCI, PCI Express). In at least one embodiment, touch sensors 2325 can include touch screen sensors, pressure sensors, or fingerprint sensors. In at least one embodiment, wireless transceiver 2326 can be a Wi-Fi transceiver, a Bluetooth transceiver, or a mobile network transceiver such as a 3G, 4G, or Long Term Evolution (LTE) transceiver. In at least one embodiment, firmware interface 2328 enables communication with system firmware, and can be, for example, a unified extensible firmware interface (UEFI). In at least one embodiment, network controller 2334 can enable a network connection to a wired network. In at least one embodiment, a high-performance network controller (not shown) couples with interface bus 2310. In at least one embodiment, audio controller 2346 is a multi-channel high definition audio controller. In at least one embodiment, system 2300 includes an optional legacy I/O controller 2340 for coupling legacy (e.g., Personal System 2 (PS/2)) devices to system. In at least one embodiment, platform controller hub 2330 can also connect to one or more Universal Serial Bus (USB) controllers 2342 connect input devices, such as keyboard and mouse 2343 combinations, a camera 2344, or other USB input devices.

In at least one embodiment, an instance of memory controller 2316 and platform controller hub 2330 may be integrated into a discreet external graphics processor, such as external graphics processor 2312. In at least one embodiment, platform controller hub 2330 and/or memory controller 2316 may be external to one or more processor(s) 2302. For example, in at least one embodiment, system 2300 can include an external memory controller 2316 and platform controller hub 2330, which may be configured as a memory controller hub and peripheral controller hub within a system chipset that is in communication with processor(s) 2302.

In at least one embodiment, processor(s) 2302 decode encoded data by providing compressed parts of information to decode encoded data to processor core(s) 2307.

Figure 24:
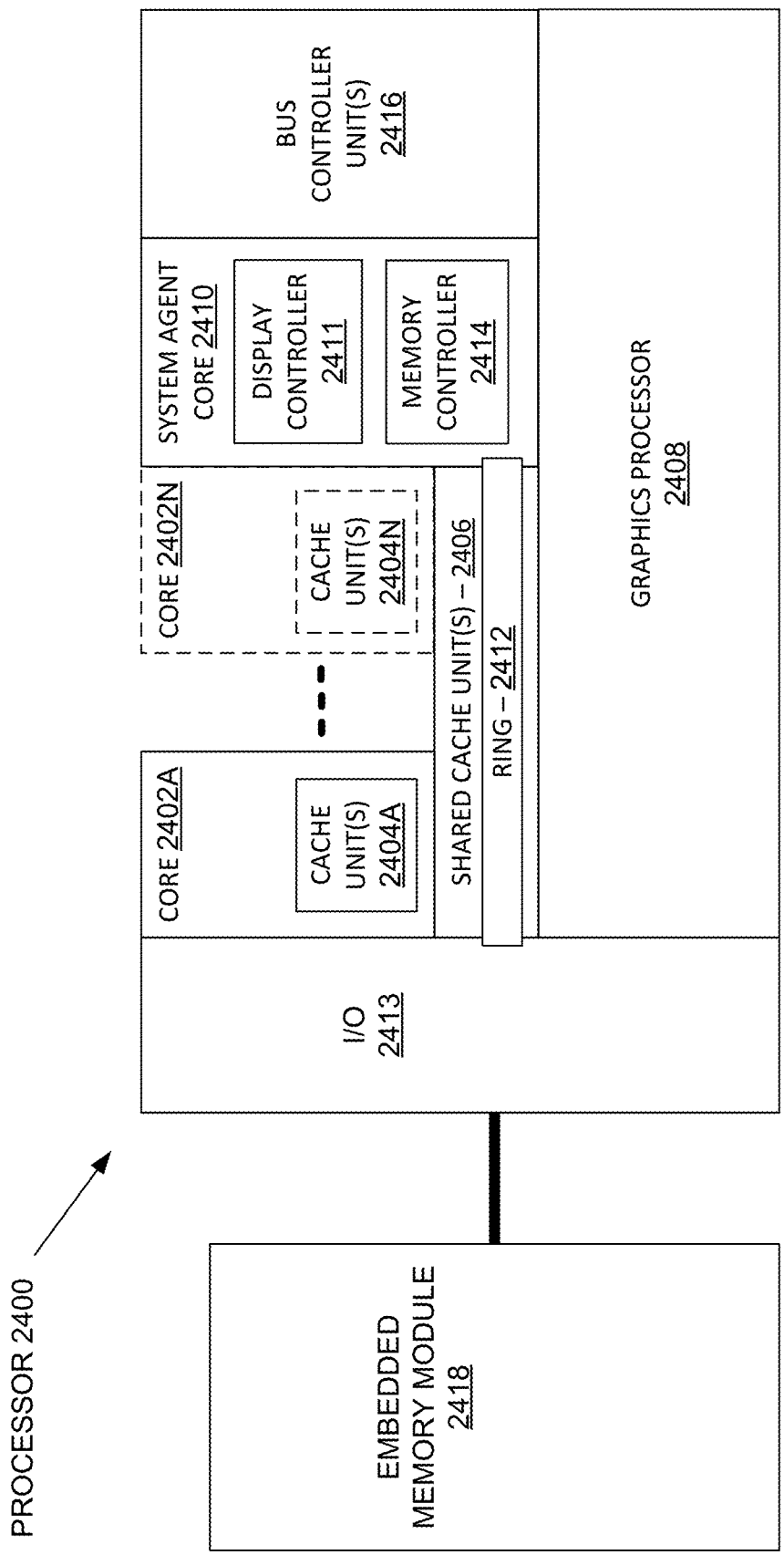
FIG. 24 illustrates at least portions of a graphics processor, according to one or more embodiments.

FIG. 24 is a block diagram of a processor 2400 having one or more processor cores 2402A-2402N, an integrated memory controller 2414, and an integrated graphics processor 2408, according to at least one embodiment. In at least one embodiment, processor 2400 can include additional cores up to and including additional core 2402N represented by dashed lined boxes. In at least one embodiment, each of processor cores 2402A-2402N includes one or more internal cache units 2404A-2404N. In at least one embodiment, each processor core also has access to one or more shared cached units 2406.

In at least one embodiment, internal cache units 2404A-2404N and shared cache units 2406 represent a cache memory hierarchy within processor 2400. In at least one embodiment, cache memory units 2404A-2404N may include at least one level of instruction and data cache within each processor core and one or more levels of shared mid-level cache, such as a Level 2 (L2), Level 3 (L3), Level 4 (L4), or other levels of cache, where a highest level of cache before external memory is classified as an LLC. In at least one embodiment, cache coherency logic maintains coherency between various cache units 2406 and 2404A-2404N.

In at least one embodiment, processor 2400 may also include a set of one or more bus controller units 2416 and a system agent core 2410. In at least one embodiment, one or more bus controller units 2416 manage a set of peripheral buses, such as one or more PCI or PCI express busses. In at least one embodiment, system agent core 2410 provides management functionality for various processor components. In at least one embodiment, system agent core 2410 includes one or more integrated memory controllers 2414 to manage access to various external memory devices (not shown).

In at least one embodiment, one or more of processor cores 2402A-2402N include support for simultaneous multi-threading. In at least one embodiment, system agent core 2410 includes components for coordinating and operating cores 2402A-2402N during multi-threaded processing. In at least one embodiment, system agent core 2410 may additionally include a power control unit (PCU), which includes logic and components to regulate one or more power states of processor cores 2402A-2402N and graphics processor 2408.

In at least one embodiment, processor 2400 additionally includes graphics processor 2408 to execute graphics processing operations. In at least one embodiment, graphics processor 2408 couples with shared cache units 2406, and system agent core 2410, including one or more integrated memory controllers 2414. In at least one embodiment, system agent core 2410 also includes a display controller 2411 to drive graphics processor output to one or more coupled displays. In at least one embodiment, display controller 2411 may also be a separate module coupled with graphics processor 2408 via at least one interconnect, or may be integrated within graphics processor 2408.

In at least one embodiment, a ring based interconnect unit 2412 is used to couple internal components of processor 2400. In at least one embodiment, an alternative interconnect unit may be used, such as a point-to-point interconnect, a switched interconnect, or other techniques. In at least one embodiment, graphics processor 2408 couples with ring interconnect 2412 via an I/O link 2413.

In at least one embodiment, I/O link 2413 represents at least one of multiple varieties of I/O interconnects, including an on package I/O interconnect which facilitates communication between various processor components and a high-performance embedded memory module 2418, such as an eDRAM module. In at least one embodiment, each of processor cores 2402A-2402N and graphics processor 2408 use embedded memory modules 2418 as a shared Last Level Cache.

In at least one embodiment, processor cores 2402A-2402N are homogenous cores executing a common instruction set architecture. In at least one embodiment, processor cores 2402A-2402N are heterogeneous in terms of instruction set architecture (ISA), where one or more of processor cores 2402A-2402N execute a common instruction set, while one or more other cores of processor cores 2402A-24-02N executes a subset of a common instruction set or a different instruction set. In at least one embodiment, processor cores 2402A-2402N are heterogeneous in terms of microarchitecture, where one or more cores having a relatively higher power consumption couple with one or more power cores having a lower power consumption. In at least one embodiment, processor 2400 can be implemented on one or more chips or as an SoC integrated circuit.

In at least one embodiment, processor 2400 decodes encoded data by providing compressed parts of information to decode encoded data to core(s) 2402.

Figure 25:
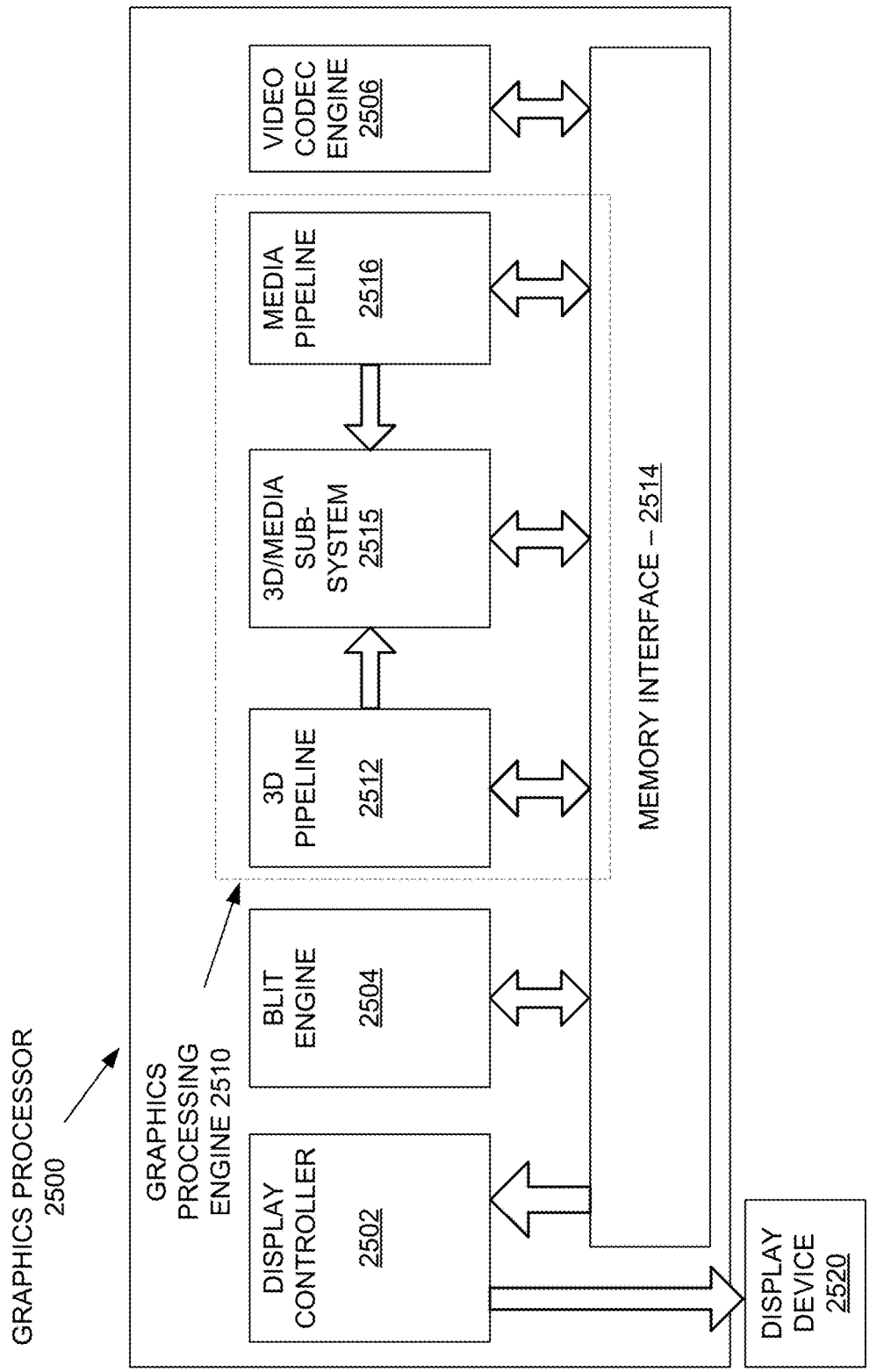
FIG. 25 illustrates at least portions of a graphics processor, according to one or more embodiments.

FIG. 25 is a block diagram of a graphics processor 2500, which may be a discrete graphics processing unit, or may be a graphics processor integrated with a plurality of processing cores. In at least one embodiment, graphics processor 2500 communicates via a memory mapped I/O interface to registers on graphics processor 2500 and with commands placed into memory. In at least one embodiment, graphics processor 2500 includes a memory interface 2514 to access memory. In at least one embodiment, memory interface 2514 is an interface to local memory, one or more internal caches, one or more shared external caches, and/or to system memory.

In at least one embodiment, graphics processor 2500 also includes a display controller 2502 to drive display output data to a display device 2520. In at least one embodiment, display controller 2502 includes hardware for one or more overlay planes for display device 2520 and composition of multiple layers of video or user interface elements. In at least one embodiment, display device 2520 can be an internal or external display device. In at least one embodiment, display device 2520 is a head mounted display device, such as a virtual reality (VR) display device or an augmented reality (AR) display device. In at least one embodiment, graphics processor 2500 includes a video codec engine 2506 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In at least one embodiment, graphics processor 2500 includes a block image transfer (BLIT) engine 2504 to perform two-dimensional (2D) rasterizer operations including, for example, bit-boundary block transfers. However, in at least one embodiment, 2D graphics operations are performed using one or more components of graphics processing engine (GPE) 2510. In at least one embodiment, GPE 2510 is a compute engine for performing graphics operations, including three-dimensional (3D) graphics operations and media operations.

In at least one embodiment, GPE 2510 includes a 3D pipeline 2512 for performing 3D operations, such as rendering three-dimensional images and scenes using processing functions that act upon 3D primitive shapes (e.g., rectangle, triangle, etc.). 3D pipeline 2512 includes programmable and fixed function elements that perform various tasks and/or spawn execution threads to a 3D/Media subsystem 2515. While 3D pipeline 2512 can be used to perform media operations, in at least one embodiment, GPE 2510 also includes a media pipeline 2516 that is used to perform media operations, such as video post-processing and image enhancement.

In at least one embodiment, media pipeline 2516 includes fixed function or programmable logic units to perform one or more specialized media operations, such as video decode acceleration, video de-interlacing, and video encode acceleration in place of, or on behalf of video codec engine 2506. In at least one embodiment, media pipeline 2516 additionally includes a thread spawning unit to spawn threads for execution on 3D/Media sub-system 2515. In at least one embodiment, spawned threads perform computations for media operations on one or more graphics execution units included in 3D/Media sub-system 2515.

In at least one embodiment, 3D/Media subsystem 2515 includes logic for executing threads spawned by 3D pipeline 2512 and media pipeline 2516. In at least one embodiment, 3D pipeline 2512 and media pipeline 2516 send thread execution requests to 3D/Media subsystem 2515, which includes thread dispatch logic for arbitrating and dispatching various requests to available thread execution resources. In at least one embodiment, execution resources include an array of graphics execution units to process 3D and media threads. In at least one embodiment, 3D/Media subsystem 2515 includes one or more internal caches for thread instructions and data. In at least one embodiment, subsystem 2515 also includes shared memory, including registers and addressable memory, to share data between threads and to store output data.

In at least one embodiment, graphics processor 2500 decodes encoded data by providing compressed parts of information to decode encoded data to spawned threads, and combining parts of decoded data obtained from spawned threads.

Figure 26:
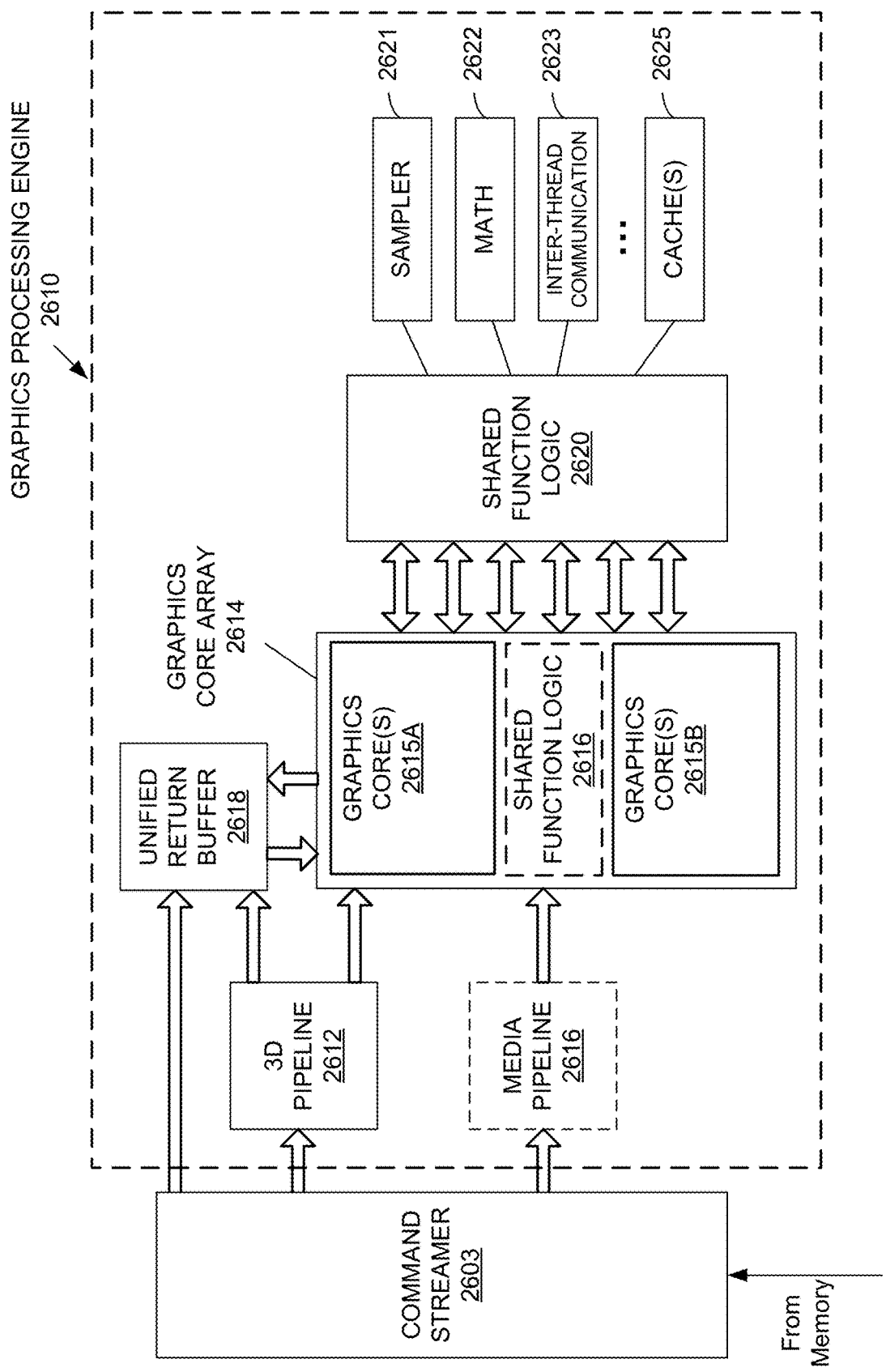
FIG. 26 is a block diagram of a graphics processing engine of a graphics processor in accordance with at least one embodiment.

FIG. 26 is a block diagram of a graphics processing engine 2610 of a graphics processor in accordance with at least one embodiment. In at least one embodiment, graphics processing engine (GPE) 2610 is a version of GPE 2510 shown in FIG. 25. In at least one embodiment, media pipeline 2616 is optional and may not be explicitly included within GPE 2610. In at least one embodiment, a separate media and/or image processor is coupled to GPE 2610.

In at least one embodiment, GPE 2610 is coupled to or includes a command streamer 2603, which provides a command stream to 3D pipeline 2612 and/or media pipelines 2616. In at least one embodiment, command streamer 2603 is coupled to memory, which can be system memory, or one or more of internal cache memory and shared cache memory. In at least one embodiment, command streamer 2603 receives commands from memory and sends commands to 3D pipeline 2612 and/or media pipeline 2616. In at least one embodiment, commands are instructions, primitives, or micro-operations fetched from a ring buffer, which stores commands for 3D pipeline 2612 and media pipeline 2616. In at least one embodiment, a ring buffer can additionally include batch command buffers storing batches of multiple commands. In at least one embodiment, commands for 3D pipeline 2612 can also include references to data stored in memory, such as but not limited to vertex and geometry data for 3D pipeline 2612 and/or image data and memory objects for media pipeline 2616. In at least one embodiment, 3D pipeline 2612 and media pipeline 2616 process commands and data by performing operations or by dispatching one or more execution threads to a graphics core array 2614. In at least one embodiment graphics core array 2614 includes one or more blocks of graphics cores (e.g., graphics core(s) 2615A, graphics core(s) 2615B), each block including one or more graphics cores. In at least one embodiment, each graphics core includes a set of graphics execution resources that includes general-purpose and graphics specific execution logic to perform graphics and compute operations, as well as fixed function texture processing and/or machine learning and artificial intelligence acceleration logic.

In at least one embodiment, 3D pipeline 2612 includes fixed function and programmable logic to process one or more shader programs, such as vertex shaders, geometry shaders, pixel shaders, fragment shaders, compute shaders, or other shader programs, by processing instructions and dispatching execution threads to graphics core array 2614. In at least one embodiment, graphics core array 2614 provides a unified block of execution resources for use in processing shader programs. In at least one embodiment, multi-purpose execution logic (e.g., execution units) within graphics core(s) 2615A-2615B of graphic core array 2614 includes support for various 3D API shader languages and can execute multiple simultaneous execution threads associated with multiple shaders.

In at least one embodiment, graphics core array 2614 also includes execution logic to perform media functions, such as video and/or image processing. In at least one embodiment, execution units additionally include general-purpose logic that is programmable to perform parallel general-purpose computational operations, in addition to graphics processing operations.

In at least one embodiment, output data generated by threads executing on graphics core array 2614 can output data to memory in a unified return buffer (URB) 2618. URB 2618 can store data for multiple threads. In at least one embodiment, URB 2618 may be used to send data between different threads executing on graphics core array 2614. In at least one embodiment, URB 2618 may additionally be used for synchronization between threads on graphics core array 2614 and fixed function logic within shared function logic 2620.

In at least one embodiment, graphics core array 2614 is scalable, such that graphics core array 2614 includes a variable number of graphics cores, each having a variable number of execution units based on a target power and performance level of GPE 2610. In at least one embodiment, execution resources are dynamically scalable, such that execution resources may be enabled or disabled as needed.

In at least one embodiment, graphics core array 2614 is coupled to shared function logic 2620 that includes multiple resources that are shared between graphics cores in graphics core array 2614. In at least one embodiment, shared functions performed by shared function logic 2620 are embodied in hardware logic units that provide specialized supplemental functionality to graphics core array 2614. In at least one embodiment, shared function logic 2620 includes but is not limited to sampler 2621, math 2622, and inter-thread communication (ITC) 2623 logic. In at least one embodiment, one or more cache(s) 2625 are in included in or couple to shared function logic 2620.

In at least one embodiment, a shared function is used if demand for a specialized function is insufficient for inclusion within graphics core array 2614. In at least one embodiment, a single instantiation of a specialized function is used in shared function logic 2620 and shared among other execution resources within graphics core array 2614. In at least one embodiment, specific shared functions within shared function logic 2620 that are used extensively by graphics core array 2614 may be included within shared function logic 2616 within graphics core array 2614. In at least one embodiment, shared function logic 2616 within graphics core array 2614 can include some or all logic within shared function logic 2620. In at least one embodiment, all logic elements within shared function logic 2620 may be duplicated within shared function logic 2616 of graphics core array 2614. In at least one embodiment, shared function logic 2620 is excluded in favor of shared function logic 2616 within graphics core array 2614.

In at least one embodiment, graphics processing engine 2610 decode encoded data by providing compressed parts of information to decode encoded data to graphics core(s) 2615.

Figure 27:
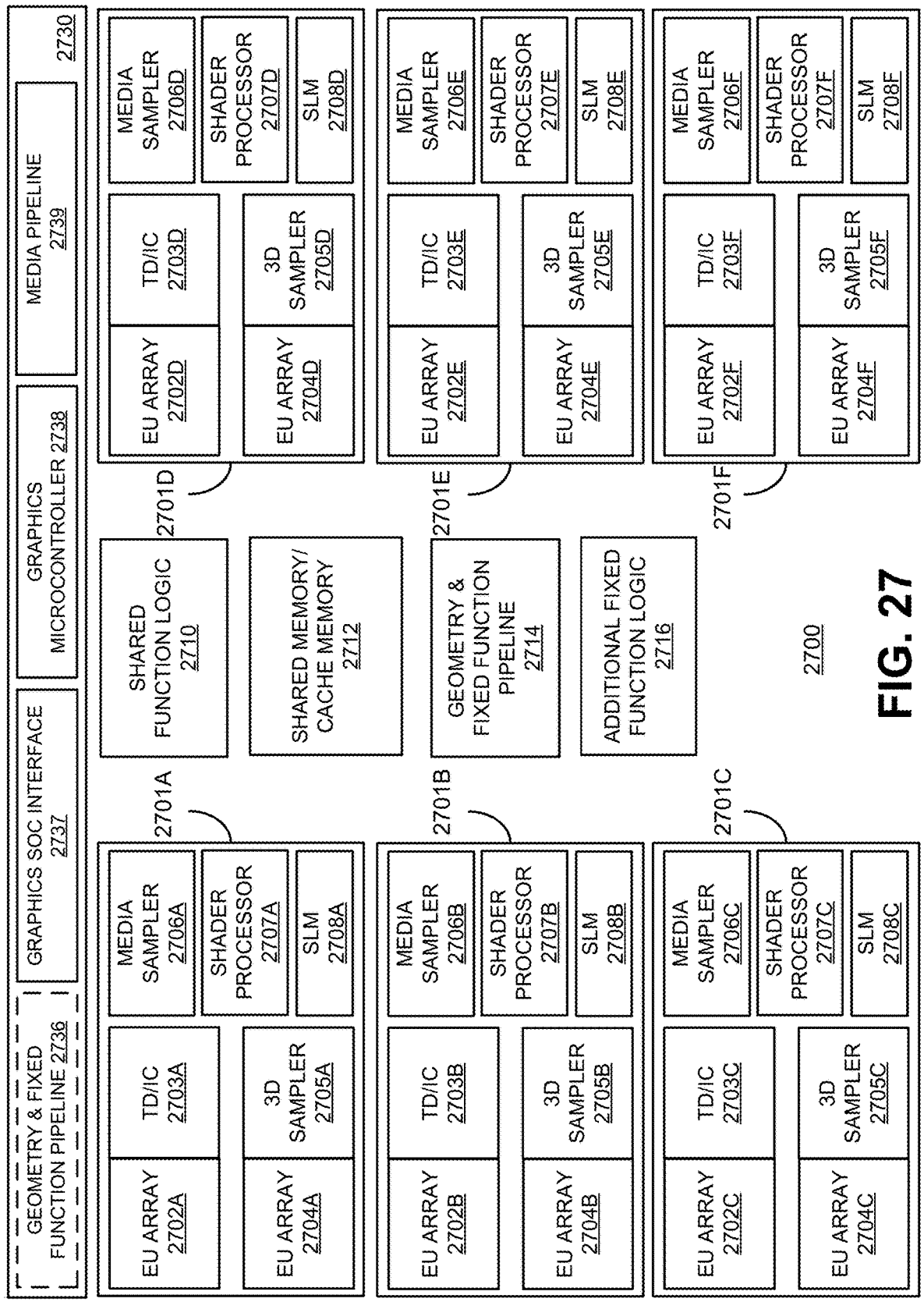
FIG. 27 is a block diagram of at least portions of a graphics processor core, according to at least one embodiment.

FIG. 27 is a block diagram of hardware logic of a graphics processor core 2700, according to at least one embodiment described herein. In at least one embodiment, graphics processor core 2700 is included within a graphics core array. In at least one embodiment, graphics processor core 2700, sometimes referred to as a core slice, can be one or multiple graphics cores within a modular graphics processor. In at least one embodiment, graphics processor core 2700 is exemplary of one graphics core slice, and a graphics processor as described herein may include multiple graphics core slices based on target power and performance envelopes. In at least one embodiment, each graphics core 2700 can include a fixed function block 2730 coupled with multiple sub-cores 2701A-2701F, also referred to as sub-slices, that include modular blocks of general-purpose and fixed function logic.

In at least one embodiment, fixed function block 2730 includes a geometry/fixed function pipeline 2736 that can be shared by all sub-cores in graphics processor 2700, for example, in lower performance and/or lower power graphics processor implementations. In at least one embodiment, geometry/fixed function pipeline 2736 includes a 3D fixed function pipeline, a video front-end unit, a thread spawner and thread dispatcher, and a unified return buffer manager, which manages unified return buffers.

In at least one embodiment fixed function block 2730 also includes a graphics SoC interface 2737, a graphics microcontroller 2738, and a media pipeline 2739. Graphics SoC interface 2737 provides an interface between graphics core 2700 and other processor cores within a system on a chip integrated circuit. In at least one embodiment, graphics microcontroller 2738 is a programmable sub-processor that is configurable to manage various functions of graphics processor 2700, including thread dispatch, scheduling, and pre-emption. In at least one embodiment, media pipeline 2739 includes logic to facilitate decoding, encoding, pre-processing, and/or post-processing of multimedia data, including image and video data. In at least one embodiment, media pipeline 2739 implement media operations via requests to compute or sampling logic within sub-cores 2701-2701F.

In at least one embodiment, SoC interface 2737 enables graphics core 2700 to communicate with general-purpose application processor cores (e.g., CPUs) and/or other components within an SoC, including memory hierarchy elements such as a shared last level cache memory, system RAM, and/or embedded on-chip or on-package DRAM. In at least one embodiment, SoC interface 2737 can also enable communication with fixed function devices within an SoC, such as camera imaging pipelines, and enables use of and/or implements global memory atomics that may be shared between graphics core 2700 and CPUs within an SoC. In at least one embodiment, SoC interface 2737 can also implement power management controls for graphics core 2700 and enable an interface between a clock domain of graphic core 2700 and other clock domains within an SoC. In at least one embodiment, SoC interface 2737 enables receipt of command buffers from a command streamer and global thread dispatcher that are configured to provide commands and instructions to each of one or more graphics cores within a graphics processor. In at least one embodiment, commands and instructions can be dispatched to media pipeline 2739, when media operations are to be performed, or a geometry and fixed function pipeline (e.g., geometry and fixed function pipeline 2736, geometry and fixed function pipeline 2714) when graphics processing operations are to be performed.

In at least one embodiment, graphics microcontroller 2738 can be configured to perform various scheduling and management tasks for graphics core 2700. In at least one embodiment, graphics microcontroller 2738 can perform graphics and/or compute workload scheduling on various graphics parallel engines within execution unit (EU) arrays 2702A-2702F, 2704A-2704F within sub-cores 2701A-2701F. In at least one embodiment, host software executing on a CPU core of an SoC including graphics core 2700 can submit workloads one of multiple graphic processor doorbells, which invokes a scheduling operation on an appropriate graphics engine. In at least one embodiment, scheduling operations include determining which workload to run next, submitting a workload to a command streamer, pre-empting existing workloads running on an engine, monitoring progress of a workload, and notifying host software when a workload is complete. In at least one embodiment, graphics microcontroller 2738 can also facilitate low-power or idle states for graphics core 2700, providing graphics core 2700 with an ability to save and restore registers within graphics core 2700 across low-power state transitions independently from an operating system and/or graphics driver software on a system.

In at least one embodiment, graphics core 2700 may have greater than or fewer than illustrated sub-cores 2701A-2701F, up to N modular sub-cores. For each set of N sub-cores, in at least one embodiment, graphics core 2700 can also include shared function logic 2710, shared and/or cache memory 2712, a geometry/fixed function pipeline 2714, as well as additional fixed function logic 2716 to accelerate various graphics and compute processing operations. In at least one embodiment, shared function logic 2710 can include logic units (e.g., sampler, math, and/or inter-thread communication logic) that can be shared by each N sub-cores within graphics core 2700. Shared and/or cache memory 2712 can be a last-level cache for N sub-cores 2701A-2701F within graphics core 2700 and can also serve as shared memory that is accessible by multiple sub-cores. In at least one embodiment, geometry/fixed function pipeline 2714 can be included instead of geometry/fixed function pipeline 2736 within fixed function block 2730 and can include same or similar logic units.

In at least one embodiment, graphics core 2700 includes additional fixed function logic 2716 that can include various fixed function acceleration logic for use by graphics core 2700. In at least one embodiment, additional fixed function logic 2716 includes an additional geometry pipeline for use in position only shading. In position-only shading, at least two geometry pipelines exist, whereas in a full geometry pipeline within geometry/fixed function pipeline 2716, 2736, and a cull pipeline, which is an additional geometry pipeline which may be included within additional fixed function logic 2716. In at least one embodiment, cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. For example, in at least one embodiment, cull pipeline logic within additional fixed function logic 2716 can execute position shaders in parallel with a main application and generally generates critical results faster than a full pipeline, as cull pipeline fetches and shades position attribute of vertices, without performing rasterization and rendering of pixels to a frame buffer. In at least one embodiment, cull pipeline can use generated critical results to compute visibility information for all triangles without regard to whether those triangles are culled. In at least one embodiment, full pipeline (which in this instance may be referred to as a replay pipeline) can consume visibility information to skip culled triangles to shade only visible triangles that are finally passed to a rasterization phase.

In at least one embodiment, additional fixed function logic 2716 can also include machine-learning acceleration logic, such as fixed function matrix multiplication logic, for implementations including optimizations for machine learning training or inferencing.

In at least one embodiment, within each graphics sub-core 2701A-2701F includes a set of execution resources that may be used to perform graphics, media, and compute operations in response to requests by graphics pipeline, media pipeline, or shader programs. In at least one embodiment, graphics sub-cores 2701A-2701F include multiple EU arrays 2702A-2702F, 2704A-2704F, thread dispatch and inter-thread communication (TD/IC) logic 2703A-2703F, a 3D (e.g., texture) sampler 2705A-2705F, a media sampler 2706A-2706F, a shader processor 2707A-2707F, and shared local memory (SLM) 2708A-2708F. EU arrays 2702A-2702F, 2704A-2704F each include multiple execution units, which are general-purpose graphics processing units capable of performing floating-point and integer/fixed-point logic operations in service of a graphics, media, or compute operation, including graphics, media, or compute shader programs. In at least one embodiment, TD/IC logic 2703A-2703F performs local thread dispatch and thread control operations for execution units within a sub-core and facilitate communication between threads executing on execution units of a sub-core. In at least one embodiment, 3D sampler 2705A-2705F can read texture or other 3D graphics related data into memory. In at least one embodiment, 3D sampler can read texture data differently based on a configured sample state and texture format associated with a given texture. In at least one embodiment, media sampler 2706A-2706F can perform similar read operations based on a type and format associated with media data. In at least one embodiment, each graphics sub-core 2701A-2701F can alternately include a unified 3D and media sampler. In at least one embodiment, threads executing on execution units within each of sub-cores 2701A-2701F can make use of shared local memory 2708A-2708F within each sub-core, to enable threads executing within a thread group to execute using a common pool of on-chip memory.

In at least one embodiment, graphics processor core 2700 receives compressed parts of information to decode encoded data, and provides partially decoded data for use in assembling a decoded result.

Figure 28A:
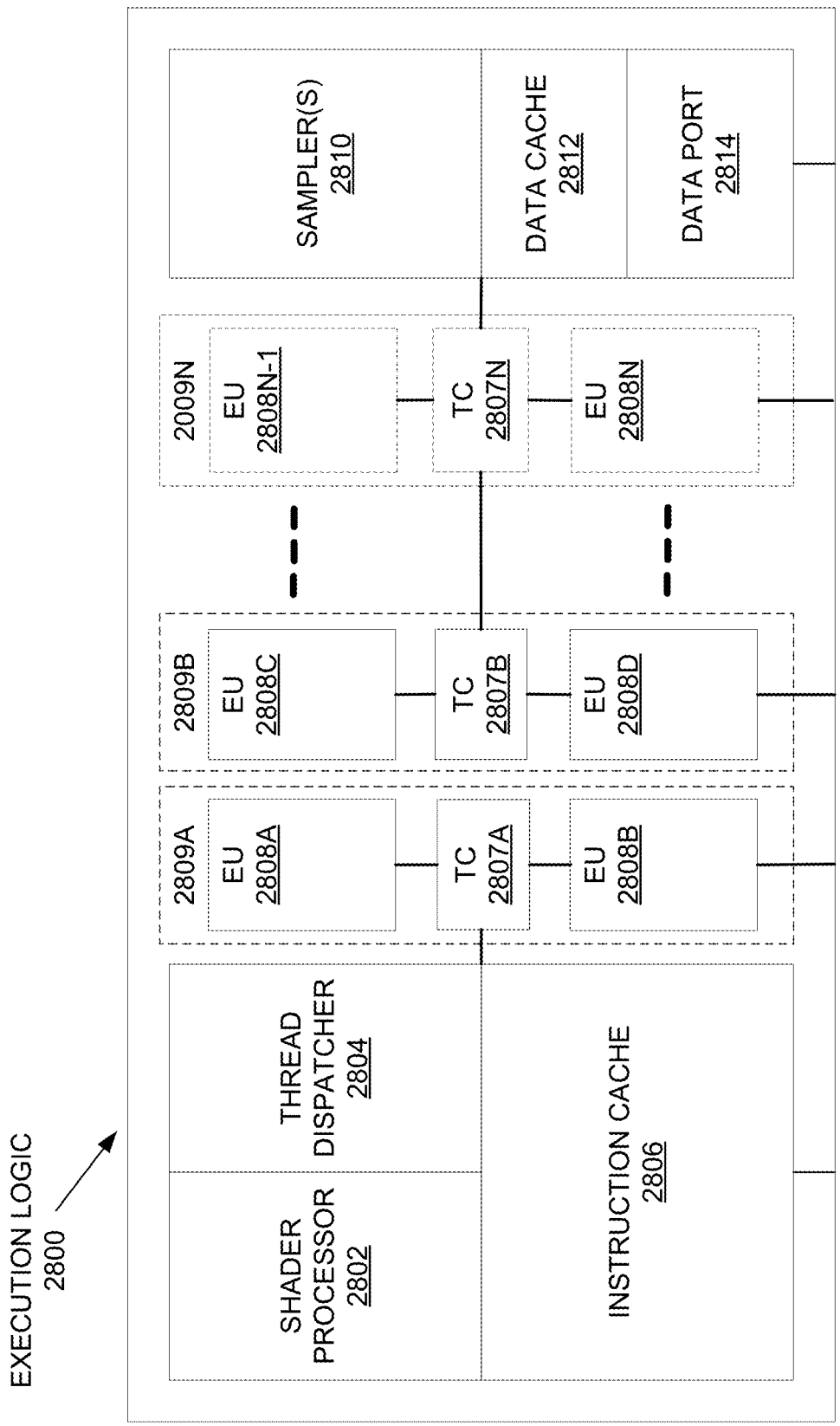
FIGS. 28A-28B illustrate thread execution logic including an array of processing elements of a graphics processor core according to at least one embodiment.
Figure 28B:
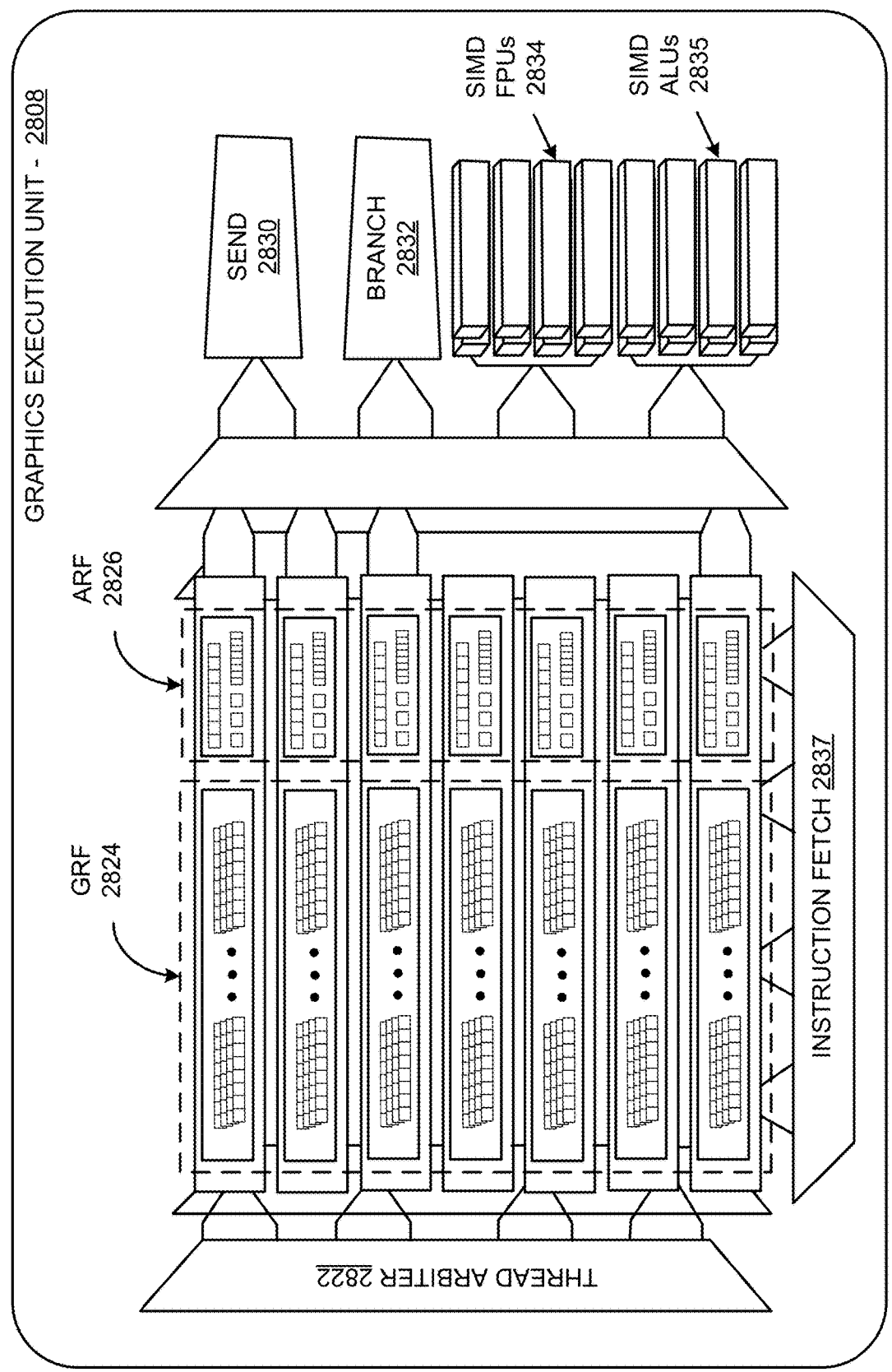

FIGS. 28A-28B illustrate thread execution logic 2800 including an array of processing elements of a graphics processor core according to at least one embodiment. FIG. 28A illustrates at least one embodiment, in which thread execution logic 2800 is used. FIG. 28B illustrates exemplary internal details of an execution unit, according to at least one embodiment.

As illustrated in FIG. 28A, in at least one embodiment, thread execution logic 2800 includes a shader processor 2802, a thread dispatcher 2804, instruction cache 2806, a scalable execution unit array including a plurality of execution units 2808A-2808N, a sampler 2810, a data cache 2812, and a data port 2814. In at least one embodiment a scalable execution unit array can dynamically scale by enabling or disabling one or more execution units (e.g., any of execution unit 2808A, 2808B, 2808C, 2808D, through 2808N-1 and 2808N) based on computational requirements of a workload, for example. In at least one embodiment, scalable execution units are interconnected via an interconnect fabric that links to each of execution unit. In at least one embodiment, thread execution logic 2800 includes one or more connections to memory, such as system memory or cache memory, through one or more of instruction cache 2806, data port 2814, sampler 2810, and execution units 2808A-2808N. In at least one embodiment, each execution unit (e.g., 2808A) is a stand-alone programmable general-purpose computational unit that is capable of executing multiple simultaneous hardware threads while processing multiple data elements in parallel for each thread. In at least one embodiment, array of execution units 2808A-2808N is scalable to include any number individual execution units.

In at least one embodiment, execution units 2808A-2808N are primarily used to execute shader programs. In at least one embodiment, shader processor 2802 can process various shader programs and dispatch execution threads associated with shader programs via a thread dispatcher 2804. In at least one embodiment, thread dispatcher 2804 includes logic to arbitrate thread initiation requests from graphics and media pipelines and instantiate requested threads on one or more execution units in execution units 2808A-2808N. For example, in at least one embodiment, a geometry pipeline can dispatch vertex, tessellation, or geometry shaders to thread execution logic for processing. In at least one embodiment, thread dispatcher 2804 can also process runtime thread spawning requests from executing shader programs.

In at least one embodiment, execution units 2808A-2808N support an instruction set that includes native support for many standard 3D graphics shader instructions, such that shader programs from graphics libraries (e.g., Direct 3D and OpenGL) are executed with a minimal translation. In at least one embodiment, execution units support vertex and geometry processing (e.g., vertex programs, geometry programs, vertex shaders), pixel processing (e.g., pixel shaders, fragment shaders) and general-purpose processing (e.g., compute and media shaders). In at least one embodiment, each of execution units 2808A-2808N, which include one or more arithmetic logic units (ALUs), is capable of multi-issue single instruction multiple data (SIMD) execution and multi-threaded operation enables an efficient execution environment despite higher latency memory accesses. In at least one embodiment, each hardware thread within each execution unit has a dedicated high-bandwidth register file and associated independent thread-state. In at least one embodiment, execution is multi-issue per clock to pipelines capable of integer, single and double precision floating point operations, SIMD branch capability, logical operations, transcendental operations, and other miscellaneous operations. In at least one embodiment, while waiting for data from memory or one of shared functions, dependency logic within execution units 2808A-2808N causes a waiting thread to sleep until requested data has been returned. In at least one embodiment, while a waiting thread is sleeping, hardware resources may be devoted to processing other threads. For example, in at least one embodiment, during a delay associated with a vertex shader operation, an execution unit can perform operations for a pixel shader, fragment shader, or another type of shader program, including a different vertex shader.

In at least one embodiment, each execution unit in execution units 2808A-2808N operates on arrays of data elements. In at least one embodiment, a number of data elements is "execution size," or number of channels for an instruction. In at least one embodiment, an execution channel is a logical unit of execution for data element access, masking, and flow control within instructions. In at least one embodiment, a number of channels may be independent of a number of physical Arithmetic Logic Units (ALUs) or Floating Point Units (FPUs) for a particular graphics processor. In at least one embodiment, execution units 2808A-2808N support integer and floating-point data types.

In at least one embodiment, an execution unit instruction set includes SIMD instructions. In at least one embodiment, various data elements can be stored as a packed data type in a register and execution unit will process various elements based on data size of elements. For example, in at least one embodiment, when operating on a 256-bit wide vector, 256 bits of a vector are stored in a register and an execution unit operates on a vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, in at least one embodiment, different vector widths and register sizes are possible.

In at least one embodiment, one or more execution units can be combined into a fused execution unit 2809A-2809N having thread control logic (2807A-2807N) that is common to fused EUs. In at least one embodiment, multiple EUs can be fused into an EU group. In at least one embodiment, each EU in fused EU group can be configured to execute a separate SIMD hardware thread. The number of EUs in a fused EU group can vary according to various embodiments. In at least one embodiment, various SIMD widths can be performed per-EU, including but not limited to SIMD8, SIMD16, and SIMD32. In at least one embodiment, each fused graphics execution unit 2809A-2809N includes at least two execution units. For example, in at least one embodiment, fused execution unit 2809A includes a first EU 2808A, second EU 2808B, and thread control logic 2807A that is common to first EU 2808A and second EU 2808B. In at least one embodiment, thread control logic 2807A controls threads executed on fused graphics execution unit 2809A, allowing each EU within fused execution units 2809A-2809N to execute using a common instruction pointer register.

In at least one embodiment, one or more internal instruction caches (e.g., 2806) are included in thread execution logic 2800 to cache thread instructions for execution units. In at least one embodiment, one or more data caches (e.g., 2812) are included to cache thread data during thread execution. In at least one embodiment, a sampler 2810 is included to provide texture sampling for 3D operations and media sampling for media operations. In at least one embodiment, sampler 2810 includes specialized texture or media sampling functionality to process texture or media data during sampling process before providing sampled data to an execution unit.

During execution, in at least one embodiment, graphics and media pipelines send thread initiation requests to thread execution logic 2800 via thread spawning and dispatch logic. In at least one embodiment, once a group of geometric objects has been processed and rasterized into pixel data, pixel processor logic (e.g., pixel shader logic, fragment shader logic, etc.) within shader processor 2802 is invoked to further compute output information and cause results to be written to output surfaces (e.g., color buffers, depth buffers, stencil buffers, etc.). In at least one embodiment, a pixel shader or fragment shader calculates values of various vertex attributes that are to be interpolated across a rasterized object. In at least one embodiment, pixel processor logic within shader processor 2802 then executes an application programming interface (API)-supplied pixel or fragment shader program. In at least one embodiment, to execute a shader program, shader processor 2802 dispatches threads to an execution unit (e.g., 2808A) via thread dispatcher 2804. In at least one embodiment, shader processor 2802 uses texture sampling logic in sampler 2810 to access texture data in texture maps stored in memory. In at least one embodiment, arithmetic operations on texture data and input geometry data compute pixel color data for each geometric fragment, or discards one or more pixels from further processing.

In at least one embodiment, data port 2814 provides a memory access mechanism for thread execution logic 2800 to output processed data to memory for further processing on a graphics processor output pipeline. In at least one embodiment, data port 2814 includes or couples to one or more cache memories (e.g., data cache 2812) to cache data for memory access via a data port.

As illustrated in FIG. 28B, in at least one embodiment, a graphics execution unit 2808 can include an instruction fetch unit 2837, a general register file array (GRF) 2824, an architectural register file array (ARF) 2826, a thread arbiter 2822, a send unit 2830, a branch unit 2832, a set of SIMD floating point units (FPUs) 2834, and In at least one embodiment a set of dedicated integer SIMD ALUs 2835. In at least one embodiment, GRF 2824 and ARF 2826 includes a set of general register files and architecture register files associated with each simultaneous hardware thread that may be active in graphics execution unit 2808. In at least one embodiment, per thread architectural state is maintained in ARF 2826, while data used during thread execution is stored in GRF 2824. In at least one embodiment, execution state of each thread, including instruction pointers for each thread, can be held in thread-specific registers in ARF 2826.

In at least one embodiment, graphics execution unit 2808 has an architecture that is a combination of Simultaneous Multi-Threading (SMT) and fine-grained Interleaved Multi-Threading (IMT). In at least one embodiment, architecture has a modular configuration that can be fine-tuned at design time based on a target number of simultaneous threads and number of registers per execution unit, where execution unit resources are divided across logic used to execute multiple simultaneous threads.

In at least one embodiment, graphics execution unit 2808 can co-issue multiple instructions, which may each be different instructions. In at least one embodiment, thread arbiter 2822 of graphics execution unit thread 2808 can dispatch instructions to one of send unit 2830, branch unit 2842, or SIMD FPU(s) 2834 for execution. In at least one embodiment, each execution thread can access 128 general-purpose registers within GRF 2824, where each register can store 32 bytes, accessible as a SIMD 8-element vector of 32-bit data elements. In at least one embodiment, each execution unit thread has access to 4 Kbytes within GRF 2824, although embodiments are not so limited, and greater or fewer register resources may be provided in other embodiments. In at least one embodiment, up to seven threads can execute simultaneously, although a number of threads per execution unit can also vary according to embodiments. In at least one embodiment, in which seven threads may access 4 Kbytes, GRF 2824 can store a total of 28 Kbytes. In at least one embodiment, flexible addressing modes can permit registers to be addressed together to build effectively wider registers or to represent strided rectangular block data structures.

In at least one embodiment, memory operations, sampler operations, and other longer-latency system communications are dispatched via "send" instructions that are executed by message passing send unit 2830. In at least one embodiment, branch instructions are dispatched to a dedicated branch unit 2832 to facilitate SIMD divergence and eventual convergence.

In at least one embodiment graphics execution unit 2808 includes one or more SIMD floating point units (FPU(s)) 2834 to perform floating-point operations. In at least one embodiment, FPU(s) 2834 also support integer computation. In at least one embodiment FPU(s) 2834 can SIMD execute up to M number of 32-bit floating-point (or integer) operations, or SIMD execute up to 2M 16-bit integer or 16-bit floating-point operations. In at least one embodiment, at least one of FPU(s) provides extended math capability to support high-throughput transcendental math functions and double precision 64-bit floating-point. In at least one embodiment, a set of 8-bit integer SIMD ALUs 2835 are also present, and may be specifically optimized to perform operations associated with machine learning computations.

In at least one embodiment, arrays of multiple instances of graphics execution unit 2808 can be instantiated in a graphics sub-core grouping (e.g., a sub-slice). In at least one embodiment execution unit 2808 can execute instructions across a plurality of execution channels. In at least one embodiment, each thread executed on graphics execution unit 2808 is executed on a different channel.

In at least one embodiment, execution logic 2800 receives compressed parts of information to decode encoded data, and provides partially decoded data for use in assembling a decoded result. In at least one embodiment, portions of a partial decoding are performed by execution units 2808.

Figure 29:
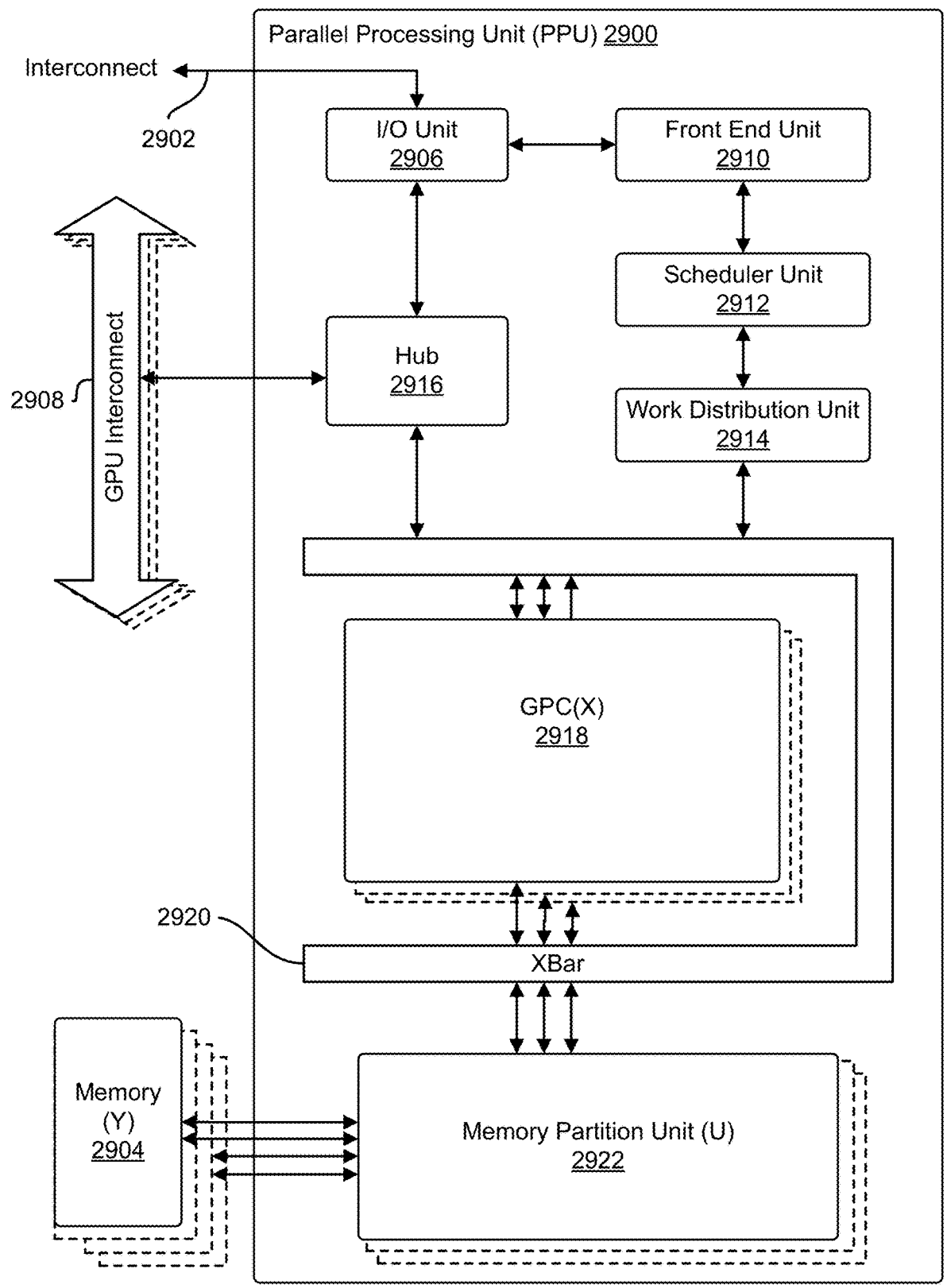
FIG. 29 illustrates a parallel processing unit ("PPU"), according to at least one embodiment.

FIG. 29 illustrates a parallel processing unit ("PPU") 2900, according to at least one embodiment. In at least one embodiment, PPU 2900 is configured with machine-readable code that, if executed by PPU 2900, causes PPU 2900 to perform some or all of processes and techniques described throughout this disclosure. In at least one embodiment, PPU 2900 is a multi-threaded processor that is implemented on one or more integrated circuit devices and that utilizes multithreading as a latency-hiding technique designed to process computer-readable instructions (also referred to as machine-readable instructions or simply instructions) on multiple threads in parallel. In at least one embodiment, a thread refers to a thread of execution and is an instantiation of a set of instructions configured to be executed by PPU 2900. In at least one embodiment, PPU 2900 is a graphics processing unit ("GPU") configured to implement a graphics rendering pipeline for processing three-dimensional ("3D") graphics data in order to generate two-dimensional ("2D") image data for display on a display device such as a liquid crystal display ("LCD") device. In at least one embodiment, PPU 2900 is utilized to perform computations such as linear algebra operations and machine-learning operations. FIG. 29 illustrates an example parallel processor for illustrative purposes only and should be construed as a non-limiting example of processor architectures contemplated within scope of this disclosure and that any suitable processor may be employed to supplement and/or substitute for same.

In at least one embodiment, one or more PPUs 2900 are configured to accelerate High Performance Computing ("HPC"), data center, and machine learning applications. In at least one embodiment, PPU 2900 is configured to accelerate deep learning systems and applications including following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and more.

In at least one embodiment, PPU 2900 includes, without limitation, an Input/Output ("I/O") unit 2906, a front-end unit 2910, a scheduler unit 2912, a work distribution unit 2914, a hub 2916, a crossbar ("Xbar") 2920, one or more general processing clusters ("GPCs") 2918, and one or more partition units ("memory partition units") 2922. In at least one embodiment, PPU 2900 is connected to a host processor or other PPUs 2900 via one or more high-speed GPU interconnects ("GPU interconnects") 2908. In at least one embodiment, PPU 2900 is connected to a host processor or other peripheral devices via an interconnect 2902. In at least one embodiment, PPU 2900 is connected to a local memory comprising one or more memory devices ("memory") 2904. In at least one embodiment, memory devices 2904 include, without limitation, one or more dynamic random access memory ("DRAM") devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 2908 may refer to a wire-based multi-lane communications link that is used by systems to scale and include one or more PPUs 2900 combined with one or more central processing units ("CPUs"), supports cache coherence between PPUs 2900 and CPUs, and CPU mastering. In at least one embodiment, data and/or commands are transmitted by high-speed GPU interconnect 2908 through hub 2916 to/from other units of PPU 2900 such as one or more copy engines, video encoders, video decoders, power management units, and other components which may not be explicitly illustrated in FIG. 29.

In at least one embodiment, I/O unit 2906 is configured to transmit and receive communications (e.g., commands, data) from a host processor (not illustrated in FIG. 29) over system bus 2902. In at least one embodiment, I/O unit 2906 communicates with host processor directly via system bus 2902 or through one or more intermediate devices such as a memory bridge. In at least one embodiment, I/O unit 2906 may communicate with one or more other processors, such as one or more of PPUs 2900 via system bus 2902. In at least one embodiment, I/O unit 2906 implements a Peripheral Component Interconnect Express ("PCIe") interface for communications over a PCIe bus. In at least one embodiment, I/O unit 2906 implements interfaces for communicating with external devices.

In at least one embodiment, I/O unit 2906 decodes packets received via system bus 2902. In at least one embodiment, at least some packets represent commands configured to cause PPU 2900 to perform various operations. In at least one embodiment, I/O unit 2906 transmits decoded commands to various other units of PPU 2900 as specified by commands. In at least one embodiment, commands are transmitted to front-end unit 2910 and/or transmitted to hub 2916 or other units of PPU 2900 such as one or more copy engines, a video encoder, a video decoder, a power management unit, etc. (not explicitly illustrated in FIG. 29). In at least one embodiment, I/O unit 2906 is configured to route communications between and among various logical units of PPU 2900.

In at least one embodiment, a program executed by host processor encodes a command stream in a buffer that provides workloads to PPU 2900 for processing. In at least one embodiment, a workload comprises instructions and data to be processed by those instructions. In at least one embodiment, buffer is a region in a memory that is accessible (e.g., read/write) by both host processor and PPU 2900—a host interface unit may be configured to access buffer in a system memory connected to system bus 2902 via memory requests transmitted over system bus 2902 by I/O unit 2906. In at least one embodiment, host processor writes command stream to buffer and then transmits a pointer to start of command stream to PPU 2900 such that front-end unit 2910 receives pointers to one or more command streams and manages one or more command streams, reading commands from command streams and forwarding commands to various units of PPU 2900.

In at least one embodiment, front-end unit 2910 is coupled to scheduler unit 2912 that configures various GPCs 2918 to process tasks defined by one or more command streams. In at least one embodiment, scheduler unit 2912 is configured to track state information related to various tasks managed by scheduler unit 2912 where state information may indicate which of GPCs 2918 a task is assigned to, whether task is active or inactive, a priority level associated with task, and so forth. In at least one embodiment, scheduler unit 2912 manages execution of a plurality of tasks on one or more of GPCs 2918.

In at least one embodiment, scheduler unit 2912 is coupled to work distribution unit 2914 that is configured to dispatch tasks for execution on GPCs 2918. In at least one embodiment, work distribution unit 2914 tracks a number of scheduled tasks received from scheduler unit 2912 and work distribution unit 2914 manages a pending task pool and an active task pool for each of GPCs 2918. In at least one embodiment, pending task pool comprises a number of slots (e.g., 32 slots) that contain tasks assigned to be processed by a particular GPC 2918; active task pool may comprise a number of slots (e.g., 4 slots) for tasks that are actively being processed by GPCs 2918 such that as one of GPCs 2918 completes execution of a task, that task is evicted from active task pool for GPC 2918 and one of other tasks from pending task pool is selected and scheduled for execution on GPC 2918. In at least one embodiment, if an active task is idle on GPC 2918, such as while waiting for a data dependency to be resolved, then active task is evicted from GPC 2918 and returned to pending task pool while another task in pending task pool is selected and scheduled for execution on GPC 2918.

In at least one embodiment, work distribution unit 2914 communicates with one or more GPCs 2918 via XBar 2920. In at least one embodiment, XBar 2920 is an interconnect network that couples many of units of PPU 2900 to other units of PPU 2900 and can be configured to couple work distribution unit 2914 to a particular GPC 2918. In at least one embodiment, one or more other units of PPU 2900 may also be connected to XBar 2920 via hub 2916.

In at least one embodiment, tasks are managed by scheduler unit 2912 and dispatched to one of GPCs 2918 by work distribution unit 2914. GPC 2918 is configured to process task and generate results. In at least one embodiment, results may be consumed by other tasks within GPC 2918, routed to a different GPC 2918 via XBar 2920, or stored in memory 2904. In at least one embodiment, results can be written to memory 2904 via partition units 2922, which implement a memory interface for reading and writing data to/from memory 2904. In at least one embodiment, results can be transmitted to another PPU 2904 or CPU via high-speed GPU interconnect 2908. In at least one embodiment, PPU 2900 includes, without limitation, a number U of partition units 2922 that is equal to number of separate and distinct memory devices 2904 coupled to PPU 2900. In at least one embodiment, partition unit 2922 will be described in more detail herein in conjunction with FIG. 31.

In at least one embodiment, a host processor executes a driver kernel that implements an application programming interface ("API") that enables one or more applications executing on host processor to schedule operations for execution on PPU 2900. In at least one embodiment, multiple compute applications are simultaneously executed by PPU 2900 and PPU 2900 provides isolation, quality of service ("QoS"), and independent address spaces for multiple compute applications. In at least one embodiment, an application generates instructions (e.g., in form of API calls) that cause driver kernel to generate one or more tasks for execution by PPU 2900 and driver kernel outputs tasks to one or more streams being processed by PPU 2900. In at least one embodiment, each task comprises one or more groups of related threads, which may be referred to as a warp. In at least one embodiment, a warp comprises a plurality of related threads (e.g., 32 threads) that can be executed in parallel. In at least one embodiment, cooperating threads can refer to a plurality of threads including instructions to perform task and that exchange data through shared memory. In at least one embodiment, threads and cooperating threads are described in more detail, in accordance with at least one embodiment, in conjunction with FIG. 31.

In at least one embodiment, PPU 2900 receives compressed parts of information to decode encoded data, and provides partially decoded data for use in assembling a decoded result.

Figure 30:
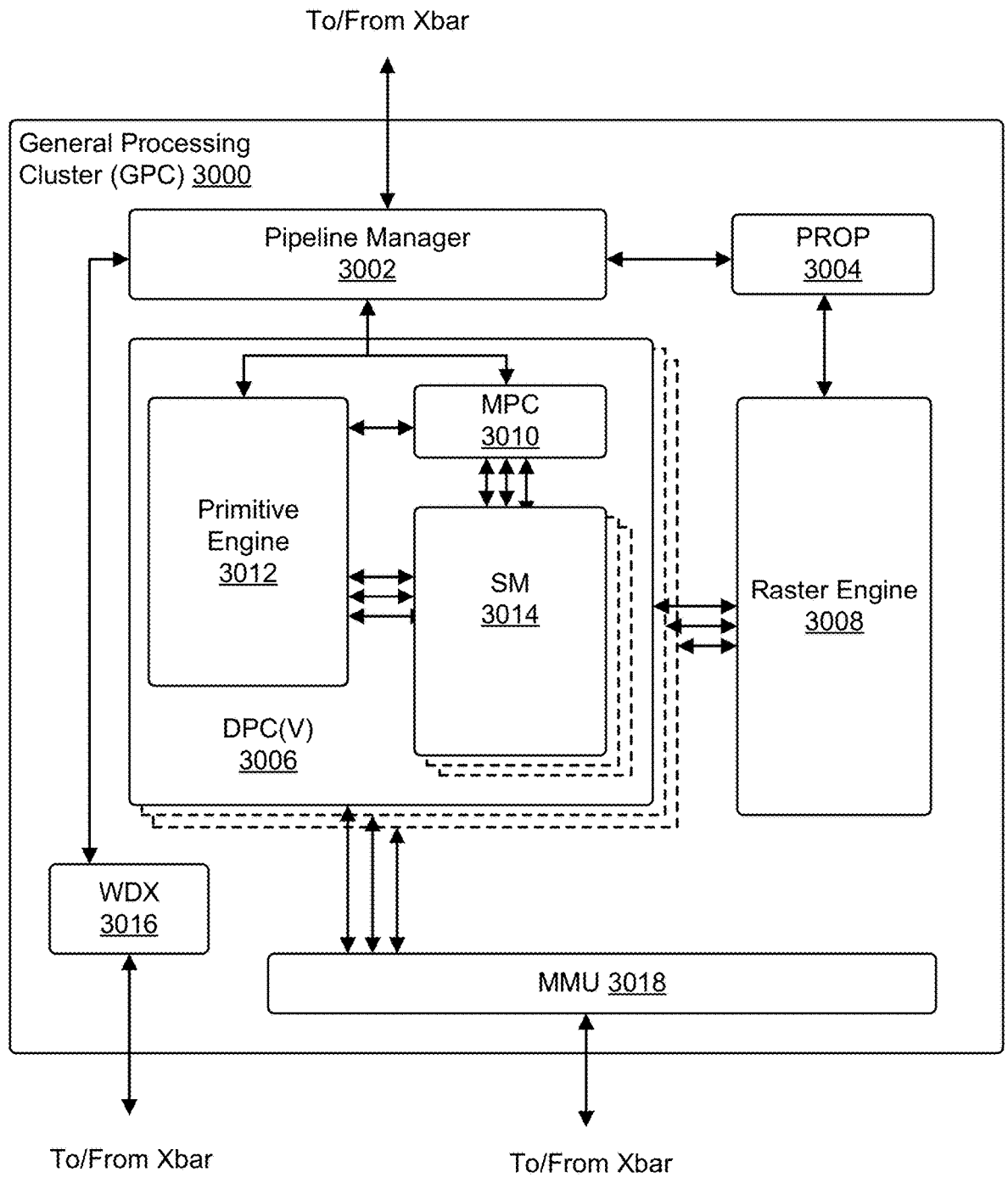
FIG. 30 illustrates a general processing cluster ("GPC"), according to at least one embodiment.

FIG. 30 illustrates a general processing cluster ("GPC") 3000, according to at least one embodiment. In at least one embodiment, GPC 3000 is GPC 2918 of FIG. 29. In at least one embodiment, each GPC 3000 includes, without limitation, a number of hardware units for processing tasks and each GPC 3000 includes, without limitation, a pipeline manager 3002, a pre-raster operations unit ("PROP") 3004, a raster engine 3008, a work distribution crossbar ("WDX")

3016, a memory management unit ("MMU") 3018, one or more Data Processing Clusters ("DPCs") 3006, and any suitable combination of parts.

In at least one embodiment, operation of GPC 3000 is controlled by pipeline manager 3002. In at least one embodiment, pipeline manager 3002 manages configuration of one or more DPCs 3006 for processing tasks allocated to GPC 3000. In at least one embodiment, pipeline manager 3002 configures at least one of one or more DPCs 3006 to implement at least a portion of a graphics rendering pipeline. In at least one embodiment, DPC 3006 is configured to execute a vertex shader program on a programmable streaming multi-processor ("SM") 3014. In at least one embodiment, pipeline manager 3002 is configured to route packets received from a work distribution unit to appropriate logical units within GPC 3000, in at least one embodiment, and some packets may be routed to fixed function hardware units in PROP 3004 and/or raster engine 3008 while other packets may be routed to DPCs 3006 for processing by a primitive engine 3012 or SM 3014. In at least one embodiment, pipeline manager 3002 configures at least one of DPCs 3006 to implement a neural network model and/or a computing pipeline.

In at least one embodiment, PROP unit 3004 is configured, in at least one embodiment, to route data generated by raster engine 3008 and DPCs 3006 to a Raster Operations ("ROP") unit in partition unit 2922, described in more detail above in conjunction with FIG. 29. In at least one embodiment, PROP unit 3004 is configured to perform optimizations for color blending, organize pixel data, perform address translations, and more. In at least one embodiment, raster engine 3008 includes, without limitation, a number of fixed function hardware units configured to perform various raster operations, in at least one embodiment, and raster engine 3008 includes, without limitation, a setup engine, a coarse raster engine, a culling engine, a clipping engine, a fine raster engine, a tile coalescing engine, and any suitable combination thereof. In at least one embodiment, setup engine receives transformed vertices and generates plane equations associated with geometric primitive defined by vertices; plane equations are transmitted to coarse raster engine to generate coverage information (e.g., an x, y coverage mask for a tile) for primitive; output of coarse raster engine is transmitted to culling engine where fragments associated with primitive that fail a z-test are culled, and transmitted to a clipping engine where fragments lying outside a viewing frustum are clipped. In at least one embodiment, fragments that survive clipping and culling are passed to fine raster engine to generate attributes for pixel fragments based on plane equations generated by setup engine. In at least one embodiment, output of raster engine 3008 comprises fragments to be processed by any suitable entity such as by a fragment shader implemented within DPC 3006.

In at least one embodiment, each DPC 3006 included in GPC 3000 comprise, without limitation, an M-Pipe Controller ("MPC") 3010; primitive engine 3012; one or more SMs 3014; and any suitable combination thereof. In at least one embodiment, MPC 3010 controls operation of DPC 3006, routing packets received from pipeline manager 3002 to appropriate units in DPC 3006. In at least one embodiment, packets associated with a vertex are routed to primitive engine 3012, which is configured to fetch vertex attributes associated with vertex from memory; in contrast, packets associated with a shader program may be transmitted to SM 3014.

In at least one embodiment, SM 3014 comprises, without limitation, a programmable streaming processor that is configured to process tasks represented by a number of threads. In at least one embodiment, SM 3014 is multi-threaded and configured to execute a plurality of threads (e.g., 32 threads) from a particular group of threads concurrently and implements a Single-Instruction, Multiple-Data ("SIMD") architecture where each thread in a group of threads (e.g., a warp) is configured to process a different set of data based on same set of instructions. In at least one embodiment, all threads in group of threads execute same instructions. In at least one embodiment, SM 3014 implements a Single-Instruction, Multiple Thread ("SIMT") architecture wherein each thread in a group of threads is configured to process a different set of data based on same set of instructions, but where individual threads in group of threads are allowed to diverge during execution. In at least one embodiment, a program counter, call stack, and execution state is maintained for each warp, enabling concurrency between warps and serial execution within warps when threads within warp diverge. In another embodiment, a program counter, call stack, and execution state is maintained for each individual thread, enabling equal concurrency between all threads, within and between warps. In at least one embodiment, execution state is maintained for each individual thread and threads executing same instructions may be converged and executed in parallel for better efficiency. At least one embodiment of SM 3014 are described in more detail herein.

In at least one embodiment, MMU 3018 provides an interface between GPC 3000 and memory partition unit (e.g., partition unit 2922 of FIG. 29) and MMU 3018 provides translation of virtual addresses into physical addresses, memory protection, and arbitration of memory requests. In at least one embodiment, MMU 3018 provides one or more translation lookaside buffers ("TLBs") for performing translation of virtual addresses into physical addresses in memory.

In at least one embodiment, GPC 3000 receives compressed parts of information to decode encoded data, and provides partially decoded data for use in assembling a decoded result.

Figure 31:
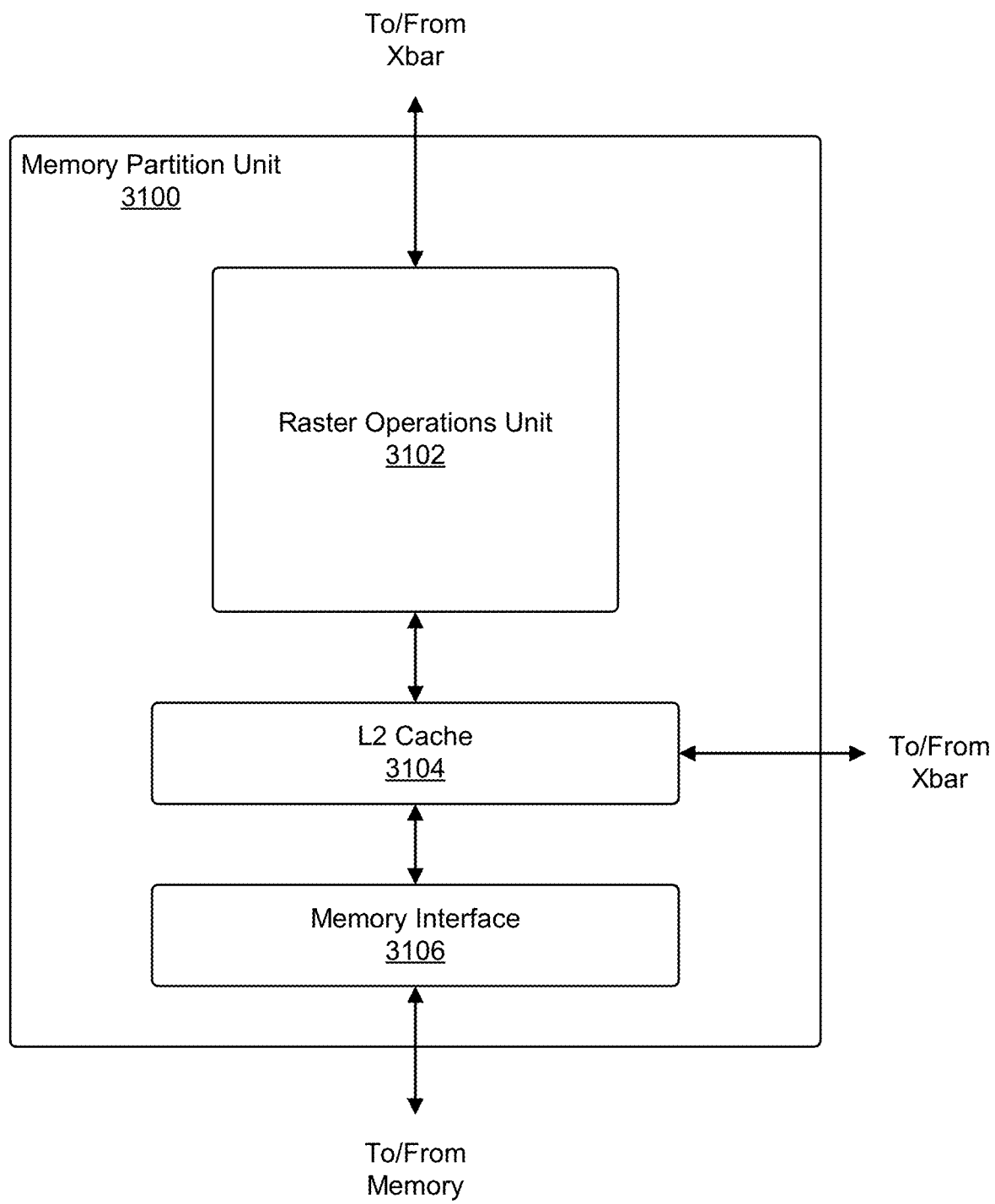
FIG. 31 illustrates a memory partition unit of a parallel processing unit ("PPU"), according to at least one embodiment.

FIG. 31 illustrates a memory partition unit 3100 of a parallel processing unit ("PPU"), in a31ordance with at least one embodiment. In at least one embodiment, memory partition unit 3100 includes, without limitation, a Raster Operations ("ROP") unit 3102; a level two ("L2") cache 3104; a memory interface 3106; and any suitable combination thereof memory interface 3106 is coupled to memory. memory interface 3106 may implement 32, 64, 128, 1024-bit data buses, or like, for high-speed data transfer. In at least one embodiment, PPU incorporates U memory interfaces 3106, one memory interface 3106 per pair of partition units 3100, where each pair of partition units 3100 is connected to a corresponding memory device. For example, in at least one embodiment, PPU may be connected to up to Y memory devices, such as high bandwidth memory stacks or graphics double-data-rate, version 5, synchronous dynamic random a31ess memory ("GDDR5 SDRAM").

In at least one embodiment, memory interface 3106 implements a high bandwidth memory second generation ("HBM2") memory interface and Y equals half U. In at least one embodiment, HBM2 memory stacks are located on same physical package as PPU, providing substantial power and area savings compared with conventional GDDR5 SDRAM systems. In at least one embodiment, each HBM2 stack includes, without limitation, four memory dies and Y equals 4, with each HBM2 stack including two 128-bit channels per die for a total of 8 channels and a data bus width of 1024 bits. In at least one embodiment, memory supports Single-Error Correcting Double-Error Detecting ("SECDED") Error Correction Code ("ECC") to protect data. ECC provides higher reliability for compute applications that are sensitive to data corruption.

In at least one embodiment, PPU implements a multi-level memory hierarchy. In at least one embodiment, memory partition unit 3100 supports a unified memory to provide a single unified virtual address space for central processing unit ("CPU") and PPU memory, enabling data sharing between virtual memory systems. In at least one embodiment frequency of a31esses by a PPU to memory located on other processors is traced to ensure that memory pages are moved to physical memory of PPU that is a31essing pages more frequently. In at least one embodiment, high-speed GPU interconnect 2908 supports address translation services allowing PPU to directly a31ess a CPU's page tables and providing full a31ess to CPU memory by PPU.

In at least one embodiment, copy engines transfer data between multiple PPUs or between PPUs and CPUs. In at least one embodiment, copy engines can generate page faults for addresses that are not mapped into page tables and memory partition unit 3100 then services page faults, mapping addresses into page table, after which copy engine performs transfer. In at least one embodiment, memory is pinned (i.e., non-pageable) for multiple copy engine operations between multiple processors, substantially reducing available memory. In at least one embodiment, with hardware page faulting, addresses can be passed to copy engines without regard as to whether memory pages are resident, and copy process is transparent.

Data from memory 2904 of FIG. 29 or other system memory is fetched by memory partition unit 3100 and stored in L2 cache 3104, which is located on-chip and is shared between various GPCs, in a31ordance with at least one embodiment. Each memory partition unit 3100, in at least one embodiment, includes, without limitation, at least a portion of L2 cache associated with a corresponding memory device. In at least one embodiment, lower level caches are implemented in various units within GPCs. In at least one embodiment, each of SMs 3014 may implement a level one ("L1") cache wherein L1 cache is private memory that is dedicated to a particular SM 3014 and data from L2 cache 3104 is fetched and stored in each of L1 caches for processing in functional units of SMs 3014. In at least one embodiment, L2 cache 3104 is coupled to memory interface 3106 and XBar 2920.

ROP unit 3102 performs graphics raster operations related to pixel color, such as color compression, pixel blending, and more, in at least one embodiment. ROP unit 3102, in at least one embodiment, implements depth testing in conjunction with raster engine 3008, receiving a depth for a sample location associated with a pixel fragment from culling engine of raster engine 3008. In at least one embodiment, depth is tested against a corresponding depth in a depth buffer for a sample location associated with fragment. In at least one embodiment, if fragment passes depth test for sample location, then ROP unit 3102 updates depth buffer and transmits a result of depth test to raster engine 3008. It will be appreciated that number of partition units 3100 may be different than number of GPCs and, therefore, each ROP unit 3102 can, in at least one embodiment, be coupled to each of GPCs. In at least one embodiment, ROP unit 3102 tracks packets received from different GPCs and determines which that a result generated by ROP unit 3102 is routed to through XBar 2920.

Figure 32:
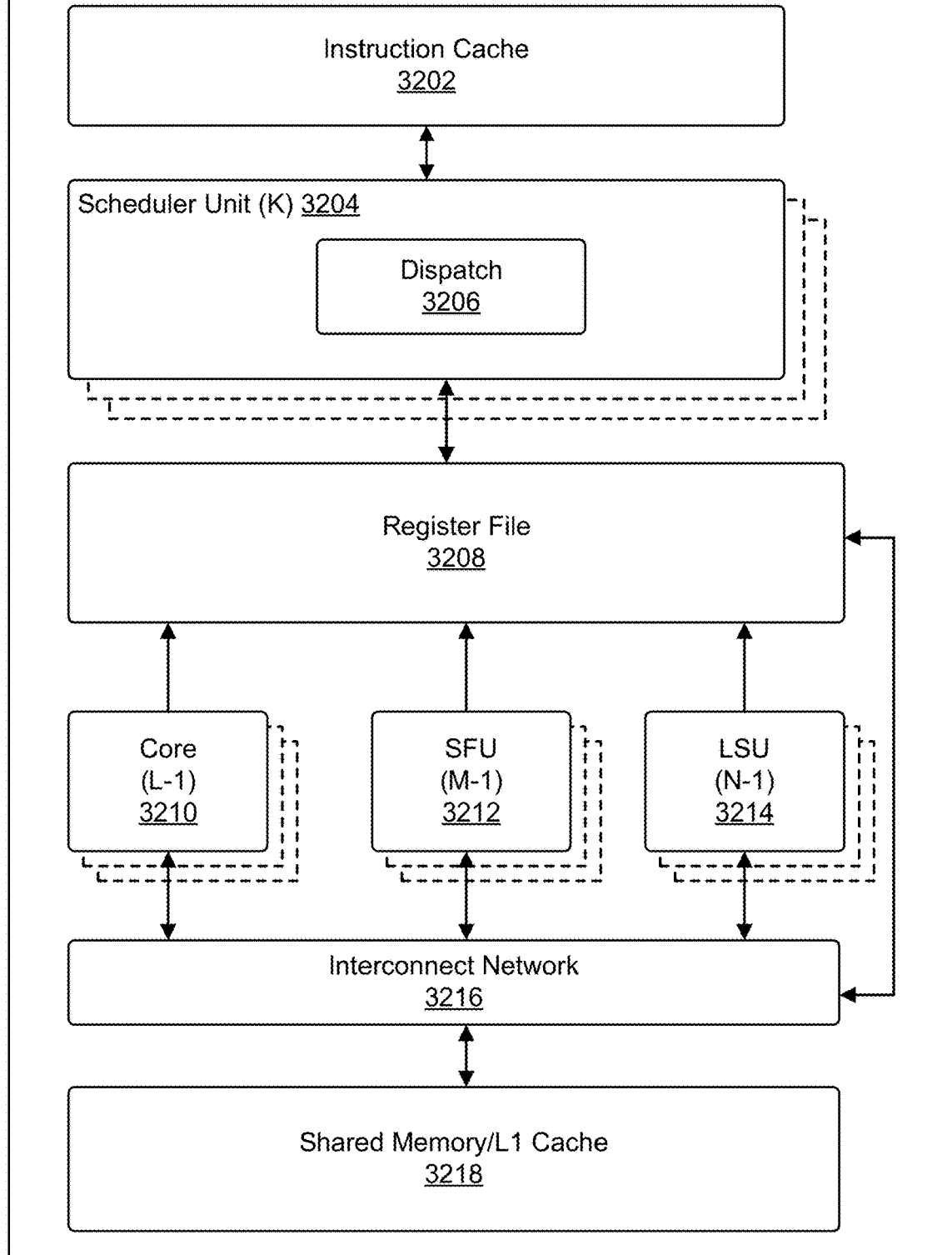
FIG. 32 illustrates a streaming multi-processor, according to at least one embodiment.

FIG. 32 illustrates a streaming multi-processor ("SM") 3200, according to at least one embodiment. In at least one embodiment, SM 3200 is SM of FIG. 30. In at least one embodiment, SM 3200 includes, without limitation, an instruction cache 3202; one or more scheduler units 3204; a register file 3208; one or more processing cores ("cores") 3210; one or more special function units ("SFUs") 3212; one or more load/store units ("LSUs") 3214; an interconnect network 3216; a shared memory/level one ("L1") cache 3218; and any suitable combination thereof. In at least one embodiment, a work distribution unit dispatches tasks for execution on general processing clusters ("GPCs") of parallel processing units ("PPUs") and each task is allocated to a particular Data Processing Cluster ("DPC") within a GPC and, if task is associated with a shader program, task is allocated to one of SMs 3200. In at least one embodiment, scheduler unit 3204 receives tasks from work distribution unit and manages instruction scheduling for one or more thread blocks assigned to SM 3200. In at least one embodiment, scheduler unit 3204 schedules thread blocks for execution as warps of parallel threads, wherein each thread block is allocated at least one warp. In at least one embodiment, each warp executes threads. In at least one embodiment, scheduler unit 3204 manages a plurality of different thread blocks, allocating warps to different thread blocks and then dispatching instructions from plurality of different cooperative groups to various functional units (e.g., processing cores 3210, SFUs 3212, and LSUs 3214) during each clock cycle.

In at least one embodiment, Cooperative Groups may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, applications of conventional programming models provide a single, simple construct for synchronizing cooperating threads: a barrier across all threads of a thread block (e.g., syncthreads( ) function). However, In at least one embodiment, programmers may define groups of threads at smaller than thread block granularities and synchronize within defined groups to enable greater performance, design flexibility, and software reuse in form of collective group-wide function interfaces. In at least one embodiment, Cooperative Groups enables programmers to define groups of threads explicitly at sub-block (i.e., as small as a single thread) and multi-block granularities, and to perform collective operations such as synchronization on threads in a cooperative group. programming model supports clean composition across software boundaries, so that libraries and utility functions can synchronize safely within their local context without having to make assumptions about convergence. In at least one embodiment, Cooperative Groups primitives enable new patterns of cooperative parallelism, including, without limitation, producer-consumer parallelism, opportunistic parallelism, and global synchronization across an entire grid of thread blocks.

In at least one embodiment, a dispatch unit 3206 is configured to transmit instructions to one or more of functional units and scheduler unit 3204 includes, without limitation, two dispatch units 3206 that enable two different instructions from same warp to be dispatched during each clock cycle. In at least one embodiment, each scheduler unit 3204 includes a single dispatch unit 3206 or a32itional dispatch units 3206.

In at least one embodiment, each SM 3200, in at least one embodiment, includes, without limitation, register file 3208 that provides a set of registers for functional units of SM 3200. In at least one embodiment, register file 3208 is divided between each of functional units such that each functional unit is allocated a dedicated portion of register file 3208. In at least one embodiment, register file 3208 is divided between different warps being executed by SM 3200 and register file 3208 provides temporary storage for operands connected to data paths of functional units. In at least one embodiment, each SM 3200 comprises, without limitation, a plurality of L processing cores 3210. In at least one embodiment, SM 3200 includes, without limitation, a large number (e.g., 128 or more) of distinct processing cores 3210. In at least one embodiment, each processing core 3210, in at least one embodiment, includes, without limitation, a fully-pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 3210 include, without limitation, 64 single-precision (32-bit) floating point cores, 64 integer cores, 32 double-precision (64-bit) floating point cores, and 8 tensor cores.

Tensor cores are configured to perform matrix operations in accordance with at least one embodiment. In at least one embodiment, one or more tensor cores are included in processing cores 3210. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation D=A×B+C, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on 16-bit floating point input data with 32-bit floating point accumulation. In at least one embodiment, 16-bit floating point multiply uses 64 operations and results in a full precision product that is then accumulated using 32-bit floating point a32ition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as CUDA 9 C++ API, exposes specialized matrix load, matrix multiply and accumulate, and matrix store operations to efficiently use tensor cores from a CUDA-C++ program. In at least one embodiment, at CUDA level, warp-level interface assumes 16×16 size matrices spanning all 32 threads of warp.

In at least one embodiment, each SM 3200 comprises, without limitation, M SFUs 3212 that perform special functions (e.g., attribute evaluation, reciprocal square root, and like). In at least one embodiment, SFUs 3212 include, without limitation, a tree traversal unit configured to traverse a hierarchical tree data structure. In at least one embodiment, SFUs 3212 include, without limitation, a texture unit configured to perform texture map filtering operations. In at least one embodiment, texture units are configured to load texture maps (e.g., a 2D array of texels) from memory and sample texture maps to produce sampled texture values for use in shader programs executed by SM 3200. In at least one embodiment, texture maps are stored in shared memory/L1 cache 3218. In at least one embodiment, texture units implement texture operations such as filtering operations using mip-maps (e.g., texture maps of varying levels of detail), in accordance with at least one embodiment. In at least one embodiment, each SM 3200 includes, without limitation, two texture units.

Each SM 3200 comprises, without limitation, N LSUs 3214 that implement load and store operations between shared memory/L1 cache 3218 and register file 3208, in at least one embodiment. Each SM 3200 includes, without limitation, interconnect network 3216 that connects each of functional units to register file 3208 and LSU 3214 to register file 3208 and shared memory/L1 cache 3218 in at least one embodiment. In at least one embodiment, interconnect network 3216 is a crossbar that can be configured to connect any of functional units to any of registers in register file 3208 and connect LSUs 3214 to register file 3208 and memory locations in shared memory/L1 cache 3218.

In at least one embodiment, shared memory/L1 cache 3218 is an array of on-chip memory that allows for data storage and communication between SM 3200 and primitive engine and between threads in SM 3200, in at least one embodiment. In at least one embodiment, shared memory/L1 cache 3218 comprises, without limitation, 128 KB of storage capacity and is in path from SM 3200 to partition unit. In at least one embodiment, shared memory/L1 cache 3218, in at least one embodiment, is used to cache reads and writes. In at least one embodiment, one or more of shared memory/L1 cache 3218, L2 cache, and memory are backing stores.

Combining data cache and shared memory functionality into a single memory block provides improved performance for both types of memory accesses, in at least one embodiment. In at least one embodiment, capacity is used or is usable as a cache by programs that do not use shared memory, such as if shared memory is configured to use half of capacity, texture and load/store operations can use remaining capacity. Integration within shared memory/L1 cache 3218 enables shared memory/L1 cache 3218 to function as a high-throughput conduit for streaming data while simultaneously providing high-bandwidth and low-latency access to frequently reused data, in accordance with at least one embodiment. In at least one embodiment, when configured for general purpose parallel computation, a simpler configuration can be used compared with graphics processing. In at least one embodiment, fixed function graphics processing units are bypassed, creating a much simpler programming model. In general purpose parallel computation configuration, work distribution unit assigns and distributes blocks of threads directly to DPCs, in at least one embodiment. In at least one embodiment, threads in a block execute same program, using a unique thread ID in calculation to ensure each thread generates unique results, using SM 3200 to execute program and perform calculations, shared memory/L1 cache 3218 to communicate between threads, and LSU 3214 to read and write global memory through shared memory/L1 cache 3218 and memory partition unit. In at least one embodiment, when configured for general purpose parallel computation, SM 3200 writes commands that scheduler unit 3204 can use to launch new work on DPCs.

In at least one embodiment, PPU is included in or coupled to a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, and more. In at least one embodiment, PPU is embodied on a single semiconductor substrate. In at least one embodiment, PPU is included in a system-on-a-chip ("SoC") along with one or more other devices such as additional PPUs, memory, a reduced instruction set computer ("RISC") CPU, a memory management unit ("MMU"), a digital-to-analog converter ("DAC"), and like.

In at least one embodiment, PPU may be included on a graphics card that includes one or more memory devices. graphics card may be configured to interface with a PCIe slot on a motherboard of a desktop computer. In at least one embodiment, PPU may be an integrated graphics processing unit ("iGPU") included in chipset of motherboard.

In at least one embodiment, a PPU receives compressed parts of information to decode encoded data, and provides partially decoded data for use in assembling a decoded result.

In at least one embodiment, a single semiconductor platform may refer to a sole unitary semiconductor-based integrated circuit or chip. In at least one embodiment, multi-chip modules may be used with increased connectivity which simulate on-chip operation, and make substantial improvements over utilizing a conventional central processing unit ("CPU") and bus implementation. In at least one embodiment, various modules may also be situated separately or in various combinations of semiconductor platforms per desires of user.

In at least one embodiment, computer programs in form of machine-readable executable code or computer control logic algorithms are stored in main memory 1204 and/or secondary storage. Computer programs, if executed by one or more processors, enable system 1200 to perform various functions in accordance with at least one embodiment. memory 1204, storage, and/or any other storage are possible examples of computer-readable media. In at least one embodiment, secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory, etc. In at least one embodiment, architecture and/or functionality of various previous figures are implemented in context of CPU 1202; parallel processing system 1212; an integrated circuit capable of at least a portion of capabilities of both CPU 1202; parallel processing system 1212; a chipset (e.g., a group of integrated circuits designed to work and sold as a unit for performing related functions, etc.); and any suitable combination of integrated circuit(s).

In at least one embodiment, architecture and/or functionality of various previous figures are implemented in context of a general computer system, a circuit board system, a game console system dedicated for entertainment purposes, an application-specific system, and more. In at least one embodiment, computer system 1200 may take form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, workstation, game consoles, embedded system, and/or any other type of logic.

In at least one embodiment, parallel processing system 1212 includes, without limitation, a plurality of parallel processing units ("PPUs") 1214 and associated memories 1216. In at least one embodiment, PPUs 1214 are connected to a host processor or other peripheral devices via an interconnect 1218 and a switch 1220 or multiplexer. In at least one embodiment, parallel processing system 1212 distributes computational tasks across PPUs 1214 which can be parallelizable—for example, as part of distribution of computational tasks across multiple graphics processing unit ("GPU") thread blocks. In at least one embodiment, memory is shared and accessible (e.g., for read and/or write access) across some or all of PPUs 1214, although such shared memory may incur performance penalties relative to use of local memory and registers resident to a PPU 1214. In at least one embodiment, operation of PPUs 1214 is synchronized through use of a command such as_syncthreads( ) wherein all threads in a block (e.g., executed across multiple PPUs 1214) to reach a certain point of execution of code before proceeding.

Networks

Figure 33:
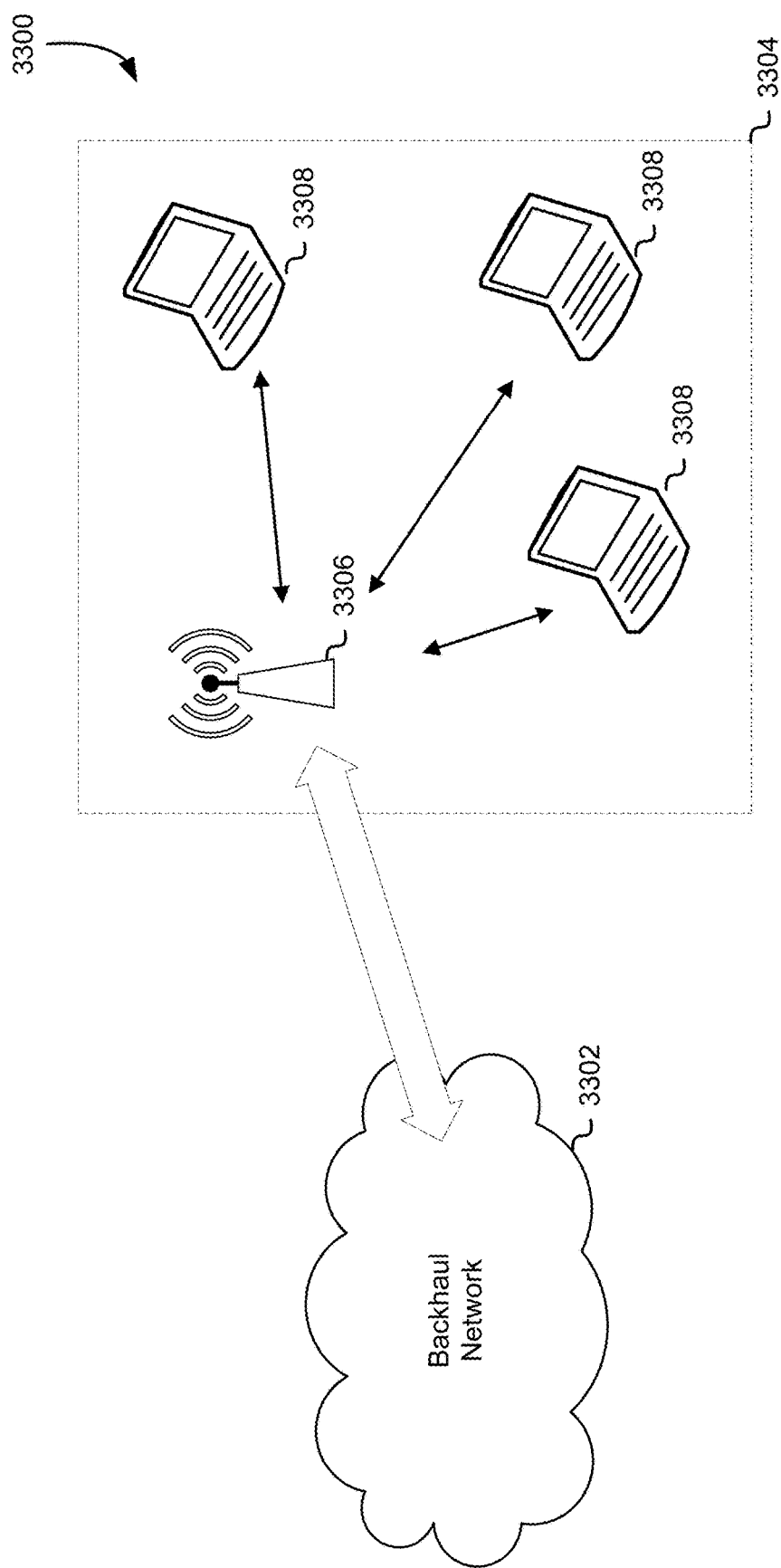
FIG. 33 illustrates a network for communicating data within a 5G wireless communications network, according to at least one embodiment.

FIG. 33 illustrates a network 3300 for communicating data within a 5G wireless communications network, in accordance with at least one embodiment. In at least one embodiment, network 3300 comprises a base station 3306 having a coverage area 3304, a plurality of mobile devices 3308, and a backhaul network 3302. In at least one embodiment, as shown, base station 3306 establishes uplink and/or downlink connections with mobile devices 3308, which serve to carry data from mobile devices 3308 to base station 3306 and vice-versa. In at least one embodiment, data carried over uplink/downlink connections may include data communicated between mobile devices 3308, as well as data communicated to/from a remote-end (not shown) by way of backhaul network 3302. In at least one embodiment, term "base station" refers to any component (or collection of components) configured to provide wireless access to a network, such as an enhanced base station (eNB), a macro-cell, a femtocell, a Wi-Fi access point (AP), or other wirelessly enabled devices. In at least one embodiment, base stations may provide wireless access in accordance with one or more wireless communication protocols, e.g., long term evolution (LTE), LTE advanced (LTE-A), High Speed Packet Access (HSPA), Wi-Fi 802.11a/b/g/n/ac, etc. In at least one embodiment, term "mobile device" refers to any component (or collection of components) capable of establishing a wireless connection with a base station, such as a user equipment (UE), a mobile station (STA), and other wirelessly enabled devices. In some embodiments, network 3300 may comprise various other wireless devices, such as relays, low power nodes, etc.

In at least one embodiment, communications received by a device 3308 are decoded by one or more processors to decode encoded information by providing compressed parts of information to one or more processors, and to combine parts of data decoded based on the compressed parts.

Figure 34:
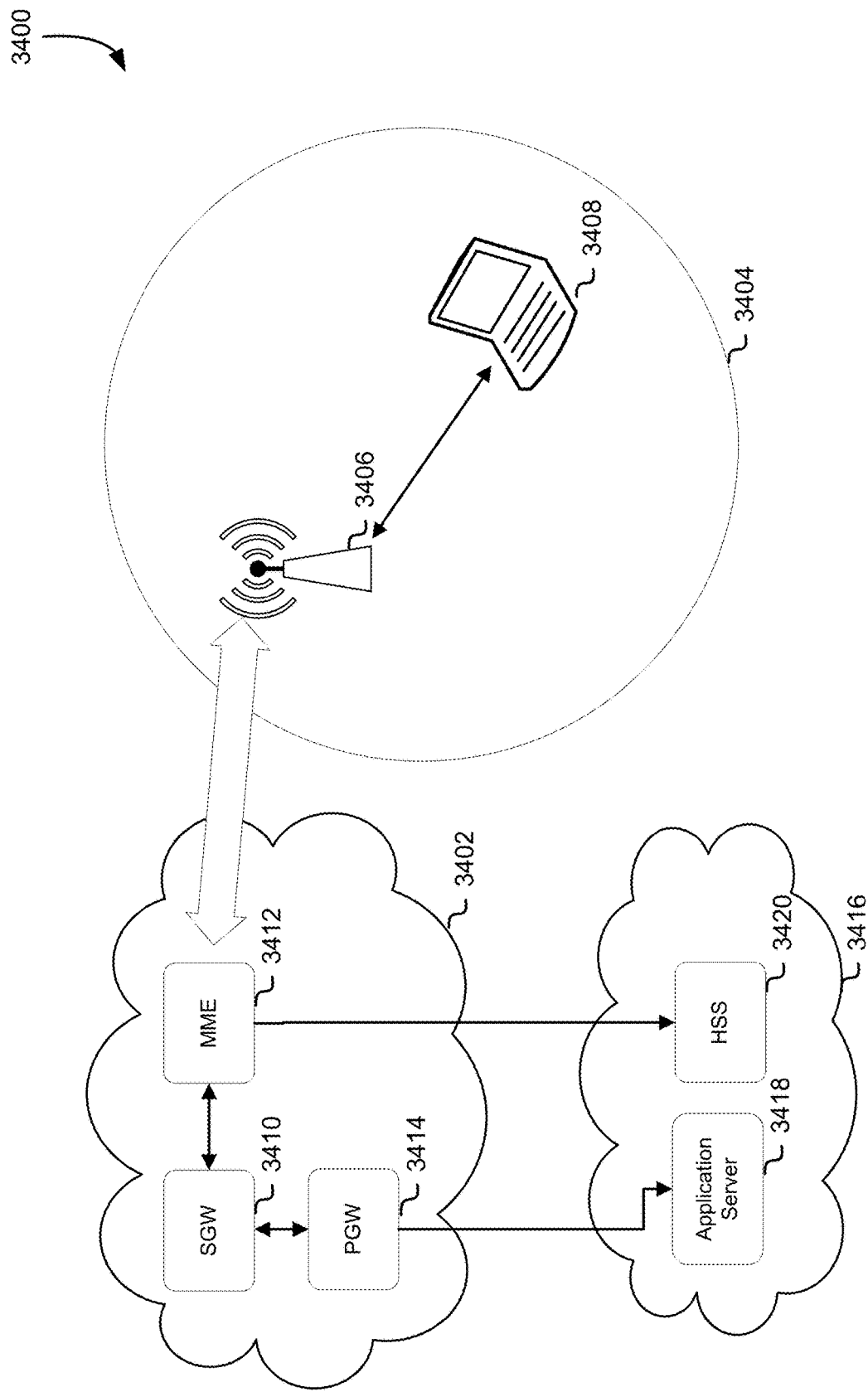
FIG. 34 illustrates a network architecture for a 5G LTE wireless network, according to at least one embodiment.

FIG. 34 illustrates a network architecture 3400 for a 5G wireless network, in accordance with at least one embodiment. In at least one embodiment, as shown, network architecture 3400 includes a radio access network (RAN) 3404, an evolved packet core (EPC) 3402, which may be referred to as a core network, and a home network 3416 of a UE 3408 attempting to access RAN 3404. In at least one embodiment, RAN 3404 and EPC 3402 form a serving wireless network. In at least one embodiment, RAN 3404 includes a base station 3406, and EPC 3402 includes a mobility management entity (MME) 3412, a serving gateway (SGW) 3410, and a packet data network (PDN) gateway (PGW) 3414. In at least one embodiment, home network 3416 includes an application server 3418 and a home subscriber server (HSS) 3420. In at least one embodiment, HSS 3420 may be part of home network 3416, EPC 3402, and/or variations thereof.

In at least one embodiment, MME 3412 is a termination point in a network for ciphering/integrity protection for NAS signaling and handles security key management. In at least one embodiment, it should be appreciated that term "MME" is used in 4G LTE networks, and that 5G LTE networks may include a Security Anchor Node (SEAN) or a Security Access Function (SEAF) that performs similar functions. In at least one embodiment, terms "MME," "SEAN," and "SEAF" may be used interchangeably. In at least one embodiment, MME 3412 also provides control plane function for mobility between LTE and 2G/3G access networks, as well as an interface to home networks of roaming UEs. In at least one embodiment, SGW 3410 routes and forwards user data packets, while also acting as a mobility anchor for an user plane during handovers. In at least one embodiment, PGW 3414 provides connectivity from UEs to external packet data networks by being a point of exit and entry of traffic for UEs. In at least one embodiment, HSS 3420 is a central database that contains user-related and subscription-related information. In at least one embodiment, application server 3418 is a central database that contains user-related information regarding various applications that may utilize and communicate via network architecture 3400.

In at least one embodiment, communications received by a device 3408 are decoded by one or more processors to decode encoded information by providing compressed parts of information to one or more processors, and to combine parts of data decoded based on the compressed parts.

Figure 35:
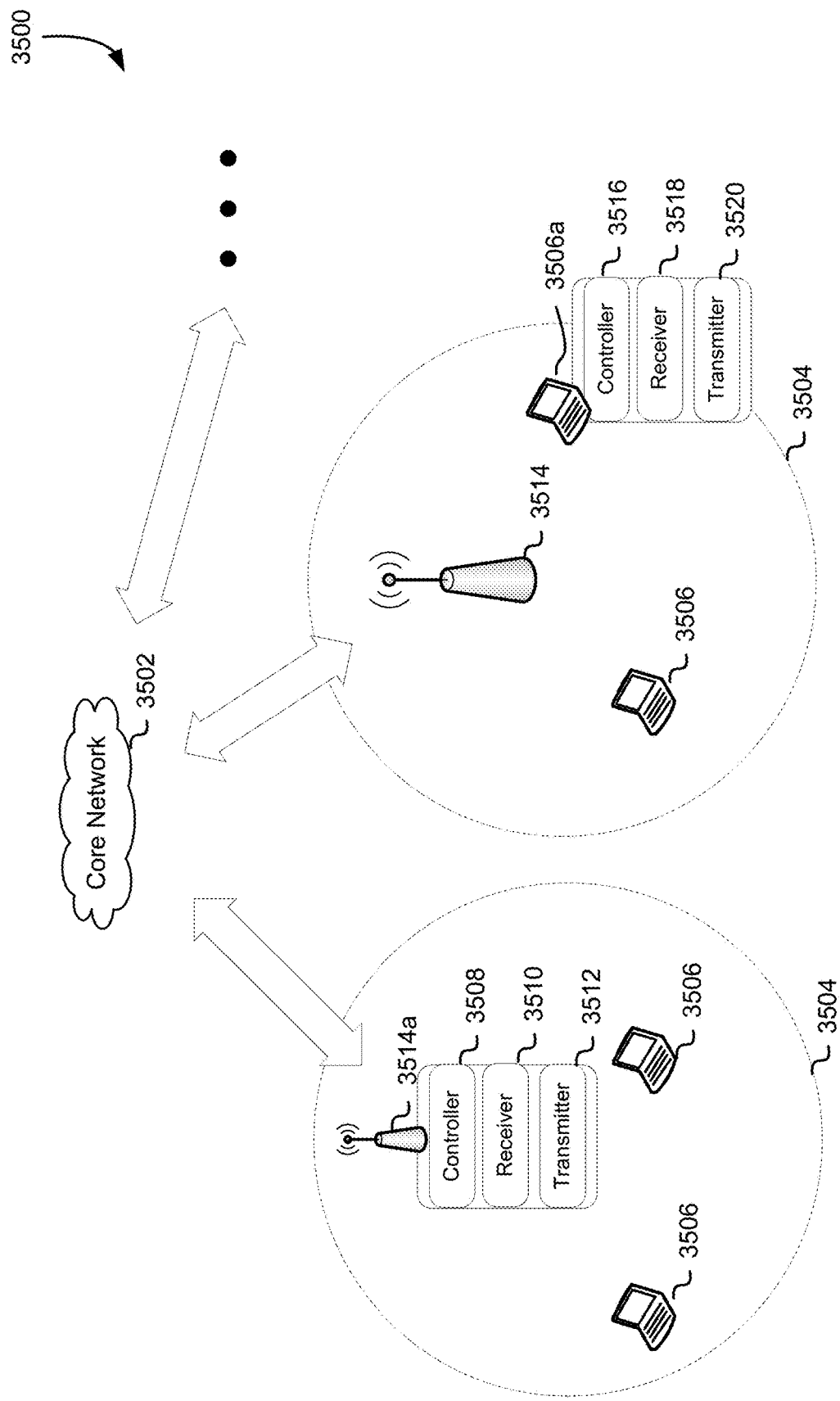
FIG. 35 is a diagram illustrating some basic functionality of a mobile telecommunications network/system operating in accordance with LTE and 5G principles, according to at least one embodiment.

FIG. 35 is a diagram illustrating some basic functionality of a mobile telecommunications network/system operating in accordance with LTE and 5G principles, in accordance with at least one embodiment. In at least one embodiment, a mobile telecommunications system includes infrastructure equipment comprising base stations 3514 which are connected to a core network 3502, which operates in accordance with a conventional arrangement which will be understood by those acquainted with communications technology. In at least one embodiment, infrastructure equipment 3514 may also be referred to as a base station, network element, enhanced NodeB (eNodeB) or a coordinating entity for example, and provides a wireless access interface to one or more communications devices within a coverage area or cell represented by a broken line 3504, which may be referred to as a radio access network. In at least one embodiment, one or more mobile communications devices 3506 may communicate data via transmission and reception of signals representing data using a wireless access interface. In at least one embodiment, core network 3502 may also provide functionality including authentication, mobility management, charging and so on for communications devices served by a network entity.

In at least one embodiment, mobile communications devices of FIG. 35 may also be referred to as communications terminals, user equipment (UE), terminal devices and so forth, and are configured to communicate with one or more other communications devices served by a same or a different coverage area via a network entity. In at least one embodiment, these communications may be performed by transmitting and receiving signals representing data using a wireless access interface over two way communications links.

In at least one embodiment, as shown in FIG. 35, one of eNodeBs 3514a is shown in more detail to include a transmitter 3512 for transmitting signals via a wireless access interface to one or more communications devices or UEs 3506, and a receiver 3510 to receive signals from one or more UEs within coverage area 3504. In at least one embodiment, controller 3508 controls transmitter 3512 and receiver 3510 to transmit and receive signals via a wireless access interface. In at least one embodiment, controller 3508 may perform a function of controlling allocation of communications resource elements of a wireless access interface and may in some examples include a scheduler for scheduling transmissions via a wireless access interface for both uplink and downlink.

In at least one embodiment, an example UE 3506a is shown in more detail to include a transmitter 3520 for transmitting signals on an uplink of a wireless access interface to eNodeB 3514 and a receiver 3518 for receiving signals transmitted by eNodeB 3514 on a downlink via a wireless access interface. In at least one embodiment, transmitter 3520 and receiver 3518 are controlled by a controller 3516.

In at least one embodiment, communications received by a mobile communications device 3506 are decoded by one or more processors to decode encoded information by providing compressed parts of information to one or more processors, and to combine parts of data decoded based on the compressed parts.

Figure 36:
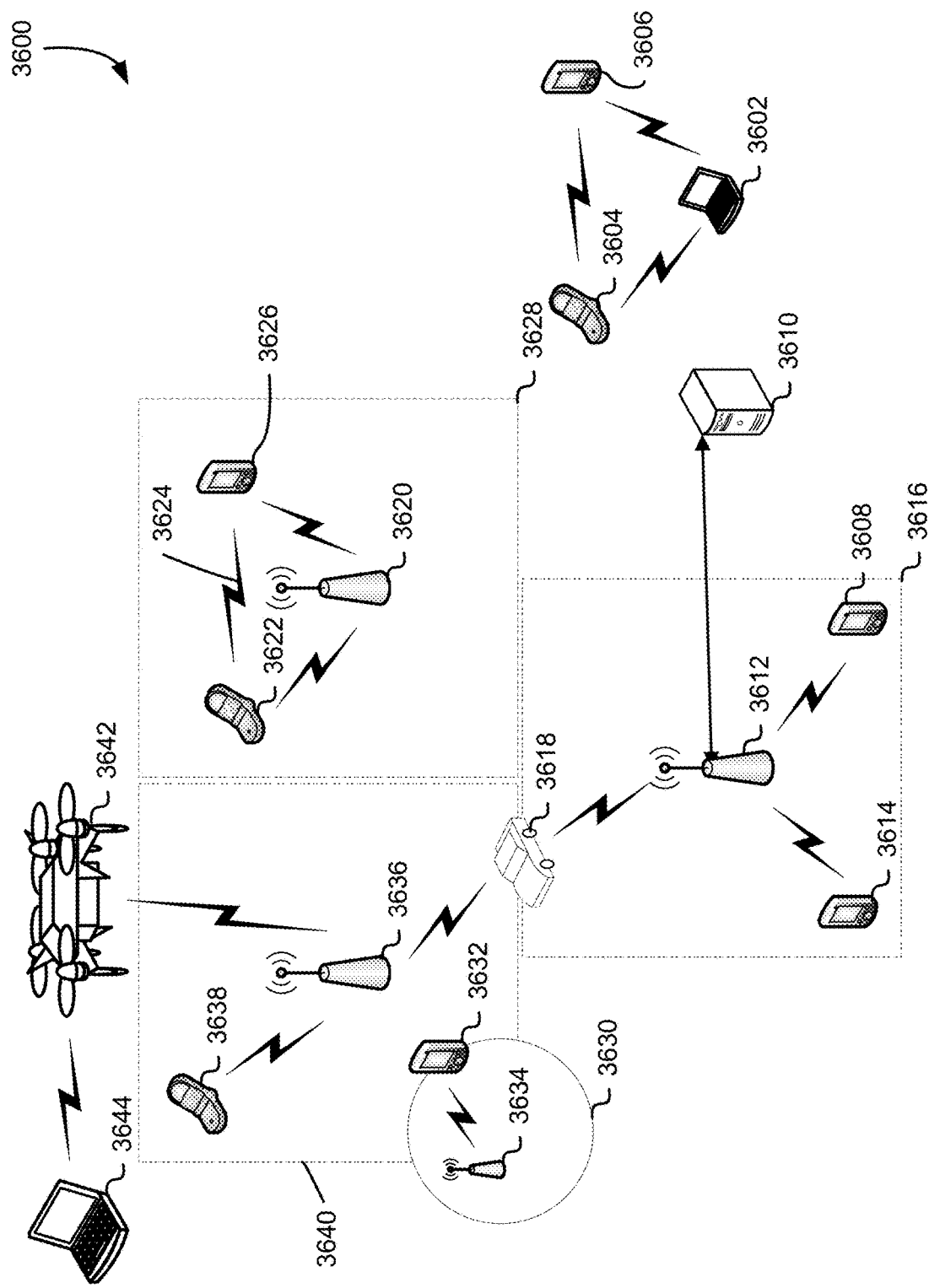
FIG. 36 illustrates a radio access network which may be part of a 5G network architecture, according to at least one embodiment.

FIG. 36 illustrates a radio access network 3600, which may be part of a 5G network architecture, in accordance with at least one embodiment. In at least one embodiment, radio access network 3600 covers a geographic region divided into a number of cellular regions (cells) that can be uniquely identified by a user equipment (UE) based on an identification broadcasted over a geographical area from one access point or base station. In at least one embodiment, macrocells 3640, 3628, and 3616, and a small cell 3630, may include one or more sectors. In at least one embodiment, a sector is a sub-area of a cell and all sectors within one cell are served by a same base station. In at least one embodiment, a single logical identification belonging to that sector can identify a radio link within a sector. In at least one embodiment, multiple sectors within a cell can be formed by groups of antennas with each antenna responsible for communication with UEs in a portion of a cell.

In at least one embodiment, each cell is served by a base station (BS). In at least one embodiment, a base station is a network element in a radio access network responsible for radio transmission and reception in one or more cells to or from a UE. In at least one embodiment, a base station may also be referred to as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology. In at least one embodiment, base stations may include a backhaul interface for communication with a backhaul portion of a network. In at least one embodiment, a base station has an integrated antenna or is connected to an antenna or remote radio head (RRH) by feeder cables.

In at least one embodiment, a backhaul may provide a link between a base station and a core network, and in some examples, a backhaul may provide interconnection between respective base stations. In at least one embodiment, a core network is a part of a wireless communication system that is generally independent of radio access technology used in a radio access network. In at least one embodiment, various types of backhaul interfaces, such as a direct physical connection, a virtual network, or like using any suitable transport network, may be employed. In at least one embodiment, some base stations may be configured as integrated access and backhaul (IAB) nodes, where a wireless spectrum may be used both for access links (i.e., wireless links with UEs), and for backhaul links, which is sometimes referred to as wireless self-backhauling. In at least one embodiment, through wireless self-backhauling, a wireless spectrum utilized for communication between a base station and UE may be leveraged for backhaul communication, enabling fast and easy deployment of highly dense small cell networks, as opposed to requiring each new base station deployment to be outfitted with its own hard-wired backhaul connection.

In at least one embodiment, high-power base stations 3636 and 3620 are shown in cells 3640 and 3628, and a high-power base station 3610 is shown controlling a remote radio head (RRH) 3612 in cell 3616. In at least one embodiment, cells 3640, 3628, and 3616 may be referred to as large size cells or macrocells. In at least one embodiment, a low-power base station 3634 is shown in small cell 3630 (e.g., a microcell, picocell, femtocell, home base station, home Node B, home eNode B, etc.) which may overlap with one or more macrocells, and may be referred to as a small cell or small size cell. In at least one embodiment, cell sizing can be done according to system design as well as component constraints. In at least one embodiment, a relay node may be deployed to extend size or coverage area of a given cell. In at least one embodiment, radio access network 3600 may include any number of wireless base stations and cells. In at least one embodiment, base stations 3636, 3620, 3610, 3634 provide wireless access points to a core network for any number of mobile apparatuses.

In at least one embodiment, a quadcopter or drone 3642 may be configured to function as a base station. In at least one embodiment, a cell may not necessarily be stationary, and a geographic area of a cell may move according to a location of a mobile base station such as quadcopter 3642.

In at least one embodiment, radio access network 3600 supports wireless communications for multiple mobile apparatuses. In at least one embodiment, a mobile apparatus is commonly referred to as user equipment (UE), but may also be referred to as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. In at least one embodiment, a UE may be an apparatus that provides a user with access to network services.

In at least one embodiment, a "mobile" apparatus need not necessarily have a capability to move, and may be stationary. In at least one embodiment, mobile apparatus or mobile device broadly refers to a diverse array of devices and technologies. In at least one embodiment, a mobile apparatus may be a mobile, a cellular (cell) phone, a smart phone, a session initiation protocol (SIP) phone, a laptop, a personal computer (PC), a notebook, a netbook, a smartbook, a tablet, a personal digital assistant (PDA), a broad array of embedded systems, e.g., corresponding to an "Internet of things" (IoT), an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, a digital home or smart home device such as a home audio, video, and/or multimedia device, an appliance, a vending machine, intelligent lighting, a home security system, a smart meter, a security device, a solar panel or solar array, a municipal infrastructure device controlling electric power (e.g., a smart grid), lighting, water, etc., an industrial automation and enterprise device, a logistics controller, agricultural equipment, military defense equipment, vehicles, aircraft, ships, and weaponry, etc. In at least one embodiment, a mobile apparatus may provide for connected medicine or telemedicine support, i.e., health care at a distance. In at least one embodiment, telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

In at least one embodiment, cells of radio access network 3600 may include UEs that may be in communication with one or more sectors of each cell. In at least one embodiment, UEs 3614 and 3608 may be in communication with base station 3610 by way of RRH 3612; UEs 3622 and 3626 may be in communication with base station 3620; UE 3632 may be in communication with low-power base station 3634; UEs 3638 and 3618 may be in communication with base station 3636; and UE 3644 may be in communication with mobile base station 3642. In at least one embodiment, each base station 3610, 3620, 3634, 3636, and 3642 may be configured to provide an access point to a core network (not shown) for all UEs in respective cells and transmissions from a base station (e.g., base station 3636) to one or more UEs (e.g., UEs 3638 and 3618) may be referred to as downlink (DL) transmission, while transmissions from a UE (e.g., UE 3638) to a base station may be referred to as uplink (UL) transmissions. In at least one embodiment, downlink may refer to a point-to-multipoint transmission, which may be referred to as broadcast channel multiplexing. In at least one embodiment, uplink may refer to a point-to-point transmission.

In at least one embodiment, quadcopter 3642, which may be referred to as a mobile network node, may be configured to function as a UE within cell 3640 by communicating with base station 3636. In at least one embodiment, multiple UEs (e.g., UEs 3622 and 3626) may communicate with each other using peer to peer (P2P) or sidelink signals 3624, which may bypass a base station such as base station 3620.

In at least one embodiment, ability for a UE to communicate while moving, independent of its location, is referred to as mobility. In at least one embodiment, a mobility management entity (MME) sets up, maintains, and releases various physical channels between a UE and a radio access network. In at least one embodiment, DL-based mobility or UL-based mobility may be utilized by a radio access network 3600 to enable mobility and handovers (i.e., transfer of a UE's connection from one radio channel to another). In at least one embodiment, a UE, in a network configured for DL-based mobility, may monitor various parameters of a signal from its serving cell as well as various parameters of neighboring cells, and, depending on a quality of these parameters, a UE may maintain communication with one or more neighboring cells. In at least one embodiment, if signal quality from a neighboring cell exceeds that from a serving cell for a given amount of time, or if a UE moves from one cell to another, a UE may undertake a handoff or handover from a serving cell to a neighboring (target) cell. In at least one embodiment, UE 3618 (illustrated as a vehicle, although any suitable form of UE may be used) may move from a geographic area corresponding to a cell, such as serving cell 3640, to a geographic area corresponding to a neighbor cell, such as neighbor cell 3616. In at least one embodiment, UE 3618 may transmit a reporting message to its serving base station 3636 indicating its condition when signal strength or quality from a neighbor cell 3616 exceeds that of its serving cell 3640 for a given amount of time. In at least one embodiment, UE 3618 may receive a handover command, and may undergo a handover to cell 3616.

In at least one embodiment, UL reference signals from each UE may be utilized by a network configured for UL-based mobility to select a serving cell for each UE. In at least one embodiment, base stations 3636, 3620, and 3610/3612 may broadcast unified synchronization signals (e.g., unified Primary Synchronization Signals (PSSs), unified Secondary Synchronization Signals (SSSs) and unified Physical Broadcast Channels (PBCH)). In at least one embodiment, UEs 3638, 3618, 3622, 3626, 3614, and 3608 may receive unified synchronization signals, derive a carrier frequency and slot timing from synchronization signals, and in response to deriving timing, transmit an uplink pilot or reference signal. In at least one embodiment, two or more cells (e.g., base stations 3636 and 3610/3612) within radio access network 3600 may concurrently receive an uplink pilot signal transmitted by a UE (e.g., UE 3618). In at least one embodiment, cells may measure a strength of a pilot signal, and a radio access network (e.g., one or more of base stations 3636 and 3610/3612 and/or a central node within a core network) may determine a serving cell for UE 3618. In at least one embodiment, a network may continue to monitor an uplink pilot signal transmitted by UE 3618 as UE 3618 moves through radio access network 3600. In at least one embodiment, a network 3600 may handover UE 3618 from a serving cell to a neighboring cell, with or without informing UE 3618, when a signal strength or quality of a pilot signal measured by a neighboring cell exceeds that of a signal strength or quality measured by a serving cell.

In at least one embodiment, synchronization signals transmitted by base stations 3636, 3620, and 3610/3612 may be unified, but may not identify a particular cell and rather may identify a zone of multiple cells operating on a same frequency and/or with a same timing. In at least one embodiment, zones in 5G networks or other next generation communication networks enable uplink-based mobility framework and improves efficiency of both a UE and a network, since amounts of mobility messages that need to be exchanged between a UE and a network may be reduced.

In at least one embodiment, air interface in a radio access network 3600 may utilize unlicensed spectrum, licensed spectrum, or shared spectrum. In at least one embodiment, unlicensed spectrum provides for shared use of a portion of a spectrum without need for a government-granted license, however, while compliance with some technical rules is generally still required to access an unlicensed spectrum, generally, any operator or device may gain access. In at least one embodiment, licensed spectrum provides for exclusive use of a portion of a spectrum, generally by virtue of a mobile network operator purchasing a license from a government regulatory body. In at least one embodiment, shared spectrum may fall between licensed and unlicensed spectrum, wherein technical rules or limitations may be required to access a spectrum, but a spectrum may still be shared by multiple operators and/or multiple RATs. In at least one embodiment, for example, a holder of a license for a portion of licensed spectrum may provide licensed shared access (LSA) to share that spectrum with other parties, e.g., with suitable licensee-determined conditions to gain access.

In at least one embodiment, communications transmitted by base stations 3636, 3620, and 3610/3612 are decoded by one or more processors to decode encoded information by providing compressed parts of information to one or more processors, and to combine parts of data decoded based on the compressed parts.

Figure 37:
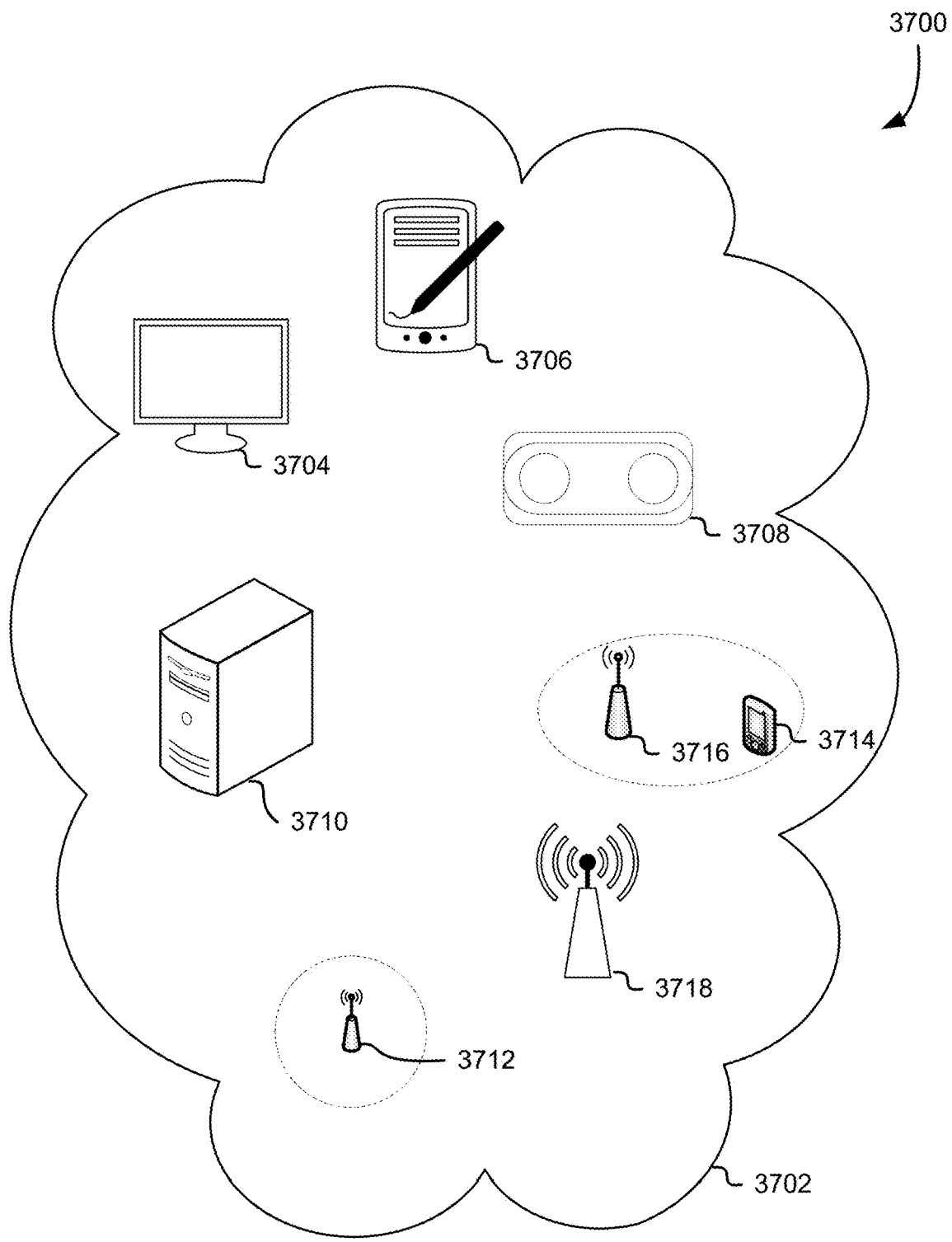
FIG. 37 provides an example illustration of a 5G mobile communications system in which a plurality of different types of devices is used, according to at least one embodiment.

FIG. 37 provides an example illustration of a 5G mobile communications system in which a plurality of different types of devices is used, in accordance with at least one embodiment. In at least one embodiment, as shown in FIG. 37, a first base station 3718 may be provided to a large cell or macro cell in which transmission of signals is over several kilometers. In at least one embodiment, however, system may also support transmission via a very small cell such as transmitted by a second infrastructure equipment 3716 which transmits and receives signals over a distance of hundreds of meters thereby forming a so called "Pico" cell. In at least one embodiment, a third type of infrastructure equipment 3712 may transmit and receive signals over a distance of tens of meters and therefore can be used to form a so called "Femto" cell.

In at least one embodiment, also shown in FIG. 37, different types of communications devices may be used to transmit and receive signals via different types of infrastructure equipment 3712, 3716, 3718 and communication of data may be adapted in accordance with different types of infrastructure equipment using different communications parameters. In at least one embodiment, conventionally, a mobile communications device may be configured to communicate data to and from a mobile communications network via available communication resources of network. In at least one embodiment, a wireless access system is configured to provide highest data rates to devices such as smart phones 3706. In at least one embodiment, "internet of things" may be provided in which low power machine type communications devices transmit and receive data at very low power, low bandwidth and may have a low complexity. In at least one embodiment, an example of such a machine type communication device 3714 may communicate via a Pico cell 3716. In at least one embodiment, a very high data rate and a low mobility may be characteristic of communications with, for example, a television 3704 which may be communicating via a Pico cell. In at least one embodiment, a very high data rate and low latency may be required by a virtual reality headset 3708. In at least one embodiment, a relay device 3710 may be deployed to extend size or coverage area of a given cell or network.

In at least one embodiment, communications transmitted by any transmitters depicted by FIG. 37, and received by any depicted receiver, are decoded by one or more processors to decode encoded information by providing compressed parts of information to one or more processors, and to combine parts of data decoded based on the compressed parts.

Figure 38:
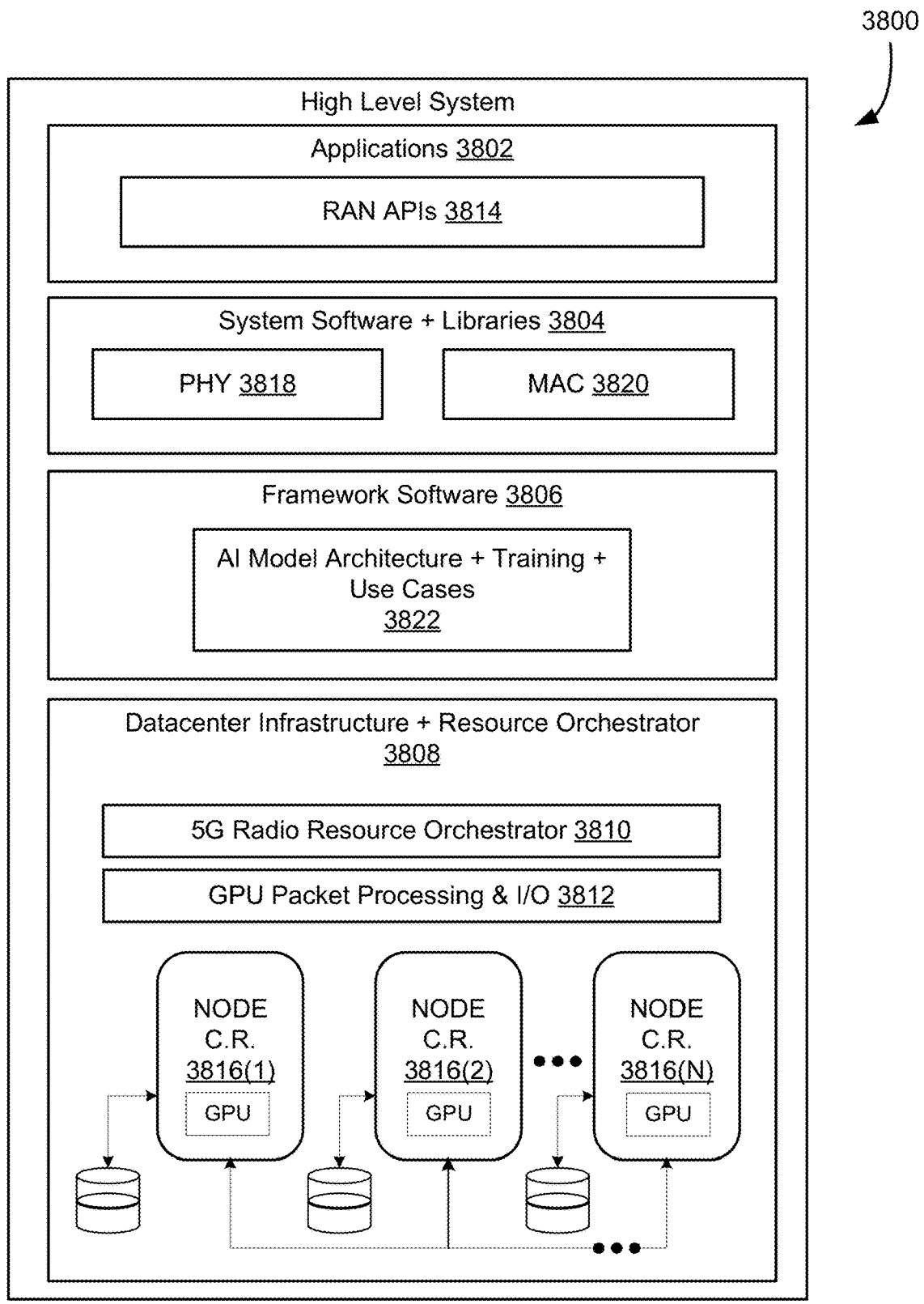
FIG. 38 illustrates an example high level system, according to at least one embodiment.

FIG. 38 illustrates an example high level system 3800, in which at least one embodiment may be used. In at least one embodiment, high level system 3800 includes applications 3802, system software+libraries 3804, framework software 3806 and a datacenter infrastructure+resource orchestrator 3808. In at least one embodiment, high level system 3800 may be implemented as a cloud service, physical service, virtual service, network service, and/or variations thereof.

In at least one embodiment, as shown in FIG. 38, datacenter infrastructure+resource orchestrator 3808 may include 5G radio resource orchestrator 3810, GPU packet processing & I/O 3812, and node computing resources ("node C.R.s") 3816(1)-3816(N), where "N" represents any whole, positive integer. In at least one embodiment, node C.R.s 3816(1)-3816(N) may include, but are not limited to, any number of central processing units ("CPUs") or other processors (including accelerators, field programmable gate arrays (FPGAs), graphics processors ("GPUs"), etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 3816(1)-3816(N) may be a server having one or more of above-mentioned computing resources.

In at least one embodiment, 5G radio resource orchestrator 3810 may configure or otherwise control one or more node C.R.s 3816(1)-3816(N) and/or other various components and resources a 5G network architecture may comprise. In at least one embodiment, 5G radio resource orchestrator 3810 may include a software design infrastructure ("SDI") management entity for high level system 3800. In at least one embodiment, 5G radio resource orchestrator 3810 may include hardware, software or some combination thereof. In at least one embodiment, 5G radio resource orchestrator 3810 may be utilized to configure or otherwise control various medium access control sublayers, radio access networks, physical layers or sublayers, and/or variations thereof, which may be part of a 5G network architecture. In at least one embodiment, 5G radio resource orchestrator 3810 may configure or allocate grouped compute, network, memory or storage resources to support one or more workloads which may be executed as part of a 5G network architecture.

In at least one embodiment, GPU packet processing & I/O 3812 may configure or otherwise process various inputs and outputs, as well as packets such as data packets, which may be transmitted/received as part of a 5G network architecture, which may be implemented by high level system 3800. In at least one embodiment, a packet may be data formatted to be provided by a network and may be typically divided into control information and payload (i.e., user data). In at least one embodiment, types of packets may include Internet Protocol version 4 (IPv4) packets, Internet Protocol version 6 (IPv6) packets, and Ethernet II frame packets. In at least one embodiment, control data of a data packet may be classified into data integrity fields and semantic fields. In at least one embodiment, network connections that a data packet may be received upon include a local area network, a wide-area network, a virtual private network, Internet, an intranet, an extranet, a public switched telephone network, an infrared network, a wireless network, a satellite network and any combination thereof.

In at least one embodiment, framework software 3806 includes an AI Model Architecture+Training+Use Cases 3822. In at least one embodiment, AI Model Architecture+Training+Use Cases 3822 may include tools, services, software or other resources to train one or more machine learning models or predict or infer information using one or more machine learning models according to one or more embodiments. For example, in at least one embodiment, a machine learning model may be trained by calculating weight parameters according to a neural network architecture using software and computing resources described above with respect to high level system 3800. In at least one embodiment, trained machine learning models corresponding to one or more neural networks may be used to infer or predict information using resources described above with respect to high level system 3800 by using weight parameters calculated through one or more training techniques. In at least one embodiment, framework software 3806 may include a framework to support system software+libraries 3804 and applications 3802.

In at least one embodiment, system software+libraries 3804 or applications 3802 may respectively include web-based service software or applications, such as those provided by Amazon Web Services, Google Cloud and Microsoft Azure. In at least one embodiment, framework software 3806 may include, but is not limited to, a type of free and open-source software web application framework such as Apache Spark™ (hereinafter "Spark"). In at least one embodiment, system software+libraries 3804 may include software used by at least portions of node C.R.s 3816(1)-3816(N). In at least one embodiment, one or more types of software may include, but are not limited to, Internet web page search software, e-mail virus scan software, database software, and streaming video content software.

In at least one embodiment, PHY 3818 is a set of system software and libraries configured to provide an interface with a physical layer of a wireless technology, which may be a physical layer such as a 5G New Radio (NR) physical layer. In at least one embodiment, an NR physical layer utilizes a flexible and scalable design and may comprise various components and technologies, such as modulation schemes, waveform structures, frame structures, reference signals, multi-antenna transmission and channel coding.

In at least one embodiment, a NR physical layer supports quadrature phase shift keying (QPSK), 16 quadrature amplitude modulation (QAM), 64 QAM and 256 QAM modulation formats. In at least one embodiment, different modulation schemes for different user entity (UE) categories may also be included in a NR physical layer. In at least one embodiment, a NR physical layer may utilize cyclic prefix orthogonal frequency division multiplexing (CP-OFDM) with a scalable numerology (subcarrier spacing, cyclic prefix) in both uplink (UL) and downlink (DL) up to at least 52.6 GHz. In at least one embodiment, a NR physical layer may support discrete Fourier transform spread orthogonal frequency division multiplexing (DFT-SOFDM) in UL for coverage-limited scenarios, with single stream transmissions (that is, without spatial multiplexing).

In at least one embodiment, a NR frame supports time division duplex (TDD) and frequency division duplex (FDD) transmissions and operation in both licensed and unlicensed spectrum, which enables very low latency, fast hybrid automatic repeat request (HARQ) acknowledgements, dynamic TDD, coexistence with LTE and transmissions of variable length (for example, short duration for ultra-reliable low-latency communications (URLLC) and long duration for enhanced mobile broadband (eMBB)). In at least one embodiment, NR frame structure follows three key design principles to enhance forward compatibility and reduce interactions between different features.

In at least one embodiment, a first principle is that transmissions are self-contained, which can refer to a scheme in which data in a slot and in a beam are decodable on its own without dependency on other slots and beams. In at least one embodiment, this implies that reference signals required for demodulation of data are included in a given slot and a given beam. In at least one embodiment, a second principle is that transmissions are well confined in time and frequency, which results in a scheme in which new types of transmissions in parallel with legacy transmissions may be introduced. In at least one embodiment, a third principle is avoiding static and/or strict timing relations across slots and across different transmission directions. In at least one embodiment, usage of a third principle can entail utilizing asynchronous hybrid automatic repeat request (HARQ) instead of predefined retransmission time.

In at least one embodiment, NR frame structure also allows for rapid HARQ acknowledgement, in which decoding is performed during reception of DL data and HARQ acknowledgement is prepared by a UE during a guard period, when switching from DL reception to UL transmission. In at least one embodiment, to obtain low latency, a slot (or a set of slots in case of slot aggregation) is front-loaded with control signals and reference signals at a beginning of a slot (or set of slots).

In at least one embodiment, NR has an ultra-lean design that minimizes always-on transmissions to enhance network energy efficiency and ensure forward compatibility. In at least one embodiment, reference signals in NR are transmitted only when necessary. In at least one embodiment, four main reference signals are demodulation reference signal (DMRS), phase-tracking reference signal (PTRS), sounding reference signal (SRS) and channel-state information reference signal (CSI-RS).

In at least one embodiment, DMRS is used to estimate a radio channel for demodulation. In at least one embodiment, DMRS is UE-specific, can be beamformed, confined in a scheduled resource, and transmitted only when necessary, both in DL and UL. In at least one embodiment, to support multiple-layer multiple-input, multiple-output (MIMO) transmission, multiple orthogonal DMRS ports can be scheduled, one for each layer. In at least one embodiment, a basic DMRS pattern is front loaded, as a DMRS design takes into account an early decoding requirement to support low-latency applications. In at least one embodiment, for low-speed scenarios, DMRS uses low density in a time domain. In at least one embodiment, however, for high-speed scenarios, a time density of DMRS is increased to track fast changes in a radio channel.

In at least one embodiment, PTRS is introduced in NR to enable compensation of oscillator phase noise. In at least one embodiment, typically, phase noise increases as a function of oscillator carrier frequency. In at least one embodiment, PTRS can therefore be utilized at high carrier frequencies (such as mmWave) to mitigate phase noise. In at least one embodiment, PTRS is UE-specific, confined in a scheduled resource and can be beamformed. In at least one embodiment, PTRS is configurable depending on a quality of oscillators, carrier frequency, OFDM sub-carrier spacing, and modulation and coding schemes used for transmission.

In at least one embodiment, SRS is transmitted in UL to perform channel state information (CSI) measurements mainly for scheduling and link adaptation. In at least one embodiment, for NR, SRS is also utilized for reciprocity-based precoder design for massive MIMO and UL beam management. In at least one embodiment, SRS has a modular and flexible design to support different procedures and UE capabilities. In at least one embodiment, an approach for channel state information reference signal (CSI-RS) is similar.

In at least one embodiment, NR employs different antenna solutions and techniques depending on which part of a spectrum is used for its operation. In at least one embodiment, for lower frequencies, a low to moderate number of active antennas (up to around 32 transmitter chains) is assumed and FDD operation is common. In at least one embodiment, acquisition of CSI requires transmission of CSI-RS in a DL and CSI reporting in an UL. In at least one embodiment, limited bandwidths available in this frequency region require high spectral efficiency enabled by multi-user MIMO (MU-MIMO) and higher order spatial multiplexing, which is achieved via higher resolution CSI reporting compared with LTE.

In at least one embodiment, for higher frequencies, a larger number of antennas can be employed in a given aperture, which increases a capability for beamforming and multi user (MU)-MIMO. In at least one embodiment, here, spectrum allocations are of TDD type and reciprocity-based operation is assumed. In at least one embodiment, high-resolution CSI in a form of explicit channel estimations is acquired by UL channel sounding. In at least one embodiment, such high-resolution CSI enables sophisticated pre-coding algorithms to be employed at a base station (BS). In at least one embodiment, for even higher frequencies (in mmWave range) an analog beamforming implementation is typically required currently, which limits transmission to a single beam direction per time unit and radio chain. In at least one embodiment, since an isotropic antenna element is very small in this frequency region owing to a short carrier wavelength, a great number of antenna elements is required to maintain coverage. In at least one embodiment, beamforming needs to be applied at both transmitter and receiver ends to combat increased path loss, even for control channel transmission.

In at least one embodiment, to support these diverse use cases, NR features a highly flexible but unified CSI framework, in which there is reduced coupling between CSI measurement, CSI reporting and an actual DL transmission in NR compared with LTE. In at least one embodiment, NR also supports more advanced schemes such as multi-point transmission and coordination. In at least one embodiment, control and data transmissions follow a self-contained principle, where all information required to decode a transmission (such as accompanying DMRS) is contained within a transmission itself. In at least one embodiment, as a result, a network can seamlessly change a transmission point or beam as an UE moves in a network.

In at least one embodiment, MAC 3820 is a set of system software and libraries configured to provide an interface with a medium access control (MAC) layer, which may be part of a 5G network architecture. In at least one embodiment, a MAC layer controls hardware responsible for interaction with a wired, optical or wireless transmission medium. In at least one embodiment, MAC provides flow control and multiplexing for a transmission medium.

In at least one embodiment, a MAC sublayer provides an abstraction of a physical layer such that complexities of a physical link control are invisible to a logical link control (LLC) and upper layers of a network stack. In at least one embodiment, any LLC sublayer (and higher layers) may be used with any MAC. In at least one embodiment, any MAC can be used with any physical layer, independent of transmission medium. In at least one embodiment, a MAC sublayer, when sending data to another device on a network, encapsulates higher-level frames into frames appropriate for a transmission medium, adds a frame check sequence to identify transmission errors, and then forwards data to a physical layer as soon as appropriate channel access method permits it. In at least one embodiment, MAC is also responsible for compensating for collisions if a jam signal is detected, in which a MAC may initiate retransmission.

In at least one embodiment, applications 3802 may include one or more types of applications used by at least portions of node C.R.s 3816(1)-3816(N) and/or framework software 3806. In at least one embodiment, one or more types of applications may include, but are not limited to, any number of a genomics application, a cognitive compute, and a machine learning application, including training or inferencing software, machine learning framework software (e.g., PyTorch, TensorFlow, Caffe, etc.) or other machine learning applications used in conjunction with one or more embodiments.

In at least one embodiment, RAN APIs 3814 may be a set of subroutine definitions, communication protocols, and/or software tools that provide a method of communication with components of a radio access network (RAN) which may be part of a 5G network architecture. In at least one embodiment, a radio access network is part of a network communications system and may implement a radio access technology. In at least one embodiment, radio access network functionality is typically provided by a silicon chip residing in both a core network as well as user equipment. Further information regarding a radio access network can be found in the description of FIG. 36.

In at least one embodiment, high level system 3800 may use CPUs, application-specific integrated circuits (ASICs), GPUs, FPGAs, or other hardware to perform training, inferencing, and/or other various processes using above-described resources. In at least one embodiment, moreover, one or more software and/or hardware resources described above may be configured as a service to allow users to train or performing inferencing of information, such as image recognition, speech recognition, or other artificial intelligence services, as well as other services such as services that allow users to configure and implement various aspects of a 5G network architecture.

In at least one embodiment, high level system 3800 may use CPUs, application-specific integrated circuits (ASICs), GPUs, FPGAs, or other hardware to encode data for transmission to a processor for decoding.

Figure 39:
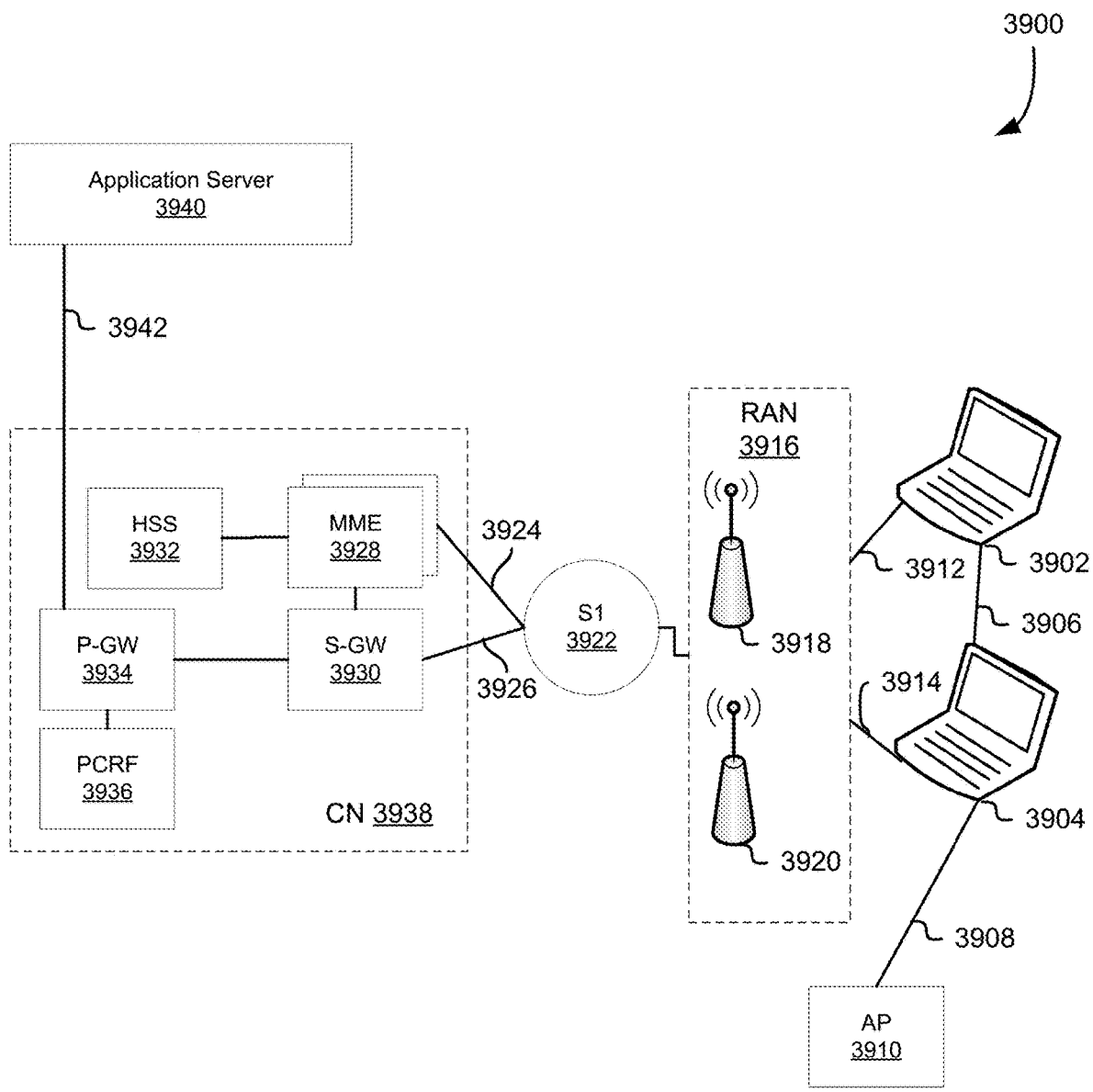
FIG. 39 illustrates an architecture of a system of a network, according to at least one embodiment.

FIG. 39 illustrates an architecture of a system 3900 of a network, in accordance with at least one embodiment. In at least one embodiment, system 3900 is shown to include a user equipment (UE) 3902 and a UE 3904. In at least one embodiment, UEs 3902 and 3904 are illustrated as smartphones (e.g., handheld touchscreen mobile computing devices connectable to one or more cellular networks) but may also comprise any mobile or non-mobile computing device, such as Personal Data Assistants (PDAs), pagers, laptop computers, desktop computers, wireless handsets, or any computing device including a wireless communications interface.

In at least one embodiment, any of UEs 3902 and 3904 can comprise an Internet of Things (IoT) UE, which can comprise a network access layer designed for low-power IoT applications utilizing short-lived UE connections. In at least one embodiment, an IoT UE can utilize technologies such as machine-to-machine (M2M) or machine-type communications (MTC) for exchanging data with an MTC server or device via a public land mobile network (PLMN), Proximity-Based Service (ProSe) or device-to-device (D2D) communication, sensor networks, or IoT networks. In at least one embodiment, a M2M or MTC exchange of data may be a machine-initiated exchange of data. In at least one embodiment, an IoT network describes interconnecting IoT UEs, which may include uniquely identifiable embedded computing devices (within Internet infrastructure), with short-lived connections. In at least one embodiment, an IoT UEs may execute background applications (e.g., keep alive messages, status updates, etc.) to facilitate connections of an IoT network.

In at least one embodiment, UEs 3902 and 3904 may be configured to connect, e.g., communicatively couple, with a radio access network (RAN) 3916. In at least one embodiment, RAN 3916 may be, for example, an Evolved Universal Mobile Telecommunications System (UMTS) Terrestrial Radio Access Network (E-UTRAN), a NextGen RAN (NG RAN), or some other type of RAN. In at least one embodiment, UEs 3902 and 3904 utilize connections 3912 and 3914, respectively, each of which comprises a physical communications interface or layer. In at least one embodiment, connections 3912 and 3914 are illustrated as an air interface to enable communicative coupling, and can be consistent with cellular communications protocols, such as a Global System for Mobile Communications (GSM) protocol, a code-division multiple access (CDMA) network protocol, a Push-to-Talk (PTT) protocol, a PTT over Cellular (POC) protocol, a Universal Mobile Telecommunications System (UMTS) protocol, a 3GPP Long Term Evolution (LTE) protocol, a fifth generation (5G) protocol, a New Radio (NR) protocol, and variations thereof.

In at least one embodiment, UEs 3902 and 3904 may further directly exchange communication data via a ProSe interface 3906. In at least one embodiment, ProSe interface 3906 may alternatively be referred to as a sidelink interface comprising one or more logical channels, including but not limited to a Physical Sidelink Control Channel (PSCCH), a Physical Sidelink Shared Channel (PSSCH), a Physical Sidelink Discovery Channel (PSDCH), and a Physical Sidelink Broadcast Channel (PSBCH).

In at least one embodiment, UE 3904 is shown to be configured to access an access point (AP) 3910 via connection 3908. In at least one embodiment, connection 3908 can comprise a local wireless connection, such as a connection consistent with any IEEE 802.11 protocol, wherein AP 3910 would comprise a wireless fidelity (WiFi®) router. In at least one embodiment, AP 3910 is shown to be connected to an Internet without connecting to a core network of a wireless system.

In at least one embodiment, RAN 3916 can include one or more access nodes that enable connections 3912 and 3914. In at least one embodiment, these access nodes (ANs) can be referred to as base stations (BSs), NodeBs, evolved NodeBs (eNBs), next Generation NodeBs (gNB), RAN nodes, and so forth, and can comprise ground stations (e.g., terrestrial access points) or satellite stations providing coverage within a geographic area (e.g., a cell). In at least one embodiment, RAN 3916 may include one or more RAN nodes for providing macrocells, e.g., macro RAN node 3918, and one or more RAN nodes for providing femtocells or picocells (e.g., cells having smaller coverage areas, smaller user capacity, or higher bandwidth compared to macrocells), e.g., low power (LP) RAN node 3920.

In at least one embodiment, any of RAN nodes 3918 and 3920 can terminate an air interface protocol and can be a first point of contact for UEs 3902 and 3904. In at least one embodiment, any of RAN nodes 3918 and 3920 can fulfill various logical functions for RAN 3916 including, but not limited to, radio network controller (RNC) functions such as radio bearer management, uplink and downlink dynamic radio resource management and data packet scheduling, and mobility management.

In at least one embodiment, UEs 3902 and 3904 can be configured to communicate using Orthogonal Frequency-Division Multiplexing (OFDM) communication signals with each other or with any of RAN nodes 3918 and 3920 over a multi-carrier communication channel in accordance various communication techniques, such as, but not limited to, an Orthogonal Frequency Division Multiple Access (OFDMA) communication technique (e.g., for downlink communications) or a Single Carrier Frequency Division Multiple Access (SC-FDMA) communication technique (e.g., for uplink and ProSe or sidelink communications), and/or variations thereof. In at least one embodiment, OFDM signals can comprise a plurality of orthogonal subcarriers.

In at least one embodiment, a downlink resource grid can be used for downlink transmissions from any of RAN nodes 3918 and 3920 to UEs 3902 and 3904, while uplink transmissions can utilize similar techniques. In at least one embodiment, a grid can be a time frequency grid, called a resource grid or time-frequency resource grid, which is a physical resource in a downlink in each slot. In at least one embodiment, such a time frequency plane representation is a common practice for OFDM systems, which makes it intuitive for radio resource allocation. In at least one embodiment, each column and each row of a resource grid corresponds to one OFDM symbol and one OFDM subcarrier, respectively. In at least one embodiment, a duration of a resource grid in a time domain corresponds to one slot in a radio frame. In at least one embodiment, a smallest time-frequency unit in a resource grid is denoted as a resource element. In at least one embodiment, each resource grid comprises a number of resource blocks, which describe a mapping of certain physical channels to resource elements. In at least one embodiment, each resource block comprises a collection of resource elements. In at least one embodiment, in a frequency domain, this may represent a smallest quantity of resources that currently can be allocated. In at least one embodiment, there are several different physical downlink channels that are conveyed using such resource blocks.

In at least one embodiment, a physical downlink shared channel (PDSCH) may carry user data and higher-layer signaling to UEs 3902 and 3904. In at least one embodiment, a physical downlink control channel (PDCCH) may carry information about a transport format and resource allocations related to PDSCH channel, among other things. In at least one embodiment, it may also inform UEs 3902 and 3904 about a transport format, resource allocation, and HARQ (Hybrid Automatic Repeat Request) information related to an uplink shared channel. In at least one embodiment, typically, downlink scheduling (assigning control and shared channel resource blocks to UE 3902 within a cell) may be performed at any of RAN nodes 3918 and 3920 based on channel quality information fed back from any of UEs 3902 and 3904. In at least one embodiment, downlink resource assignment information may be sent on a PDCCH used for (e.g., assigned to) each of UEs 3902 and 3904.

In at least one embodiment, a PDCCH may use control channel elements (CCEs) to convey control information. In at least one embodiment, before being mapped to resource elements, PDCCH complex valued symbols may first be organized into quadruplets, which may then be permuted using a sub-block interleaver for rate matching. In at least one embodiment, each PDCCH may be transmitted using one or more of these CCEs, where each CCE may correspond to nine sets of four physical resource elements known as resource element groups (REGs). In at least one embodiment, four Quadrature Phase Shift Keying (QPSK) symbols may be mapped to each REG. In at least one embodiment, PDCCH can be transmitted using one or more CCEs, depending on a size of a downlink control information (DCI) and a channel condition. In at least one embodiment, there can be four or more different PDCCH formats defined in LTE with different numbers of CCEs (e.g., aggregation level, L=1, 2, 4, or 8).

In at least one embodiment, an enhanced physical downlink control channel (EPDCCH) that uses PDSCH resources may be utilized for control information transmission. In at least one embodiment, EPDCCH may be transmitted using one or more enhanced control channel elements (ECCEs). In at least one embodiment, each ECCE may correspond to nine sets of four physical resource elements known as an enhanced resource element groups (EREGs). In at least one embodiment, an ECCE may have other numbers of EREGs in some situations.

In at least one embodiment, RAN 3916 is shown to be communicatively coupled to a core network (CN) 3938 via an S1 interface 3922. In at least one embodiment, CN 3938 may be an evolved packet core (EPC) network, a NextGen Packet Core (NPC) network, or some other type of CN. In at least one embodiment, S1 interface 922 is split into two parts: S1-U interface 3926, which carries traffic data between RAN nodes 3918 and 3920 and serving gateway (S-GW) 3930, and a S1-mobility management entity (MME) interface 3924, which is a signaling interface between RAN nodes 3918 and 3920 and MMEs 3928.

In at least one embodiment, CN 3938 comprises MMEs 3928, S-GW 3930, Packet Data Network (PDN) Gateway (P-GW) 3934, and a home subscriber server (HSS) 3932. In at least one embodiment, MMEs 3928 may be similar in function to a control plane of legacy Serving General Packet Radio Service (GPRS) Support Nodes (SGSN). In at least one embodiment, MMEs 3928 may manage mobility aspects in access such as gateway selection and tracking area list management. In at least one embodiment, HSS 3932 may comprise a database for network users, including subscription related information to support a network entities' handling of communication sessions. In at least one embodiment, CN 3938 may comprise one or several HSSs 3932, depending on a number of mobile subscribers, on a capacity of an equipment, on an organization of a network, etc. In at least one embodiment, HSS 3932 can provide support for routing/roaming, authentication, authorization, naming/addressing resolution, location dependencies, etc.

In at least one embodiment, S-GW 3930 may terminate a S1 interface 3922 towards RAN 3916, and routes data packets between RAN 3916 and CN 3938. In at least one embodiment, S-GW 3930 may be a local mobility anchor point for inter-RAN node handovers and also may provide an anchor for inter-3GPP mobility. In at least one embodiment, other responsibilities may include lawful intercept, charging, and some policy enforcement.

In at least one embodiment, P-GW 3934 may terminate an SGi interface toward a PDN. In at least one embodiment, P-GW 3934 may route data packets between an EPC network 3938 and external networks such as a network including application server 3940 (alternatively referred to as application function (AF)) via an Internet Protocol (IP) interface 3942. In at least one embodiment, application server 3940 may be an element offering applications that use IP bearer resources with a core network (e.g., UMTS Packet Services (PS) domain, LTE PS data services, etc.). In at least one embodiment, P-GW 3934 is shown to be communicatively coupled to an application server 3940 via an IP communications interface 3942. In at least one embodiment, application server 3940 can also be configured to support one or more communication services (e.g., Voice-over- Internet Protocol (VoIP) sessions, PTT sessions, group communication sessions, social networking services, etc.) for UEs 3902 and 3904 via CN 3938.

In at least one embodiment, P-GW 3934 may further be a node for policy enforcement and charging data collection. In at least one embodiment, policy and Charging Enforcement Function (PCRF) 3936 is a policy and charging control element of CN 3938. In at least one embodiment, in a non-roaming scenario, there may be a single PCRF in a Home Public Land Mobile Network (HPLMN) associated with a UE's Internet Protocol Connectivity Access Network (IP-CAN) session. In at least one embodiment, in a roaming scenario with local breakout of traffic, there may be two PCRFs associated with a UE's IP-CAN session: a Home PCRF (H-PCRF) within a HPLMN and a Visited PCRF (V-PCRF) within a Visited Public Land Mobile Network (VPLMN). In at least one embodiment, PCRF 3936 may be communicatively coupled to application server 3940 via P-GW 3934. In at least one embodiment, application server 3940 may signal PCRF 3936 to indicate a new service flow and select an appropriate Quality of Service (QoS) and charging parameters. In at least one embodiment, PCRF 3936 may provision this rule into a Policy and Charging Enforcement Function (PCEF) (not shown) with an appropriate traffic flow template (TFT) and QoS class of identifier (QCI), which commences a QoS and charging as specified by application server 3940.

In at least one embodiment, UEs 3902 and 3904 comprise processors to decode encoded data by providing compressed parts of information to decode encoded data to one or more processors, and to combine parts of data decoded by one or more processors.

Figure 40:
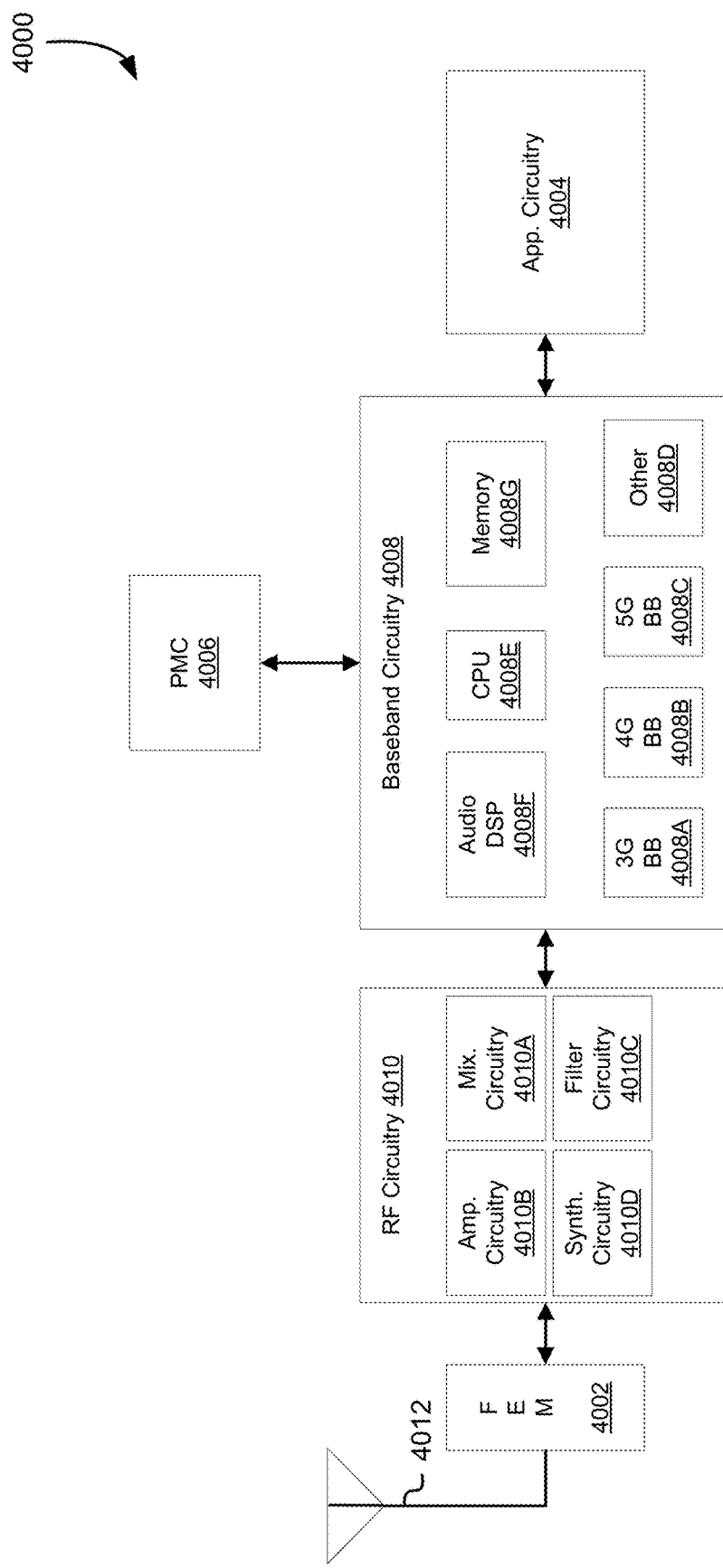
FIG. 40 illustrates example components of a device, according to at least one embodiment.

FIG. 40 illustrates example components of a device 4000 in accordance with at least one embodiment. In at least one embodiment, device 4000 may include application circuitry 4004, baseband circuitry 4008, Radio Frequency (RF) circuitry 4010, front-end module (FEM) circuitry 4002, one or more antennas 4012, and power management circuitry (PMC) 4006 coupled together at least as shown. In at least one embodiment, components of illustrated device 4000 may be included in a UE or a RAN node. In at least one embodiment, device 4000 may include less elements (e.g., a RAN node may not utilize application circuitry 4004, and instead include a processor/controller to process IP data received from an EPC). In at least one embodiment, device 4000 may include additional elements such as, for example, memory/storage, display, camera, sensor, or input/output (I/O) interface. In at least one embodiment, components described below may be included in more than one device (e.g., said circuitries may be separately included in more than one device for Cloud-RAN (C-RAN) implementations).

In at least one embodiment, application circuitry 4004 may include one or more application processors. In at least one embodiment, application circuitry 4004 may include circuitry such as, but not limited to, one or more single-core or multi-core processors. In at least one embodiment, processor(s) may include any combination of general purpose processors and dedicated processors (e.g., graphics processors, application processors, etc.). In at least one embodiment, processors may be coupled with or may include memory/storage and may be configured to execute instructions stored in memory/storage to enable various applications or operating systems to run on device 4000. In at least one embodiment, processors of application circuitry 4004 may process IP data packets received from an EPC.

In at least one embodiment, baseband circuitry 4008 may include circuitry such as, but not limited to, one or more single-core or multi-core processors. In at least one embodiment, baseband circuitry 4008 may include one or more baseband processors or control logic to process baseband signals received from a receive signal path of RF circuitry 4010 and to generate baseband signals for a transmit signal path of RF circuitry 4010. In at least one embodiment, baseband processing circuity 4008 may interface with application circuitry 4004 for generation and processing of baseband signals and for controlling operations of RF circuitry 4010. In at least one embodiment, baseband circuitry 4008 may include a third generation (3G) baseband processor 4008A, a fourth generation (4G) baseband processor 4008B, a fifth generation (5G) baseband processor 4008C, or other baseband processor(s) 4008D for other existing generations, generations in development or to be developed (e.g., second generation (2G), sixth generation (6G), etc.). In at least one embodiment, baseband circuitry 4008 (e.g., one or more of base-band processors 4008A-D) may handle various radio control functions that enable communication with one or more radio networks via RF circuitry 4010. In at least one embodiment, some or all of a functionality of baseband processors 4008A-D may be included in modules stored in memory 4008G and executed via a Central Processing Unit (CPU) 4008E. In at least one embodiment, radio control functions may include, but are not limited to, signal modulation/demodulation, encoding/decoding, radio frequency shifting, etc. In at least one embodiment, modulation/demodulation circuitry of baseband circuitry 4008 may include Fast-Fourier Transform (FFT), precoding, or constellation mapping/demapping functionality. In at least one embodiment, encoding/decoding circuitry of baseband circuitry 4008 may include convolution, tailbiting convolution, turbo, Viterbi, or Low Density Parity Check (LDPC) encoder/decoder functionality.

In at least one embodiment, baseband circuitry 4008 may include one or more audio digital signal processor(s) (DSP) 4008F. In at least one embodiment, audio DSP(s) 4008F may be include elements for compression/decompression and echo cancellation and may include other suitable processing elements in other embodiments. In at least one embodiment, components of baseband circuitry may be suitably combined in a single chip, a single chipset, or disposed on a same circuit board in some embodiments. In at least one embodiment, some or all of constituent components of baseband circuitry 4008 and application circuitry 4004 may be implemented together such as, for example, on a system on a chip (SOC).

In at least one embodiment, baseband circuitry 4008 may provide for communication compatible with one or more radio technologies. In at least one embodiment, baseband circuitry 4008 may support communication with an evolved universal terrestrial radio access network (EUTRAN) or other wireless metropolitan area networks (WMAN), a wireless local area network (WLAN), a wireless personal area network (WPAN). In at least one embodiment, baseband circuitry 4008 is configured to support radio communications of more than one wireless protocol and may be referred to as multimode baseband circuitry.

In at least one embodiment, RF circuitry 4010 may enable communication with wireless networks using modulated electromagnetic radiation through a non-solid medium. In at least one embodiment, RF circuitry 4010 may include switches, filters, amplifiers, etc. to facilitate communication with a wireless network. In at least one embodiment, RF circuitry 4010 may include a receive signal path which may include circuitry to down-convert RF signals received from FEM circuitry 4002 and provide baseband signals to baseband circuitry 4008. In at least one embodiment, RF circuitry 4010 may also include a transmit signal path which may include circuitry to up-convert baseband signals provided by baseband circuitry 4008 and provide RF output signals to FEM circuitry 4002 for transmission.

In at least one embodiment, receive signal path of RF circuitry 4010 may include mixer circuitry 4010*a*, amplifier circuitry 4010*b* and filter circuitry 4010*c*. In at least one embodiment, a transmit signal path of RF circuitry 4010 may include filter circuitry 4010*c* and mixer circuitry 4010*a*. In at least one embodiment, RF circuitry 4010 may also include synthesizer circuitry 4010*d* for synthesizing a frequency for use by mixer circuitry 4010*a* of a receive signal path and a transmit signal path. In at least one embodiment, mixer circuitry 4010*a* of a receive signal path may be configured to down-convert RF signals received from FEM circuitry 4002 based on a synthesized frequency provided by synthesizer circuitry 4010*d*. In at least one embodiment, amplifier circuitry 4010*b* may be configured to amplify down-converted signals and filter circuitry 4010*c* may be a low-pass filter (LPF) or band-pass filter (BPF) configured to remove unwanted signals from down-converted signals to generate output baseband signals. In at least one embodiment, output baseband signals may be provided to baseband circuitry 4008 for further processing. In at least one embodiment, output baseband signals may be zero-frequency baseband signals, although this is not a requirement. In at least one embodiment, mixer circuitry 4010*a* of a receive signal path may comprise passive mixers.

In at least one embodiment, mixer circuitry 4010*a* of a transmit signal path may be configured to up-convert input baseband signals based on a synthesized frequency provided by synthesizer circuitry 4010*d* to generate RF output signals for FEM circuitry 4002. In at least one embodiment, baseband signals may be provided by baseband circuitry 4008 and may be filtered by filter circuitry 4010*c*.

In at least one embodiment, mixer circuitry 4010*a* of a receive signal path and mixer circuitry 4010*a* of a transmit signal path may include two or more mixers and may be arranged for quadrature down conversion and up conversion, respectively. In at least one embodiment, mixer circuitry 4010*a* of a receive signal path and mixer circuitry 4010*a* of a transmit signal path may include two or more mixers and may be arranged for image rejection (e.g., Hartley image rejection). In at least one embodiment, mixer circuitry 4010*a* of a receive signal path and mixer circuitry 4010*a* may be arranged for direct down conversion and direct up conversion, respectively. In at least one embodiment, mixer circuitry 4010*a* of a receive signal path and mixer circuitry 4010*a* of a transmit signal path may be configured for super-heterodyne operation.

In at least one embodiment, output baseband signals and input baseband signals may be analog baseband signals. In at least one embodiment, output baseband signals and input baseband signals may be digital baseband signals. In at least one embodiment, RF circuitry 4010 may include analog-to-digital converter (ADC) and digital-to-analog converter (DAC) circuitry and baseband circuitry 4008 may include a digital baseband interface to communicate with RF circuitry 4010.

In at least one embodiment, a separate radio IC circuitry may be provided for processing signals for each spectrum In at least one embodiment, synthesizer circuitry 4010*d* may be a fractional-N synthesizer or a fractional N/N+1 synthesizer. In at least one embodiment, synthesizer circuitry 4010*d* may be a delta-sigma synthesizer, a frequency multiplier, or a synthesizer comprising a phase-locked loop with a frequency divider.

In at least one embodiment, synthesizer circuitry 4010*d* may be configured to synthesize an output frequency for use by mixer circuitry 4010*a* of RF circuitry 4010 based on a frequency input and a divider control input. In at least one embodiment, synthesizer circuitry 4010*d* may be a fractional N/N+1 synthesizer.

In at least one embodiment, frequency input may be provided by a voltage-controlled oscillator (VCO). In at least one embodiment, divider control input may be provided by either baseband circuitry 4008 or applications processor 4004 depending on a desired output frequency. In at least one embodiment, a divider control input (e.g., N) may be determined from a look-up table based on a channel indicated by applications processor 4004.

In at least one embodiment, synthesizer circuitry 4010*d* of RF circuitry 4010 may include a divider, a delay-locked loop (DLL), a multiplexer and a phase accumulator. In at least one embodiment, divider may be a dual modulus divider (DMD) and phase accumulator may be a digital phase accumulator (DPA). In at least one embodiment, DMD may be configured to divide an input signal by either N or N+1 (e.g., based on a carry out) to provide a fractional division ratio. In at least one embodiment, DLL may include a set of cascaded, tunable, delay elements, a phase detector, a charge pump and a D-type flip-flop. In at least one embodiment, delay elements may be configured to break a VCO period up into Nd equal packets of phase, where Nd is a number of delay elements in a delay line. In at least one embodiment, in this way, DLL provides negative feedback to help ensure that total delay through a delay line is one VCO cycle.

In at least one embodiment, synthesizer circuitry 4010*d* may be configured to generate a carrier frequency as an output frequency, while in other embodiments, output frequency may be a multiple of a carrier frequency (e.g., twice a carrier frequency, four times a carrier frequency) and used in conjunction with quadrature generator and divider circuitry to generate multiple signals at a carrier frequency with multiple different phases with respect to each other. In at least one embodiment, output frequency may be a LO frequency (fLO). In at least one embodiment, RF circuitry 4010 may include an IQ/polar converter.

In at least one embodiment, FEM circuitry 4002 may include a receive signal path which may include circuitry configured to operate on RF signals received from one or more antennas 4012, amplify received signals and provide amplified versions of received signals to RF circuitry 4010 for further processing. In at least one embodiment, FEM circuitry 4002 may also include a transmit signal path which may include circuitry configured to amplify signals for transmission provided by RF circuitry 4010 for transmission by one or more of one or more antennas 4012. In at least one embodiment, amplification through a transmit or receive signal paths may be done solely in RF circuitry 4010, solely in FEM 4002, or in both RF circuitry 4010 and FEM 4002.

In at least one embodiment, FEM circuitry 4002 may include a TX/RX switch to switch between transmit mode and receive mode operation. In at least one embodiment, FEM circuitry may include a receive signal path and a transmit signal path. In at least one embodiment, a receive signal path of FEM circuitry may include an LNA to amplify received RF signals and provide amplified received RF signals as an output (e.g., to RF circuitry 4010). In at least one embodiment, a transmit signal path of FEM circuitry 4002 may include a power amplifier (PA) to amplify input RF signals (e.g., provided by RF circuitry 4010), and one or more filters to generate RF signals for subsequent transmission (e.g., by one or more of one or more antennas 4012).

In at least one embodiment, PMC 4006 may manage power provided to baseband circuitry 4008. In at least one embodiment, PMC 4006 may control power-source selection, voltage scaling, battery charging, or DC-to-DC conversion. In at least one embodiment, PMC 4006 may often be included when device 4000 is capable of being powered by a battery, for example, when device is included in a UE. In at least one embodiment, PMC 4006 may increase power conversion efficiency while providing desirable implementation size and heat dissipation characteristics.

In at least one embodiment, PMC 4006 may be additionally or alternatively coupled with, and perform similar power management operations for, other components such as, but not limited to, application circuitry 4004, RF circuitry 4010, or FEM 4002.

In at least one embodiment, PMC 4006 may control, or otherwise be part of, various power saving mechanisms of device 4000. In at least one embodiment, if device 4000 is in an RRC Connected state, where it is still connected to a RAN node as it expects to receive traffic shortly, then it may enter a state known as Discontinuous Reception Mode (DRX) after a period of inactivity. In at least one embodiment, during this state, device 4000 may power down for brief intervals of time and thus save power.

In at least one embodiment, if there is no data traffic activity for an extended period of time, then device 4000 may transition off to an RRC Idle state, where it disconnects from a network and does not perform operations such as channel quality feedback, handover, etc. In at least one embodiment, device 4000 goes into a very low power state and it performs paging where again it periodically wakes up to listen to a network and then powers down again. In at least one embodiment, device 4000 may not receive data in this state, in order to receive data, it must transition back to RRC Connected state.

In at least one embodiment, an additional power saving mode may allow a device to be unavailable to a network for periods longer than a paging interval (ranging from seconds to a few hours). In at least one embodiment, during this time, a device is totally unreachable to a network and may power down completely. In at least one embodiment, any data sent during this time incurs a large delay and it is assumed delay is acceptable.

In at least one embodiment, processors of application circuitry 4004 and processors of baseband circuitry 4008 may be used to execute elements of one or more instances of a protocol stack. In at least one embodiment, processors of baseband circuitry 4008, alone or in combination, may be used execute Layer 3, Layer 2, or Layer 1 functionality, while processors of application circuitry 4008 may utilize data (e.g., packet data) received from these layers and further execute Layer 4 functionality (e.g., transmission communication protocol (TCP) and user datagram protocol (UDP) layers). In at least one embodiment, layer 3 may comprise a radio resource control (RRC) layer. In at least one embodiment, Layer 2 may comprise a medium access control (MAC) layer, a radio link control (RLC) layer, and a packet data convergence protocol (PDCP) layer. In at least one embodiment, Layer 1 may comprise a physical (PHY) layer of a UE/RAN node.

Figure 41:
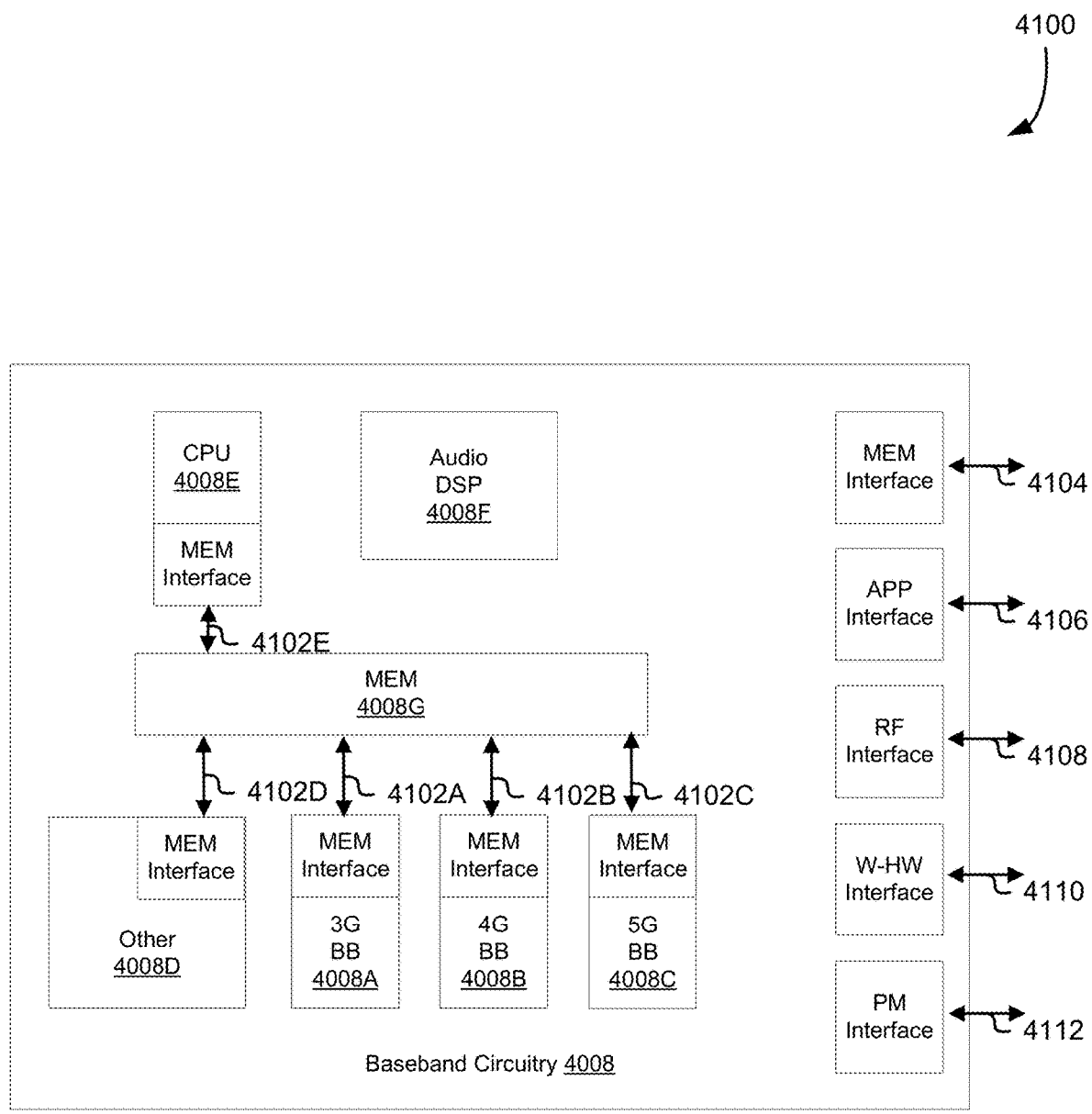
FIG. 41 illustrates example interfaces of baseband circuitry, according to at least one embodiment.

FIG. 41 illustrates example interfaces of baseband circuitry, in accordance with at least one embodiment. In at least one embodiment, as discussed above, baseband circuitry 4008 of FIG. 40 may comprise processors 4008A-4008E and a memory 4008G utilized by said processors. In at least one embodiment, each of processors 4008A-4008E may include a memory interface, 4102A-4102E, respectively, to send/receive data to/from memory 4008G.

In at least one embodiment, baseband circuitry 4008 may further include one or more interfaces to communicatively couple to other circuitries/devices, such as a memory interface 4104 (e.g., an interface to send/receive data to/from memory external to baseband circuitry 4008), an application circuitry interface 4106 (e.g., an interface to send/receive data to/from application circuitry 4004 of FIG. 40), an RF circuitry interface 4108 (e.g., an interface to send/receive data to/from RF circuitry 4010 of FIG. 40), a wireless hardware connectivity interface 4110 (e.g., an interface to send/receive data to/from Near Field Communication (NFC) components, Bluetooth® components (e.g., Bluetooth® Low Energy), Wi-Fi® components, and other communication components), and a power management interface 4112 (e.g., an interface to send/receive power or control signals to/from PMC 4006.

Figure 42:
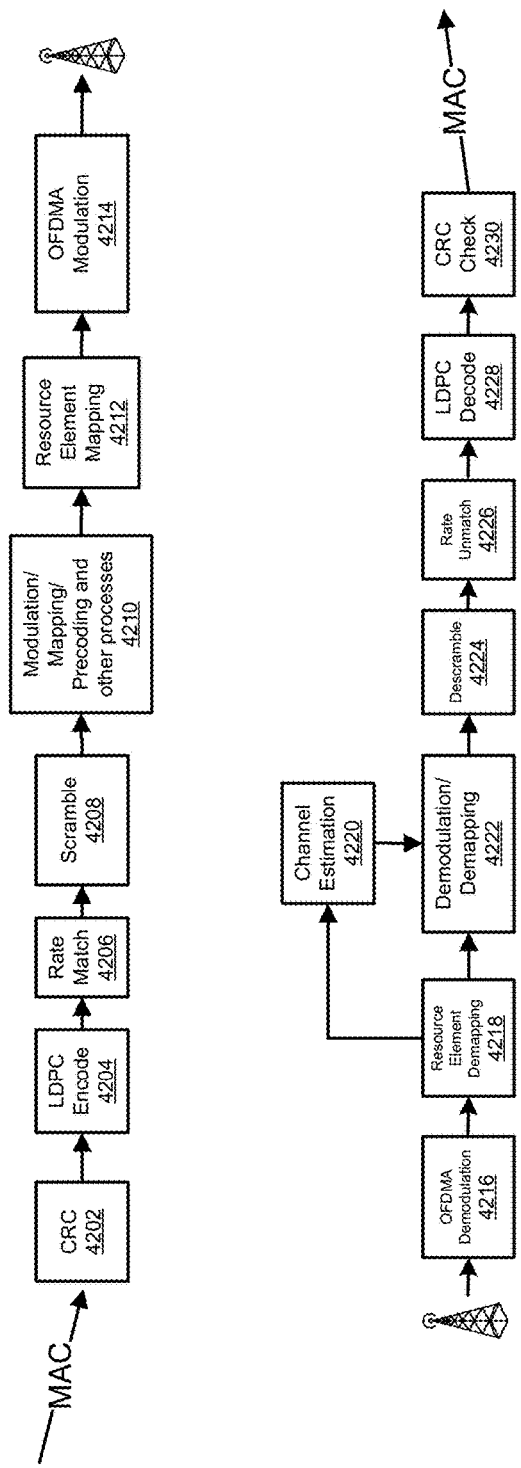
FIG. 42 illustrates an example of an uplink channel, according to at least one embodiment.

FIG. 42 illustrates an example of an uplink channel, in accordance with at least one embodiment. In at least one embodiment, FIG. 42 illustrates transmitting and receiving data within a physical uplink shared channel (PUSCH) in 5G NR, which may be part of a physical layer of a mobile device network.

In at least one embodiment, Physical Uplink Shared Channel (PUSCH) in 5G NR is designated to carry multiplexed control information and user application data. In at least one embodiment, 5G NR provides much more flexibility and reliability comparing to its predecessor, which in some examples may be referred to as 4G LTE, including more elastic pilot arrangements and support for both cyclic prefix (CP)-OFDM and Discrete Fourier Transform spread (DFT-s)-OFDM waveforms. In at least one embodiment, standard introduced filtered OFDM (f-OFDM) technique is utilized to add additional filtering to reduce Out-of-Band emission and improve performance at higher modulation orders. In at least one embodiment, modifications in Forward Error Correction (FEC) were imposed to replace Turbo Codes used in 4G LTE by Quasi-Cyclic Low Density Parity Check (QC-LDPC) codes, which were proven to achieve better transmission rates and provide opportunities for more efficient hardware implementations.

In at least one embodiment, transmission of 5G NR downlink and uplink data is organized into frames of 10 ms duration, each divided into 10 subframes of 1 ms each. In at least one embodiment, subframes are composed of a variable number of slots, depending on a selected subcarrier spacing which is parameterized in 5G NR. In at least one embodiment, a slot is built from 14 OFDMA symbols, each prepended with a cyclic prefix. In at least one embodiment, a subcarrier that is located within a passband and is designated for transmission is called a Resource Element (RE). In at least one embodiment, a group of 12 neighboring RE in a same symbol form a Physical Resource Block (PRB).

In at least one embodiment, 5G NR standard defined two types of reference signals associated with transmission within a PUSCH channel. In at least one embodiment, Demodulation Reference Signal (DMRS) is a user specific reference signal with high frequency density. In at least one embodiment, DMRS is transmitted within dedicated orthogonal frequency-division multiple access (OFDMA) symbols only and designated for frequency-selective channel estimation. In at least one embodiment, a number of DMRS symbols within a slot may vary between 1 and 4 depending on configuration, where a denser DMRS symbol spacing in time is designated for fast time-varying channels to obtain more accurate estimates within a coherence time of a channel. In at least one embodiment, in a frequency domain, DMRS PRB are mapped within a whole transmission allocation. In at least one embodiment, spacing between a DMRS resource element (RE) assigned for a same Antenna Port (AP) may be chosen between 2 and 3. In at least one embodiment, in a case of 2-2 multiple-input, multiple-output (MIMO), a standard allows for orthogonal assignment of RE between AP. In at least one embodiment, a receiver may perform partial single input, multiple output (SIMO) channel estimation based on a DMRS RE prior to MIMO equalization, neglecting spatial correlation.

In at least one embodiment, a second type of reference signal is a Phase Tracking Reference Signal (PTRS). In at least one embodiment, PTRS subcarriers are arranged in a comb structure having high density in a time domain. In at least one embodiment, it is used mainly in mmWave frequency bands to track and correct phase noise, which is a considerable source of performance losses. In at least one embodiment, usage of PTRS is optional, as it may lower a total spectral efficiency of a transmission when effects of phase noise are negligible.

In at least one embodiment, for transmission of data, a transport block may be generated from a MAC layer and given to a physical layer. In at least one embodiment, a transport block may be data that is intended to be transmitted. In at least one embodiment, a transmission in a physical layer starts with grouped resource data, which may be referred to as transport blocks. In at least one embodiment, a transport block is received by a cyclic redundancy check (CRC) 4202. In at least one embodiment, a cyclic redundancy check is appended to each transport block for error detection. In at least one embodiment, a cyclic redundancy check is used for error detection in transport blocks. In at least one embodiment, an entire transport block is used to calculate CRC parity bits and these parity bits are then attached to an end of a transport block. In at least one embodiment, minimum and maximum code block sizes are specified so blocks sizes are compatible with further processes. In at least one embodiment, an input block is segmented when an input block is greater than a maximum code block size.

In at least one embodiment, a transport block is received and encoded by a low-density parity-check (LDPC) encode 4204. In at least one embodiment, NR employs low-density parity-check (LDPC) codes for a data channel and polar codes for a control channel. In at least one embodiment, LDPC codes are defined by their parity-check matrices, with each column representing a coded bit, and each row representing a parity-check equation. In at least one embodiment, LDPC codes are decoded by exchanging messages between variables and parity checks in an iterative manner. In at least one embodiment, LDPC codes proposed for NR use a quasi-cyclic structure, where a parity-check matrix is defined by a smaller base matrix. In at least one embodiment, each entry of the base matrix represents either a Z×Z zero matrix or a shifted Z×Z identity matrix In at least one embodiment, an encoded transport block is received by rate match 4206. In at least one embodiment, an encoded block is used to create an output bit stream with a desired code rate. In at least one embodiment, rate match 4206 is utilized to create an output bit stream to be transmitted with a desired code rate. In at least one embodiment, bits are selected and pruned from a buffer to create an output bit stream with a desired code rate. In at least one embodiment, a Hybrid Automatic Repeat Request (HARQ) error correction scheme is incorporated.

In at least one embodiment, output bits are scrambled, which may aid in privacy, in scramble 4208. In at least one embodiment, codewords are bit-wise multiplied with an orthogonal sequence and a UE-specific scrambling sequence. In at least one embodiment, output of scramble 4208 may be input into modulation/mapping/precoding and other processes 4210. In at least one embodiment, various modulation, mapping, and precoding processes are performed.

In at least one embodiment, bits output from scramble 4208 are modulated with a modulation scheme, resulting in blocks of modulation symbols. In at least one embodiment, scrambled codewords undergo modulation using one of modulation schemes QPSK, 16 QAM, 64 QAM, resulting in a block of modulation symbols. In at least one embodiment, a channel interleaver process may be utilized that implements a first time mapping of modulation symbols onto a transmit waveform while ensuring that HARQ information is present on both slots. In at least one embodiment, modulation symbols are mapped to various layers based on transmit antennas. In at least one embodiment, symbols may be precoded, in which they are divided into sets, and an Inverse Fast Fourier Transform may be performed. In at least one embodiment, transport data and control multiplexing may be performed such that HARQ acknowledge (ACK) information is present in both slots and is mapped to resources around demodulation reference signals. In at least one embodiment, various precoding processes are performed.

In at least one embodiment, symbols are mapped to allocated physical resource elements in resource element mapping 4212. In at least one embodiment, allocation sizes may be limited to values whose prime factors are 2, 3 and 5. In at least one embodiment, symbols are mapped in increasing order beginning with subcarriers. In at least one embodiment, subcarrier mapped modulation symbols data are orthogonal frequency-division multiple access (OFDMA) modulated through IFFT operation in OFDMA modulation 4214. In at least one embodiment, time domain representations of each symbol are concatenated and filtered using transmit FIR filter to attenuate unwanted Out of Band emission to adjacent frequency bands caused by phase discontinuities and utilization of different numerologies. In at least one embodiment, an output of OFDMA modulation 4214 may be transmitted to be received and processed by another system.

In at least one embodiment, a transmission may be received by OFDMA demodulation 4216. In at least one embodiment, a transmission may originate from user mobile devices over a cellular network, although other contexts may be present. In at least one embodiment, a transmission may be demodulated through IFFT processing. In at least one embodiment, once OFDMA demodulation through IFFT processing has been accomplished, an estimation and correction of residual Sample Time Offset (STO) and Carrier Frequency Offset (CFO) may be performed. In at least one embodiment, both CFO and STO corrections have to be performed in frequency domain, because a received signal can be a superposition of transmissions coming from multiple UEs multiplexed in frequency, each suffering from a specific residual synchronization error. In at least one embodiment, residual CFO is estimated as a phase rotation between pilot subcarriers belonging to different OFDM symbols and corrected by a circular convolution operation in frequency domain.

In at least one embodiment, output of OFDMA demodulation 4216 may be received by resource element demapping 4218. In at least one embodiment, resource element demapping 4218 may determine symbols and demap symbols from allocated physical resource elements. In at least one embodiment, a channel estimation and equalization is performed in channel estimation 4220 in order to compensate for effects of multipath propagation. In at least one embodiment, channel estimation 4220 may be utilized to minimize effects of noise originating from various transmission layers and antennae. In at least one embodiment, channel estimation 4220 may generate equalized symbols from an output of resource element demapping 4218. In at least one embodiment, demodulation/demapping 4222 may receive equalized symbols from channel estimation 4220. In at least one embodiment, equalized symbols are demapped and permuted through a layer demapping operation. In at least one embodiment, a Maximum A Posteriori Probability (MAP) demodulation approach may be utilized to produce values representing beliefs regarding a received bit being 0 or 1, expressed in a form of Log-Likelihood Ratio (LLR).

In at least one embodiment, soft-demodulated bits are processed using various operations, including descrambling, deinterleaving and rate unmatching with LLR soft-combining using a circular buffer prior to LDPC decoding. In at least one embodiment, descramble 4224 may involve processes that reverse one or more processes of scramble 4208. In at least one embodiment, rate unmatch 4226 may involve processes that reverse one or more processes of rate match 4206. In at least one embodiment, descramble 4224 may receive output from demodulation/demapping 4222, and descramble received bits. In at least one embodiment, rate unmatch 4226 may receive descrambled bits, and utilize LLR soft-combining utilizing a circular buffer prior to LDPC decode 4228.

In at least one embodiment, decoding of LDPC codes in practical applications is done based on iterative belief propagation algorithms. In at least one embodiment, an LDPC code can be represented in a form of a bipartite graph with parity check matrix H of size M×N being a biadjacency matrix defining connections between graph nodes. In at least one embodiment, M rows of matrix H corresponds to parity check nodes, whereas N columns corresponds to variable nodes, i.e. received codeword bits. In at least one embodiment, a principle of belief propagation algorithms is based on iterative message exchange, in which A Posteriori probabilities between a variable and check nodes are updated, until a valid codeword is obtained. In at least one embodiment, LDPC decode 4228 may output a transport block comprising data.

In at least one embodiment, CRC check 4230 may determine errors and perform one or more actions based on parity bits attached to a received transport block. In at least one embodiment, CRC check 4230 may analyze and process parity bits attached to a received transport block, or otherwise any information associated with a CRC. In at least one embodiment, CRC check 4230 may transmit a processed transport block to a MAC layer for further processing.

It should be noted that, in various embodiments, transmitting and receiving data, which may be a transport block or other variation thereof, may include various processes not depicted in FIG. 42. In at least one embodiment, processes depicted in FIG. 42 are not intended to be exhaustive and further processes such as additional modulation, mapping, multiplexing, precoding, constellation mapping/demapping, MIMO detection, detection, decoding and variations thereof may be utilized in transmitting and receiving data as part of a network.

Figure 43:
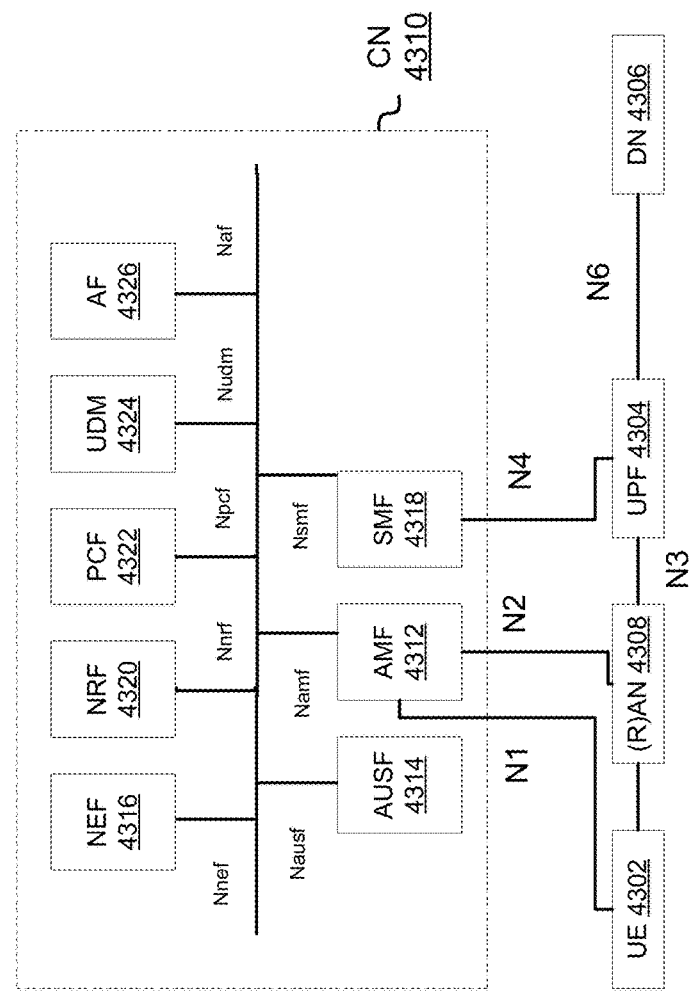
FIG. 43 illustrates an architecture of a system of a network, according to at least one embodiment.

FIG. 43 illustrates an architecture of a system 4300 of a network in accordance with some embodiments. In at least one embodiment, system 4300 is shown to include a UE 4302, a 5G access node or RAN node (shown as (R)AN node 4308), a User Plane Function (shown as UPF 4304), a Data Network (DN 4306), which may be, for example, operator services, Internet access or 3rd party services, and a 5G Core Network (5GC) (shown as CN 4310).

In at least one embodiment, CN 4310 includes an Authentication Server Function (AUSF 4314); a Core Access and Mobility Management Function (AMF 4312); a Session Management Function (SMF 4318); a Network Exposure Function (NEF 4316); a Policy Control Function (PCF 4322); a Network Function (NF) Repository Function (NRF 4320); a Unified Data Management (UDM 4324); and an Application Function (AF 4326). In at least one embodiment, CN 4310 may also include other elements that are not shown, such as a Structured Data Storage network function (SDSF), an Unstructured Data Storage network function (UDSF), and variations thereof.

In at least one embodiment, UPF 4304 may act as an anchor point for intra-RAT and inter-RAT mobility, an external PDU session point of interconnect to DN 4306, and a branching point to support multi-homed PDU session. In at least one embodiment, UPF 4304 may also perform packet routing and forwarding, packet inspection, enforce user plane part of policy rules, lawfully intercept packets (UP collection); traffic usage reporting, perform QoS handling for user plane (e.g. packet filtering, gating, UL/DL rate enforcement), perform Uplink Traffic verification (e.g., SDF to QoS flow mapping), transport level packet marking in uplink and downlink, and downlink packet buffering and downlink data notification triggering. In at least one embodiment, UPF 4304 may include an uplink classifier to support routing traffic flows to a data network. In at least one embodiment, DN 4306 may represent various network operator services, Internet access, or third party services.

In at least one embodiment, AUSF 4314 may store data for authentication of UE 4302 and handle authentication related functionality. In at least one embodiment, AUSF 4314 may facilitate a common authentication framework for various access types.

In at least one embodiment, AMF 4312 may be responsible for registration management (e.g., for registering UE 4302, etc.), connection management, reachability management, mobility management, and lawful interception of AMF-related events, and access authentication and authorization. In at least one embodiment, AMF 4312 may provide transport for SM messages for SMF 4318, and act as a transparent proxy for routing SM messages. In at least one embodiment, AMF 4312 may also provide transport for short message service (SMS) messages between UE 4302 and an SMS function (SMSF) (not shown by FIG. 43). In at least one embodiment, AMF 4312 may act as Security Anchor Function (SEA), which may include interaction with AUSF 4314 and UE 4302 and receipt of an intermediate key that was established as a result of UE 4302 authentication process. In at least one embodiment, where USIM based authentication is used, AMF 4312 may retrieve security material from AUSF 4314. In at least one embodiment, AMF 4312 may also include a Security Context Management (SCM) function, which receives a key from SEA that it uses to derive access-network specific keys. In at least one embodiment, furthermore, AMF 4312 may be a termination point of RAN CP interface (N2 reference point), a termination point of NAS (NI) signaling, and perform NAS ciphering and integrity protection.

In at least one embodiment, AMF 4312 may also support NAS signaling with a UE 4302 over an N3 interworking-function (IWF) interface. In at least one embodiment, N3IWF may be used to provide access to untrusted entities. In at least one embodiment, N3IWF may be a termination point for N2 and N3 interfaces for control plane and user plane, respectively, and as such, may handle N2 signaling from SMF and AMF for PDU sessions and QoS, encapsulate/de-encapsulate packets for IPSec and N3 tunneling, mark N3 user-plane packets in uplink, and enforce QoS corresponding to N3 packet marking taking into account QoS requirements associated to such marking received over N2. In at least one embodiment, N3IWF may also relay uplink and downlink control-plane NAS (NI) signaling between UE 4302 and AMF 4312, and relay uplink and downlink user-plane packets between UE 4302 and UPF 4304. In at least one embodiment, N3IWF also provides mechanisms for IPsec tunnel establishment with UE 4302.

In at least one embodiment, SMF 4318 may be responsible for session management (e.g., session establishment, modify and release, including tunnel maintain between UPF and AN node); UE IP address allocation & management (including optional Authorization); Selection and control of UP function; Configures traffic steering at UPF to route traffic to proper destination; termination of interfaces towards Policy control functions; control part of policy enforcement and QoS; lawful intercept (for SM events and interface to LI System); termination of SM parts of NAS messages; downlink Data Notification; initiator of AN specific SM information, sent via AMF over N2 to AN; determine SSC mode of a session. In at least one embodiment, SMF 4318 may include following roaming functionality: handle local enforcement to apply QoS SLAB (VPLMN); charging data collection and charging interface (VPLMN); lawful intercept (in VPLMN for SM events and interface to LI System); support for interaction with external DN for transport of signaling for PDU session authorization/authentication by external DN.

In at least one embodiment, NEF 4316 may provide means for securely exposing services and capabilities provided by 3GPP network functions for third party, internal exposure/re-exposure, Application Functions (e.g., AF 4326), edge computing or fog computing systems, etc. In at least one embodiment, NEF 4316 may authenticate, authorize, and/or throttle AFs. In at least one embodiment, NEF 4316 may also translate information exchanged with AF 4326 and information exchanged with internal network functions. In at least one embodiment, NEF 4316 may translate between an AF-Service-Identifier and an internal 5GC information. In at least one embodiment, NEF 4316 may also receive information from other network functions (NFs) based on exposed capabilities of other network functions. In at least one embodiment, this information may be stored at NEF 4316 as structured data, or at a data storage NF using a standardized interfaces. In at least one embodiment, stored information can then be re-exposed by NEF 4316 to other NFs and AFs, and/or used for other purposes such as analytics.

In at least one embodiment, NRF 4320 may support service discovery functions, receive NF Discovery Requests from NF instances, and provide information of discovered NF instances to NF instances. In at least one embodiment, NRF 4320 also maintains information of available NF instances and their supported services.

In at least one embodiment, PCF 4322 may provide policy rules to control plane function(s) to enforce them, and may also support unified policy framework to govern network behavior. In at least one embodiment, PCF 4322 may also implement a front end (FE) to access subscription information relevant for policy decisions in a UDR of UDM 4324.

In at least one embodiment, UDM 4324 may handle subscription-related information to support a network entities' handling of communication sessions, and may store subscription data of UE 4302. In at least one embodiment, UDM 4324 may include two parts, an application FE and a User Data Repository (UDR). In at least one embodiment, UDM may include a UDM FE, which is in charge of processing of credentials, location management, subscription management and so on. In at least one embodiment, several different front ends may serve a same user in different transactions. In at least one embodiment, UDM-FE accesses subscription information stored in an UDR and performs authentication credential processing; user identification handling; access authorization; registration/mobility management; and subscription management. In at least one embodiment, UDR may interact with PCF 4322. In at least one embodiment, UDM 4324 may also support SMS management, wherein an SMS-FE implements a similar application logic as discussed previously.

In at least one embodiment, AF 4326 may provide application influence on traffic routing, access to a Network Capability Exposure (NCE), and interact with a policy framework for policy control. In at least one embodiment, NCE may be a mechanism that allows a 5GC and AF 4326 to provide information to each other via NEF 4316, which may be used for edge computing implementations. In at least one embodiment, network operator and third party services may be hosted close to UE 4302 access point of attachment to achieve an efficient service delivery through a reduced end-to-end latency and load on a transport network. In at least one embodiment, for edge computing implementations, 5GC may select a UPF 4304 close to UE 4302 and execute traffic steering from UPF 4304 to DN 4306 via N6 interface. In at least one embodiment, this may be based on UE subscription data, UE location, and information provided by AF 4326. In at least one embodiment, AF 4326 may influence UPF (re)selection and traffic routing. In at least one embodiment, based on operator deployment, when AF 4326 is considered to be a trusted entity, a network operator may permit AF 4326 to interact directly with relevant NFs.

In at least one embodiment, CN 4310 may include an SMSF, which may be responsible for SMS subscription checking and verification, and relaying SM messages to/from UE 4302 to/from other entities, such as an SMS-GMSC/IWMSC/SMS-router. In at least one embodiment, SMS may also interact with AMF 4312 and UDM 4324 for notification procedure that UE 4302 is available for SMS transfer (e.g., set a UE not reachable flag, and notifying UDM 4324 when UE 4302 is available for SMS).

In at least one embodiment, system 4300 may include following service-based interfaces: Namf: Service-based interface exhibited by AMF; Nsmf: Service-based interface exhibited by SMF; Nnef: Service-based interface exhibited by NEF; Npcf: Service-based interface exhibited by PCF; Nudm: Service-based interface exhibited by UDM; Naf: Service-based interface exhibited by AF; Nnrf: Service-based interface exhibited by NRF; and Nausf: Service-based interface exhibited by AUSF.

In at least one embodiment, system 4300 may include following reference points: N1: Reference point between UE and AMF; N2: Reference point between (R)AN and AMF;

N3: Reference point between (R)AN and UPF; N4: Reference point between SMF and UPF; and N6: Reference point between UPF and a Data Network. In at least one embodiment, there may be many more reference points and/or service-based interfaces between a NF services in NFs, however, these interfaces and reference points have been omitted for clarity. In at least one embodiment, an NS reference point may be between a PCF and AF; an N7 reference point may be between PCF and SMF; an N11 reference point between AMF and SMF; etc. In at least one embodiment, CN 4310 may include an Nx interface, which is an inter-CN interface between MME and AMF 4312 in order to enable interworking between CN 4310 and CN 7243.

In at least one embodiment, system 4300 may include multiple RAN nodes (such as (R)AN node 4308) wherein an Xn interface is defined between two or more (R)AN node 4308 (e.g., gNBs) that connecting to 5GC 410, between a (R)AN node 4308 (e.g., gNB) connecting to CN 4310 and an eNB (e.g., a macro RAN node), and/or between two eNBs connecting to CN 4310.

In at least one embodiment, Xn interface may include an Xn user plane (Xn-U) interface and an Xn control plane (Xn-C) interface. In at least one embodiment, Xn-U may provide non-guaranteed delivery of user plane PDUs and support/provide data forwarding and flow control functionality. In at least one embodiment, Xn-C may provide management and error handling functionality, functionality to manage a Xn-C interface; mobility support for UE 4302 in a connected mode (e.g., CM-CONNECTED) including functionality to manage UE mobility for connected mode between one or more (R)AN node 4308. In at least one embodiment, mobility support may include context transfer from an old (source) serving (R)AN node 4308 to new (target) serving (R)AN node 4308; and control of user plane tunnels between old (source) serving (R)AN node 4308 to new (target) serving (R)AN node 4308.

In at least one embodiment, a protocol stack of a Xn-U may include a transport network layer built on Internet Protocol (IP) transport layer, and a GTP-U layer on top of a UDP and/or IP layer(s) to carry user plane PDUs. In at least one embodiment, Xn-C protocol stack may include an application layer signaling protocol (referred to as Xn Application Protocol (Xn-AP)) and a transport network layer that is built on an SCTP layer. In at least one embodiment, SCTP layer may be on top of an IP layer. In at least one embodiment, SCTP layer provides a guaranteed delivery of application layer messages. In at least one embodiment, in a transport IP layer point-to-point transmission is used to deliver signaling PDUs. In at least one embodiment, Xn-U protocol stack and/or a Xn-C protocol stack may be same or similar to an user plane and/or control plane protocol stack(s) shown and described herein.

Figure 44:
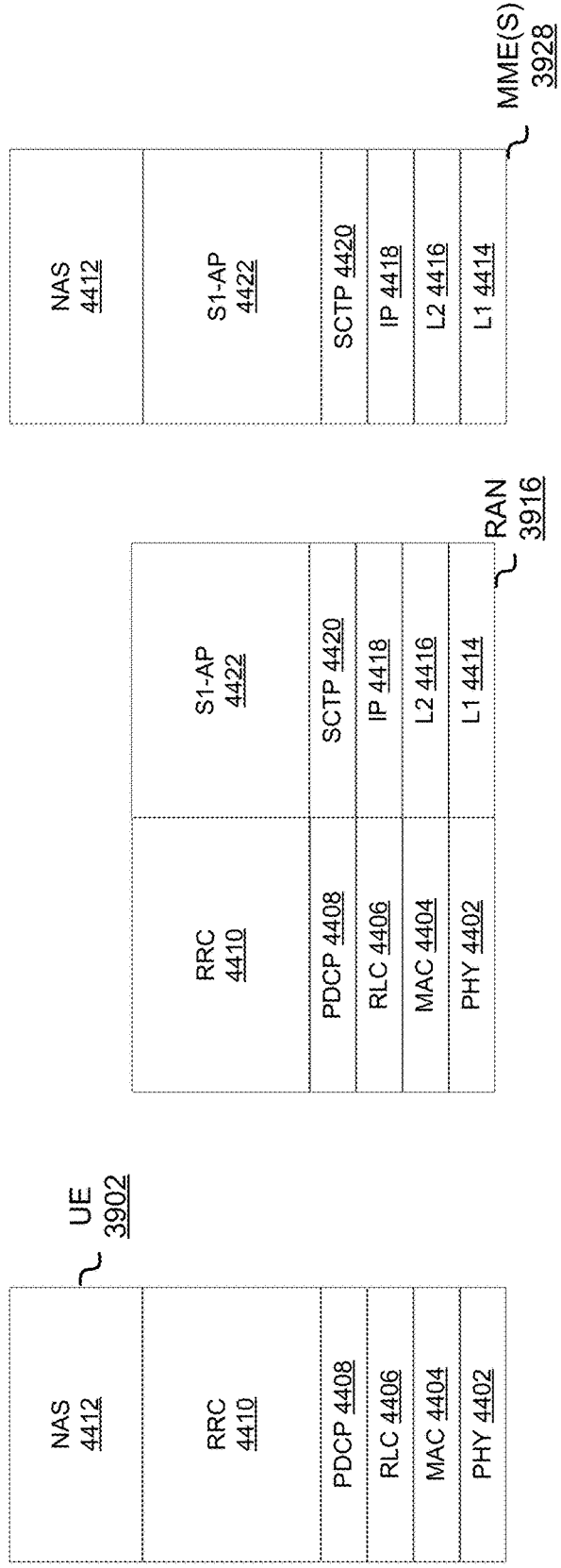
FIG. 44 illustrates a control plane protocol stack, according to at least one embodiment.

FIG. 44 is an illustration of a control plane protocol stack in accordance with some embodiments. In at least one embodiment, a control plane 4400 is shown as a communications protocol stack between UE 3902 (or alternatively, UE 3904), RAN 3916, and MME(s) 3928.

In at least one embodiment, PHY layer 4402 may transmit or receive information used by MAC layer 4404 over one or more air interfaces. In at least one embodiment, PHY layer 4402 may further perform link adaptation or adaptive modulation and coding (AMC), power control, cell search (e.g., for initial synchronization and handover purposes), and other measurements used by higher layers, such as an RRC layer 4410. In at least one embodiment, PHY layer 4402 may still further perform error detection on transport channels, forward error correction (FEC) coding/de-coding of transport channels, modulation/demodulation of physical channels, interleaving, rate matching, mapping onto physical channels, and Multiple Input Multiple Output (MIMO) antenna processing.

In at least one embodiment, MAC layer 4404 may perform mapping between logical channels and transport channels, multiplexing of MAC service data units (SDUs) from one or more logical channels onto transport blocks (TB) to be delivered to PHY via transport channels, de-multiplexing MAC SDUs to one or more logical channels from transport blocks (TB) delivered from PHY via transport channels, multiplexing MAC SDUs onto TBs, scheduling information reporting, error correction through hybrid automatic repeat request (HARD), and logical channel prioritization.

In at least one embodiment, RLC layer 4406 may operate in a plurality of modes of operation, including: Transparent Mode (TM), Unacknowledged Mode (UM), and Acknowledged Mode (AM). In at least one embodiment, RLC layer 4406 may execute transfer of upper layer protocol data units (PDUs), error correction through automatic repeat request (ARQ) for AM data transfers, and concatenation, segmentation and reassembly of RLC SDUs for UM and AM data transfers. In at least one embodiment, RLC layer 4406 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

In at least one embodiment, PDCP layer 4408 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

In at least one embodiment, main services and functions of a RRC layer 4410 may include broadcast of system information (e.g., included in Master Information Blocks (MIBs) or System Information Blocks (SIBs) related to a non-access stratum (NAS)), broadcast of system information related to an access stratum (AS), paging, establishment, maintenance and release of an RRC connection between an UE and E-UTRAN (e.g., RRC connection paging, RRC connection establishment, RRC connection modification, and RRC connection release), establishment, configuration, maintenance and release of point-to-point radio bearers, security functions including key management, inter radio access technology (RAT) mobility, and measurement configuration for UE measurement reporting. In at least one embodiment, said MIBs and SIBs may comprise one or more information elements (IEs), which may each comprise individual data fields or data structures.

In at least one embodiment, UE 3902 and RAN 3916 may utilize a Uu interface (e.g., an LTE-Uu interface) to exchange control plane data via a protocol stack comprising PHY layer 4402, MAC layer 4404, RLC layer 4406, PDCP layer 4408, and RRC layer 4410.

In at least one embodiment, non-access stratum (NAS) protocols (NAS protocols 4412) form a highest stratum of a control plane between UE 3902 and MME(s) 3928. In at least one embodiment, NAS protocols 4412 support mobility of UE 3902 and session management procedures to establish and maintain IP connectivity between UE 3902 and P-GW 3934.

In at least one embodiment, Si Application Protocol (S1-AP) layer (Si-AP layer 4422) may support functions of a Si interface and comprise Elementary Procedures (EPs). In at least one embodiment, an EP is a unit of interaction between RAN 3916 and CN 3928. In at least one embodiment, S1-AP layer services may comprise two groups: UE-associated services and non UE-associated services. In at least one embodiment, these services perform functions including, but not limited to: E-UTRAN Radio Access Bearer (E-RAB) management, UE capability indication, mobility, NAS signaling transport, RAN Information Management (RIM), and configuration transfer.

In at least one embodiment, Stream Control Transmission Protocol (SCTP) layer (alternatively referred to as a stream control transmission protocol/internet protocol (SCTP/IP) layer) (SCTP layer 4420) may ensure reliable delivery of signaling messages between RAN 3916 and MME(s) 3928 based, in part, on an IP protocol, supported by an IP layer 4418. In at least one embodiment, L2 layer 4416 and an L1 layer 4414 may refer to communication links (e.g., wired or wireless) used by a RAN node and MME to exchange information.

In at least one embodiment, RAN 3916 and MME(s) 3928 may utilize an S1-MME interface to exchange control plane data via a protocol stack comprising a L1 layer 4414, L2 layer 4416, IP layer 4418, SCTP layer 4420, and Si-AP layer 4422.

Figure 45:
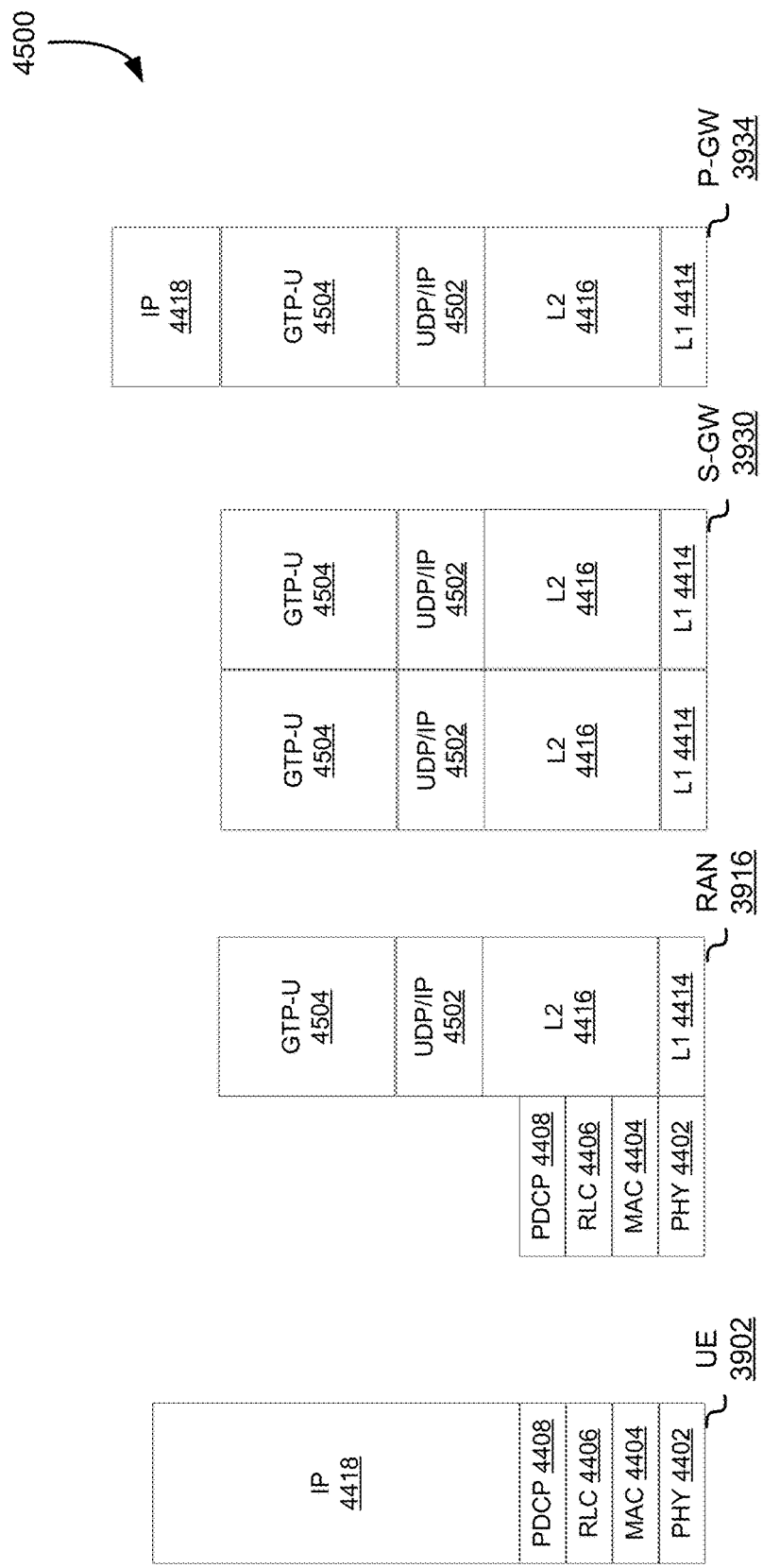
FIG. 45 illustrates a user plane protocol stack, according to at least one embodiment.

FIG. 45 is an illustration of a user plane protocol stack in accordance with at least one embodiment. In at least one embodiment, a user plane 4500 is shown as a communications protocol stack between a UE 3902, RAN 3916, S-GW 3930, and P-GW 3934. In at least one embodiment, user plane 4500 may utilize a same protocol layers as control plane 4400. In at least one embodiment, for example, UE 3902 and RAN 3916 may utilize a Uu interface (e.g., an LTE-Uu interface) to exchange user plane data via a protocol stack comprising PHY layer 4402, MAC layer 4404, RLC layer 4406, PDCP layer 4408.

In at least one embodiment, General Packet Radio Service (GPRS) Tunneling Protocol for a user plane (GTP-U) layer (GTP-U layer 4504) may be used for carrying user data within a GPRS core network and between a radio access network and a core network. In at least one embodiment, user data transported can be packets in any of IPv4, IPv6, or PPP formats, for example. In at least one embodiment, UDP and IP security (UDP/IP) layer (UDP/IP layer 4502) may provide checksums for data integrity, port numbers for addressing different functions at a source and destination, and encryption and authentication on selected data flows. In at least one embodiment, RAN 3916 and S-GW 3930 may utilize an S1-U interface to exchange user plane data via a protocol stack comprising L1 layer 4414, L2 layer 4416, UDP/IP layer 4502, and GTP-U layer 4504. In at least one embodiment, S-GW 3930 and P-GW 3934 may utilize an S5/S8a interface to exchange user plane data via a protocol stack comprising L1 layer 4414, L2 layer 4416, UDP/IP layer 4502, and GTP-U layer 4504. In at least one embodiment, as discussed above with respect to FIG. 44, NAS protocols support a mobility of UE 3902 and session management procedures to establish and maintain IP connectivity between UE 3902 and P-GW 3934.

Figure 46:
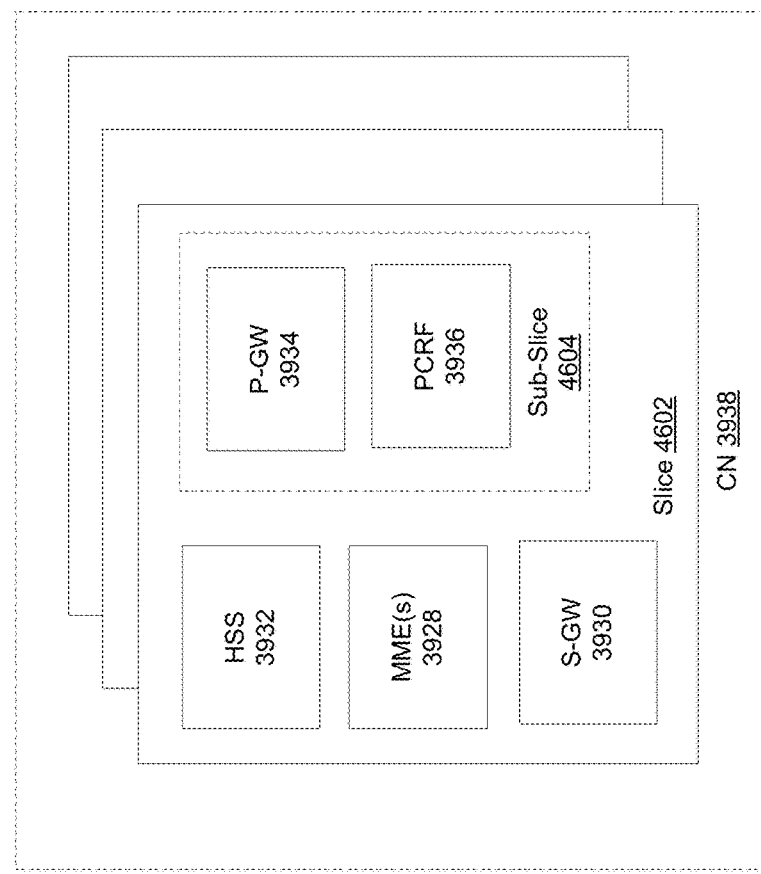
FIG. 46 illustrates components of a core network, according to at least one embodiment.

FIG. 46 illustrates components 4600 of a core network in accordance with at least one embodiment. In at least one embodiment, components of CN 3938 may be implemented in one physical node or separate physical nodes including components to read and execute instructions from a machine-readable or computer-readable medium (e.g., a non-transitory machine-readable storage medium). In at least one embodiment, Network Functions Virtualization (NFV) is utilized to virtualize any or all of above described network node functions via executable instructions stored in one or more computer readable storage mediums (described in further detail below). In at least one embodiment, a logical instantiation of CN 3938 may be referred to as a network slice 4602 (e.g., network slice 4602 is shown to include HSS 3932, MME(s) 3928, and S-GW 3930). In at least one embodiment, a logical instantiation of a portion of CN 3938 may be referred to as a network sub-slice 4604 (e.g., network sub-slice 4604 is shown to include P-GW 3934 and PCRF 3936).

In at least one embodiment, NFV architectures and infrastructures may be used to virtualize one or more network functions, alternatively performed by proprietary hardware, onto physical resources comprising a combination of industry-standard server hardware, storage hardware, or switches. In at least one embodiment, NFV systems can be used to execute virtual or reconfigurable implementations of one or more EPC components/functions.

Figure 47:
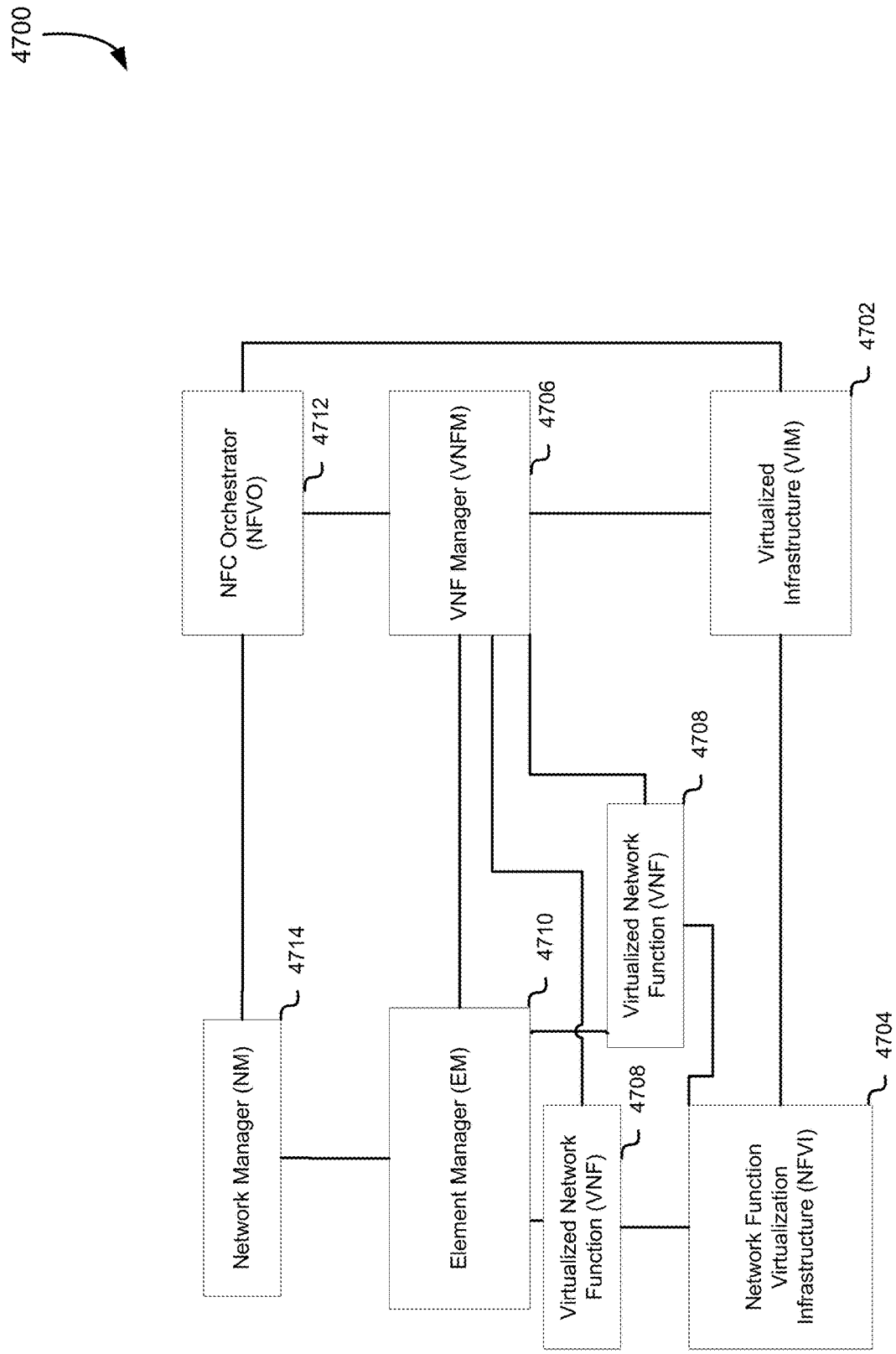
FIG. 47 illustrates components of a system to support network function virtualization (NFV), according to at least one embodiment.

FIG. 47 is a block diagram illustrating components, according to at least one embodiment, of a system 4700 to support network function virtualization (NFV). In at least one embodiment, system 4700 is illustrated as including a virtualized infrastructure manager (shown as VIM 4702), a network function virtualization infrastructure (shown as NFVI 4704), a VNF manager (shown as VNFM 4706), virtualized network functions (shown as VNF 4708), an element manager (shown as EM 4710), an NFV Orchestrator (shown as NFVO 4712), and a network manager (shown as NM 4714).

In at least one embodiment, VIM 4702 manages resources of NFVI 4704. In at least one embodiment, NFVI 4704 can include physical or virtual resources and applications (including hypervisors) used to execute system 4700. In at least one embodiment, VIM 4702 may manage a life cycle of virtual resources with NFVI 4704 (e.g., creation, maintenance, and tear down of virtual machines (VMs) associated with one or more physical resources), track VM instances, track performance, fault and security of VM instances and associated physical resources, and expose VM instances and associated physical resources to other management systems.

In at least one embodiment, VNFM 4706 may manage VNF 4708. In at least one embodiment, VNF 4708 may be used to execute EPC components/functions. In at least one embodiment, VNFM 4706 may manage a life cycle of VNF 4708 and track performance, fault and security of virtual aspects of VNF 4708. In at least one embodiment, EM 4710 may track performance, fault and security of functional aspects of VNF 4708. In at least one embodiment, tracking data from VNFM 4706 and EM 4710 may comprise, for example, performance measurement (PM) data used by VIM 4702 or NFVI 4704. In at least one embodiment, both VNFM 4706 and EM 4710 can scale up/down a quantity of VNFs of system 4700.

In at least one embodiment, NFVO 4712 may coordinate, authorize, release and engage resources of NFVI 4704 in order to provide a requested service (e.g., to execute an EPC function, component, or slice). In at least one embodiment, NM 4714 may provide a package of end-user functions with responsibility for a management of a network, which may include network elements with VNFs, non-virtualized network functions, or both (management of the VNFs may occur via the EM 4710).

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
   two or more decoders to decode, in parallel, a first compressed portion of one or more fifth generation new radio ("5G NR") signals using a first portion of a software graph indicating how the first compressed portion of the 5G NR signal is compressed and a second compressed portion of the 5G NR signal using a second portion of the software graph indicating how the second compressed portion of the 5G NR signal is compressed; and
   one or more circuits to cause the decoded first and second compressed portions of the 5G NR signal to be combined.

2. The system of claim 1, wherein the first portion of a software graph corresponds to a row of one or more code graphs, wherein the first portion of a software graph is used by a processor of one or more processors to partially decode the first compressed portion of one or more 5G NR signals, and wherein completion of decoding is based, at least in part, on combining results of the partial decoding.

3. The system of claim 1, wherein the first portion of the software graph comprises a count of non-zero values in a row of the one or more code graphs.

4. The system of claim 1, wherein the first portion of the software graph comprises a reference to a non-zero location in a row of the one or more code graphs.

5. The system of claim 1, wherein the first portion of the software graph comprises a representation of a portion of a lifting set.

6. The system of claim 5, wherein the representation of the portion of the lifting set comprises a count of non-zero values in a row of one or more code graphs and a rotation amount.

7. The system of claim 1, wherein the first compressed portion of one or more 5G NR signals and the second compressed portion of one or more 5G NR signals are encoded using a low-density parity check code.

8. A processor comprising:
   two or more decoders to decode, in parallel, a first compressed portion of one or more fifth generation new radio ("5G NR") signals using a first portion of a software graph indicating how the first compressed portion of the 5G NR signal is compressed and a second compressed portion of the 5G NR signal using a second portion of the software graph indicating how the second compressed portion of the 5G NR signal is compressed; and
   one or more circuits to cause the decoded first and second compressed portions of the 5G NR signal to be combined.

9. The processor of claim 8, wherein belief propagation is used to combine results of decoding one or more portions of the one or more 5G NR signals.

10. The processor of claim 8, wherein the first portion of the software graph comprises a count of non-zero locations in a row of one or more code graphs and one or more references to the non-zero locations in the row of the one or more code graphs.

11. The processor of claim 8, wherein the first portion of a software graph comprises a representation of a portion of a lifting set.

12. The processor of claim 8, wherein the first compressed portion of one or more 5G NR signals and the second compressed portion of one or more 5G NR signals are encoded using a low-density parity check code.

13. The processor of claim 8, wherein threads are executed by the one or more circuits in accordance with a single instruction, multiple thread execution model.

14. A non-transitory machine-readable medium having stored thereon a set of instructions, which if performed by one or more processors, causes two or more decoders to at least:
  decode, in parallel, a first compressed portion of one or more fifth generation new radio ("5G NR") signals using a first portion of a software graph indicating how the first compressed portion of the 5G NR signal is compressed and a second compressed portion of the 5G NR signal using a second portion of the software graph indicating how the second compressed portion of the 5G NR signal is compressed; and
  one or more circuits to cause the decoded first and second compressed portions of the 5G NR signal to be combined.

15. The non-transitory machine-readable medium of claim 14, having stored thereon a set of instructions, which if performed by one or more processors, causes the one or more processors to at least:
  identify a row of one or more code graphs based at least in part on the first portion of the software graph.

16. The non-transitory machine-readable medium of claim 14, wherein the first portion of the software graph comprises a count of non-zero locations in a row of one or more code graphs and one or more references to the non-zero locations.

17. The non-transitory machine-readable medium of claim 14, wherein the first portion of the software graph comprises a representation of a portion of a lifting set.

18. The non-transitory machine-readable medium of claim 14, wherein the first compressed portion of one or more 5G NR signals and the second compressed portion of one or more 5G NR signals are encoded using a low-density parity check code.

19. The non-transitory machine-readable medium of claim 14, having stored thereon a set of instructions, which if performed by one or more processors, causes the one or more processors to at least:
  complete decoding based at least in part on belief propagation, the belief propagation based at least in part on partial decoding of the 5G NR signals by the one or more processors.

20. A communications device comprising two or more decoders decode, in parallel, a first compressed portion of one or more fifth generation new radio ("5G NR") signals using a first portion of a software graph indicating how the first compressed portion of the 5G NR signal is compressed and a second compressed portion of the 5G NR signal using a second portion of the software graph indicating how the second compressed portion of the 5G NR signal is compressed; and
  one or more circuits to cause the decoded first and second compressed portions of the 5G NR signal to be combined.

21. The communications device of claim 20, further comprising one or more processors to decode one or more 5G NR signals based at least in part on the first portion of the software graph, wherein the first portion of the software graph comprises a row of one or more code graphs, and wherein the first portion of the software graph is used by a processor of the one or more processors to partially decode the 5G NR signals.

22. The communications device of claim 20, wherein the first portion of the software graph comprises a count of non-zero locations in a row of one or more code graphs and one or more references to the non-zero locations.

23. The communications device of claim 20, wherein the first portion of the software graph comprises one or more rotation values of a lifting set.

24. The communications device of claim 20, wherein the 5G NR signal is encoded based at least in part on a QC-LDPC code.

25. The communications device of claim 20, wherein the first portion of the software graph comprises a compressed representation of a row of a base graph and a compressed representation of a row of a lifting set.

* * * * *